US012057692B2

(12) United States Patent
Eriksen et al.

(10) Patent No.: US 12,057,692 B2
(45) Date of Patent: Aug. 6, 2024

(54) BUILT-IN INSTRUMENTATION INTEGRATING POWER MEASUREMENT, DISTRIBUTION AND MANAGEMENT, POWER SAFETY, AND AUTOMATION CONTROL

(71) Applicant: Brainwave Research Corporation, Woodbridge (CA)

(72) Inventors: John Eriksen, Thornhill (CA); Ghanshyam Rathi, Mississauga (CA); Benoit Fortin, Richmond Hill (CA); Rene Pardo, Woodbridge (CA)

(73) Assignee: Brainwave Research Corporation, Woodbridge (CA)

( * ) Notice: Subject to any disclaimer, the term of this patent is extended or adjusted under 35 U.S.C. 154(b) by 800 days.

(21) Appl. No.: 16/858,243

(22) Filed: Apr. 24, 2020

(65) Prior Publication Data

US 2020/0328586 A1 Oct. 15, 2020

Related U.S. Application Data

(63) Continuation-in-part of application No. 16/335,881, filed as application No. PCT/CA2017/051121 on Sep. 22, 2017, which is a continuation-in-part of application No. 15/659,382, filed on Jul. 25, 2017, now Pat. No. 10,910,776, and a continuation-in-part of application No. 15/274,469, filed on Sep. 23, 2016, now Pat. No. 10,673,225, said application No. 15/659,382 is a continuation-in-part of application No. 15/274,469, filed on Sep. 23, 2016, now Pat. No. 10,673,225.

(60) Provisional application No. 62/505,434, filed on May 12, 2017, provisional application No. 62/490,527, filed on Apr. 26, 2017, provisional application No. 62/377,962, filed on Aug. 22, 2016, provisional (Continued)

(30) Foreign Application Priority Data

Jul. 25, 2017 (WO) ................ PCT/CA2017/050893
Apr. 24, 2019 (CA) ................................ CA 3040940

(51) Int. Cl.

| | |
|---|---|
| ***H02H 1/00*** | (2006.01) |
| ***H01R 13/713*** | (2006.01) |
| ***H02H 7/22*** | (2006.01) |
| ***H04B 3/54*** | (2006.01) |
| *H01R 25/00* | (2006.01) |
| *H05K 7/14* | (2006.01) |

(52) U.S. Cl.

CPC ......... *H02H 1/0061* (2013.01); *H01R 13/713* (2013.01); *H02H 1/0007* (2013.01); *H02H 1/0092* (2013.01); *H02H 7/226* (2013.01); *H04B 3/548* (2013.01); *H01R 25/006* (2013.01); *H04B 2203/5408* (2013.01); *H04B 2203/5454* (2013.01); *H05K 7/1427* (2013.01)

(58) Field of Classification Search

CPC .................................................. H04B 3/54–60
See application file for complete search history.

(56) References Cited

U.S. PATENT DOCUMENTS

2014/0032003 A1* 1/2014 Chapel .................. G05B 15/02 700/295
2014/0036976 A1* 2/2014 Shad ..................... H04B 3/542 375/224

* cited by examiner

*Primary Examiner* — Jared Fureman
*Assistant Examiner* — Christopher J Clark
(74) *Attorney, Agent, or Firm* — Smart & Biggar LP

(57) ABSTRACT

Built-in instrumentation for power measurement integrating power monitoring, delivery and management, power safety, and automation control.

15 Claims, 105 Drawing Sheets

Related U.S. Application Data application No. 62/366,910, filed on Jul. 26, 2016, provisional application No. 62/222,904, filed on Sep. 24, 2015.

RAM Data Table

0: Sample Counter
1: BLK Voltage
2: Upper Current
3: Lower Current
4: WHT Current
5: Down Current
6: BLK RMS Voltage
7: Upper RMS Current
8: Lower RMS Current
9: WHT RMS Current
10: Down RMS Current
11: BLK V Peak
12: Upper C Peak
13: Lower C Peak
14: WHT C Peak
15: Down C Peak
16: BLK V Timer
17: Upper Timer
18: Lower Timer
20: Down Timer
30: ADC Timer
31: Samples Permissible
50 to 60: Flags & internal parameters
100 to 199: BLK Voltage Samples
200 to 299: Upper Current Samples
300 to 399: Lower Current Samples
400 to 499: WHT Current Samples
500 to 599: Down Current Samples

FIG. 18

Circuit Breaker connection design for power line communication and power control Wire connectors :

| | |
|---|---|
| Ground | - 3902 |
| Neutral | -3904 |

Included in this receptacle:

- ac/dc converter
- processors
- current sensors/meter
- voltage sensors/meter
- environmental sensors
- built in flash memory
- communication chip/circuits
- reset /test switches
- test ports
- USB ports
- serial communication ports
- power control devices
- power connectors
- downstream channel
- status led lights
- surge arrestors

4900

5200

5800

5900

6000

6500

Safety Ground wire Current Monitoring Sensor
(a Non-contact magnetic field sensor)

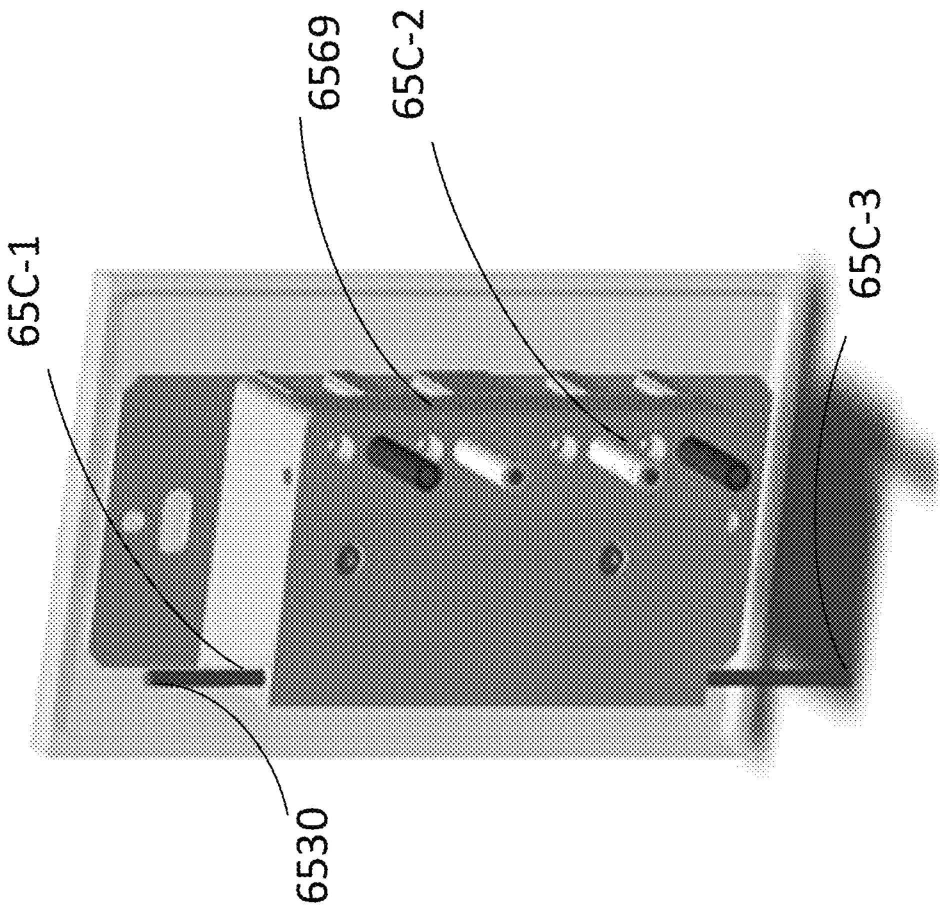
FIGURE 65C (1)
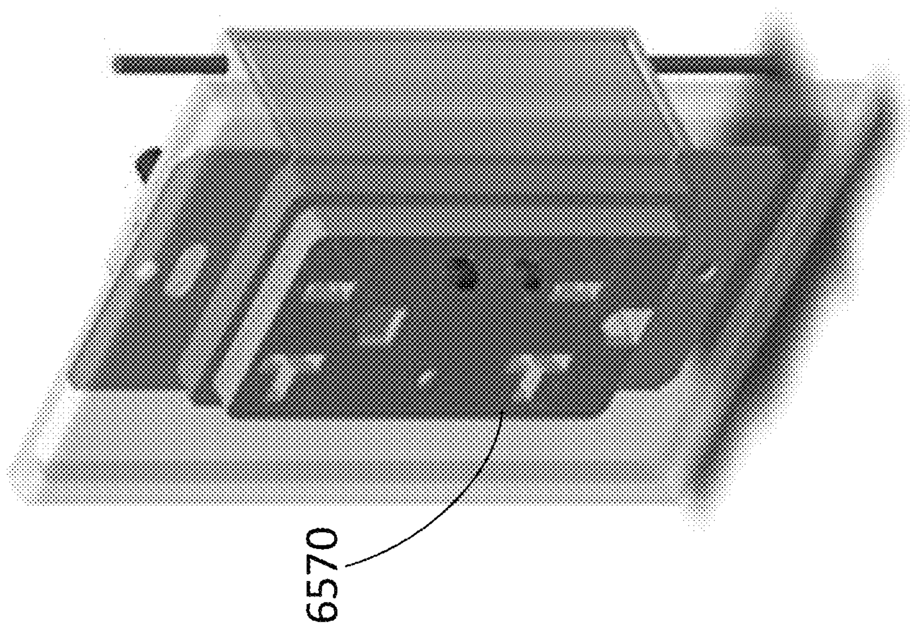
FIGURE 65C (2)

6600

6700B

BUILT-IN INSTRUMENTATION INTEGRATING POWER MEASUREMENT, DISTRIBUTION AND MANAGEMENT, POWER SAFETY, AND AUTOMATION CONTROL

CROSS REFERENCE TO RELATED APPLICATIONS

This application claims the benefit of priority to Canadian Application No. 3040940 filed Apr. 24, 2019. This application is also a continuation-in-part of U.S. patent application Ser. No. 16/335,881 filed Mar. 22, 2019, which is a U.S. nationalization under 35 U.S.C. § 371 of International Application no. PCT/CA2017/051121 filed Sep. 22, 2017, which is a continuation-in-part of U.S. application Ser. No. 15/274,469 filed Sep. 23, 2016, which claims priority from U.S. provisional application No. 62/490,527, filed Apr. 26, 2017, U.S. provisional application No. 62/505,434, filed May 12, 2017, PCT Patent Application No. PCT/CA2017/050893, filed Jul. 25, 2017, and which U.S. application Ser. No. 15/274,469 is a continuation-in-part of U.S. patent application Ser. No. 15/659,382, filed Jul. 25, 2017, which claims the benefit of priority to U.S. provisional application No. 62/222,904 filed Sep. 24, 2015, U.S. provisional application No. 62/366,910 filed Jul. 26, 2016, U.S. provisional application No. 62/377,962 filed Aug. 22, 2016, U.S. provisional application No. 62/490,527 filed Apr. 26, 2017, U.S. provisional application No. 62/505,434 filed May 12, 2017, and which International Application no. PCT/CA2017/051121 claims priority from U.S. provisional application No. 62/490,527, filed Apr. 26, 2017, U.S. provisional application No. 62/505,434, filed May 12, 2017, PCT Patent Application No. PCT/CA2017/050893, filed Jul. 25, 2017, and U.S. patent application Ser. No. 15/659,382, filed Jul. 25, 2017. The contents of all of the above-noted references are herein incorporated by reference into the Detailed Description of Example Embodiments below.

TECHNICAL FIELD

This disclosure is related to electrical receptacles, more particularly, to integrated power control, communication and monitoring of electrical receptacles and similar devices.

BACKGROUND

Various conventional circuit interruption devices exist for arc fault protection, ground fault protection, overcurrent protection, and surge suppression. An arc fault is an unintentional electrical discharge in household wiring characterized by low and erratic voltage/current conditions that may ignite combustible materials. A parallel current fault results from direct contact of two wires of opposite polarity. A ground current fault occurs when there is a contact, which may be an arc, between a hot wire and ground. A series voltage fault occurs when there is an arc across a break in a single conductor. When a ground or arc fault is detected, power is conventionally terminated on the circuit by an AFCI or ground fault circuit interrupter (GFCI) disconnecting both receptacle outlets and any downstream receptacles.

The devices include transformers that combine magnetic representations of the current in an analog form. Transformer current sensors are limited to a fixed current value and time interval. Upon sensed voltage imbalance of greater than a specified level, such as 6 mV, power is interrupted by electromechanical means, such as solenoid tripping a locking mechanism. The conventional devices lack capability to disconnect outlets individually, independently of other loads connected to the outlet.

A normal arc can occur when a motor starts or a switch is tripped. Only current flow imbalance between the hot and neutral conductors is detected by conventional circuit interrupters. The individual current line difference is not monitored. Conventional circuit interrupters trip frequently by false triggers, as they lack adequate capability to distinguish between normal arcing and unwanted arcing. Transformer current sensors are limited to a fixed current value and time interval. Upon sensed voltage imbalance of greater than a specified level, such as 6 mV, power is interrupted by electromechanical means, such as solenoid tripping a locking mechanism. The conventional devices lack capability to disconnect outlets individually, independently of other loads connected to the outlet.

As indicated above, it may be advantageous to improve the usability and safety of existing conventional receptacles. Existing conventional GFCI and AFCI receptacles do not provide detail about a fault. Currents are not being individually measured. Existing conventional GFCI and AFCI receptacles do not measure, monitor and control the delivery of current and voltage, and do not protect against overcurrent, under voltage or over voltage at the outlet. It may be advantageous to limit interruption of power to affected outlets, receptacles or devices only on the circuit, based on the type and location of the fault. Overcurrent protection at the outlet is preferable to the protection provided by the circuit breaker as it would avoid detection delay; as well as associated voltage losses associated with wire resistance along increasing wire length whereby such voltage losses impede the ability of existing circuit breakers to detect a short circuit at a remote location.

It may be advantageous for overcurrent protection that more effectively distinguishes between short circuits, momentary overcurrent and overload so that false triggering can be avoided. It may be advantageous for a receptacle that can provide local overcurrent protection as well as protection against arc faults and ground faults.

Conventional existing dual amperage receptacles will supply up to 20 A to an appliance rated for 15 A and potentially cause an overcurrent event. It may be advantageous for a dual amperage (e.g. 15 A/20 A) receptacle that restricts amperage supplied to a lower rated plug when a low rated appliance is plugged in.

Some existing code standards require the electrician or installer to apply a very conservative load rating when designing the appropriate amperage of the system, for example 80% maximum permissibility as a factor of safety, e.g. maximum 12 A load for a 15 A circuit breaker. This is due to some existing receptacles and breakers being slow to respond, and is required in order to prevent overheating or electrical fires/faults.

The particular individual line circuit breakers of e.g. 15 A/20 A are also conservative in some situations or code standards and are often defined so as not to overload the main circuit breaker panel. These power allocations can be inflexible once setup so as not to overload.

Current measurement accuracy is important for effective ground and arc fault detection as well as overcurrent protection. Conventional receptacles are factory calibrated and not re-calibrated by the device once installed. It may be advantageous for continued self-calibration of receptacles and outlets.

If the hot and neutral conductors have been incorrectly wired to the receptacle terminals, electrical equipment plugged into the receptacle can be damaged. Incorrect wiring can cause short circuits with potential to harm the user through shock or fire. It may be advantageous to warn the receptacle installer that the receptacle has been incorrectly wired and to preclude supply power to the load in such event. It may also be advantageous that the outlet not be operational if the black wire and white wire are incorrectly connected to the opposite terminals.

Conventional outlets lack surge protection features, which are typically provided by power strips and power bars. A power strip is inserted into a receptacle after which a sensitive electrical device is plugged into one of the power strip extension receptacles. Use of the power strip tends to lead to a false impression that it is safe to insert additional loads that more than permissible. It may be advantageous for surge protection at the electrical receptacle to avoid use of a dedicated power strip and its attendant disadvantages of power loss and limited life.

It is possible to plug a GFI extension cord or a power strip with a comprised ground prong into a two blade ungrounded receptacle by using a "cheater plug" that allows the ground prong to be inserted without a present ground. It is also possible to replace an ungrounded two blade electrical receptacle with one with ground socket without actually providing a conductor to ground pin. Conventional existing receptacles do not indicate that the supply side safety ground is present or if it is compromised. It may be advantageous to protect the user and the equipment in the event of an incorrect grounding of an electrical receptacle. If no safety-ground is present and a wire conductor is exposed (e.g. has degraded insulation) the user may act as the ground path and receive a shock.

Traditionally, GFCI manual testing is accomplished by injecting a current imbalance. A toroid type transformer is typically used to measure the current imbalance between neutral and hot conductors. The monitoring circuit indicates that an imbalance has occurred without indicating the amount of imbalance. This method is limited in that the absolute value of current imbalance is not available. There is merely a voltage level that indicates that an imbalance or fault has occurred. It may be advantageous for more comprehensive self-testing and interruption of supply power to downstream and/or receptacle loads upon fault detection or an internal component fault.

There are some devices that leverage power lines of a home's existing power outlets to provide a communication network, so that a computer located at each outlet can communicate using signals over the power line. These devices often use the hot power line to communicate, and are therefore prone to circuit breaker trips and high voltage fluctuation problems as well as no communication from phase to phase, if the receptacles are not connected to the same phase.

Traditional breakers and electrical receptacles are electromechanical in design. Certain types of leakage are captured through AFCI and GFCI.

Electrical fault detection such as for arcs, are based on capturing current differentials and then de-energizing a circuit. They do not incorporate line voltage measurement and depend on current fluctuating sufficiently to detect the presence of an arc. They do not directly measure current and line voltage and attempt to detect fault conditions by calculating voltage and current RMS values (averaging value calculated as Root Means Squared), and doing frequency analysis. The analysis of harmonics and variations in high frequency currents are not part of their fault detection processes and means.

Line voltage variation traditionally has not been a consideration in detecting that an arc has occurred. Using current sensors on their own will not properly detect some types of parallel and series arcs. Furthermore, current sensors have their limitations in programmability resolutions and consistency, affected for example, by temperature drift. Breakers and electrical receptacles using a processor to measure, analyze and directly control the delivery of current and voltage do not exist.

A need exists to replace existing slower electro-mechanical processes and means which are typical in existing breakers and conventional receptacle protection as they can exhibit false triggering and are prone to faulty detection processes. Although AFCIs detect leakage and provide protection against certain parallel arcing (e.g. live to ground), they are inadequate in properly detecting the occurrence of arcs between black (live) and white (neutral) where there won't be current imbalance. Furthermore, traditional AFCI's do not provide true protection against series arcing—rather indirectly providing AFCI tripping as a function of other events such as shorting, over current and/or overload.

A need exists to eliminate the weaknesses of existing AFCI which are inadequate to detect and protect against series arcs, in order to reduce the risk of electrical fires.

Conventional AFCI in-wall receptacles and breakers may not adequately prevent arcing and often exhibit false tripping. In some cases, the initial arc may cause ignition prior to detection and circuit interruption by the AFCI. AFCI protective features are not available in wall adaptors, extension cords and power strips.

While MCB circuit breakers provide both overcurrent and overload protection, Branch/feeder and combination AFCIs provide some ground fault protection (for example, tripping on 70 mA current differentials).

The need exists for a means and method to provide a higher degree of confidence that a current signature traditionally indicative of an arc fault, will not be a false positive, causing false tripping, thereby reducing the number of occurrences of false tripping.

Industry literature and publication(s) regarding arc faults has traditionally been related to examination of current. Unique signatures have been documented in the current domain. Examining arc faults only on the basis of current, may result in only certain kinds of arcs being detected, as well as not detecting many false triggers causing false tripping.

Branch feeder AFCI's and Combination AFCI's, being circuit breakers, both types provide both overcurrent and overload protection. Both claim to provide protection against parallel arcing, while neither provides protection against series arcing. Manufacturers claiming to detect and trip on parallel arc fault events, may not be able to do so for certain types of parallel arcs, such as occurring between live (black wiring) and neutral (white wiring) as a current imbalance between black and white may not occur and accordingly, depending on detection means, will not trip the circuit.

UL 1699 AFCI standard may test for parallel arcing and not for ground fault or series arcing. Furthermore, appliance cords are not protected by the AFCI Combination breakers.

Ground fault detection has been proposed as enhancing the ability of breakers to recognize arc faults, but certification bodies at times have limited their inclusion in the standards requirements of the incorporation of 30 Amperage ground fault detection within the AFCI breaker mechanism.

Certain arc faults may be indirectly detectable by the inclusion of leakage current detection, but this is not a requirement under the electrical code.

If ground fault detection can enhance response to arcs, then AFCI detection is further made more difficult when corded devices are 2-wired, without a path to ground. AFCI breakers cannot detect if an arc event is taking place in an electrical cord of an appliance/device plugged into receptacles (nor extension cords).

Existing AFCI related technologies on the market have resulted in the certification bodies testing using various alloys to test for arc faults (copper-to-alloys such as copper/phosphor) rather than copper-to-copper in order to provide a sustainable arc(s) for testing purposes.

Certification bodies use an copper alloy to be able to create a sustainable arc; the arcing is prolonged and intermittent. However, it should be noted that continuous low current arcing is not possible with copper-copper. According to Pashen's Law, 1889 establishing relationships between breakdown voltage, the gap between two metal plates and the pressure, it has been argued that a break in a copper wire will not create a sustainable arc—supporting the argument that a Combination AFCI cannot respond to arcing at a break in a carbon-carbon conductor or a loose connection.

The need exists for branch feeder AFCI breakers, whether stand-alone or Combination AFCI's, and Receptacle Devices to provide reliable arc fault detection for both series and parallel, at the branch feeder breaker level and Receptacle Device level. Corded devices should as well be protected against arcs.

Other electrical fault concerns include the discontinuance of power should there be "glowing contacts". These may take place at many levels whereby connections may be loose or partial in the case of multi stranded wires, at the wiring connections in receptacle devices or the appliance on the load (e.g. bulb, hair dryer, electric drill, toaster, vacuum cleaner, etc.).

Instantaneous tripping-type breakers (e.g. MCB's) are designed such that they won't trip at 15 Amps; rather the current may continue increasing to 200 Amps. During an overload condition (e.g. often caused by multiple or too many appliances), it takes a few seconds for the bi-metallic to heat up and trip.

Circuit Breakers at the panel do provide overload and overcurrent (short circuit), but their overcurrent rating is as high as 200 Amps to 500 Amps.

When a certification body requires, say 75 Amperes as the minimum amount of current to be provided, "short circuit available" is the current flow that is guaranteed to be provided, in order for the traditional industry detection mechanisms to work.

It is an object of the inventions disclosed herein to provide means and processes which address many of the above inadequacies of traditional electrical fault detection.

It is also an object of the disclosures to provide means and methods to detect glowing contacts, reduce the risk of fires caused by glowing contacts, and even eliminate them at the receptacle outlet through mechanical design which prevents looping of the wires at the contact point, eliminating bad connections. As well, accordingly without the glowing contacts, the plastic would not melt reducing another potential fire risk caused by glowing contacts.

It is also an object of the disclosures to provide for the improved detection of both series and parallel arc faults through means and processes for detecting non-continuous arc faults.

Additional difficulties with existing systems may be appreciated in view of the Detailed Description of Example Embodiments, herein below.

SUMMARY OF DISCLOSURE

An example embodiment is an electrical device for separated power lines, the electrical device comprising: a plurality of electrical devices, each electrical device comprising a first contact for electrical connection to a respective upstream hot power line, a second contact for electrical connection to a respective neutral power line, and a third contact for electrical connection to a respective upstream ground line; each electrical device comprising a fourth contact for electrical connection to a respective downstream hot power line, a fifth contact for electrical connection to a respective downstream neutral power line, and a sixth contact for electrical connection to a respective downstream ground line; and a bus for electrically connecting all of the downstream ground lines.

Another example embodiment is an extension cord, comprising: a cable having a first end portion and a second end portion; a power input end terminating the first end portion of the cable; a power output end terminating the second end portion of the cable; at least one sensor positioned at the second end portion for detecting signals indicative of the cable; a solid state switch in series relationship with the cable at the second end portion of the cable; a processor configured to determine, based on the detected current, that there is a ground fault, arc fault or over-current condition, and in response cause the solid state switch to deactivate.

Another example embodiment is a communication device, comprising: a first contact configured for electrical connection to a downstream power line; a second contact configured for electrical connection to ground; a processor; and a communication subsystem configured for wired communications over the downstream power line to the ground by sending an AC signal over the downstream power line.

Another example embodiment is a communication device, comprising: a first contact configured for electrical connection to a neutral power line; a second contact configured for electrical connection to ground; a processor; and a communication subsystem configured for wired communications over the neutral power line to the ground by sending an AC signal over the neutral line.

Another example embodiment is an electrical device comprising: a first contact and a second contact configured for electrical connection to a hot power line and a neutral power line, respectively, the first contact and the second contact for downstream electrical connection to a downstream hot power line and downstream neutral power line, respectively; a switch connected in series relationship to the hot power line; at least one sensor configured to detect signals of the hot power line and/or the neutral power line; memory; a communication interface; at least one processor configured to execute instructions stored in the memory for: i) active power distribution of the power line within each cycle of the detected voltage signals by activating or deactivating the switch in response to the signals detected by at least one of the sensors, ii) control of the switch in response to receiving a communication over the communication interface, iii) processing raw information of the signals detected by the at least one sensor to arrive at processed information, and storing the raw information and the processed information to the memory, and iv) sending at least the processed information through the communication interface.

Another example embodiment is a metering device configured for distributing power, comprising: a first contact, a second contact, and a third configured for electrical connection to a hot power line, a neutral power line, and a ground line, respectively, the first contact, the second contact, and the third contact for downstream electrical connection to a downstream hot power line, downstream neutral power line, and downstream ground line, respectively; a switch connected in series relationship to the hot power line; at least one sensor configured to detect signals of the hot power line and/or the neutral power line; memory; a communication interface; and at least one processor configured to execute instructions stored in the memory for i) active power distribution of the power line within each cycle of the detected voltage signals by activating or deactivating the switch in response to the signals detected by at least one of the sensors, ii) control of the switch in response to receiving a communication over the communication interface, and iii) storing raw information of the signals and/or processed information of the signals to the memory.

Another example embodiment is an electrical device comprising: a contact for electrical connection to a hot power line, and configured for downstream electrical connection to a downstream power line; a switch connected in series relationship to the hot power line; at least one sensor configured to detect current or voltage signals of the hot power line; at least one further sensor, including a temperature sensor, humidity sensor, liquid sensor, vibration sensor, or carbon monoxide sensor, configured to detect a condition of the electrical device; and a processor configured to control an activation or a deactivation of the switch in response to the current or voltage signals detected by the at least one sensor and the condition detected by at least one further sensor.

Another example embodiment is an electrical device, comprising: a plug outlet comprising a first contact configured for electrical connection to a first hot power line having a first phase and a second contact configured for electrical connection to a second hot power line having a second phase, a first switch connected to the first contact in series relationship with the first hot power line, a second switch connected to the first contact in series relationship with the second hot power line, a processor configured to control an activation or a deactivation of the first switch and the second switch, the switches being in a deactivation state as a default when there is a plug in the plug outlet, the processor configured to determine that electrical conditions are safe, and in response activate the first switch and the second switch to distribute two-phase power to the plug, wherein the plug is from an electric vehicle.

Another example embodiment is an electrical device comprising: at least one circuit breaker for connection to at least one hot power line, and each circuit breaker configured for downstream electrical connection to a respective downstream power line; and a communication subsystem; a processor configured to send, through the communication subsystem, a communication that one of the circuit breakers has opened or tripped.

Additional features of the present disclosure will become readily apparent to those skilled in this art from the following detailed description, wherein only the preferred embodiments are shown and described, simply by way of illustration. As may be realized, there are other and different embodiments, and its several details are capable of modifications in various obvious respects, all without departing from the scope. Accordingly, the drawings and description are to be regarded as illustrative in nature, and not as restrictive.

BRIEF DESCRIPTION OF DRAWINGS

Various exemplary embodiments are illustrated by way of example, and not by way of limitation, in the figures of the accompanying drawings in which like reference numerals may refer to similar elements and in which:

FIG. 18 is a RAM data table for the processor of the example embodiment;

FIGS. 49A and 40B is an example of an extension cord in accordance with an example embodiment;

FIGS. 59-1A and 59-1B represent a single cycle of sinusoidal waveforms (or sine wave) of voltage in an AC Circuit of a parallel arc fault, showing instantaneous voltage over time ("Vt");

FIGS. 59-2A and 59-2B illustrate FFT values of normal (non-fault) sinusoidal waveform;

FIGS. 59-3A and 59-3B illustrate FFT values based on 64 samples of the sinusoidal waveforms of FIGS. 59-1A and 59-1B;

FIG. 60-1A is a photograph of normal operation of a power line prior to a series arc fault;

FIG. 60-1B illustrates example graphs of the occurrence illustrated in FIG. 60-1A;

FIG. 60-1C illustrate example data of the occurrence illustrated in FIG. 60-1A;

FIG. 61-1A is a photograph of a manual break in the power line and an arc starting to appear;

FIG. 61-1B illustrates example graphs of the occurrence illustrated in FIG. 61-1A;

FIG. 61-1C illustrate example data of the occurrence illustrated in FIG. 61-1A;

FIG. 62-1A is a photograph of the arc in full motion;

FIG. 62-1B illustrates example graphs of the occurrence illustrated in FIG. 62-1A;

FIG. 62-1C illustrate example data of the occurrence illustrated in FIG. 62-1A;

FIG. 63-1A is a photograph of the arc diminishing with glowing contacts;

FIG. 63-1B illustrates example graphs of the occurrence illustrated in FIG. 63-1A;

FIG. 63-1C illustrate example data of the occurrence illustrated in FIG. 63-1A;

FIG. 64-1A is a photograph of the arc finished, the conductors are back to normal.

FIG. 64-1B illustrate example data of the occurrence illustrated in FIG. 64-1A;

FIG. 65C(1) is a rear view of the safety ground current monitoring sensor incorporated in an enclosure;

FIG. 65C(2) is a front view of the safety ground current monitoring sensor incorporated in an enclosure;

DETAILED DESCRIPTION OF EXAMPLE EMBODIMENTS

As understood in the art of electrical circuits and power lines, Black refers to hot or live power line, White refers to neutral power line, and Ground means earth ground. Last mile setups can be referred to as Black, White & Ground; or Live, Neutral and Ground. There is no potential difference (zero volts) between ground and white. The Neutral carries current back from the Black power line. Voltage Black to White potential will show the line voltage e.g., 110 V; and Ground to Black potential will show the line voltage, e.g. 110 V.

The Applicant has described electrical systems and methods in PCT/CA2017/051121, filed Sep. 22, 2017, PCT Patent Application No. PCT/CA2017/050893, filed Jul. 25, 2017, U.S. patent application Ser. No. 15/659,382, filed Jul. 25, 2017, and U.S. patent application Ser. No. 15/274,469, filed Sep. 23, 2016, the contents of which are herein incorporated by reference.

Figure 1A:
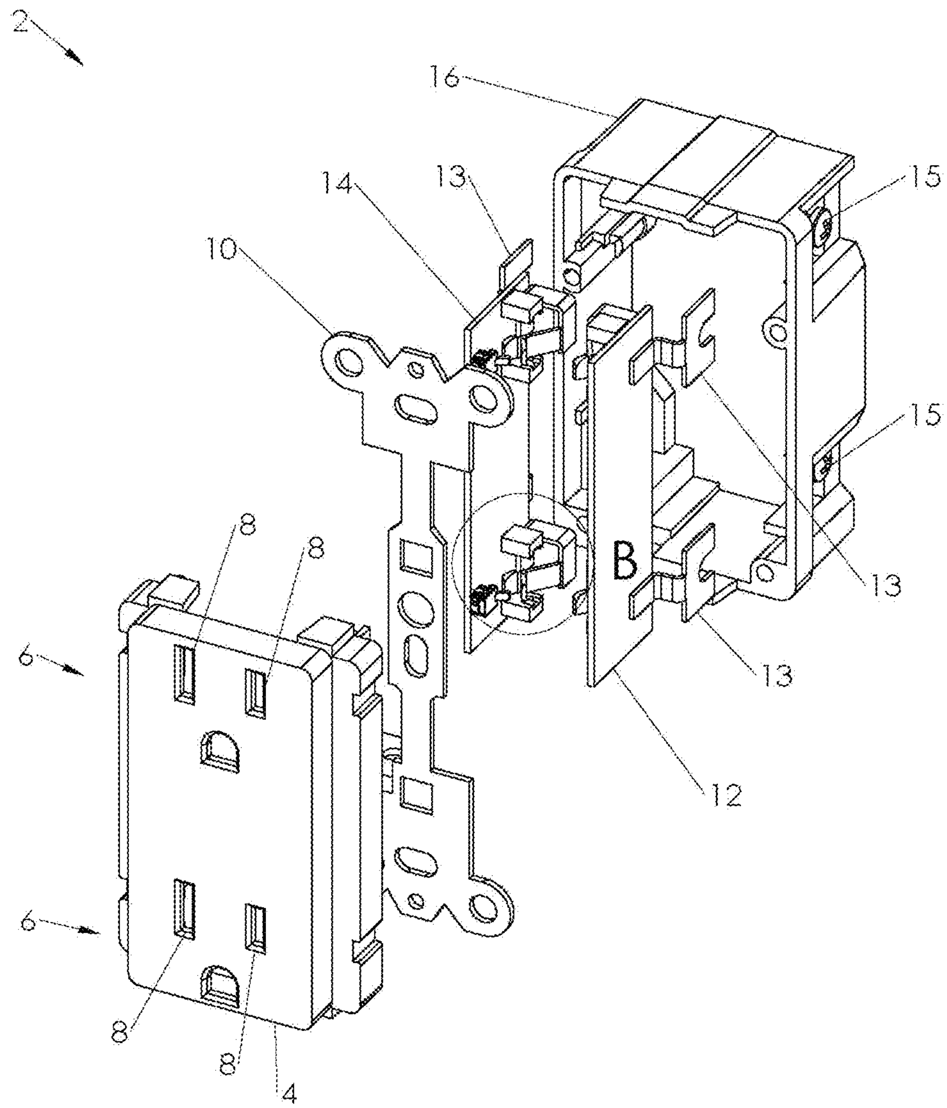
FIG. 1A is an isometric exploded view of a tamper resistant (TR) electrical receptacle in accordance with an example embodiment.
Figure 1B:
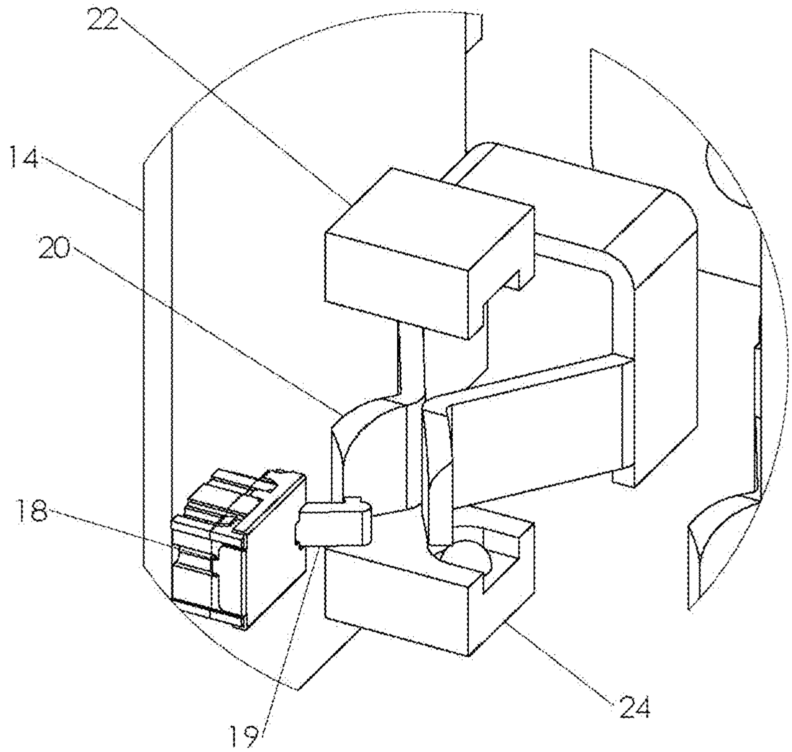
FIG. 1B is an enlarged view of portion B of FIG. 1A.
Figure 1C:
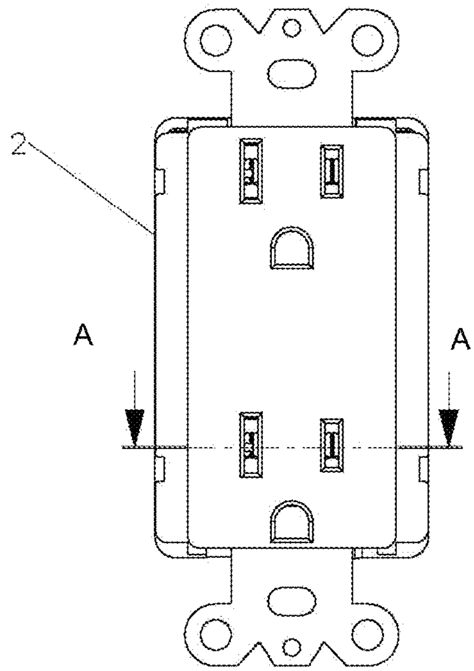
FIG. 1C is a front view of the TR receptacle of FIG. 1A.

FIG. 1C is a front view of receptacle 2 without plug insertion in outlets 6. Referring to the isometric view of FIG. 1A, receptacle 2 includes front housing 4 and rear housing 16. Sockets 8 in front housing 4 serve to receive plug blades for each of two outlets 6. Enclosed within housing 4 and 16 are ground plate 10, neutral circuit board 14, hot circuit board 12 and terminal plates 13. Terminal screws 15 provide fastening to power wires. FIG. 1B is an enlarged detail view of a portion of FIG. 1A. Lever 19 is positioned in the path of a contact 20 of each outlet 6. Detector switch 18, positioned on circuit board 14, can be activated to energize a low voltage circuit by tripping lever 19 when an object has been inserted into the left opening in the socket. An optical sensor, comprising emitter 22 and collector 24 is powered by the low voltage circuit when activated. Two optical sensors are for provided for each outlet 6. The optical sensors are coupled to control circuitry responsive to signals received therefrom. The circuitry permits connection between power terminals 13 and contacts 20 of outlet 6 if optical sensor signals are indicative of non-tamper conditions. Control circuitry for the circuit boards is shown in detail in the circuit diagrams of FIGS. 2, 4, 6A, 6B, 7A, 7B, 7C, and 8.

Figure 1D:
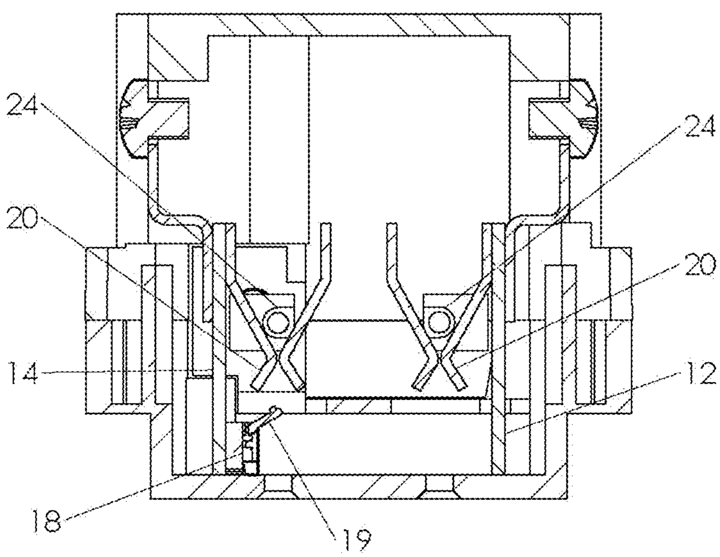
FIG. 1D is a cross-sectional view taken from line A-A of FIG. 1C.
Figure 1E:
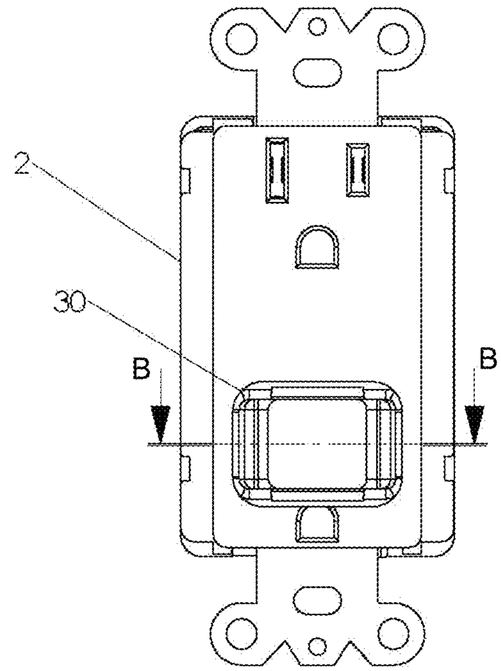
FIG. 1E is a front view of TR receptacle of FIG. 1A shown with a plug inserted.
Figure 1F:
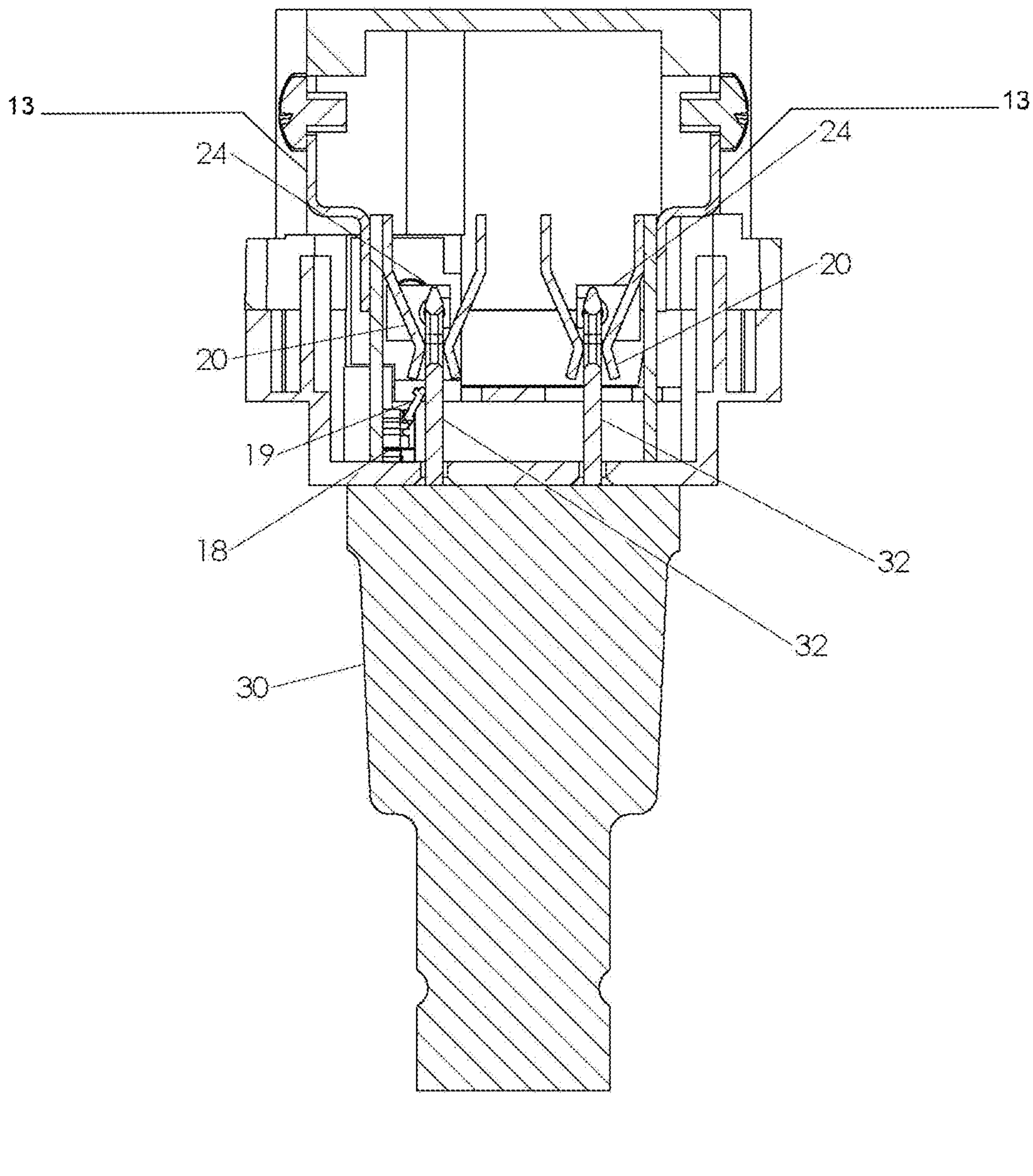
FIG. 1F is a cross-sectional view taken from line B-B of FIG. 1E.

FIG. 1D is a cross sectional view taken from line A-A of FIG. 1C. FIG. 1E is a front view of receptacle 2, shown with plug prong blades 32, inserted in an outlet 6. FIG. 1F is a cross sectional view taken from line B-B FIG. 1E. Referring to FIG. 1D, as no object has been inserted in the socket, lever 19 has not moved to activate detector switch 18. The low voltage circuit portion to which the optical sensor connected thus does not provide power to emitter 22. Collector 24 does not produce output signals. No connection is made between terminals 13 and contacts 20.

Referring to FIG. 1F, detector switch 18 lever arm 19 has been tripped by blade 32 inserted in socket 8. Contacts 20 are sprung open by the application of force on blades 32 of plug 30. Power is applied to the low voltage circuit by virtue of tripped detector switch 18. The low voltage power remains applied when lever 19 is in the tripped position, e.g., whenever an object has been inserted in socket 8. Emitters 22 above each socket are active to produce light. Each collector produces an output signal when exposed to light produced by the corresponding emitter. As shown, collectors 24 beneath blades 32 do not produce output signals because the prong blades located in the path between emitters and collectors have blocked the light transmission.

In operation, when a plug or foreign object is inserted in the left socket 8 of outlet 6, lever 19 is moved to the tripped position before the inserted object makes contact with the socket contacts 20. During this time, power is applied to the low voltage circuit and to emitters 22 of the respective outlet 6. As object insertion has not yet reached contacts 20, each collector 24 receives emitted light and produces an output signal to the control circuitry. The control circuitry will not permit connection between power terminals 13 and contacts 20 of outlet 6 if a light output signal is received from either collector. As insertion of the plug advances to socket contacts 20, as depicted in FIG. 1F, emitted light from both emitters is blocked and no signal is produced by collectors 24.

The control circuitry is capable of determining the time difference, if any, between termination of light signals received from both collectors 24. If the time difference is determined to be near simultaneous, for example within twenty five milliseconds, the control circuity will effect connection of contacts 20 to terminals 13. That is, simultaneous or near simultaneous sensing of insertion at both sockets is indicative of non-tampering. If a foreign object is attempted to be inserted into a socket, or if insertion of the plug cannot be completed to the contacts 20, collector output signals preclude connection of the contacts to the terminals

13. Connection of the sockets 6 of the receptacle are those controlled independently of each other.

Figure 2:
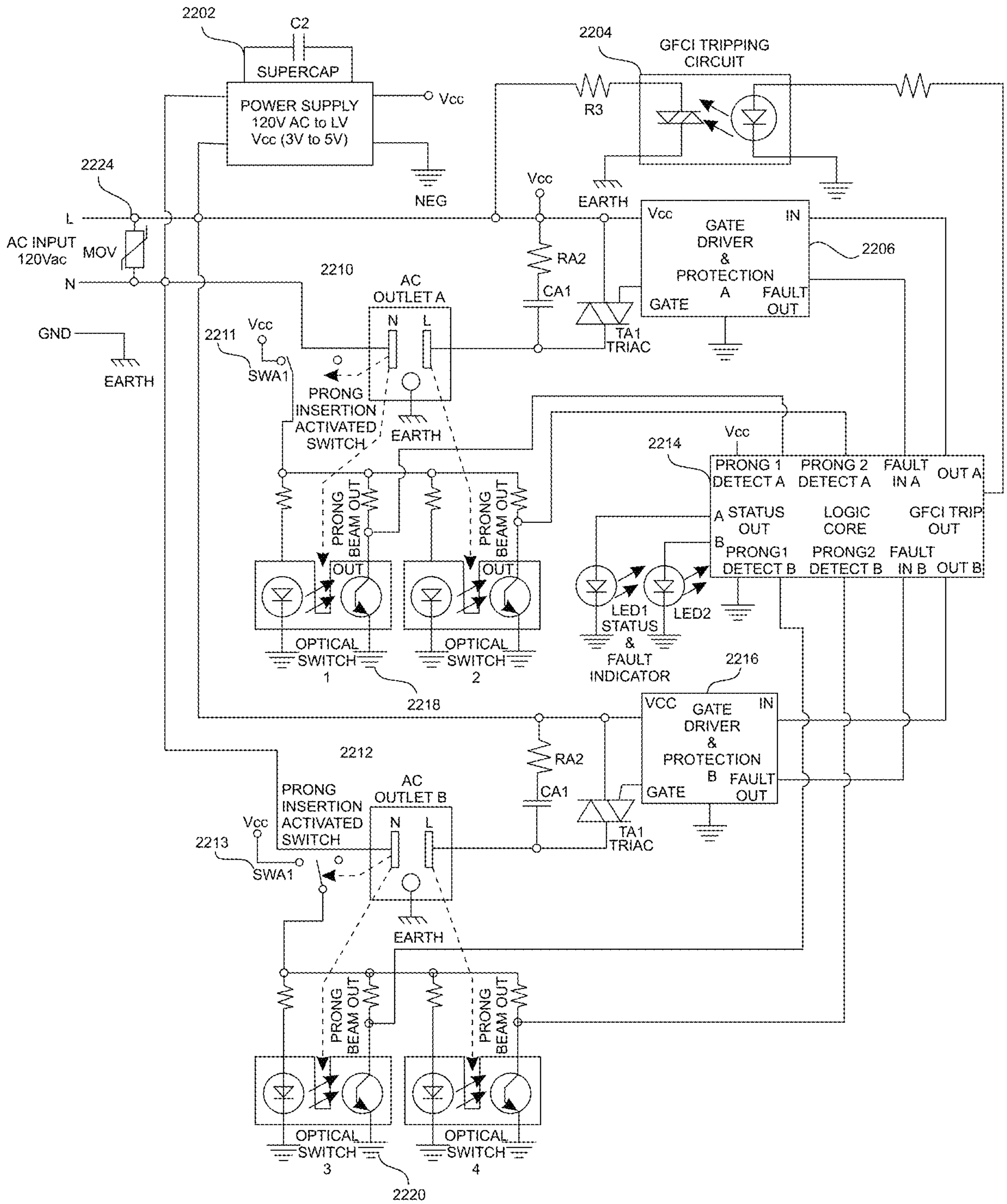
FIG. 2 is a circuit diagram for the example embodiment of FIG. 1A, utilizing GFI protection.

Referring to the circuit diagram of FIG. 2, an N contact of each outlet 2210 and 2212 of the receptacle is directly connected to the N (neutral) terminal of the alternating current source. The L contact of each outlet 2210 and 2212 is coupled to the L (hot) terminal of the alternating current source through a respective TRIAC (TA1, TB1). Metal oxide varistor (MOV) 2224 is connected across the L and N terminals to protect against overvoltage. Driver circuit 2206 is coupled to the control terminal of the TRIAC of outlet 2210. Driver circuit 2216 is coupled to the control terminal of the TRIAC of outlet 2212. Power supply 2202, connected across the L and N terminals, corresponds to power supply 18 of FIG. 1B. Optical sensor arrangement 2218 contains optical emitters and receivers that correspond to emitter 22 and 24 of FIG. 1B. Switch 2211, which corresponds to switch 19 of FIG. 1B, is connected between optical sensor arrangement 2218 and power supply 2202 when an object has been inserted into the socket of outlet 2210. Optical sensor arrangement 2220 contains optical emitters and receivers that correspond to emitter 22 and 24 of FIG. 1B. Switch 2213, which corresponds to switch 19 of FIG. 1B, is connected between optical sensor arrangement 2220 and power supply 2202 when an object has been inserted into the socket of outlet 2212.

Figure 3:
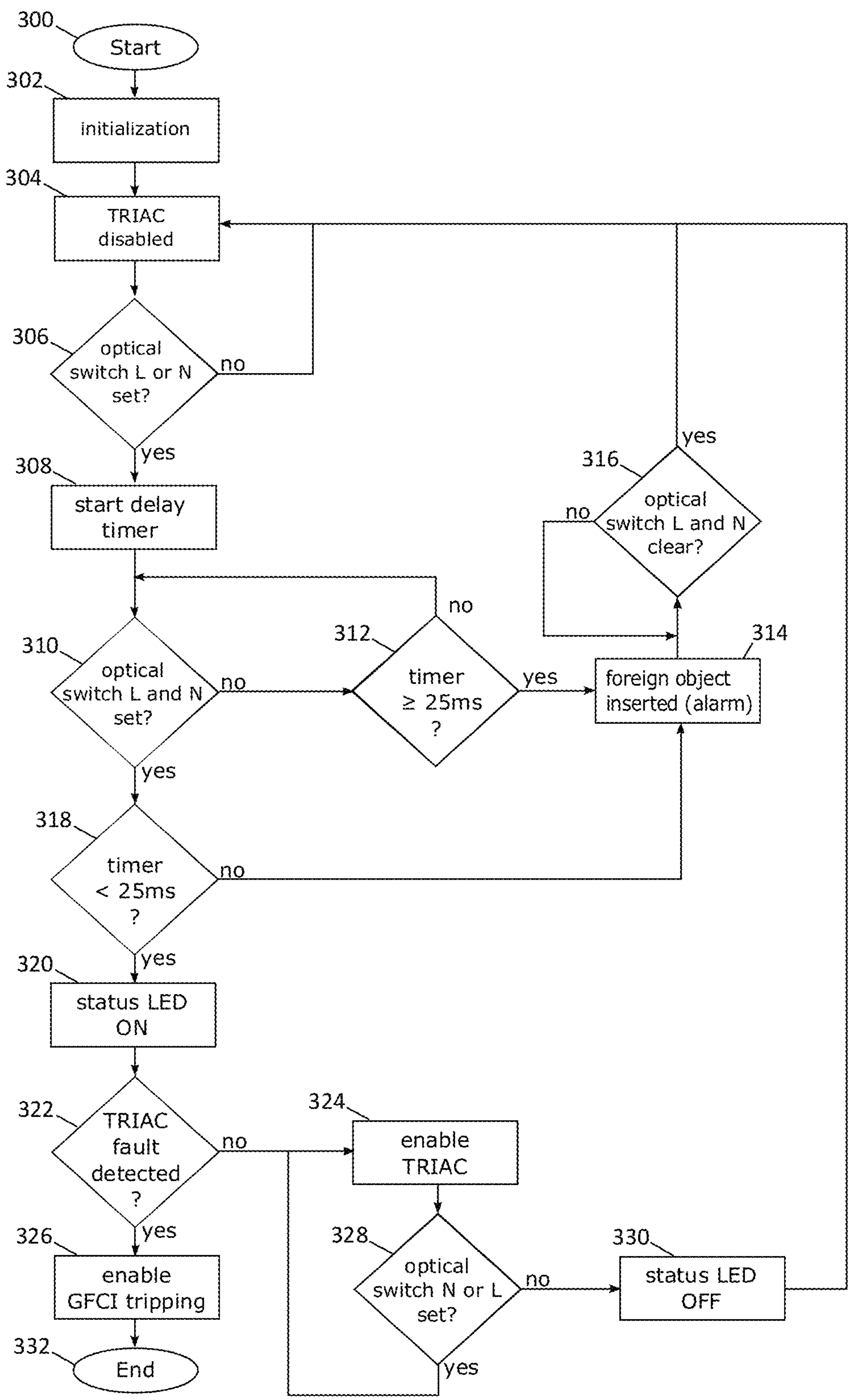
FIG. 3 is a flowchart for operation of the circuit of FIG. 2.

Logic core 2214 (aka a processor) comprises inputs connected to receive signals output from optical sensors 2218 and 2220. Outputs of logic core processor are connected respectively to driver circuits 2206 and 2216. Outputs of processor 2214 are connected to LED1 and LED2 for energization thereof to indicate that objects have not been inserted in the respective plug sockets within a specified time. Processor 2214 is further connected to ground fault injector 2204 to generate a trip output for a current imbalance. The disclosed logic circuitry may include an AND gate or the like to receive signals from the optical sensors FIG. 3 is a flow chart of operation for the circuit of FIG. 2. At step 300, operation is started. Initialization proceeds at step 302 with power supply 2202 connected to the alternating current terminals. At step 304, there has been no activation of the TRIAC of a respective outlet. Step 306 is a decision block as to whether switch 2211 or 2213 has been tripped to supply power to the corresponding optical switches and whether the L or N socket optical switch has been initially set by blockage of emitted light. If so, a delay timer is started at step 308. Decision block 310 determines whether both L and N socket optical switches are set by blockage of emitted light. If the outcome of step 310 is positive, decision block 318 determines whether the positive output of step 310 has occurred within 25 ms. If the outcome of step 318 is positive, an ON status LED is activated at step 320. If there has been no fault detected at step 322, the respective TRIAC is activated at step 324 and activation thereof is continued as long as both L and N optical switches are set by emitted light blockage, as determined in step 328. A negative outcome of step 328 results in turning off the status LED at step 330 and flow reverts to step 304, in which the TRIAC is disabled.

If the outcome at step 310 is negative, the timer continues until it is determined that 25 ms has expired at step 312. A positive outcome of step 312 is indicative that a foreign object has been inserted in a respective socket to initiate an alarm in step 314. Decision block step 316 determines whether optical switches for both L and N sockets have cleared. When the outcome of step 316 is positive, flow reverts to step 304. The 25 ms delay period for TRIAC activation is intended to allow for slight variations in plug blade length within manufacturing tolerances or slight misalignment of the blades in the sockets during insertion, while not being long enough to permit connection to the power source by insertion of distinct foreign objects.

Figure 4:
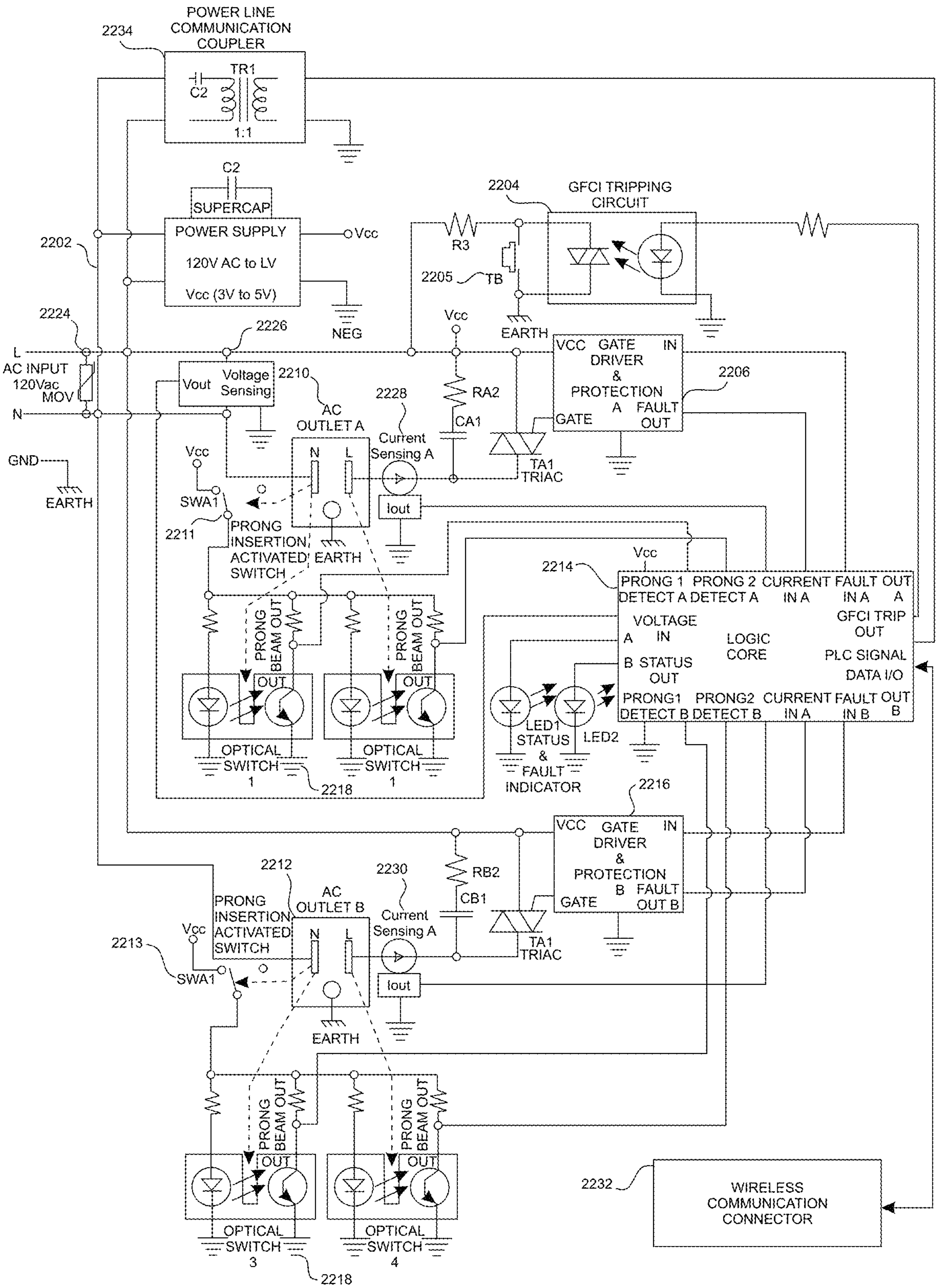
FIG. 4 is a more detailed circuit diagram of the example embodiment of FIG. 1A, including GFI tester and sensing, and communications module.

FIG. 4 is a more detailed circuit diagram, illustrating enhancements to FIG. 2, for operation of the embodiment of FIGS. 1A-1F. Current sensor 2228 is coupled to the hot line current path for the socket of outlet 2210. The output of current sensor 2228 is connected to an input of processor logic core 2214. Current sensor 2230 is coupled to the hot line current path for the socket outlet 2212. Wireless communication module 2232 is connected to a data input/output terminal of processor logic core 2214. Protocol for wireless communications may include Wifi, Zigbee or other protocols. Power line communications module 2234 is coupled between the alternating current source and a signal input of logic core 2214. The processor logic core 2214 is also therefore enabled for wired communication. Manual test button 2205 may be used for GFCI testing.

Figure 5A:
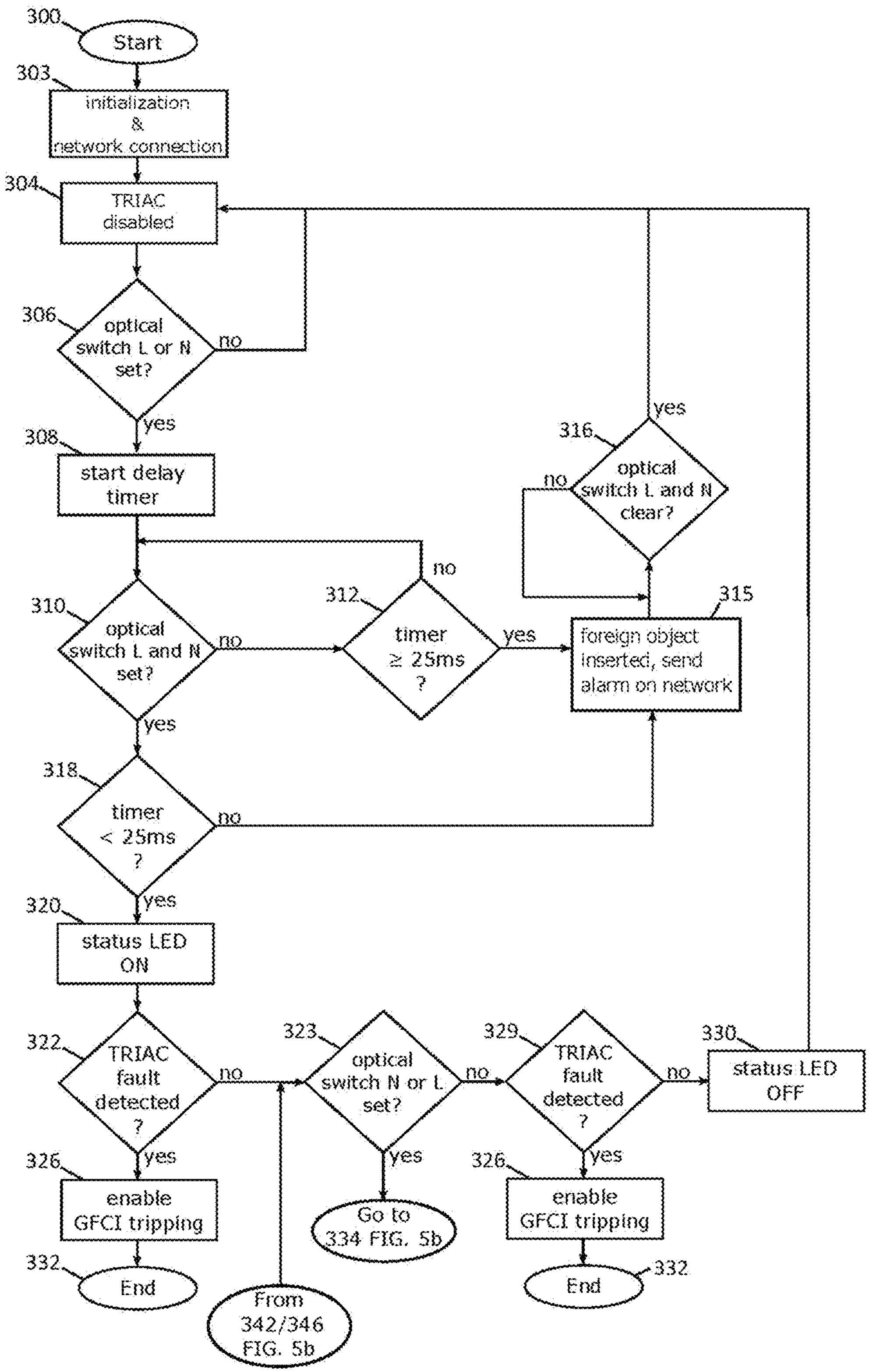
FIGS. 5A and 5B are flowcharts showing operations of the circuit of FIG. 4.
Figure 5B:
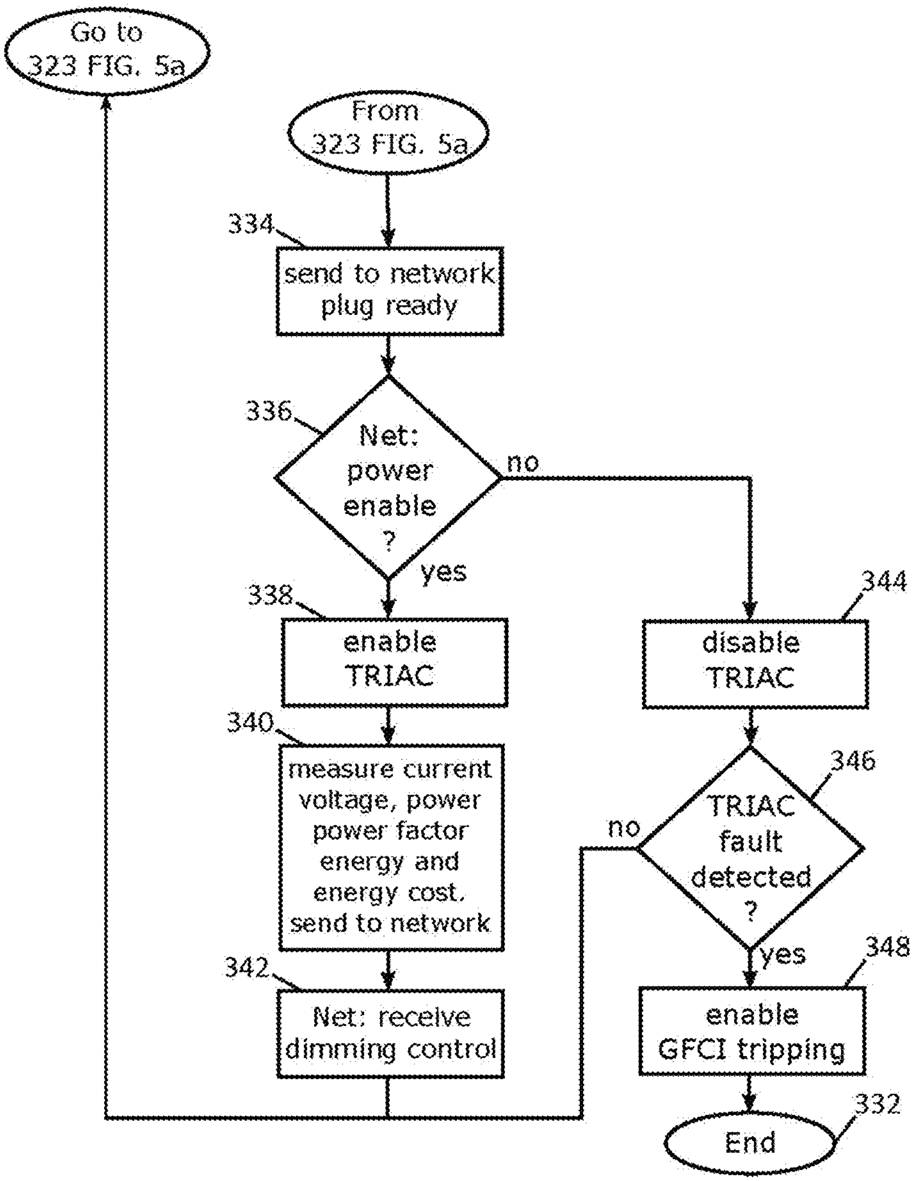

FIGS. 5A and 5B together form a flow chart for operation of the circuit of FIG. 4. Elements of FIGS. 5A and 5B that are in common with those of FIG. 3 contain the same reference numerals and the description thereof can be referred to the description of FIG. 3. FIG. 5A differs from FIG. 3 in the respect that the decision branch from decision block 322 has changed from step 324 and expanded to decision blocks 323 and 329. Steps are provided for related communications beginning at step 334. At step 334 communication is sent to the network that the plug has been successfully inserted. Decision block 336 establishes whether the network power should be enabled. If so, steps 338, 340 and 342 are processes related to power measurement and dimming. If not, steps 344, 346 and 348 deal with disabling the Triac and any resulting Triac faults (decision block 346). Upon a fault detection, GFI tripping is enabled in step 348. In an example embodiment, dimming is achieved by cycle stealing performed by the processor onto the Triac, for example. For example, this can be done by removing partial or whole cycles by controlling the Triac.

Figure 6A:
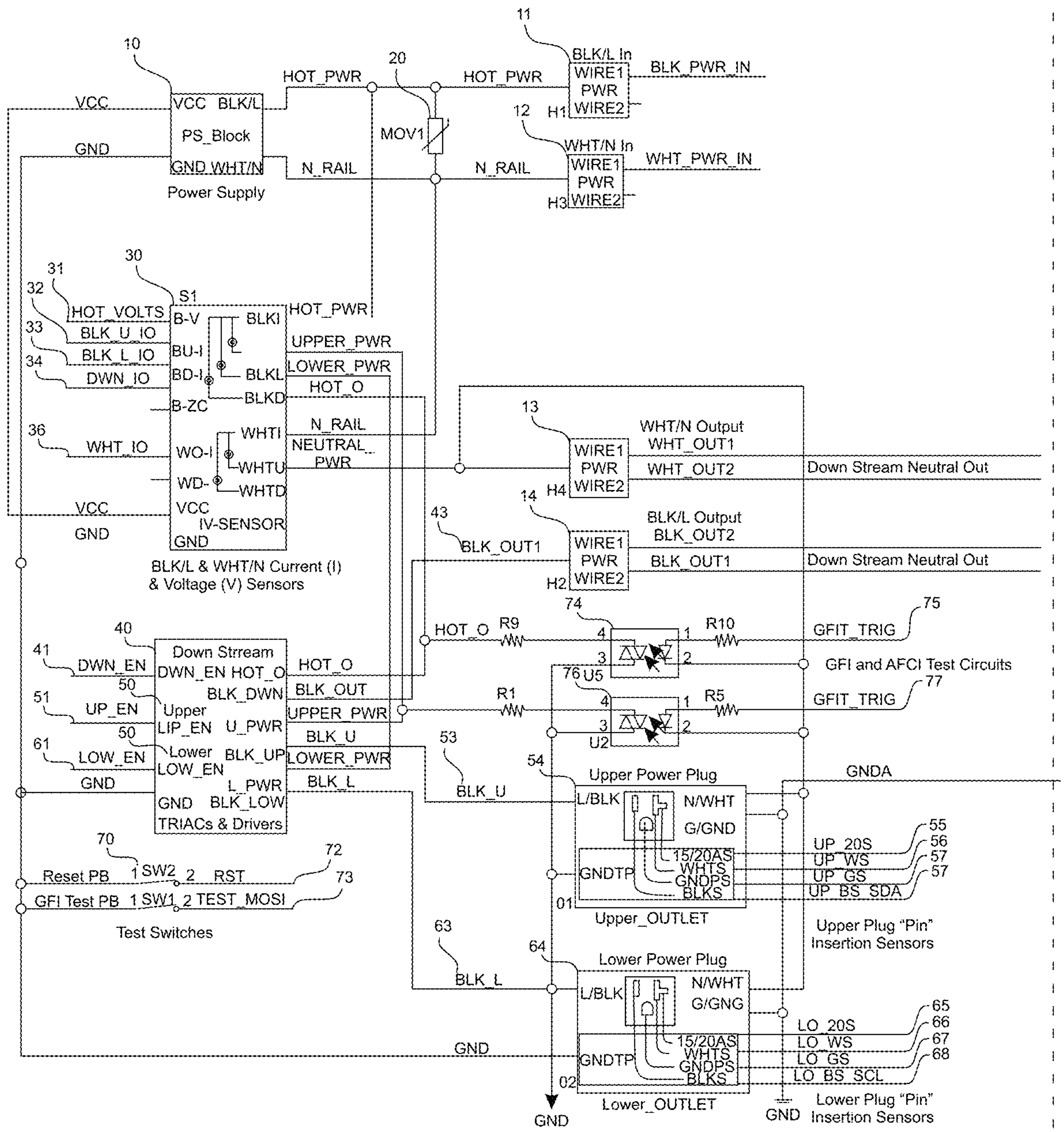
FIGS. 6A, 6B, 7A, 7B, 7C together comprise a circuit diagram for AFCI and GFCI and surge protection, taken with the circuit diagram of FIG. 4.
Figure 6B:
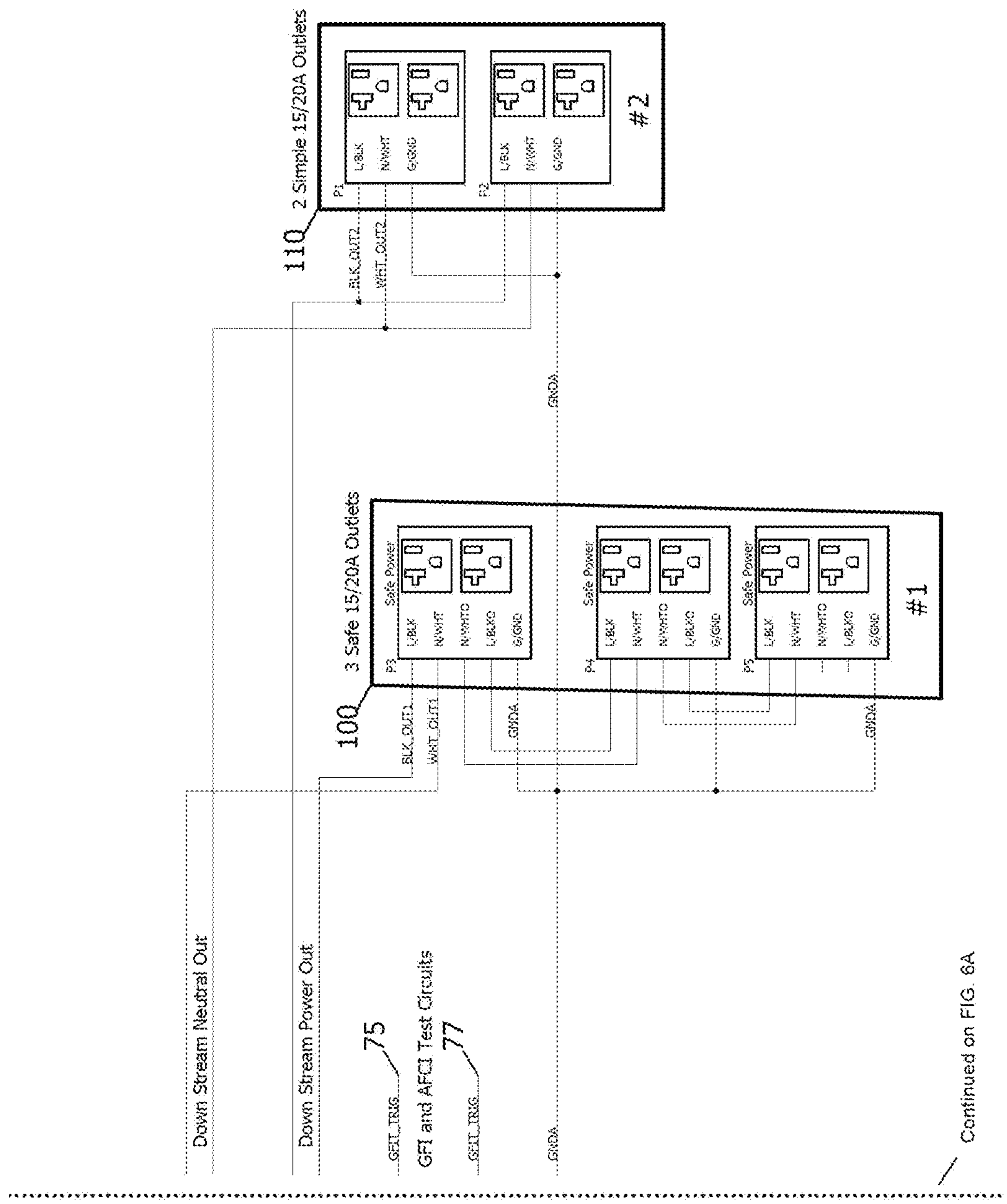
Figure 7A:
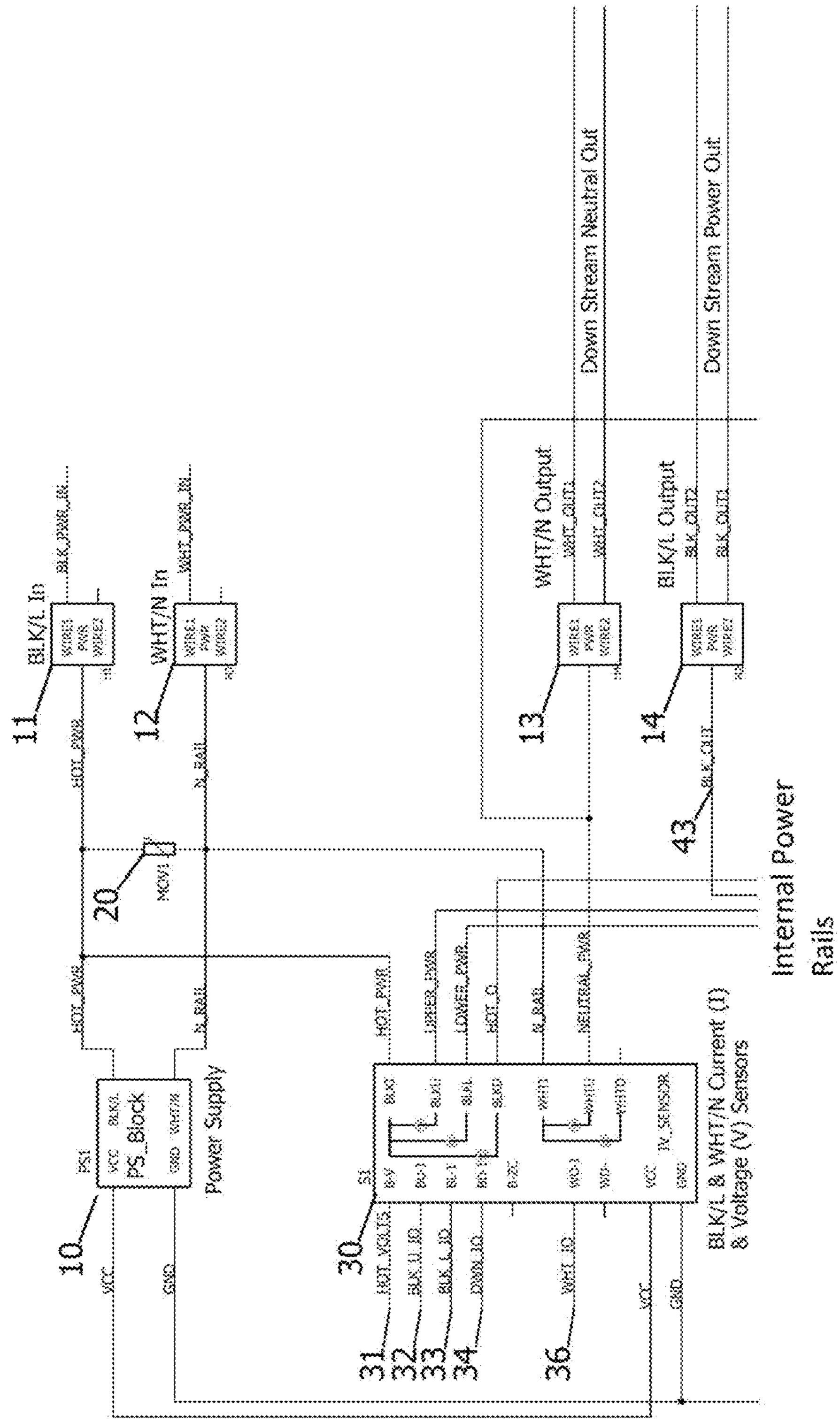

FIGS. 6A and 6B are a more detailed circuit representation of FIGS. 2 and 4, including a plurality of receptacles in a system for protection against AFCI, GFCI and surge faults. For ease of clarity, FIGS. 6A and 6B are divided into three sections, reproduced in FIGS. 7A, 7B and 7C. Referring to FIG. 7A, power input lines are connected to hot power terminal 11 and neutral power terminal 12. MOV 20 is connected across the hot power and neutral power lines to protect against overvoltage. Power supply block 10, fed from the hot and neutral power lines, provides low voltage power to the processor logic circuitry. The processor circuit may comprise a microcontroller 80, shown in detail in FIG. 8. Microcontroller 80 may contain a broadband noise filter routine such as fast Fourier transform.

Figure 7B:
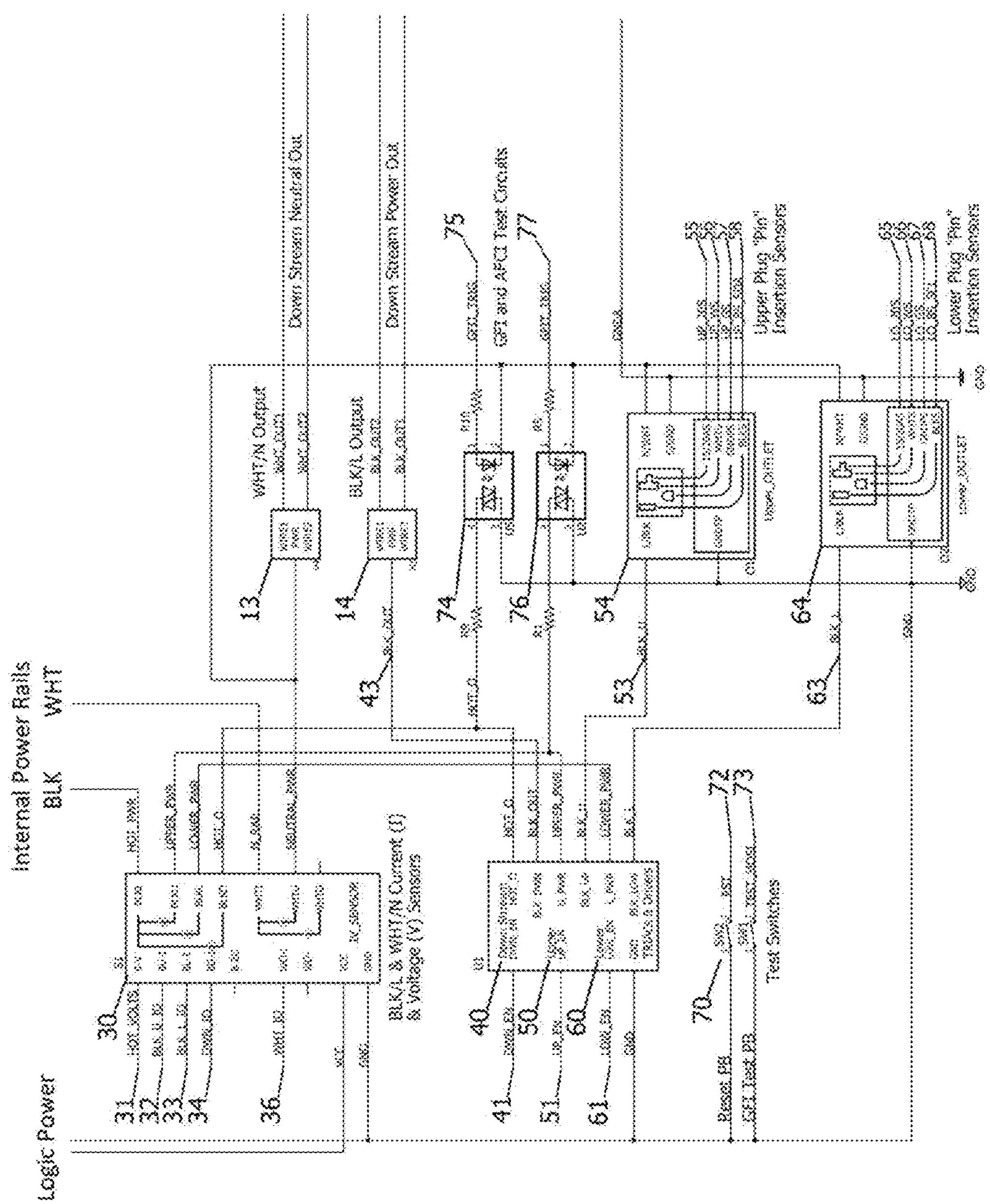

The output of power supply block 10 is coupled to current and voltage sensors block 30, and TRIAC drive blocks 40, 50 and 60 of the processor circuit. Block 30 may represent a plurality of sensors, which are not shown here for clarity of description. Blocks 50 and 60 are illustrated in FIG. 7B. Activation of TRIAC 43 by drive block 40 connects hot and neutral line power to terminals 13 and 14, which connect to three series outlets 100 and two parallel outlets 110 that are downstream, shown in FIG. 7C. Downstream may also include a load to be controlled and monitored, such as a light receptacle (not shown here). Activation of TRIAC 53 by drive block 50 connects the hot line to upper outlet 54, shown in FIG. 7B. Activation of TRIAC 63 by drive block 60 connects the hot line to lower outlet 64. GFI test push button switch SW1 and reset push button switch SW2 are connected between the output of supply block 10 and the processor circuit. GFI and AFCI test circuits 74 and 76 receive outputs 75 and 77, respectively as shown in FIG. 7B, from the microcontroller 80, shown in FIG. 8. All inputs and outputs shown in FIGS. 7A, 7B and 7C relate to the respective terminals of similar references in the processor of FIG. 8.

Figure 7C:
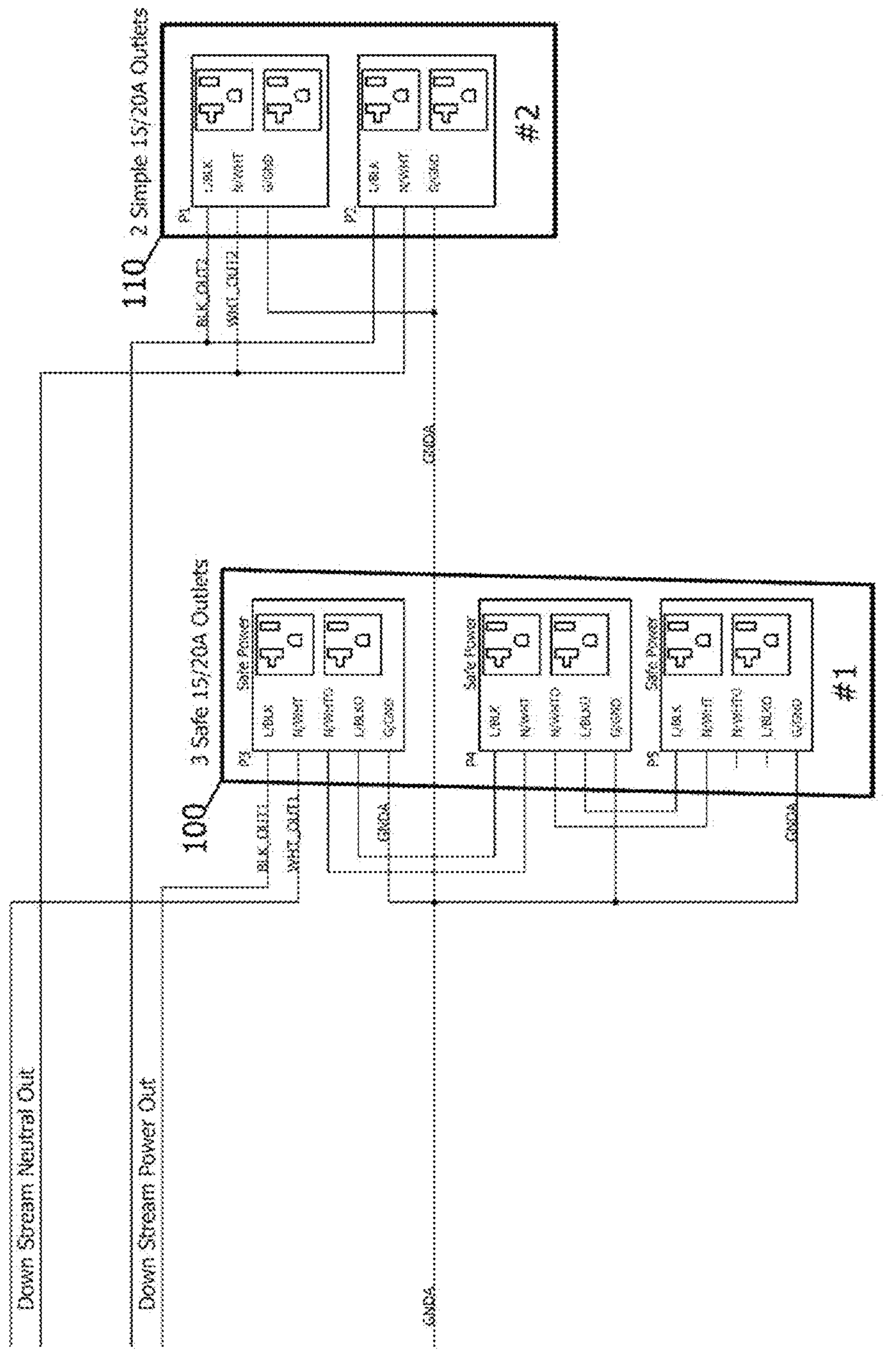

Accordingly, in another example embodiment, it would be apparent that the receptacle of FIGS. 7A, 7B and 7C can be used as an in-line connector which is serially connected to upstream power lines, providing control, safety, and monitoring of downstream loads and/or downstream receptacle outlets. Instead of the form of a plug outlet being the output of line power to a load, the receptacle comprises in-line connectors/contacts as the output. Accordingly, in an example embodiment, the receptacle itself may not require a plug outlet, but rather can be used for downstream loads and/or downstream receptacle outlets. For example, the receptacle can be hardwired (e.g., with screwed down wires) with the downstream loads and/or downstream receptacle outlets.

Each outlet 54, 64 of the receptacle has tamper resistance that restricts energizing of the sprung contacts until the blades of an electrical plug are completely inserted into the receptacle. Multiple sensor inputs 55, 56, 57, 58, 65, 66, 67, 68 for the plug blades of outlets 54 and 64 are shown in FIG. 7B. The sensors sense the arrival of the blades. If the arrivals are within a specified period of time, the applicable outlet 54, 64 is energized. The device will only turn ON power to the particular outlet, when it detects that the two power plug pin detection circuits have detected that the BLK & WHT plug pins have been inserted. The circuits provide a logic signal which operates as an interrupt to the microcontroller, so it will turn ON or OFF the TRIAC driver circuit (logic Output signal) 41, 51, 61. There is also a respective TRIAC fault signal which is provided for each power TRIAC. For example, the particular outlet 54, 64 is not provided with line power until a specified length, e.g. ⅞ inches (2.2 cm), of the bottom of the plug is inserted.

Upstream series arc faults can be detected by monitoring voltage 31. During a series arc fault the voltage on the conductor tends to be erratic and does not follow sine wave attributes. By monitoring current 30 on the hot and neutral conductors and comparing it to the ground conductor, the presence of an arc fault is detected and the severity of the arc fault is reduced by disabling the receptacle outlets 54, 64 and/or the downstream loads 14 to minimize current flow. Different arc fault types have different timing profiles. The logic processing can compare sensed data to reference data that can be stored in a table.

As noted above, FIG. 8 sets forth in detail the input and output pins of the microcontroller 80. Included in the receptacle with microcontroller 80 is communication module 90. Communication terminals 91 and 92 are connected to corresponding pins of microcontroller 80. The antenna provides communication with circuit receptacles to allow monitoring of the current draw of the circuit. Information from monitored voltage and current can be analyzed, accessed, reported and/or acted upon. Power to and from any outlet can be turned on and/or off by external commands to the communications module. A buffer interface, not shown, can be added to communications lines 91 and 92. Data from microcontroller 80 can be collected by an external software application to provide external controls such as dimming, turning power on/off, controlling power outputs, or for obtaining information on power outputs.

In an example embodiment, a dry contact switch can be implemented which shorts two pins on any one of the microcontroller 80, the Serial Port JP1, and/or the communication module 90, therefore providing a manually operated input command that can be processed by device, e.g. the microcontroller 80. The microcontroller 80 can be configured to implement a suitable task or series of tasks in response to activation of the dry contact switch. A dry contact switch does not require an active voltage source, but rather the applicable processor can be configured to detect a manually-triggered short between two of its pins.

Figure 9:
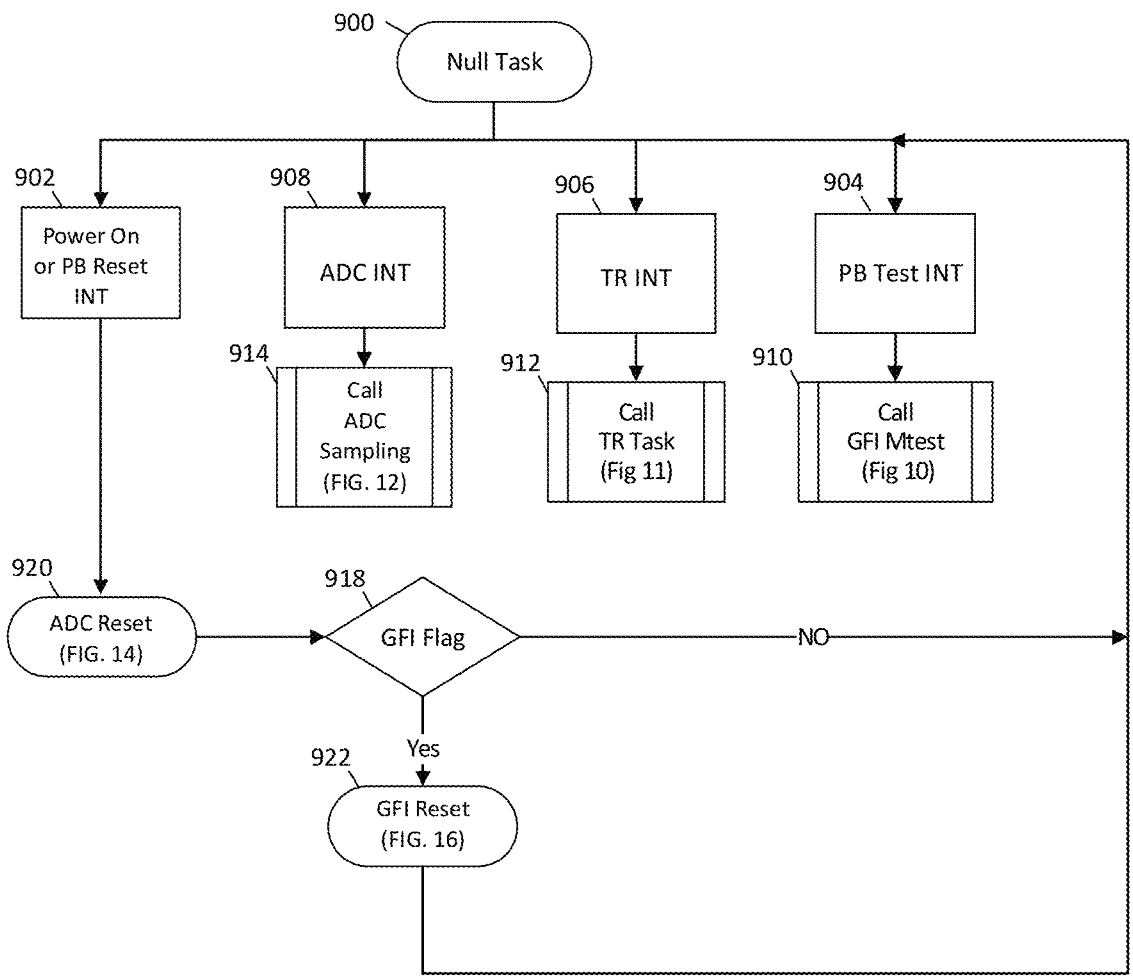
FIG. 9 is a flowchart showing operations of the processor of FIG. 8.

FIG. 9 is a flowchart of null task process 900 routines implemented by processor 80. Signals to processor 80 generate interrupts in accordance multi-interrupt structure 902, 904, 906, and 908. Any of received reset interrupt signal 902, push button test interrupt signal 904, tamper resistant related interrupt signal 906, and a-d converter (ADC) interrupt signal 908 triggers an interrupt for execution of the appropriate subsequent routine. In an example embodiment, the provision of high power to a plug outlet by the receptacle is "always powered off" as a default until initiated by the processor, for example in response to one of the interrupts or when it is determined that the plug outlet is safe to be activated.

Interrupt 902, caused by a push button activated fault or by a requirement for a reset, such as need for a power up/startup, triggers step 920 to activate the ADC Initialization process. Subsequently, if step 918 determines that the GFI flag is set, then step 922 initiates GFI process steps depicted in FIG. 16, to reset and/or initialize GFI hardware. Tamper related interrupt 906, triggers step 912. Testing of Tamper Resistance is determined by sensing pins and responding to ADC interrupts. The process for 912 is depicted in FIG. 11. Analog to Digital Conversion (ADC) interrupt 908, indicating that the ADC completed a conversion of one of the analog voltages, triggers ADC sampling process 914, depicted in FIG. 12. PB Test Interrupt 904 initiates the GFI Manual test step routine 910 depicted in FIG. 10.

In an example embodiment, downstream loads or downstream further electrical receptacle(s) are serially connected to the receptacle, with the receptacle serially between the power lines and such downstream loads or downstream further electrical receptacle(s). In such example embodiments, it can be appreciated that the tamper related interrupt 906 may not be required to be implemented, while any and/or all of the remaining interrupts 902, 904, 908 can still be implemented, as applicable.

Figure 10:
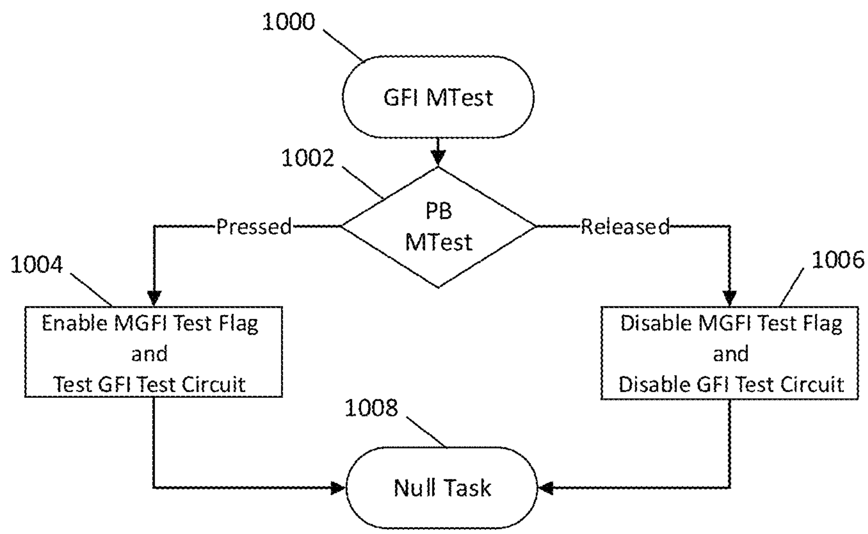
FIG. 10 is a flowchart showing a GFI manual test operation of the processor of FIG. 8.
Figure 11:
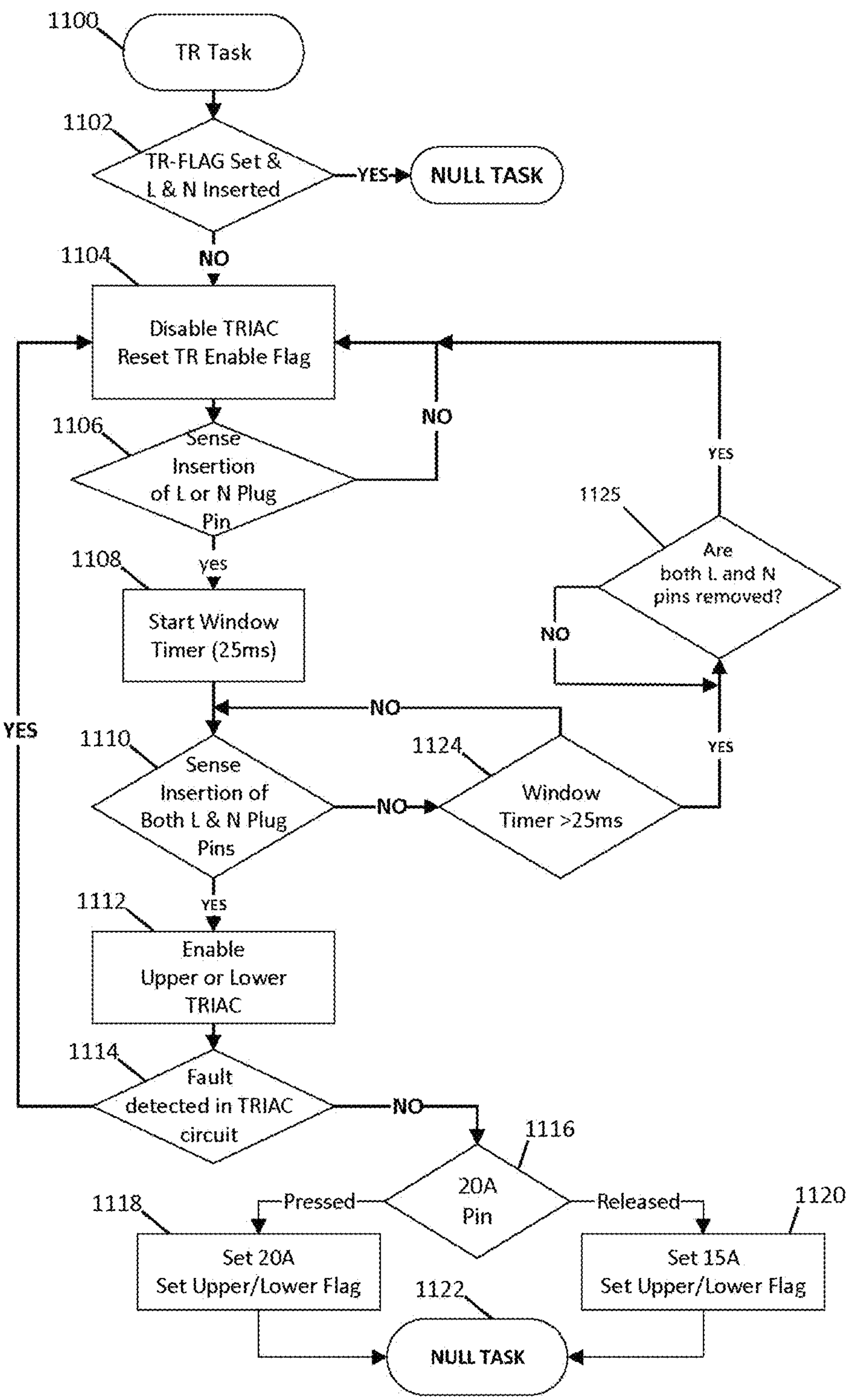
FIG. 11 is a processing task flowchart for tamper resistance blade detection circuitry for FIGS. 6-8.

The flow chart of FIG. 10 relates to a manual GFI test 1000. Test Circuit is represented as block 76 in FIG. 7B. Step 1002 determines whether the test push button (PB) is pressed or released. Step 1004 sets the manual test flag ("enabled") and tests the GFI test circuit if PB has been pressed. Step 1006 disables the manual test flag and the GFI test circuit, respectively, if PB is released. This process illustrated can also be applicable to a manual push button test for GFI other faults including but not limited to AFCI. The enabling of the MGFI test flag is to trigger a priority interrupt during the next logical processing step.

FIG. 11 is a flowchart that is common for both the upper and lower outlets for detecting the insertion and removal of plug pins. Block 1100 starts the tamper resistant function. Step 1102 verifies that TR processing is being done as indicated by the TR flag having been set. If the line (L) and neutral (N) pins are already inserted, the process returns to the Null Task polling routine 900 in FIG. 9. If the L and N pins have not been inserted, then the process continues to step 1104. As the triac should be off unless both L and N pins are detected to have been inserted each within a predetermined window timer (25 ms in this example), the triac is disabled. At step 1106, determination is made of whether an L or N plug prong is inserted. If so, the window timer at step starts at step 1108. If decision block 1110 determines whether both L and N plug prongs have been inserted in an upper or lower outlet in a receptacle within the acceptable 25 ms time frame, then step 1112 enables the Upper or Lower Triac for the "upper outlet" or for the "lower outlet" respectively. If not, step 1124 has determined that insertion of both prongs has not occurred within the 25 ms timeframe, and then at step. 1125 it is determined whether both L and N plug prongs have been removed, If so, flow may then revert to step 1104 to disable the triac.

The decision block at step 1114 determines whether a fault is detected in the triac circuit. If not, decision block at step 1116 determines whether a 20 amp or 15 amp pin has been inserted in the outlet. Depending on whether or not a 20 A Pin has been pressed or released, step 1118 will set 20 A or step 1120 will set 15 A as the maximum current.

If step 1124 determines that both pins aren't inserted within the required 25 ms timer parameter, then the process continues to step 1104 to disable the Triac. If a fault has been determined in step 1114, the process returns to step 1104 where the Triac is disabled.

Figure 12:
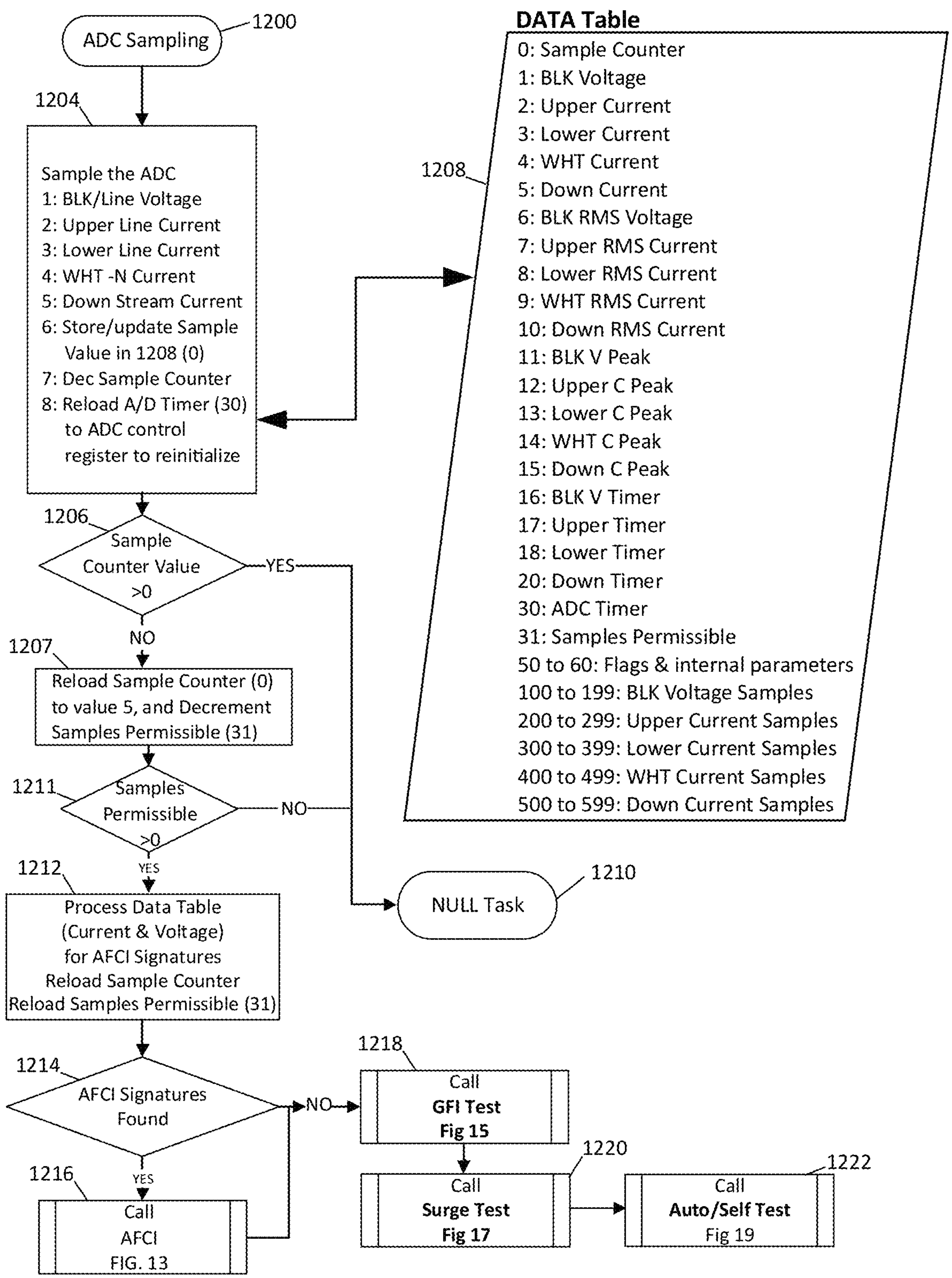
FIG. 12 is a sampling flowchart for the ADC circuitry for FIGS. 6A, 6B, 7A, 7B, 7C and 8.

FIG. 12 is the flowchart of the AFCI sampling process 1200 which takes place as a result of receiving an Analog to Digital Converter Interrupt 908 in FIG. 9 indicating the presence of a new analog value, which interrupt calls this sampling routine 1200 from block 914. It can be appreciated that the ADC sampling process 1200 can be performed continuously in example embodiments. Some conventional systems may only monitor power (watts), they may not look for high frequency data or attributes.

Once values of voltage and current (1-5 in block 1204) have been sampled, stored in the Data Table 1208 and a sufficient preset number (Samples Permissible Counter 31 in Data Table) of samples have been accumulated (steps 1204, 1206, 1207 and 1211), then values in the Data Table are processed according to the actions in block 1212 to be used for other purposes such as fault testing.

For each new analog value, the tasks in block 1204 are executed: establishing which line (1-5) was sampled; e.g. the Black/Line Voltage (1), the current of the upper outlet (2), the current of the lower outlet (3), the White/Neutral Current (4) and the downstream current (5). Upon receipt of one value for any of 1-5, the sample counter value (preset in this embodiment to the value 5) is stored (block 1204, step 6) in Data Table block 1208(0) which value gets updated. This sample counter is then decremented (step 7) in order to read the next value (1-5) retrieved from MUX which is set to next logical input. Step 8 in block 1204 then reloads the value of the ADC ("A/D") Timer found in Data Table block 1208(30) to the ADC control register to reinitialize. The MUX is an analog multiplexor which selects for the ADC one of the 8 permissible analog inputs (in this embodiment, only 5 are used for analog signals).

One ADC generates one value based on the MUX selecting the next of one of the 5 analog inputs signal values to be processed, reloading the timing register in the processor which is for the Analog Digital conversion. A/D sample Timer (30) in the Date Table 1208 is the number of processor clock cycles to wait (e.g. 16) before the processor's ADC generates the next analog value to be stored. As it is ADC hardware dependent, the 16 clock cycles may be a different value for another processor.

Decision block 1206 tests to see if the sampling processes in block 1204 have been repeated five times to acquire the five analog measurements (1-5 in block 1204), based on the Sample Counter being decremented (7, block 1204) from five to zero.

Data Table 1208 builds values in locations 1-5 from the sample values 1-5 obtained in block 1204 and is stored in the Data Table based on the sample counter (0).

During the process 1204, the Sample Counter which is decremented ranges from 1 to 5, and is used as a pointer in the Data Table 1208, being an index indicating which of the 100 to 500 arrays to use.

Decision block 1206 determines that if the Sample Counter has not decremented down to zero, then the process returns to null task FIG. 9 waiting for next ADC interrupt signal.

Once the counter has decremented to 0, sampling will repeat until sufficient samples have been collected based on the value in Samples Permissible 31, Data Table 1208.

For example, in this embodiment, as 99 sample values are being accumulated for each of the 1-5 power signals, then 99 sample values of the Black Voltage these can be stored in the Data Table as 101 to 199; 99 sample current values for the upper outlet in 201-299; 99 sample values for the lower outlet, in 301 to 399; 99 sample values for the White Current, in 401-499; and 99 sample values for Downstream Current, in 501-599.

The steps in block 1207 and the decision block 1211 cause the sampling of the 5 signal values to take place for 99 times to be used to determine AFCI signature, and to calculate averages (RMS) for example. Decision block 1211 using the changing value in 31 of Data Table 1208, determines if the value in the Samples Permissible Counter (31) has been decremented from 99 to 0.

In an embodiment, in FIG. 12 ADC values are read from the ADC register and stored in data sets and then the data is processed. In this embodiment 99 values have been used for each of the five power types, as being sufficient to represent the sine wave signature. The sample values (100-599) are used after processing to detect spikes, etc. occurring in the values in the Table.

At block 1212, there now are a full set of values within each of the 5 arrays 100, 200, 300, 400 and 500.

From the samples collected in each of 100, 200, 300, 400 and 500 series, peaks can be calculated (11, 12, 13, 14, and 15), as well as averages (6, 7, 8, 9 and 10).

Subsequent to processing steps in block 1212, four types of tests are performed; namely, AFCI (1214, 1216), GFI (1218), Surge (1220) and Auto/Self (1222). However, in another embodiment, the data sampled may also be processed for Peak Values (11-15 in the Data Table 1208), power spikes may be tested for; similarly RMS (average) values may be used to monitor, test and disable power for brownout and/or other conditions.

Following the processing of the Data Table 1208 and establishment of an AFCI signature in 1212, the signature block 1214 tests for the presence of an AFCI Signature. If AFCI signature is found it continues to step 1216 to process AFCI tasks on FIG. 13.

FFT (Fast Fourier Transform) is a possible method of extracting frequencies out of a Data Table. The FFT is looking at the values in 100-599.

The detection of spikes indicates that there is arcing; e.g. high frequency pulses. FFT finds the frequency that is indicative of the arcing, then values are checked for duration and amplitude. If decision table 1214 does not find an AFCI signature, the process continues to block 1218 to determine if GFI fault conditions exist. Subsequently the process continues testing for Surge 1220 and then Auto/Self Test 1222.

Other tests may be incorporated, for example, for over-voltage and brownouts. Similar to GFI and Surge, all the raw data required exists in the Data Table 1208.

Since ADC sampling is performed by the processor of the receptacle, in an example embodiment, when a plug is inserted into the plug outlet, the processor can further be controlled to output the activation signal at or near the zero volt level of the alternating current waveform.

In another example embodiment, the receptacle can protect against arc faults by applying the zero crossing switching technology, because the insert does not activate the full line power until all of the safety checks are completed.

Activating power only if no fault condition has been detected, results in the receptacle offering power control while remaining safe. Once it is determined that it is safe to turn on the power, the processor does so by activating the applicable TRIAC for the applicable power line.

Figure 13:
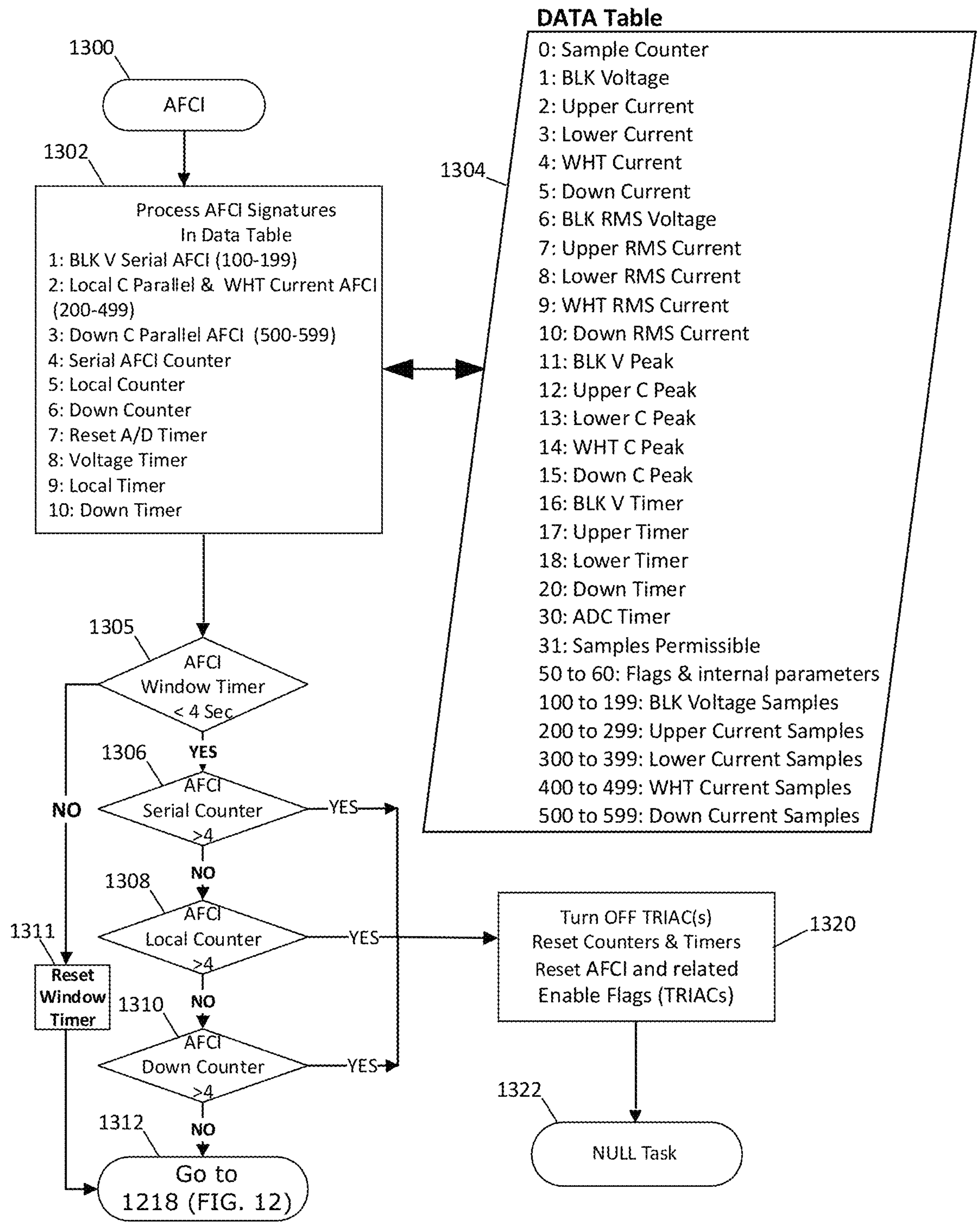
FIG. 13 is an AFCI flowchart for the circuits of FIGS. 6A, 6B, 7A, 7B, 7C and 8.

Referring to the flowchart of FIG. 13, block 1300 starts processes for AFCI signatures and establishes whether and where there may be an AFCI fault requiring power to be shut off. Various types of processing activities for various types of AFCI interrupts which can take place due to voltage faults on the Black line in series, and/or current faults due to faults on the local outlet or downstream. These are listed in block 1302.

In Block 1302, Black Voltage signals are processed as these can signal Serial AFCI ("BLK V Serial AFCI") conditions. Current on the white ("WHT") for the local and for the downstream is processed for parallel AFCI fault signals. Block 1302 also references Serial, Local and Downstream ("Down") preset counters for the Black Voltage Serial (4), Local (outlet) Current Parallel (5) and Downstream Current (6) AFCI conditions. In addition to event counters, there are timers for each of the three conditions (8, 9, 10). In this embodiment, both conditions of minimum number of events and maximum timing must be met to turn off the Triac(s) at block 1320. The counters are used to minimize false triggers (e.g. an acceptable motor startup) of a non-AFCI condition provided the flag occurred a certain number of times and within a short time window such as 4 seconds for the series, local and downstream timers (decision block 1305) indicating a valid AFCI condition requiring turning off of the power.

The Data Table 1304 in FIG. 13 is the same as table 1208 shown in FIG. 12, as the values are re-used for different conditions. If an AFCI fault has been detected at steps 1306, 1308, 1310 then the processes in Block 1320 cause the Triac(s) to be turned off, cutting power at the local outlet and downstream. Counters, timers, AFCI and related flags (eg Triacs) are reset. Process continues to Null Task.

In an alternative example embodiment, it is possible to shut off power only to the local outlet or receptacle that is to be shut off, and not to devices further downstream.

In addition to real time monitoring and recording of current, voltage and data, the flowchart of FIG. 13 can be used for: disabling power based on detection of electrical safety events; and real time control of the delivery of power (of both current and voltage) and that control being integral to the circuitry as well as user specified, remote, computer data base, event control.

Figure 14:
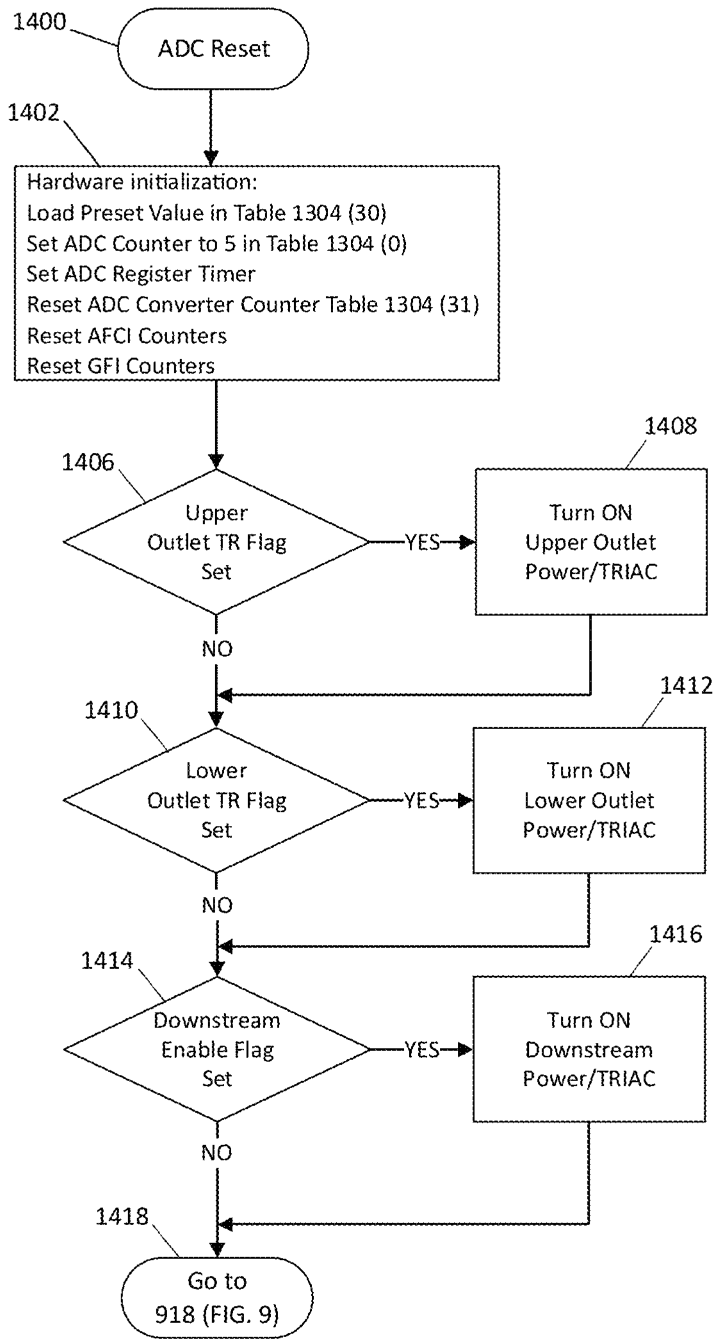
FIG. 14 illustrates a flowchart showing an ADC reset process for the circuits of FIGS. 6A, 6B, 7A, 7B, 7C and 8.

FIG. 14 is a flowchart of the ADC reset process. Interrupt 902 (FIG. 9) signals a manual power reset or power startup condition requiring an ADC reset action for hardware and power initialization tasks to be executed. Block 1402 initializes and resets certain counters and values:

Preset value (e.g. 16), representing the clock cycle, is loaded in 30, Table 1304 Value of 16 is specific to particular ADC hardware; ADC Converter counter is set to the value 5 in Table 1304(0); ADC Register Timer is set by storing the value in Table 1304(30) in the ADC Register Timer; ADC Converter Samples Permissible Counter in Table 1304(31) is reset to 99; AFCI Counters and GFI Counters are reset.

Although other processes may turn on the power Triac(s) independently of a TR testing requirement, in process 1400, Triacs are not turned on at steps 1408, 1412 and 1416 unless the TR function requirement has been met by decision box steps 1406, 1410 and 1414. Steps 1406, 1410 and 1414 turn on the appropriate power Triac(s), depending on whether the Upper Outlet, Lower Outlet and/or Downstream flags have been set.

If 1406 indicates that there is nothing wrong in the upper outlet, the Upper Outlet is turned on at step 1408. If step 1410 indicates determines that the Lower Outlet flag is set, indicating that there is nothing wrong with the Lower Outlet, then the Lower Outlet Power/Triac is turned on at step 1412. If step 1414 verifies that the Downstream power feature is active, e.g. the enable flag has been set, the Downstream is made available for processing by turning ON the Downstream Power/Triac at step 1416. Turn on (or off) of the Power/Triac for downstream is made for the entire receptacle, although this action can be restricted to one or both of the outlets in the receptacle only. In another example embodiment, plug outlets are not provided by the electrical receptacle and therefore steps 1406, 1408, 1410, 1412 are not required, and the flowchart can proceed directly to step 1414, and step 1416 to control downstream series loads if required.

Figure 15:
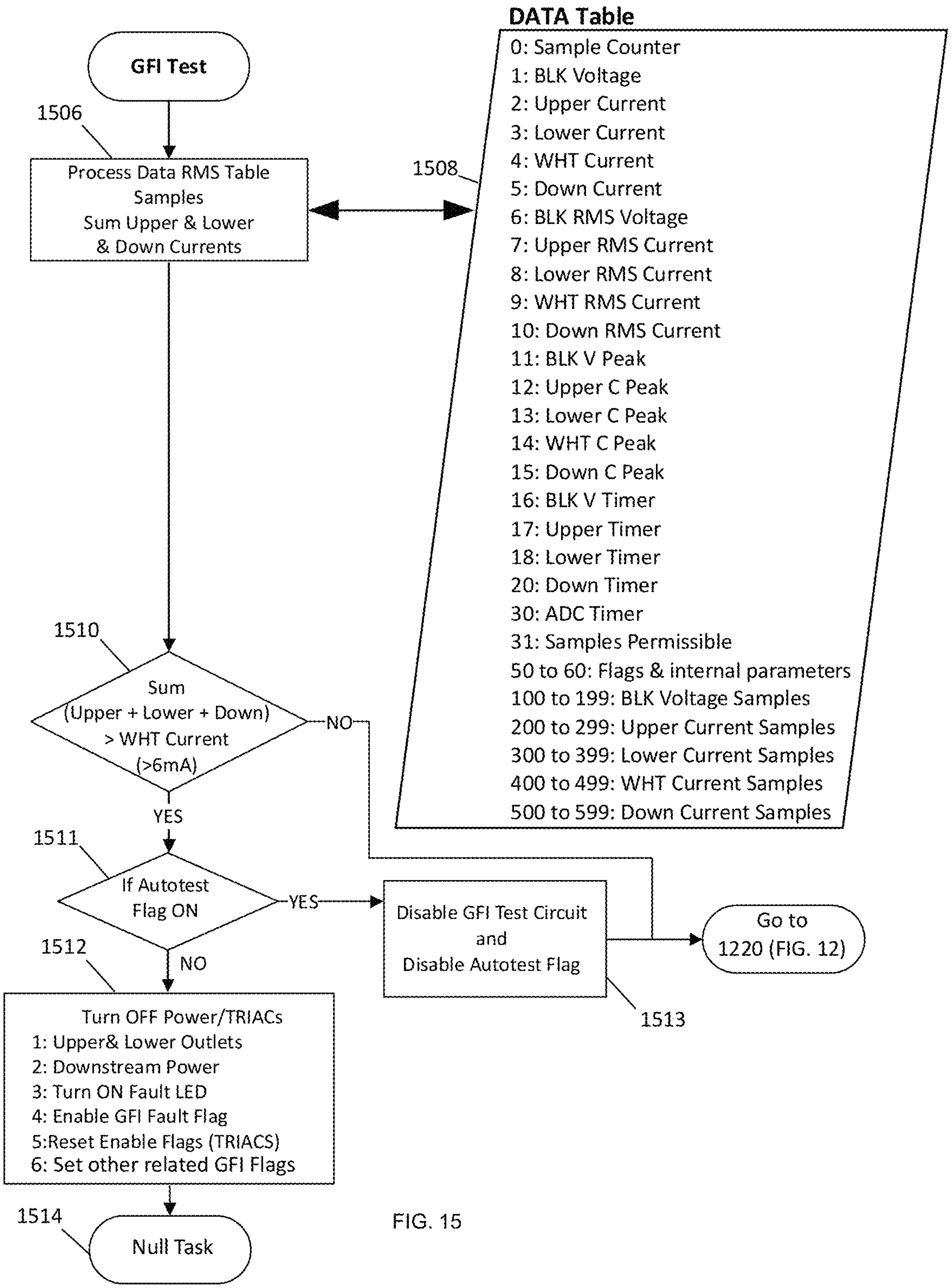
FIG. 15 is a GFI Test flowchart for the circuits of FIGS. 6A, 6B, 7A, 7B, 7C and 8.

FIG. 15 is GFI test flowchart, in contrast to AFCI which works on signatures (block 1214, FIG. 12). GFCI processing works on sample values, RMS values and durations, applying data table 1508, elements 5-20. For example, the RMS (average) values are used for the Black ("BLK") 7, 8 and 10 which is for power in and out; the White ("WHY") 9 represents all return currents. As noted previously, the various data tables 1208, 1304, 1508 and the table of FIG. 18 represent the same processor memory storage. For example, creation of the data table 1508 has occurred during the processes in FIG. 12.

The decision block of step 1510 determines that if the sum of the current of Upper and Lower outlets and the downstream current is greater than 6 ma, then there is a GFI fault and the three power/Triacs are to be turned off for both the upper and lower outlets as well as for the downstream power. The signal Led Fault is turned ON and GFI Fault Flag is set. More specifically, step 1506 processes values in the Data Table 1508 and sums the RMS (average) values for the upper (7), lower (8) and down current (10). Decision block 1510 then determines if this sum is greater than the White Current (4) on a sample by sample basis than a predetermined current (in this embodiment 6 mA has been used), and if not, then there is no GFI fault.

Step 1510 compares the sum of individual values Upper, Lower and Down in 200-299, 300-399, 500-599 respectively, against the value of the matching white values in 400. If this sum of the upper, lower and downstream as compared to the White Current than 6 mA, then a fault is determined and 1512 turns off the power triac(s), whether for the upper or lower outlet and the downstream. The Fault LED is turned ON and the GFI Fault Flag is enabled. In an example embodiment, following a predetermined period of time (e.g. 15 minutes), the system may auto reset, and test if the GFI fault still is present. If not, the system may automatically restart.

Figure 16:
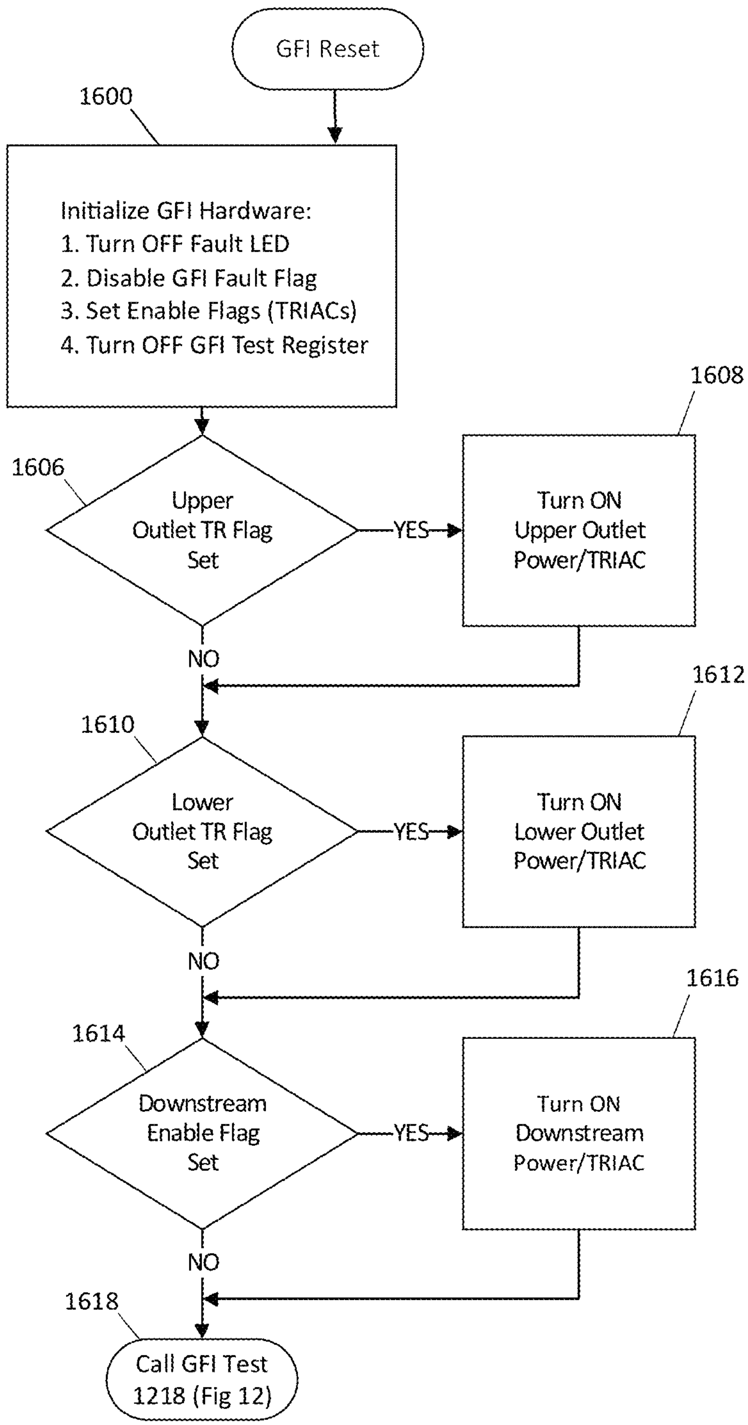
FIG. 16 is an GFI reset process flowchart for the circuits of FIGS. 6A, 6B, 7A, 7B, 7C and 8.

FIG. 16 is a GFI reset process flowchart. This GFI Reset routine block 1600 initializes GFI Hardware by turning OFF Fault LED, disabling the GFI Fault Flag, setting Enable Flags (TRIACS), and turning off the GFI Test Register. Decision blocks of steps 1606, 1610 and 1614 establish if certain Power/TRIACs are to be turned on, depending on whether upper outlet TR flags, lower outlet TR flags and downstream enable flags having been set. Similar to the process in the flowchart of FIG. 14 which turns on power/Triacs used for any or all the upper, lower and/or downstream functions, the GFI reset process turns on any or all of the three Triacs during a GFI Reset process. Following reset, the process step 1618 continues to the GFI Test 1218, FIG. 12.

Figure 17:
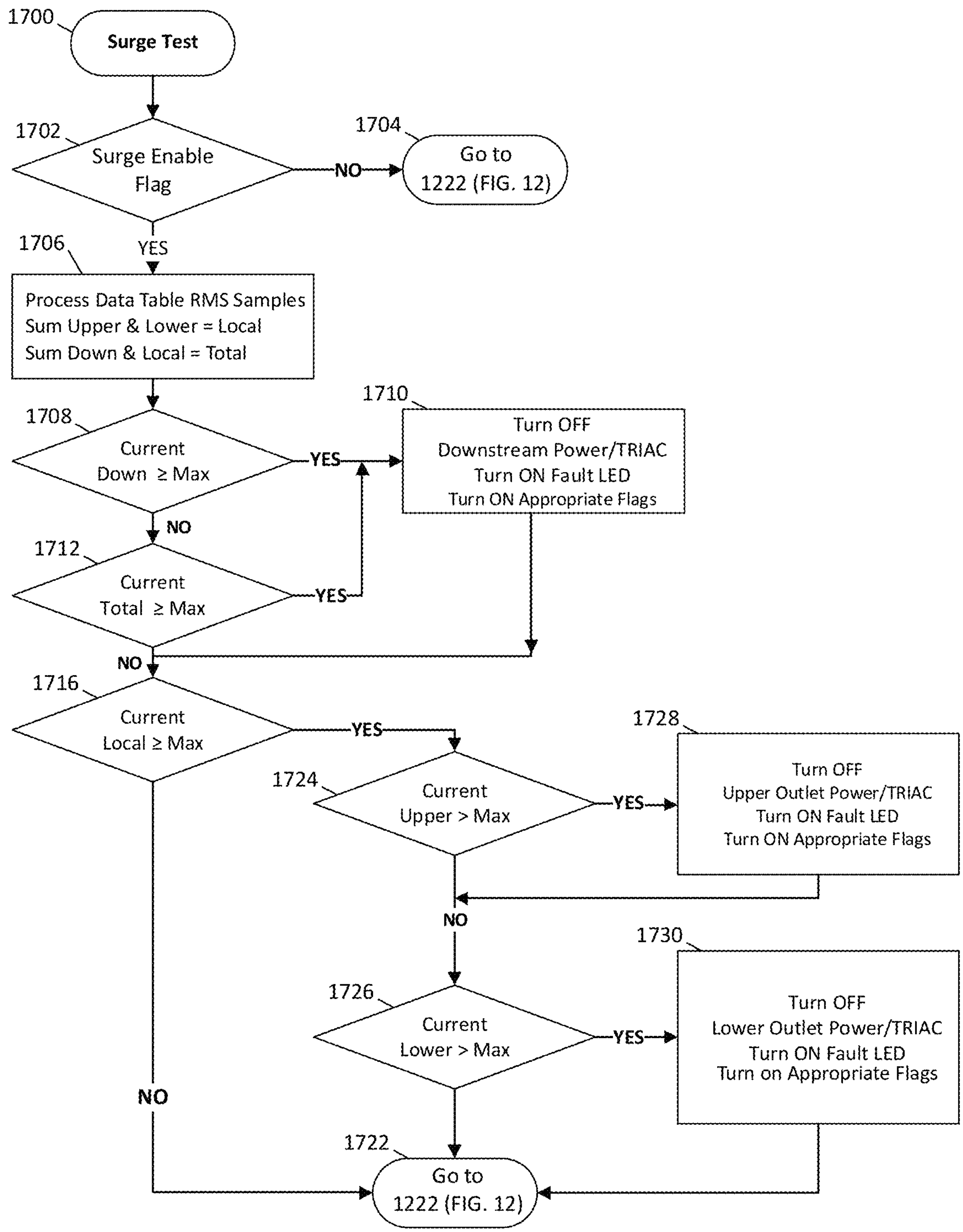
FIG. 17 is a surge test process flowchart for the circuits of FIGS. 6A, 6B, 7A, 7B, 7C and 8.

FIG. 17 is a surge test process flowchart for turning off power/Triacs for overcurrent and surges. The decision block of step 1702 determines if there is a flag indication that Surge Protection is a feature in the outlet. If not, the process returns to FIG. 12 block 1222 and proceeds to call the Auto/Self Test routine.

If the Surge test feature is enabled as indicated by the presence of a Surge Enable Flag at step 1702, it has been determined that there is no Arc Fault occurring, and that there is no current imbalance between Hot and Neutral (GFI). At step 1706, Data Table samples are processed and the process continues to decision steps 1708, 1712, and 1716 to determine if current exceeds the permissible level (15 Amperes or 20 Amperes). Certain overages over the MAX may be permissible for a limited time duration to provide for cases of a limited surge such as a motor start-up.

Step 1706 processes the Data Table Samples (Block 1508): The Local Power is totaled "Local" by adding the RMS values of the Upper and Lower outlets, assuming two outlets are active in the receptacle. Then the sum of the Downstream RMS and the Local RMS generates "Total" Power. The decision blocks 1708 and 1712 then determine if the Downstream Current or Total Current, respectively, is greater than or equal to Max, in which case step 1710 turns off the Downstream Power/Triac, and turns ON Fault LED and appropriate flags. Max is a preset value based on whether the outlet is operating in 15 A or 20 A mode.

There is the capability to determine the Max current parameter depending upon the presence of 15 A or 20 A plug blade. For example, it may be permissible to draw 100% continuous current or 120% for less duration to provide for start up time such as inrush for a hair dryer or air conditioner. Decision block 1716 compares the Local value (sum of both Upper and Lower outlet) to the Max Current Parameter value. If greater, decision blocks 1724 and 1726 compare each of the upper and Lower outlets, shutting off the respective Power/Triacs and turning on the respective Fault LED(s).

FIG. 18 lists the elements in the Data Table. These are preset or accumulated, and/or processed during the execution of various routines. Of the 1 to 5 signals being monitored, 1, 2, 3 and 5 are done on the black input, and 4 ("WHY") is the return path. Current related information is used for GFI, Surges and Overcurrent processing; voltage, for AFCI serial, overvoltage and brownouts. The Sample Counter (0) is preset to a value of 5 as the embodiments are monitoring 5 current, or voltage values: Black Voltage, Upper Black Current, Lower Black Current, Down Black Current and White ("WHT") Current. Timers 21 to 26 are for tracking how long the events occurred. BLK shows individual load current drawn and WHT is the return path for all currents unless there is a fault.

Figure 19:
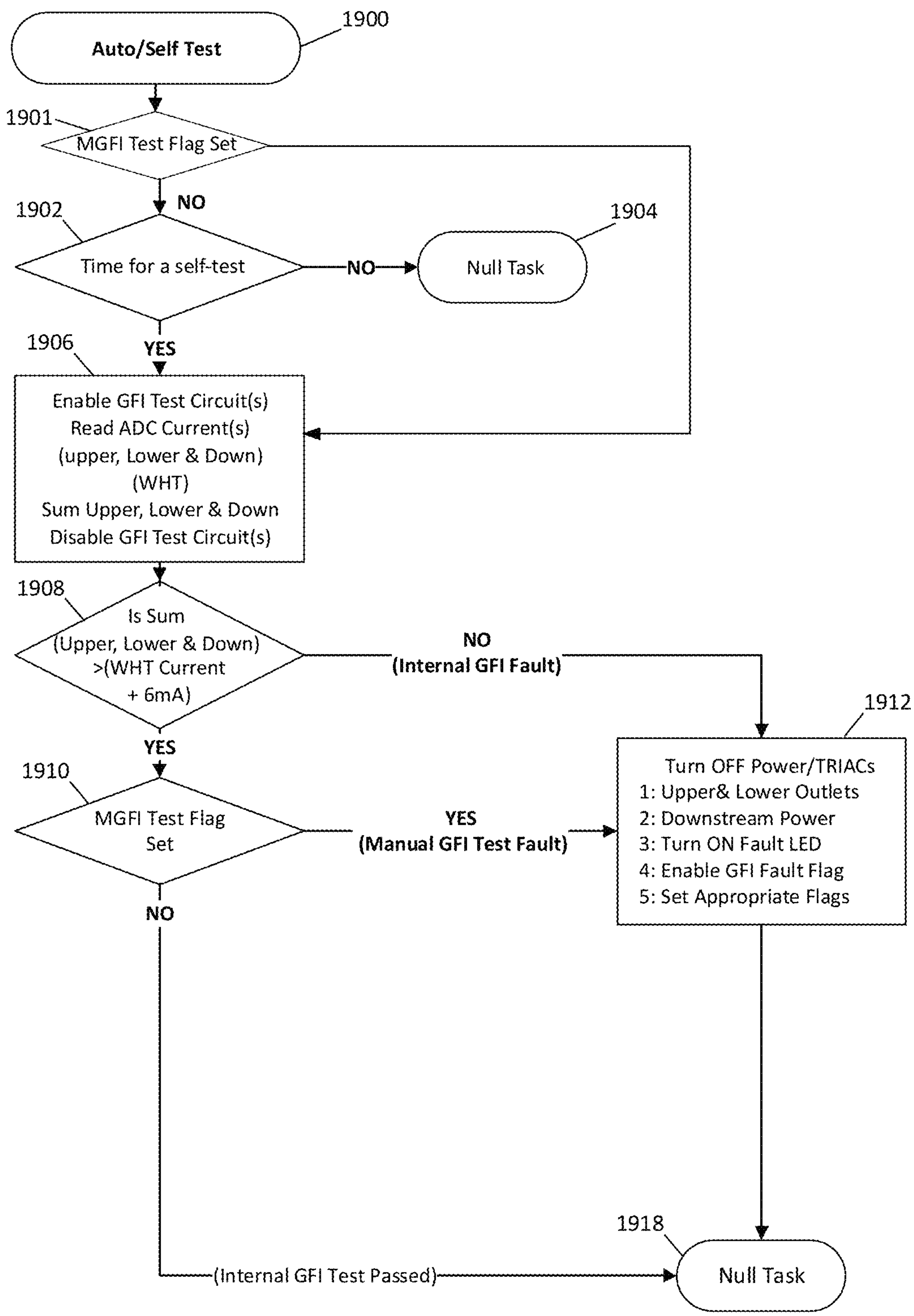
FIG. 19 is an auto/self-test process flowchart for the example embodiment.

FIG. 19 is an auto/self-test process flowchart that is initiated from FIG. 12, block 1222 and is primarily for auto/self testing of the system's hardware including but not limited to the GFI function (decision block 1908). The system may also test information from other sensors for calibration, temperature, etc.

If step 1901 determines that this is a manual test, then the processes in block 1906 are initiated. If a fault has been determined, the power is turned off at step 1904. Whether a self test as established in step 1902, or a manual test as determined in step 1901, step 1906 enables the GFI test circuit, reads the ADC values for the Upper, Lower, the White, and the Black & the White downstream, sums the Upper and Lower values, and disables the GFI Test Circuits.

Step 1908 tests whether an imbalance has occurred. If it was a manual test, the process continues to 1912. If it was an internal test and failed, the power is turned off. If is determined in step 1910 that a manual test failed, the power is turned off.

The electrical device in example embodiments can perform calibration of the ADC. The electrical device is calibrated by: presenting a known current or voltage and letting ADC measure the actual value; do it at 2 points and hence can do a linear calibration.

An example embodiment is an electrical device, including: a contact configured for electrical connection to a power line; at least one sensor to detect signals indicative of the power line and provide analog signals indicative of the detected signals; an analog-to-digital convertor (ADC) configured to receive the analog signals from the at least one sensor and output digital signals to the processor; and a processor configured to calibrate the electrical device by: applying a first known analog signal value to the ADC and receiving a first digital signal value, applying a second known analog signal value to the ADC and receiving a second digital signal value, performing linear interpolation or extrapolation using the first digital signal value and the second digital signal value for the calibrating of the electrical device.

In an example, more than two digital signal values may be used for calibrating non-linear sensor characteristics using a piece-wise linear approximation.

In an example, the electrical device further comprises a solid state switch for in-series electrical connection with the power line, the processor further configured to determine that a series arc fault has occurred, and in response deactivating the solid state switch. In an example, the solid state switch is a TRIAC. In an example, the contact is configured for downstream electrical connection to a downstream power line. In an example, the contact is configured for electrical connection through an electrical outlet. In an example, the processor is a microprocessor.

Figure 20A:
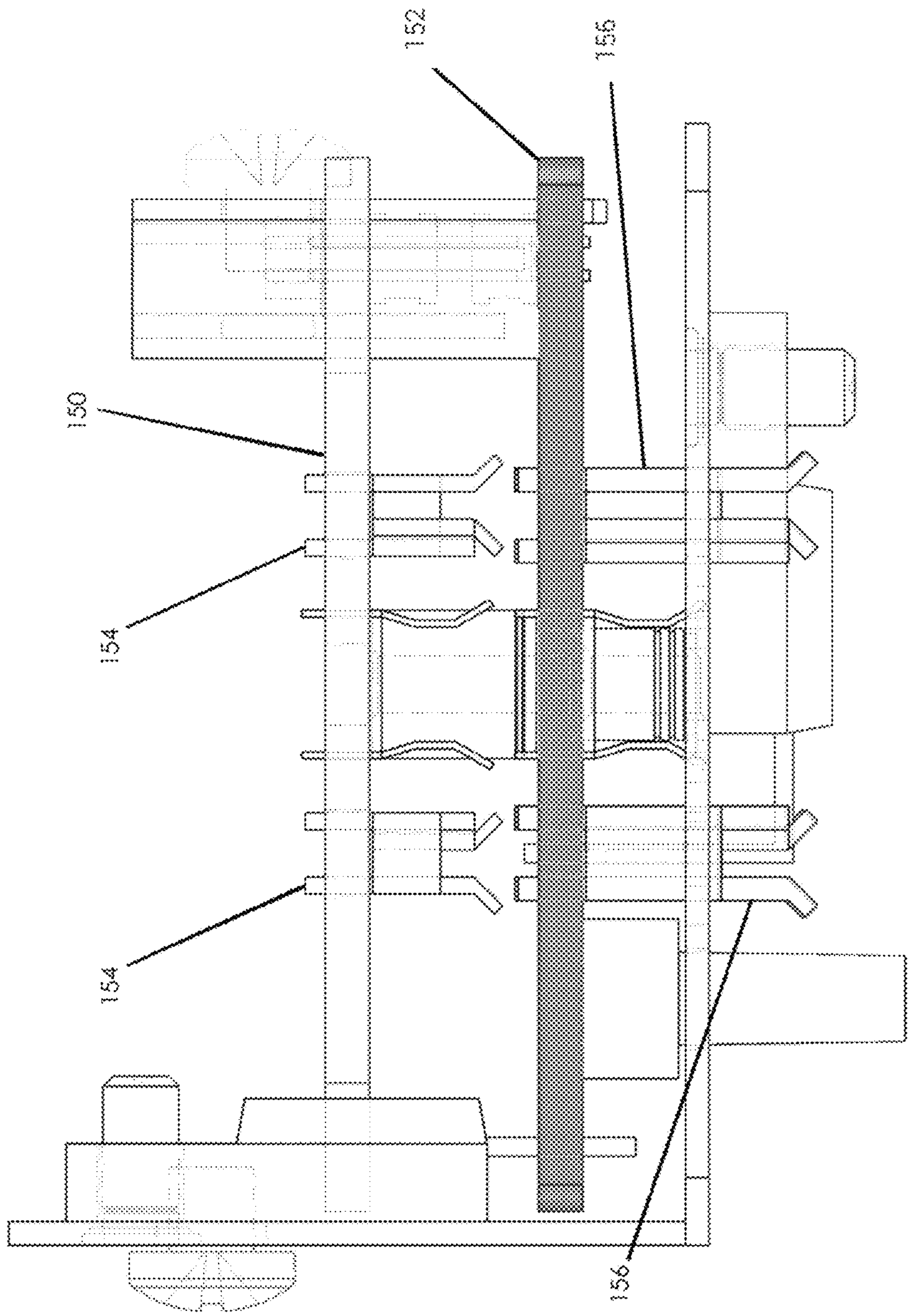
FIG. 20A is a plan view of the receptacle of example embodiment.
Figure 20B:
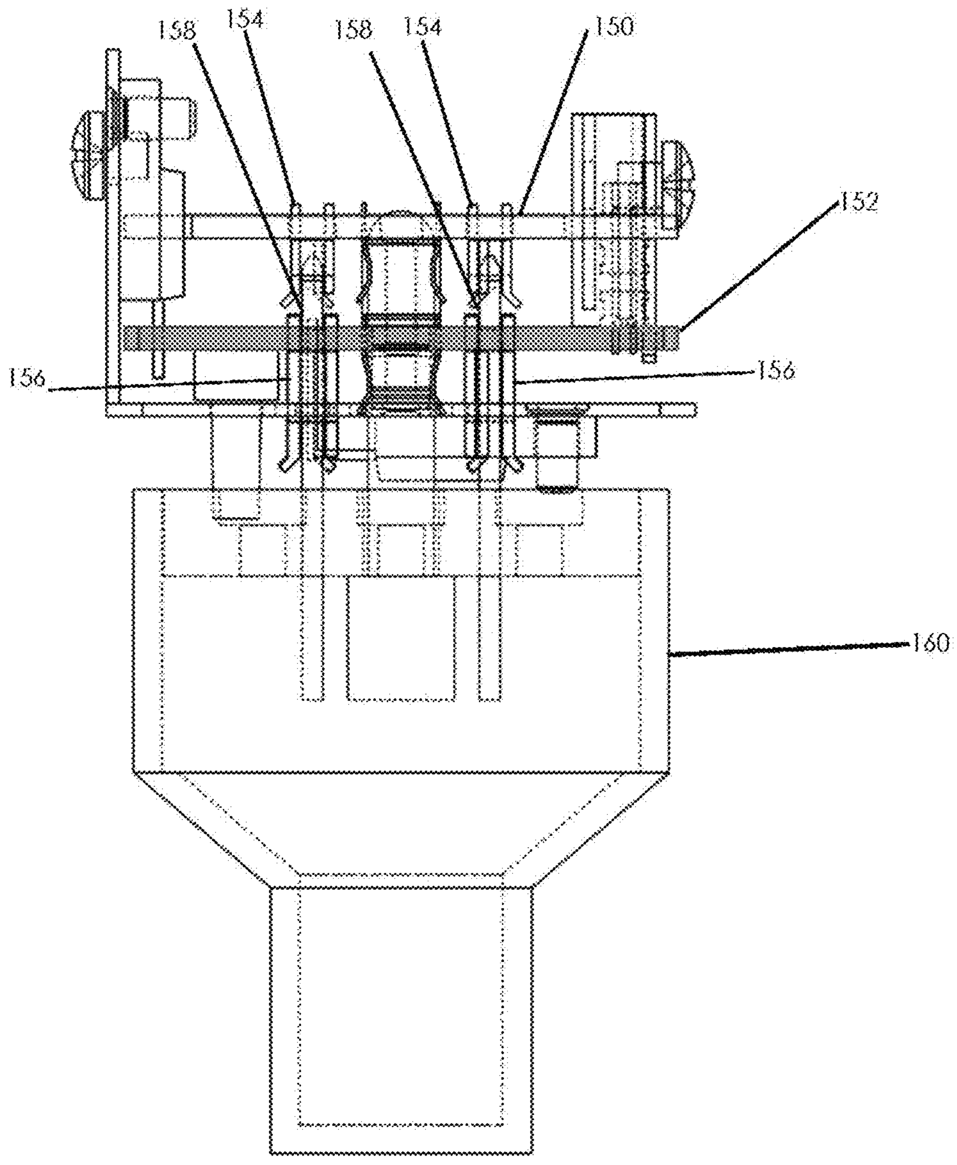
FIG. 20B is a top view of the receptacle from FIG. 20A with a plug inserted.

FIG. 20A is a partial plan view of a physical layout of a receptacle, such as described with respect to FIGS. 1A, 1B, 1C, 1D, 1E and 1F, operable by means of the circuits of FIGS. 6A, 6B, 7A, 7B, 7C and 8. A plug has not been inserted in the receptacle. FIG. 20B illustrates the receptacle of FIG. 20A with insertion of plug 160. Power circuit board 152 includes two sprung contacts 156. Daughter circuit board 150 includes two sprung contacts 154. Circuit board 152 includes sprung contacts 156.

Boards 152 and 156 are substantially parallel to, and separated from, each other. Contacts 154 and 156 are aligned with each other, bridged across the separation by inserted plug blades 158, as shown in FIG. 20B. The two circuit boards allow separation between the high voltage power control logic components on circuit board 152 and circuit board 150, the latter containing sensing logic and communication components. More particularly, the voltage sensing, control, connection of high voltage to the plug pins, device power interconnect lines (Upstream [BLK/WHT IN]/Downstream [BLK/WHT Out]) 30 are included on power circuit board 152. Plug pin sensing logic elements are include on circuit board 150. This arrangement provides high efficiency of the power circuitry, as the high current traces are all together. Ability of the GFI and AFCI protection is afforded to measure the currents on both the neutral as well as on the hot lines, and to reliably measure a fine current imbalance, for example as little as six milliamps.

Figure 8:
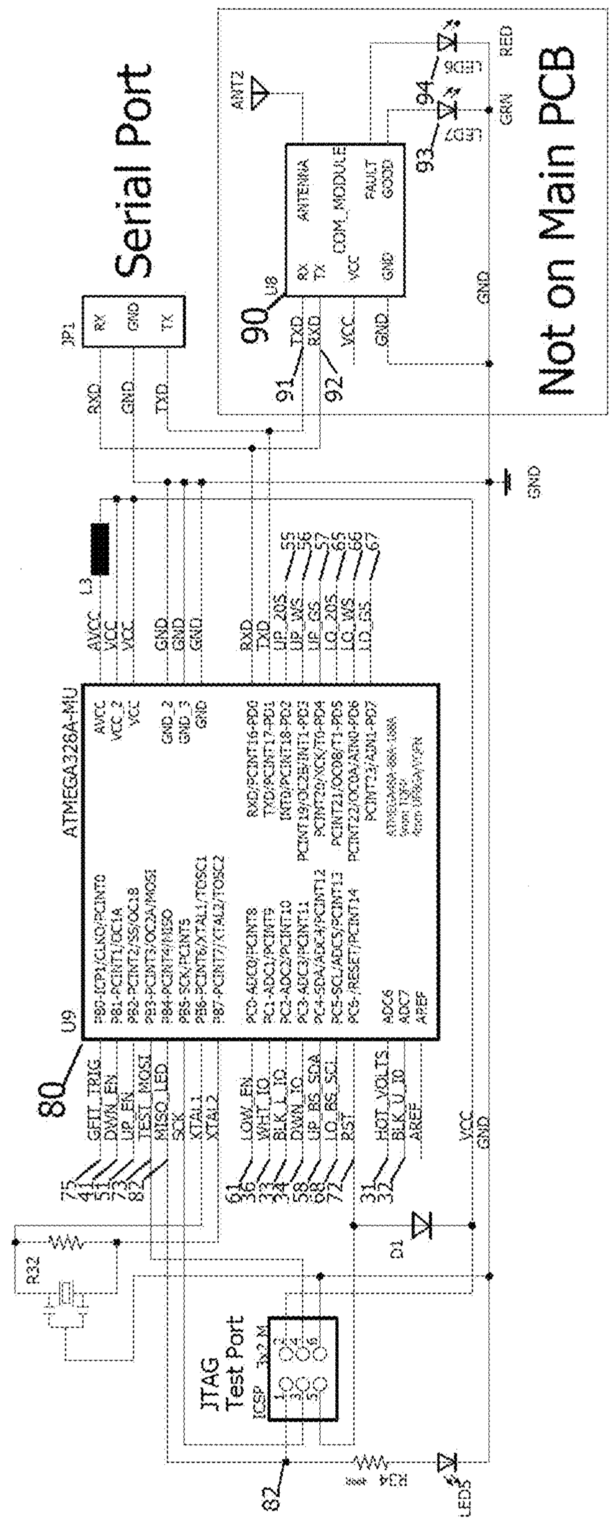
FIG. 8 is an exemplary circuit diagram showing the processor, communications module and logic elements.

Full insertion of plug 160 completes circuit connection of microcontroller 80 with low voltage sensor circuits 55, 56, 57, 58 and 65, 66, 67, 68, depicted in FIGS. 6, 7B and 8. Microcontroller 80 monitors the sensor contacts to determine whether the power is to be turned on or off. Circuit board 150 monitors the contact sensors to determine the insertion time of the plug neutral and hot blades. Ground prong 57, 67 insertion time is also assessed. The ground prong is longer than the hot and neutral blades. If a ground plug is present, it is detected first to establish distinctive timing criteria. The microcontroller will wait for the other blades to be inserted.

Separation of the current sensors to a single board facilitates measurement of precision, calibration, and long term stability. There is no need to tamper with any of the high voltage variables that are stable, having already been calibrated. The separated board makes provision for addition of other communication functions, e.g, Bluetooth, Zigbee, WiFi power line communications while limiting the number of signals traveling between the two circuit boards.

Figure 21:
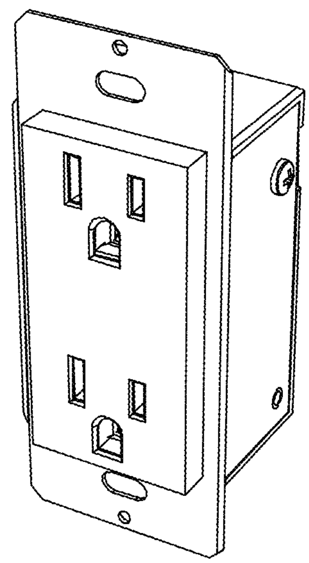
FIG. 21 is an isometric view the example embodiment of the receptacle with side heat sink.
Figure 22:
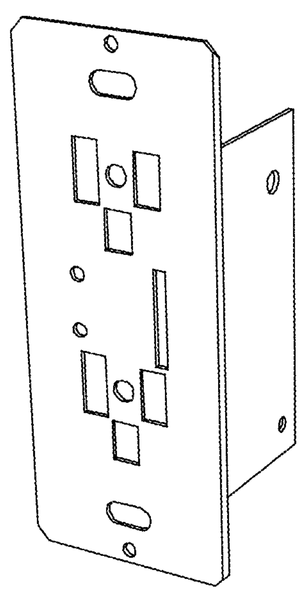
FIG. 22 is a partial view of the receptacle of FIG. 21 shown with a ground plate.
Figure 23:
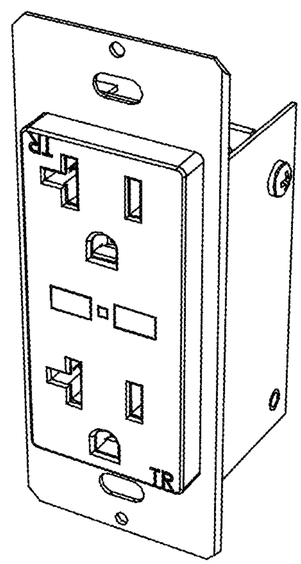
FIG. 23 is an isometric view of the example embodiment for a 15/20 A receptacle.
Figure 24:
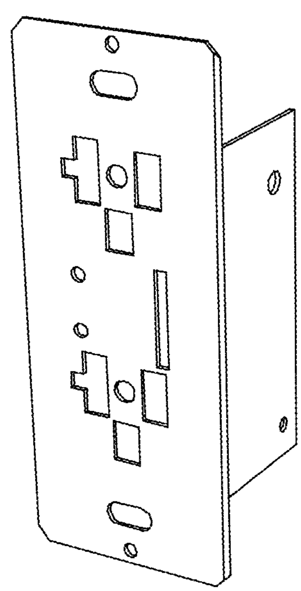
FIG. 24 is a partial view of the receptacle shown in FIG. 23 with ground plate and heat sink flange.
Figure 25A:
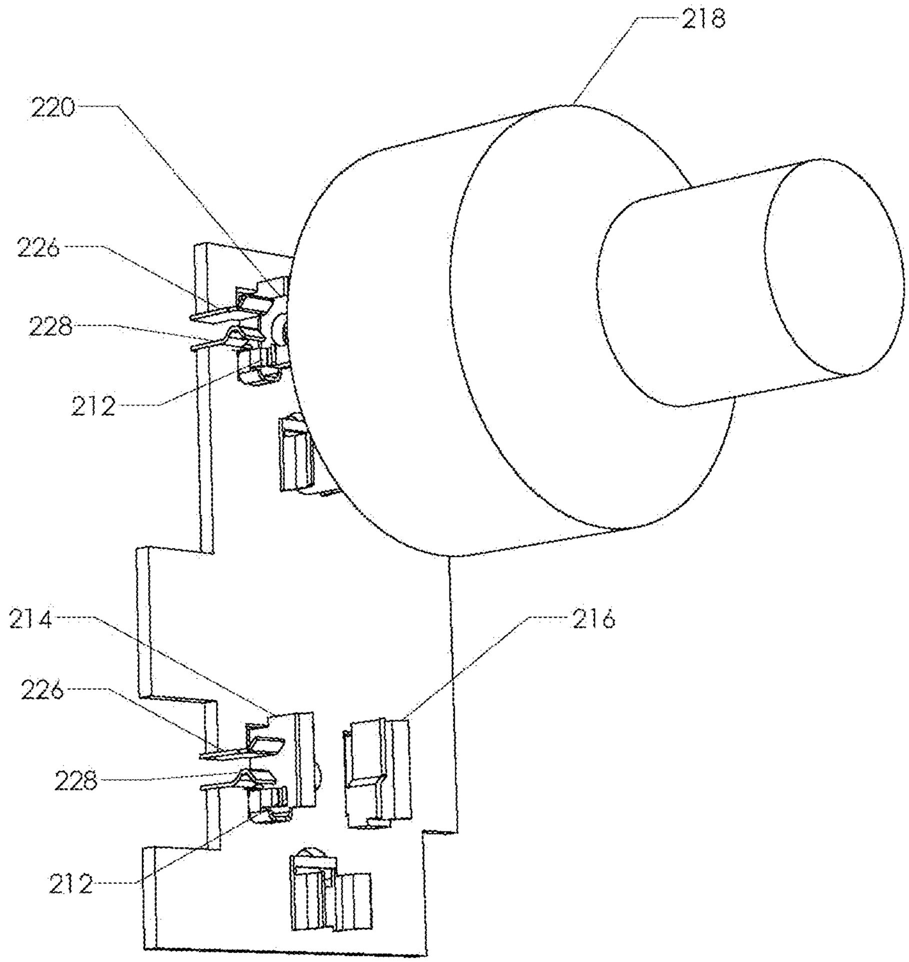
FIG. 25A is an isometric view of an example embodiment of a 15 A plug inserted into a daughter board of the receptacle shown in FIG. 23.
Figure 25B:
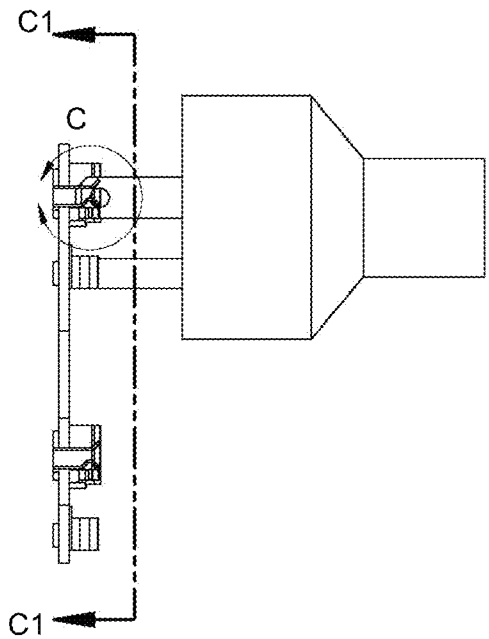
FIG. 25B is a side view of FIG. 25A.
Figure 25C:
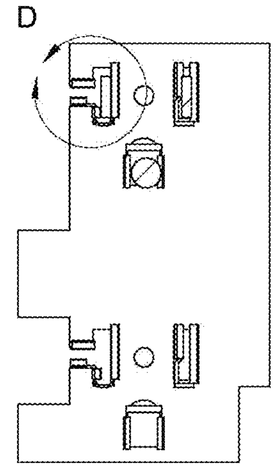
FIG. 25C is a front view of the daughter board of receptacle of FIG. 25A taken from line C1-C1.
Figure 25D:
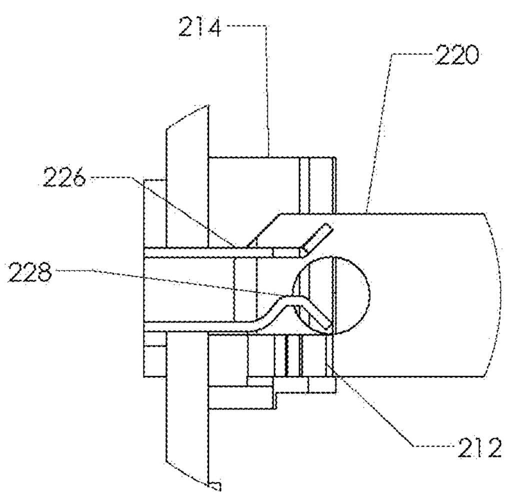
FIG. 25D is an enlarged view of the portion C in FIG. 25B.
Figure 25E:
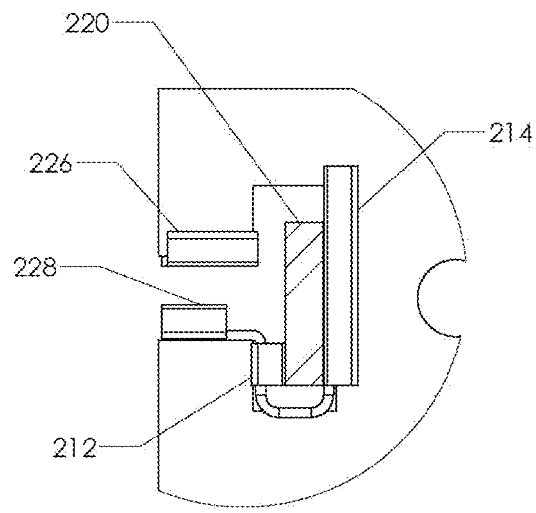
FIG. 25E is an enlarged view of the portion D in FIG. 25C.
Figure 26A:
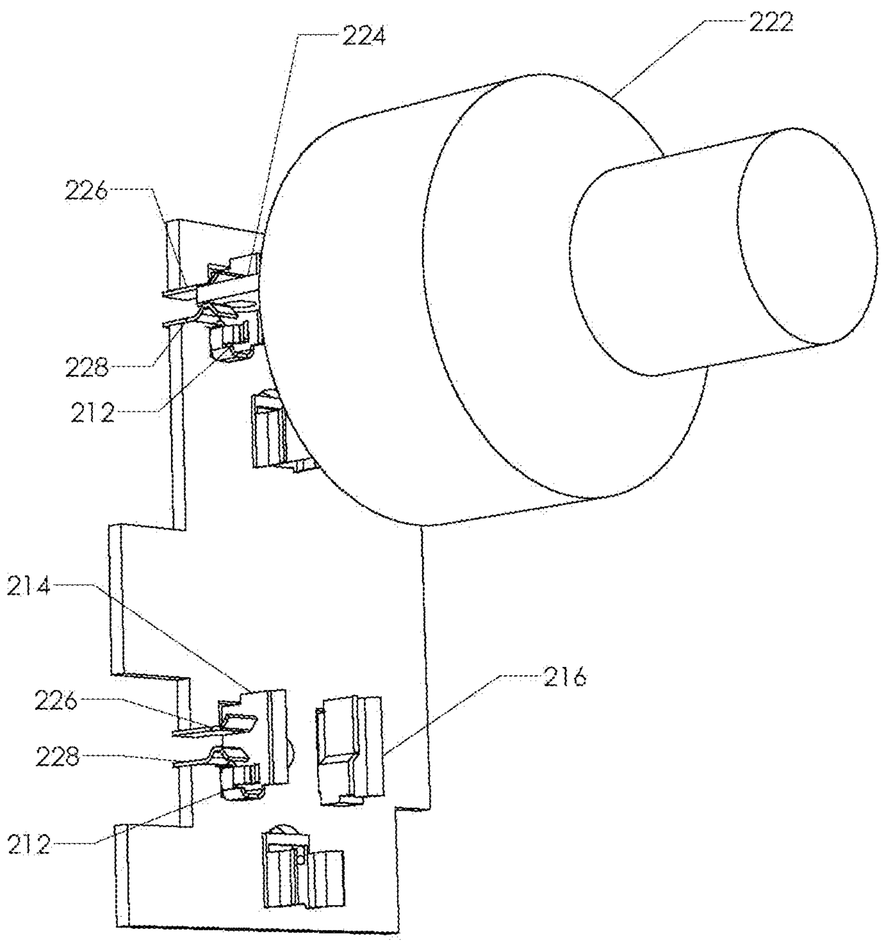
FIG. 26A is an isometric view of an example embodiment of a 20 A plug inserted into the daughter board of the receptacle shown in FIG. 23.
Figure 26B:
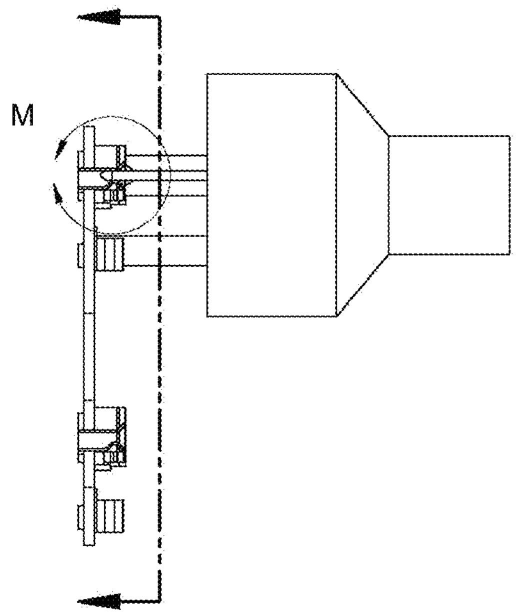
FIG. 26B is a side view of FIG. 26A.
Figure 26C:
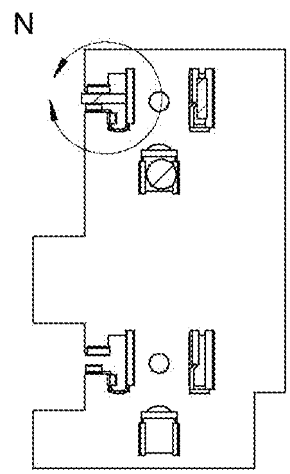
FIG. 26C is a front view of the daughter board of the receptacle of FIG. 6A.
Figure 26D:
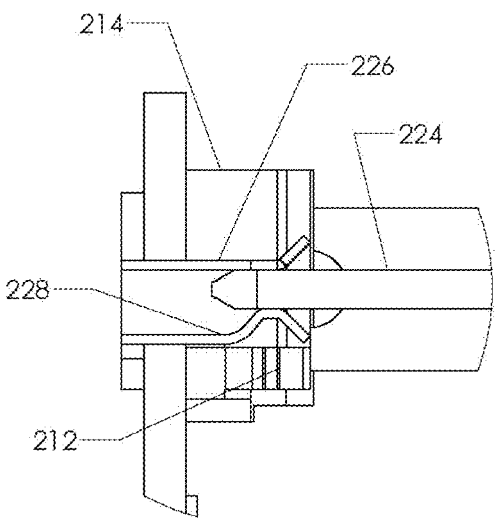
FIG. 26D is an enlarged view of the portion M of FIG. 26B.
Figure 26E:
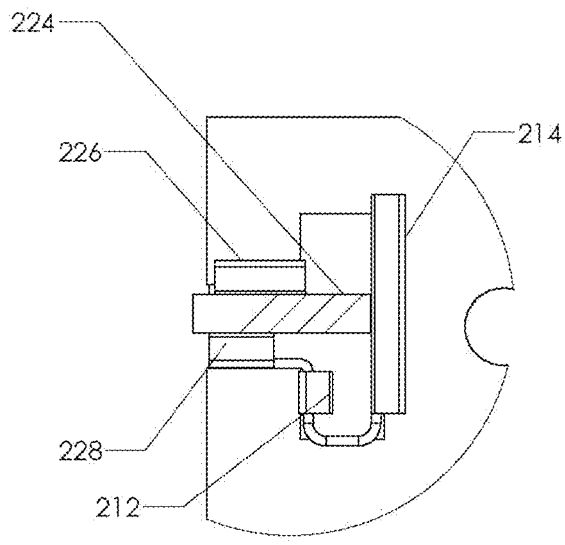
FIG. 26E is an enlarged view of the portion N of FIG. 26C.

The reliability and lifespan of electrical components are enhanced by maintaining them at a relatively low temperature. FIGS. 21 and 22 exemplify provision in the receptacle of an oversized ground plate that acts as a heat sink for the electrical thermal components that generate heat, such as the exemplified TRIACs. A ground plate width and height are maximized on the front face. A bent flange on the receptacle side adds to the surface area and strength for heat dissipation. The ground plate may be constructed of galvanized steel or alternate thermal conductive materials. Fins may be added to maximize heat conduction surface area. FIG. 23 exemplifies a 15/20 A embodiment of the receptacle. FIG. 24 depicts ground plate with heat sink flange for the receptacle shown in FIG. 23.

Referring to FIGS. 25A, 25B, 25C, 25D and 25E, a 15 A plug 218 is inserted into the daughter board of the receptacle shown in FIG. 23. FIGS. 26A, 26B, 26C, 26D and 26E illustrate insertion of a 20 A into the daughter board of the receptacle shown in FIG. 23. Sprung contacts 212 and 214 and 228 sense insertion of neutral blade 220. Hot sprung contact 216 only senses the insertion of the hot plug blade. A neutral blade 220 for a 15 A plug mates only with neutral sprung contacts 212 and 214, as depicted in FIGS. 25A, 25B, 25C, 25D and 25E. Additional mating with contact 226 occurs only for insertion of a 20 A plug, depicted in FIGS. 26A, 26B, 26C, 26D and 26E. Blades 214 and 216 are sensed to determine the arrival time of each of the blades to confirm insertion of a plug rather than foreign objects. The orientation of the blades is also sensed by the contacts in order to determine if the plug configuration is for a 15 A appliance or a 20 A appliance 226. On the neutral side, there is the possibility of two neutral plug blade orientations. THE WHT/Neutral pin can be inserted vertically or horizontally. If vertical then the plug is signaling that it is a 20 Amp plug. If it is horizontal then it is a 15 Amp plug. For example, when the TR features of the circuit detects the second pin has been fully inserted, it sets the TR flag for the particular (upper or lower) outlet and sets its current rating. The current limit/rating for the downstream power is set by software (at manufacturer or by installer).

Figure 27A:
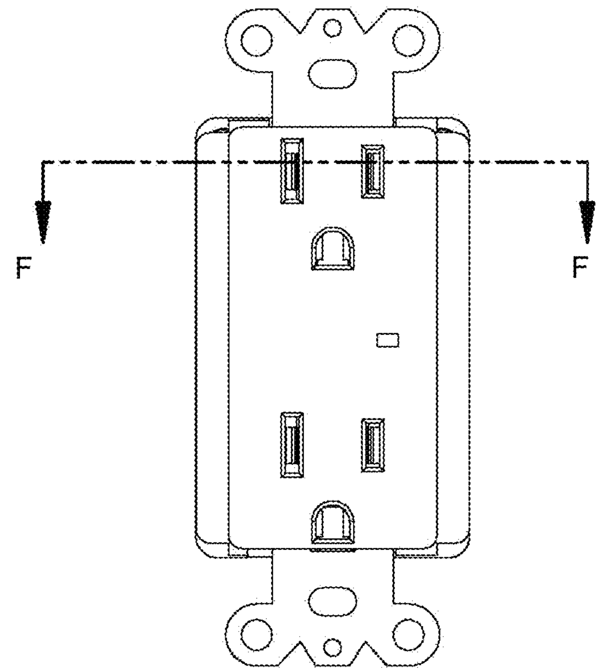
FIG. 27A is a front view of an example receptacle embodiment with micro-switch implementation for blade detection.
Figure 27B:
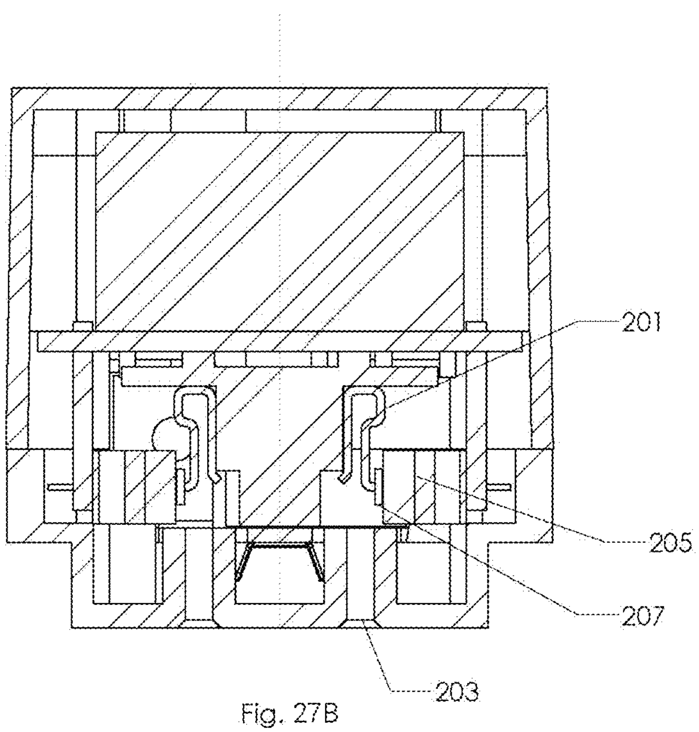
FIG. 27B is a cross-sectional view taken from line F- of FIG. 27A.

Referring to FIGS. 27A-27B, micro switches 205 are used to determine whether there is full insertion of a plug blade. Sprung contacts depress switch push buttons upon insertion. Micro switch plunger 207 is depressed by the sprung contact 201 that is deformed when a plug blade is inserted into the outlet socket 203. The side of the plug blade is used to determine insertion time. This is because the variation in blade length allowed by standard is quite large.

Figure 28:
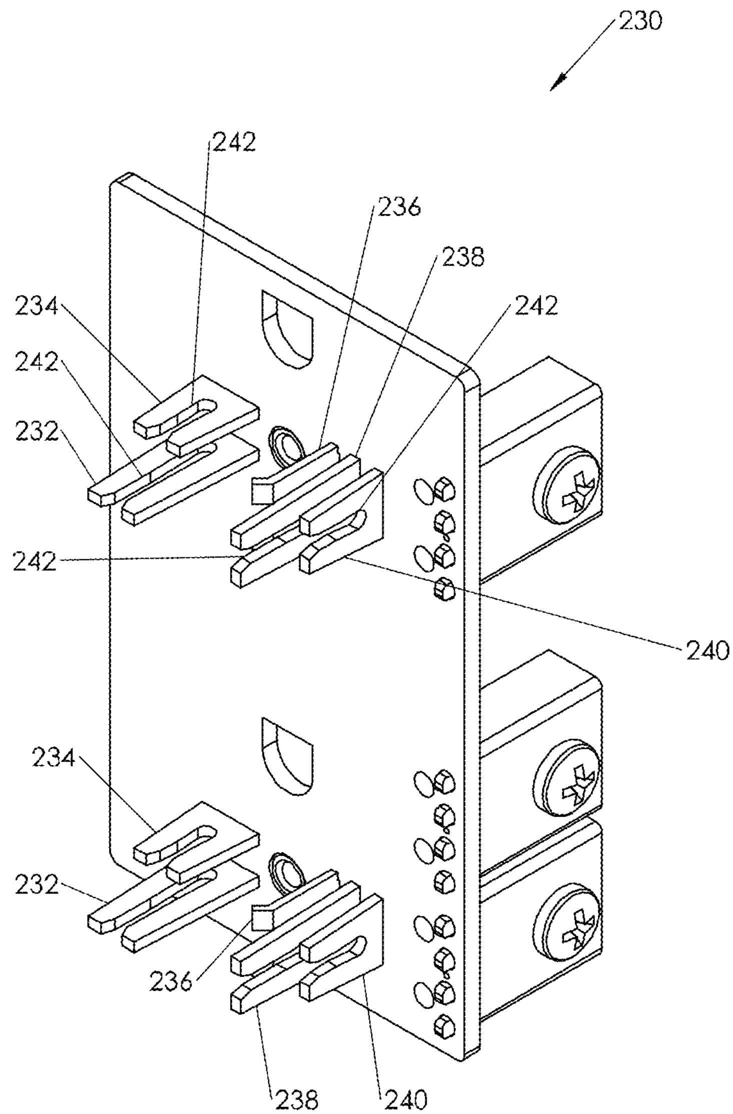
FIG. 28 is an isometric view of a single circuit board of the embodiment of FIGS. 20A and 20B.
Figure 29:
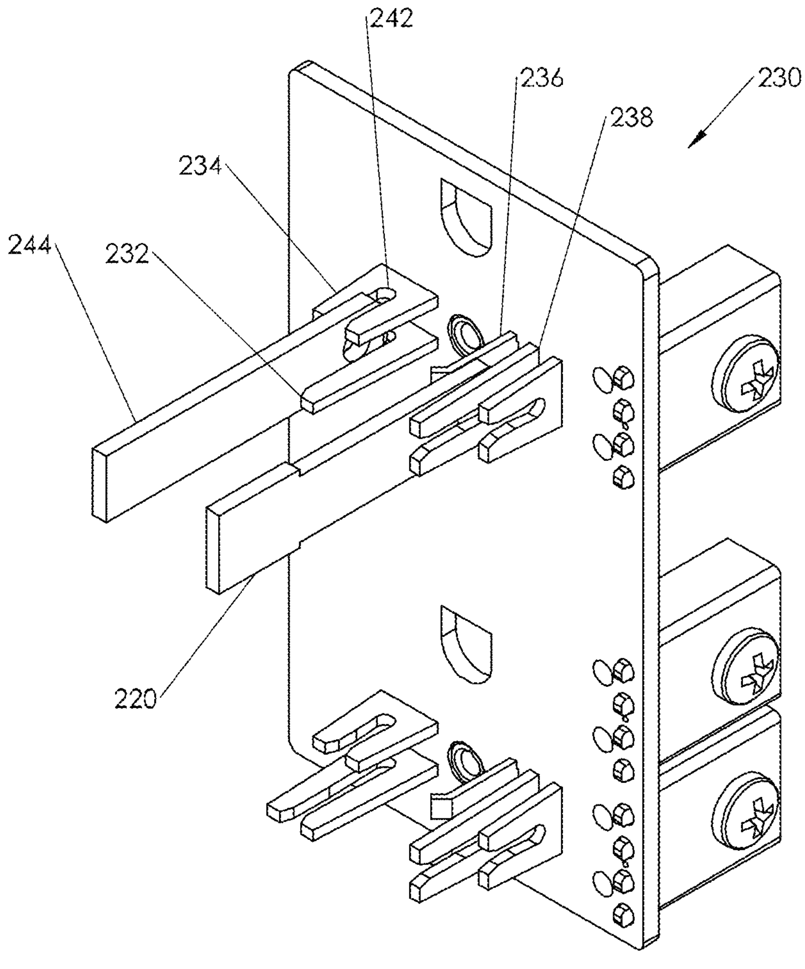
FIG. 29 is an isometric view of the blades of a plug in the single circuit board embodiment shown in FIG. 28.
Figure 30:
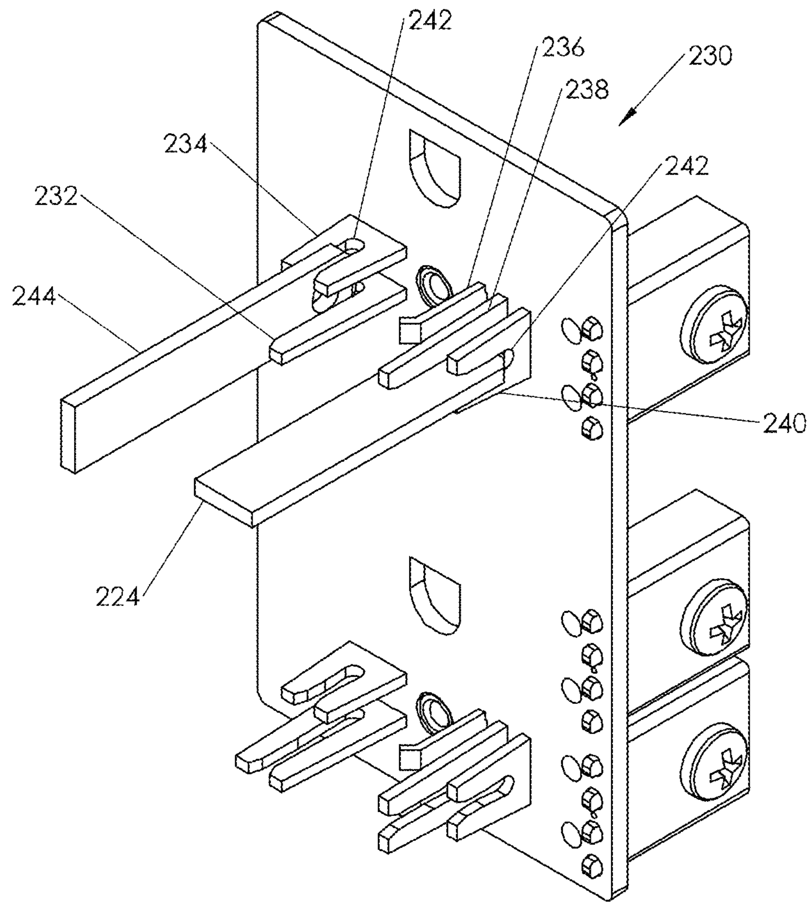
FIG. 30 is an isometric view of blades of a 20 A plug in the single circuit board embodiment shown in FIG. 28.

FIG. 28 is an isometric view of single circuit board that used both to sense blade insertion and supply power to the blades of the receptacles of FIGS. 25A, 25B, 25C, 25D and 25E and FIGS. 26A, 26B, 26C, 26D and 26E. The receptacle housings and ground plate have been hidden for clarity. FIG. 29 depicts insertion of a 15 A plug in the circuit board of FIG. 28. FIG. 30 depicts insertion of a 20 plug in the circuit board of FIG. 28. This configuration of contacts allows assessment of the arrival of blades and supply of power to the power contacts. Identification of whether a 15 A plug or 20 A plug has been inserted permits setting of the maximum trip current of the outlet.

For each of the two outlets of circuit board 230, there are two sprung hot contacts 232 and 234. Hot contact 232 supplies power to the hot power blade. Hot contact 234 is the sensing contact. For each of the two outlets of circuit board 230, there are three sprung neutral contacts 236, 238 and 240. Neutral contact 236 is the 15 A sensing contact, neutral contact 238 is the power contact and neutral contact 240 is the 20 A sensing contact.

Hot blade 244 closes the circuit between hot contacts 232 and 234, effectively sensing the arrival of the blade. Slots 242 in contacts 232, 234, 238 and 240 are sized slightly smaller than the thickness of the blade to allow the contacts to spring outwardly when a blade is inserted and apply pressure on the blade ensuring electrical conduction.

Neutral 15 A blade 220 closes the circuit between neutral 15 A sensing contact 236 and neutral power contact 238. Neutral 15 A sensing contact 236 is positioned at a distance, slightly less than the thickness of neutral 15 A blade 220, away from neutral power contact 238. When neutral 15 A blade is inserted neutral 15 A sensing contact flexes allowing the blade to be inserted and apply pressure on the blade ensuring electrical conduction.

Neutral 20 A blade 224 closes the circuit between neutral power contact 238 and neutral 20 A sensing contact 240. Neutral 20 A blade 224 does not contact neutral 15 A sensing contact 236 due to a clearance slot.

In this disclosure there are shown and described only exemplary embodiments and but a few examples of its versatility. It is to be understood that the embodiments are capable of use in various other combinations and environments and are capable of changes or modifications within the scope of the inventive concept as expressed herein. For example, the term "processor" has been used in this disclosure in a generic sense to include integrated circuits such as microprocessor, microcontroller, control logic circuitry, FPGA, etc. The terms "upstream" and "downstream" are used to refer to the respective relative direction in relation to the circuit branch originating at the electrical supply. The term "socket" has been used to indicate an individual contact of the outlet to mate with an individual plug prong. The terms plug "prong" and plug "blade" have been used interchangeably. While optical sensors have been illustrated, the concepts disclosed herein are applicable to the use of other equivalent sensors. Moreover, the data tables are shown as 1208, 1304, 1508 to relate to flow chart FIGS. 12, 13, 15 and 18. A single memory table of processor 80 comprises all of the described data tables. Reference to "deactivation" does not necessarily mean an explicit deactivation signal. Rather, the processor can comprise interlocking flags that ensure that the triac pulses on the pins do not pass through, are not active. When they do not pass through, this means that the power remains turned off and is not being turned on or explicitly activated.

Some example embodiments illustrate, but are not limited to, receptacles which typically include two outlets. These concepts are applicable to other receptacles of multiple other multiple outlets, one of which may lack a series switch. Moreover, although an electrical receptacle is described an example embodiment, the application of the features and means of accomplishing them are not limited to an electrical receptacle. While switches 2211 and 2213 of FIG. 2 are depicted as being tripped by an object inserted in the N socket, such tripping can, instead, occur from insertion of an object in the L socket. While a maximum time period of 25 ms for source connection has been exemplified in the description of FIGS. 2 and 3, a different time period is within the contemplation of this disclosure.

Figure 31:
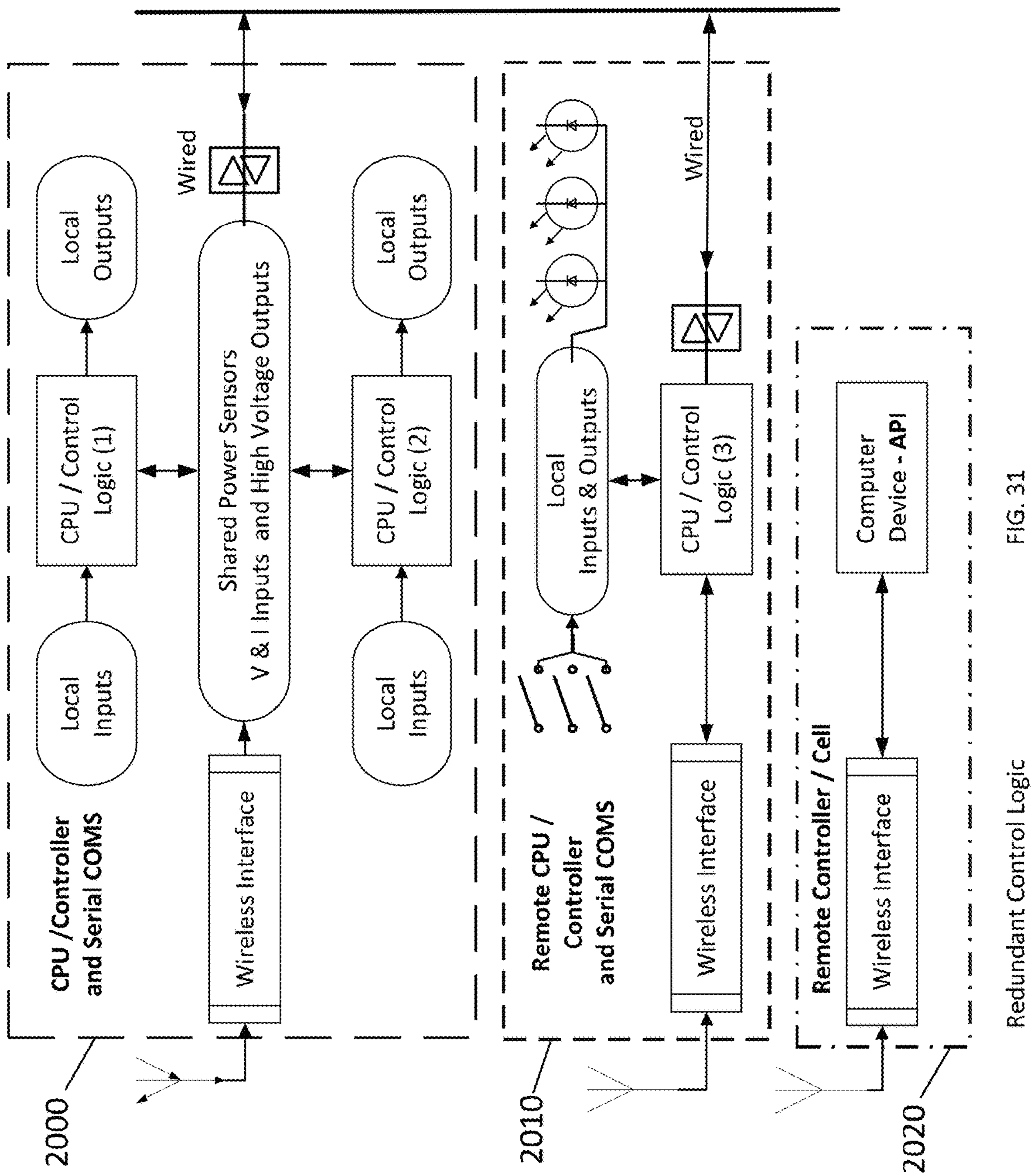
FIG. 31 is a block diagrammatic view of an example system which includes another example embodiment of the electrical receptacle, with shared processing.

FIG. 31 illustrates a block diagrammatic view of an example system which includes another embodiment of the electrical receptacle, with shared/distributed logic and shared/distributed processing. In an example embodiment, each block 2000, 2010, 2020 generally represents a separate processor. In an example embodiment, each block 2000, 2010, 2020 resides separately, at least as separate circuit boards. For example, in an example embodiment, blocks 2000, 2010 are separate circuit boards (with separate processors) residing in separate packaging, e.g. block 2010 is located at an electrically safe distance and can have its own associated local inputs and/or outputs. Block 2020 represents a separate device. "Wired" in FIG. 31 refers to the wired interface, buffer. The "wired" can comprise a data bus or connection such as an RJ-45 Data cable.

In the example embodiment shown, there are two separate processors, CPU/Control Logic (1) and CPU/Control Logic (2), which each can each handle (share) the same inputs and outputs (I/Os), including high power line signal inputs and outputs. There is a communication link between the two processors, which can be wired, wireless, or both wired and wireless. For example, these two processors can be configured to have serial communication (wired and/or wireless) there between. Antenna as input/output to wireless interface provides wireless (versus wired) communication between sensors and the control logic.

Block 2020 represents a separate wireless communication device, which can be a third party device, OEM (original equipment manufacturer) device, or other device that has its own CPU controller. Examples include wireless communication devices, mobile phones, laptops, and tablet computers. As shown in FIG. 31, there is also a wireless link that can go to block 2020.

The system shown in FIG. 31 illustrates an architecture that also gives redundancy to do enhanced safety type, in accordance with example embodiments. In block 2000, the CPU/Control Logic (2) is a redundant section for enhanced reliability.

Block 2000 can be used for the functionality of block 80 (described above with respect to at least FIG. 8). Block 2000 represents the control logic comprising of a processor and/or control logic, and its respective inputs local to the processor (such as sensors e.g. smoke, ozone, temperature, carbon monoxide etc) and outputs local to the processor (e.g. LED's, sounder, separate relay, etc., providing an alert or voltage or signaling to another device). Another example sensor is a temperature sensor which senses electronics and temperature inside the receptacle casing. The provides a calibrated sensor source in-unit, wherein current sensors have certain variation so they can be compensated for drift by the appropriate processor.

The power sensors for Block 2000 can comprise high power current sensors and/or incoming voltage sensors. The high power current sensors can be Allegro™ sensors, in an example embodiment. For the high power lines, the block 2000 performs the monitoring, control and safety functions as described herein.

Block 2000 also provides for shared inputs and outputs processed by the second processor ("CPU/Control Logic (2)"). The processors for the CPUs, Control Logic (1) and Control Logic (2), are configured to communicate to each other through the central block as they share the wireless interface and/or the wired interface. CPU/Control Logic (2) can be a failsafe or override should CPU/Control Logic (1) fail. Therefore, in one example embodiment, CPU/Control Logic (1) acts as the primary control of the triacs and other control functions, while CPU/Control Logic (2) acts as a backup control. In another example embodiment, there is shared control by both the CPU/Control Logic (1) and the CPU/Control Logic (2), for example using an OR gate to decide on any particular control activity (e.g. activation, deactivation, interrupt).

Block 2010 differs from 2000 in that it does not have the related high power inputs and outputs. Therefore, in an example embodiment, block 2010 is a low power circuit board (e.g. all 5V as logic power), while block 2000 is a high power circuit board for passing and controlling the power lines, which comprise high power inputs and outputs, as well as lower power circuitry for logic and control functions. In an example embodiment, block 2010 can have its own separate power source, which can include a battery and/or a suitable AC to DC power converter, or receive its power (e.g., 10 volts or less) through the wires in the data bus such as an RJ-45 Data cable operating as POE (Power Over Ethernet) configuration. Zero power functions can also be included, such as including one or more manual dry contact switches that are processed by the CPU in block 2010.

Block 2010 can have its own associated local sensors inputs and/or outputs. Block 2010 can be a remote control head that passes commands off through a communication line to Block 2000, e.g. through the applicable wired and/or the wireless interface. Block 2010 sends messages to the power block 2000, to implement the safety features, monitoring and control, as described herein.

In some example embodiments, there are more than two processors in block 2000, multiple blocks 2010, multiple blocks 2020's, and/or multiple blocks 2000, which are all wired on independent buses or the same bus and/or may be configured to all communicate wirelessly to each other.

In an example embodiment, a dry contact switch can be included in any or all of the CPUs of block 2000 and/or, block 2010. The dry contact switch shorts two pins of the chip packaging of one of the CPUs, therefore providing a manually operated input command that can be processed by the CPU. The CPU can be configured to implement a suitable task or series of tasks in response to activation of the dry contact switch. The task can include deactivation of a triac or sending a message to one or more other processors. A dry contact switch does not require active voltage to manually input a command, but rather the applicable CPU can be configured to detect a short between two of its pins.

In an example embodiment, an electrical device may include a contact for electrical connection to a hot power line, and configured for downstream electrical connection to a downstream power line; a switch connected in series relationship to the hot power line; at least one sensor configured to detect current or voltage signals of the hot power line; at least one further sensor, including a temperature sensor, humidity sensor, liquid sensor, vibration sensor, or carbon monoxide sensor, configured to detect a condition of the electrical device; and a processor configured to control an activation or a deactivation of the switch in response to the current or voltage signals detected by the at least one sensor and the condition detected by at least one further sensor.

The vertical bar on the right of FIG. 31 is a data communications bus, for example discreet wires such as RJ46, twisted pair, low voltage low level wires carrying data in different directions.

Block 2020 represents a wireless communication device. In an example embodiment, block 2020 can be any type of wifi wireless computer programmed with a suitable Application Program Interface (API). Block 2020 illustrates that external devices can communicate with the electrical receptacle and the processors such as blocks 2000, 2010. Further user applications can be installed onto the wireless communication device to allow the user control of the settings, functionality, and some manual controls of the electrical receptacle. Typically, a user interface device is provided to the user through block 2020 in order to control the user applications, e.g. on, off, and dimmer.

The messages and commands are passed over various interfaces, such as wired (RG 45, RG 46 or other wires for different distances and environments) and wireless interface (e.g., wifi, zigbee, etc.).

With the second processor second processor "CPU/Control Logic (2)" it is possible to share the local sensors which senses the plugs when inserted, or temperature, or other input sensors, and accordingly control the power circuitry the load. In the event that one of the processors CPU/Control Logic (1) or CPU/Control Logic (2) goes down, the receptacle is still able to keep running. The processors can communicate with each other and with the controlled loads. The processors can operate the loads with on/off, or other power controls such as dimming, for example, effectively operating as low voltage switches or controls.

Figure 32:
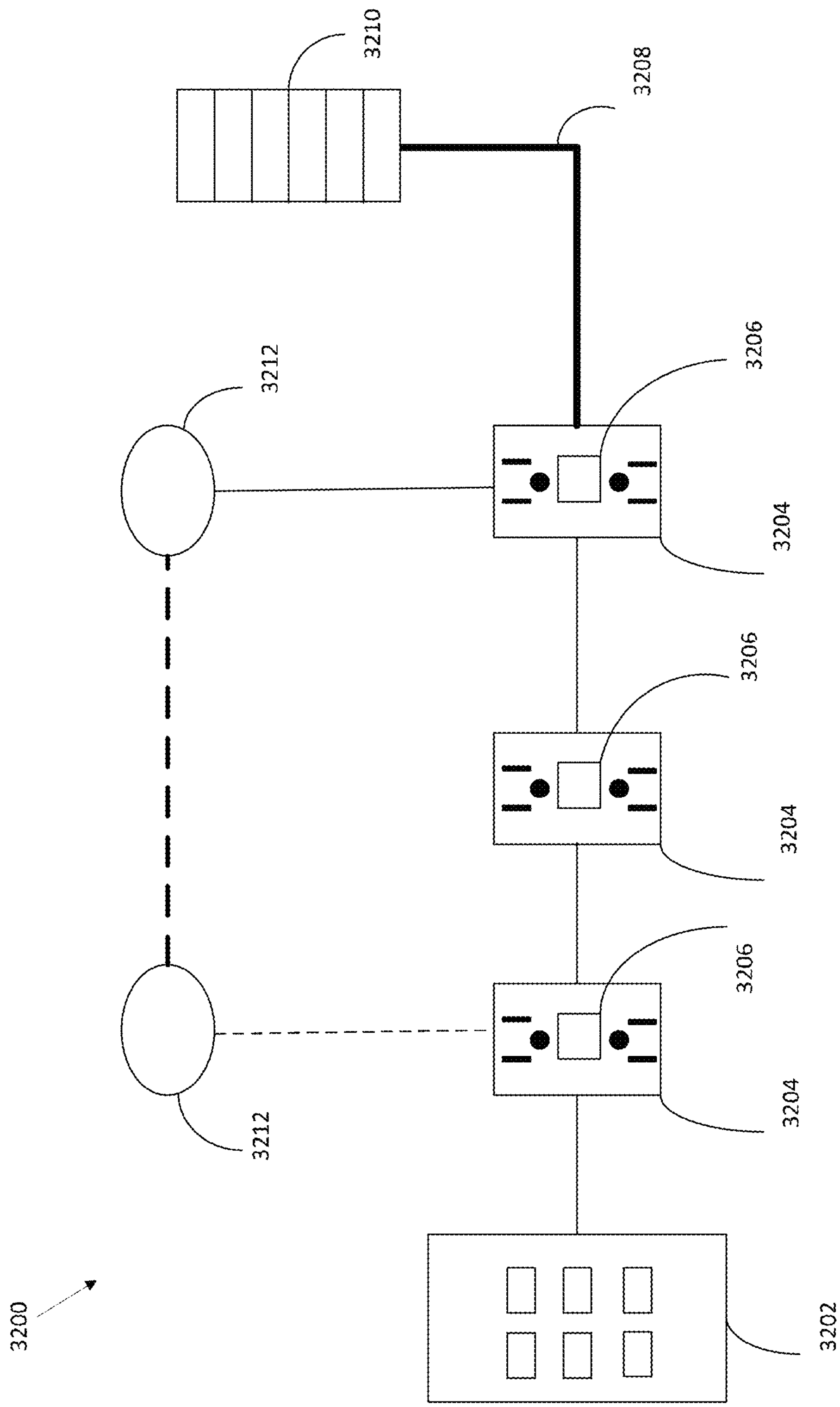
FIG. 32 is a block diagrammatic view of another example system which uses the electrical receptacle for monitoring and control, in accordance with an example embodiment.

FIG. 32 illustrates a block diagrammatic view of an example system 3200 which includes the electrical receptacle, for monitoring and control of local and remote loads, such as lights or remote lights of a home. In the example of FIG. 32, the system 3200 includes a breaker panel 3202, a plurality of electrical receptacles 3204, such as electrical receptacles having outlets and/or electrical receptacles without outlets, and a low voltage switch panel 3210.

The breaker panel 3202 divides an electrical power feed into electrical receptacles 3204 (and thus the loads 3212, which are remote to the breaker panel 3202), and provides a protective circuit breaker for each electrical receptacle 3204. Each of the electrical receptacles 3204 may supply power to the one or more loads 3212, such as one or more lights in a room or a house.

In an example embodiment, the low voltage switch panel 3210 replaces line voltage switches, 8 way switches, 4 way switches, etc. The low voltage switch panel 3210 may include a single switch low voltage panel or multiple switch low voltage panels.

The low voltage switch panel 3210 may be connected to at least one of the electrical receptacles 3204 via at least one communication cable 3208, such as a Power over Ethernet (PoE) communication cable.

In the example of FIG. 32, each electrical receptacle 3204 includes a Wi-Fi module 3206, which allows the electrical receptacle 3204 to communication with a processor or a wireless device. For example, the data collected at the electrical receptacle 3204 may be transmitted to the processor, such as the low voltage switch panel 3210, or the wireless device by the Wi-Fi module 3206; the processor, such as the low voltage switch panel 3210, or a wireless device can control the remote loads 3212 via the Wi-Fi module 3206. In an example embodiment, each Wi-Fi 3206 can be configured as an access point, a network extender, and/or a mesh network node. Each Wi-Fi module 3206 can include an antenna and applicable signal processors, hardware, and/or software. In an example embodiment, a Wi-Fi chip can be used as the Wi-Fi module 3206.

A plurality remote loads 3212, such as lights, may be grouped electronically. The low voltage switch panel 3210 may control the plurality of remote loads 3212 simultaneously as a group, for example when a plurality of downstream outputs or remote loads 3212 are grouped electronically.

The safety features of the electrical receptacle 3204 are included in a multi-zone controller giving full safety protection to the remote loads 3212, such as lights, that are desired to be controlled and monitored.

In an example embodiment, a keypad, touchscreen, or any suitable user interface can be installed to control multiple loads within a room, such as light switches, temperature controls, etc. In an example embodiment, the installer can run, e.g., 5 feet (152 cm) of CATS cable (or RS232 or twisted pair) and the rest over wifi to the receptacles 3204 from the lighting circuit area (switch, keypad, multiple buttons, etc). Control information can then be sent through the CATS to the receptacle 3204, which then controls and manages the power to the remote loads. User controls can be made to the keypad or touch screen to control the loads at the receptacle level.

In an example embodiment, the receptacle 3204 can be used so that an output contact/lead directly connects to a load such as a light receptacle, for safety, monitoring and control thereof. For example, a traditional light switch is a form of power control, but turning it on and off can generate arcs or sparks. The receptacle 3204 can protect against arc faults during on/off control of the lighting switches by applying the zero crossing switching technology described herein, because the switches do not carry power until turned on. The processor of the receptacle 3204 can further control the dimming functions of the light receptacle. Low voltage control of the light receptacle can also be performed by the processor 3210, for example using Power over Ethernet (PoE). In the example of FIG. 32, a PoE communication cable 3208 is used to connect a low voltage switch panel 3210 to a Wi-Fi module 3206 of an electrical receptacle 3204, for example, the electrical receptacle closest to the low voltage switch panel 3210. By connecting with the Wi-Fi module 3206 of an electrical receptacle 3204, the low voltage switch panel 3210 has access and control of all electrical receptacles 3204.

In an example embodiment, the Wi-Fi module 3206 of the electrical receptacles 3204 also can be configured to collectively define a wireless Local Area Network (WLAN), using the wired Local Area Network as a backbone (e.g. one of the power lines and/or low voltage lines), that can be used for local network access or Internet access. In an example embodiment, a gateway 3310 (FIG. 33) is configured to verify and authenticate access to the WLAN. The Wi-Fi modules 3206 are configured as access points to the network.

The receptacle 3204 enables replacing a light switch by using an in-line receptacle in accordance with example embodiments, whether the controller communicates with the receptacle via wires or wireless. In another embodiment, example embodiments of the receptacle can eliminate the light switch by controlling the power at the receptacle level, by using a logic command from a personal wireless device to communicate with the receptacle. The receptacle further provides the safety and fault response functions to the load (e.g. lighting receptacle) as described herein.

Another example embodiment includes a virtual control unit to shut off, which can include a dimmer, of a control switch for loads such as a light switch. An example embodiment can eliminate the traditional control switch. For example, the receptacle can be installed to act as a full control unit for downstream circuits. This has the benefit of minimizing wiring in a room by enabling, e.g. 1-2 outlets to become the command and communication central for an entire room or large area. Communication to the virtual control unit can be performed using a wireless communication device, for example.

In FIG. 32, all loads 3212 and lighting circuits of the system 3200 can take advantage of the fault protection systems described herein. For example, the system 3200 allows arc fault detection on the switching circuits of the loads 3212 (e.g. lights).

In an example embodiment, the receptacle is "always powered off" until initiated by the processor in response to turning on using the keypad or touchscreen or wireless communication device. Once it is determined that the safety checks are satisfied, the output power can is activated/energized to source the selected load(s).

Figure 33:
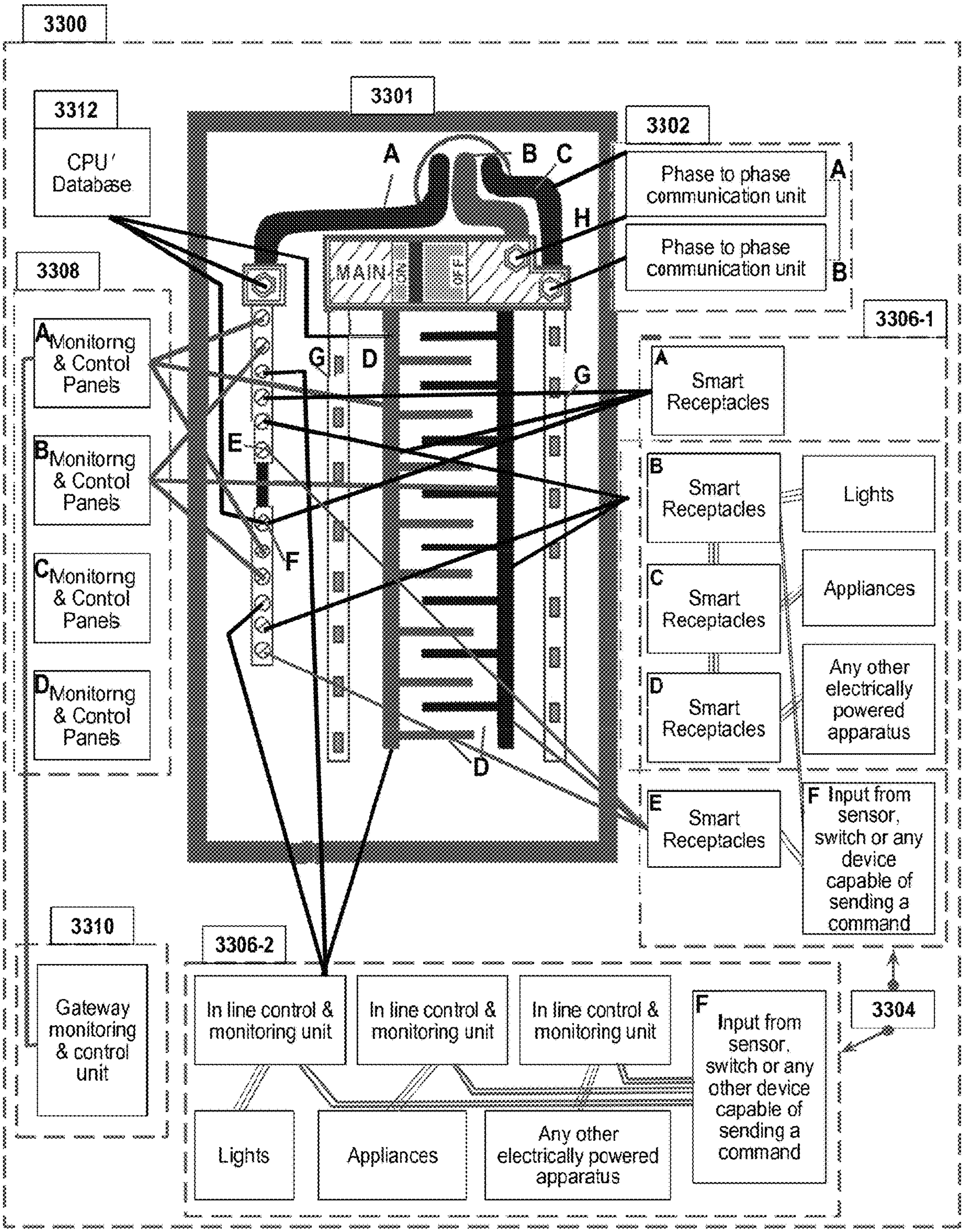
FIG. 33 is detailed schematic representation of an integrated control and monitoring system, in accordance with an example embodiment.

FIG. 33 is detailed schematic representation of an integrated control and monitoring system, in accordance with an example embodiment. FIG. 33 (BLOCK 3300) is a schematic representation of an integrated power control and monitoring system incorporating a breaker panel (3301), phase to phase communication units (3302); plug receptacles incorporating their own CPU and power monitoring and control systems (3306-1); in-line receptacle units incorporating their own CPU and power monitoring and control systems (3306-2); an external CPU and database system (BLOCK 3312) (e.g. having a database that may be accessible externally); a gateway (BLOCK 3310); and monitoring and control panels (which may be wired or wireless) (BLOCK 3308). FIG. 33 illustrates having input(s) for sensors or any other device capable of sending a command to activate a specific part of the receptacle, whether upper outlet, lower outlet in the case of a plug-type receptacle, or downstream.

FIG. 33 illustrates integrated connectivity and the relationship between different apparatus within the system. FIG. 33 also highlights the concept of behind and outside a secured contained logical and physical space ("fence"), the fence defining and restricting/limiting access to and between protected units. In an example embodiment, the fence is in-wall, e.g. installed behind drywall or other wall boundaries.

A gateway (BLOCK 3310), in an example embodiment, illustrates that all the other communication is a "ring fence"; e.g. there is no external way to communicate with each and every receptacle or inline control unit without going through the gateway or without being physically connected to the electrical network of either the house, factory, plant, commerce that the system is installed into. The fence comprises a local wired network, that is associated with the electrical receptacles for communication there between, and for other communication functions.

BLOCK 3301 is a circuit breaker panel.

ELEMENT 3301-A is a neutral feed.

ELEMENT 3301-B is live feed phase 1.

ELEMENT 3301-C is live feed phase 2. Note that live feed phase 2 has a different phase than live feed phase 1.

ELEMENT 3301-D are ungrounded conductor (Hot) Bus that circuit breakers mount to.

ELEMENT 3301-E are connection points for neutral (white).

ELEMENT 3301-F are connection points for ground.

ELEMENTS 3301-G are mounting brackets for breakers.

BLOCK 3302 also discloses phase-to-phase communication, in an example embodiment. In particular, communication between two phases 3301-B and 3301-C is illustrated by means of two inline connection units (BLOCKS 3302A and 3302B) which connect to each of the two phases through connection points logs (ELEMENTS 3301 H) which are connected to each phase. These two units (BLOCKS 3302A and 3302B) incorporate their own CPU and can communicate to each other, and in an example embodiment monitoring and controlling voltage and/or current. The embodiment illustrates two phases, but there may be multiple phases and multiple respective inline receptacles.

Connecting a phase-to-phase communication unit to each phase and interconnecting each phase, allows for communication between each phase. The BLOCK 3302 acts as a bridge between the two or more hot power line phases. For example, the BLOCK 3302 can acts as a repeater, man-in-the-middle, etc.

Alternatively, in another example embodiment, ground (3301-F) to neutral (3301-E) wired communication can be used, replacing Block 3302. This is described in greater detail herein.

BLOCK 3306-1 represents plug receptacle power line connection to a breaker panel and to the potential downstream apparatus and control devices.

Although communications through the power line among each other is illustrated in this embodiment, the communications from the plug receptacles may be through low voltage wiring, or any of a number of wireless communication means and protocols.

Although plug receptacles with their own CPU ("Smart Receptacles") have been described in BLOCK 3306 of the illustration, the downstream of 3306-E may be traditional plug receptacles with, in an example embodiment, traditional tripping means.

BLOCK 3306-2 reflects power line communications to a breaker panel. It is a similar to the scenario in BLOCK 3306-1, but instead of specifying Smart Receptacles (with plug outlets), it illustrates a particular example of communicating in-line control and monitoring units (without plugs) to be inserted and connected within the circuitry of lights, appliance or electrically powered apparatus.

Figure 34:
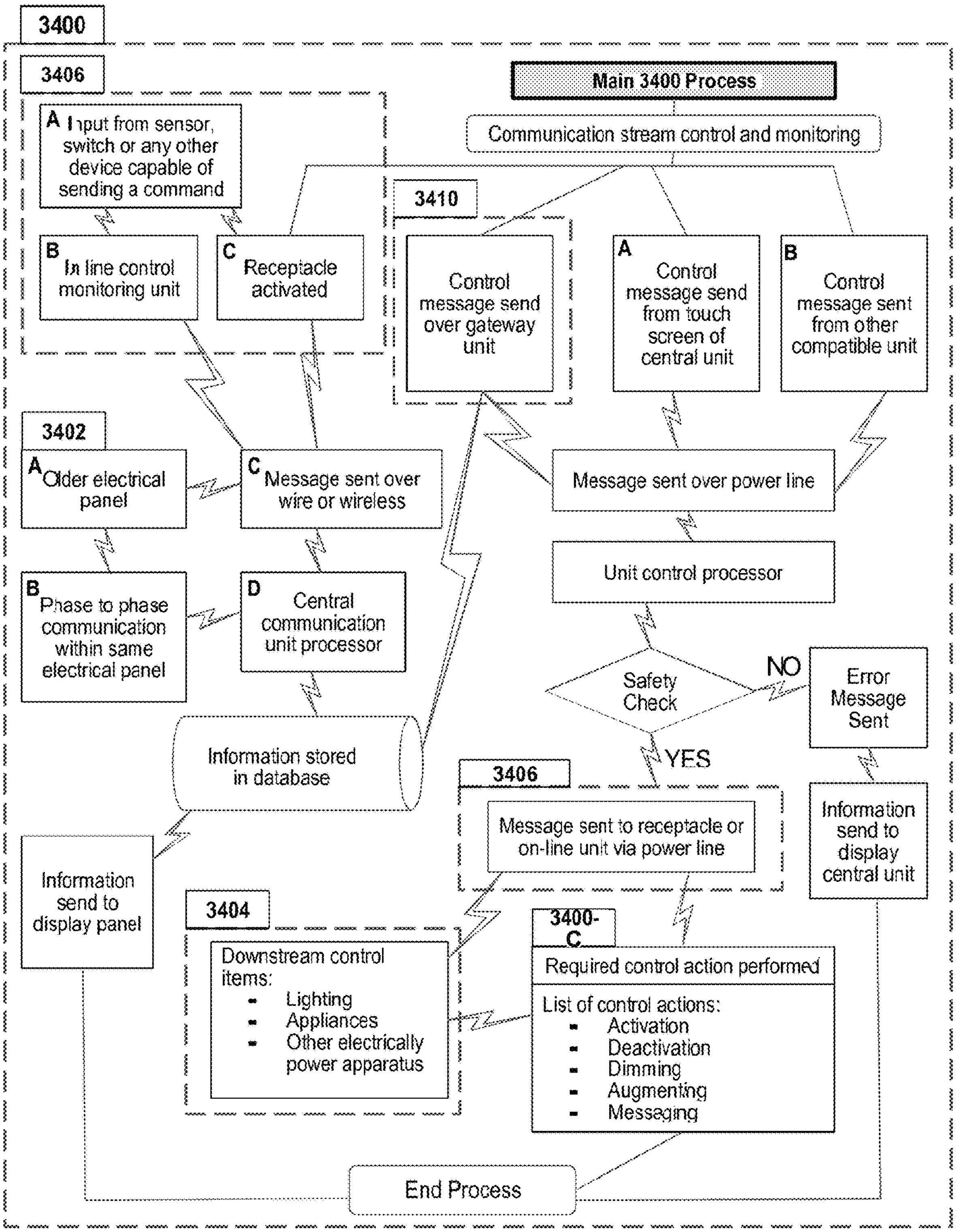
FIG. 34 is a communications diagram, in accordance with an example embodiment.

Communication and actions can also be triggered by any input from sensor or switch or device capable of sending a command (BLOCK 3306-2F and BLOCK 3306-1F) and as illustrated in FIG. 34, BLOCK 3400C.

Although communications through the power line through the breaker panel to communicate with each other is illustrated in this embodiment, in another example embodiment, the communications from the in-line receptacles may be through low voltage wiring, or any of a number of wireless communication means and protocols.

BLOCK 3306-1F and BLOCK 3306-2F illustrate that a command may be sent to control end of the plugs or downstream apparatus to the receptacle or in-line control and monitoring unit, whether light, appliance or other electrical apparatus, the command being initiated by any kind of input connected to the receptacle or in-line control and monitoring unit (for example originating from BLOCK 3306).

BLOCKS 3306-1 and 3306-2 also illustrate having more than one Smart Receptacle and having them able to talk to each other. On occurrence of a fault, no matter from where it comes from, there may be logic that may send a force trip to any upstream receptacle in the circuit. Detection of wiring faults or any other faults that may be detected from receptacle to receptacle or alternatively from control units shown in BLOCK 3306-2 or a combination of both. Block 3304 provides direct communicative connectivity between 3306-1 and 3306-2, if needed.

For example, if receptacle BLOCK 3306-1D detects a fault, it can be configured to send a signal to either 3306-1C or 3306-1B to ultimately trip themselves. Even on the downstream of receptacle BLOCK 3306-1D at any other electrically connected apparatus (including possibly a traditional receptacle), if BLOCK 3306-1D detects the fault, the logic behind BLOCK 3306-1D will determine if a tripping signal should be sent to BLOCK 3306-1B or 3306-1C disabling partially or completely the entire circuit.

In BLOCK 3306-1, top receptacle BLOCK 3306-A is stand-alone receptacle on a single stand-alone (dedicated) circuit (e.g. may be used for a refrigerator).

The three lower receptacles BLOCKS 3306-1B, 3306-1C and 3306-1D.

BLOCK 3306-1B is the first upstream receptacle going straight to the circuit.

BLOCK 3306-1B has downstream connection to some lighting and is also downstream to another receptacle incorporating a CPU. That downstream receptacle is also controlling potential appliances.

And BLOCK 3306-1D which is part of the same circuit is also part of controlling any other electrically powered apparatus. In case of a fault, whether the fault occurs from D's downstream, or any other receptacle it still detects a fault. Then depending on the logic instigated by that particular fault, it may force trigger 3306-1B or 3306-1C to trip.

In the above example, where BLOCK 3306-1 has been referenced, 3306-2 may be replaced analogously, or one may have a combination of Smart Receptacles and inline control and/or monitoring units.

In an industry environment which upon detection of a fault, requires the entire line to be shut down, the system in accordance with example embodiments may shut down either just the downstream of D, or may send a forced shutdown to C either for its downstream or for its 2 plugs (up and down), or send a full shutdown to B, which in turn may send a false trip, tripping everything through the breaker.

As losing power may cause loss of communications, battery circuitry may be incorporated in the receptacles to maintain communications functionality in the case of losing power.

BLOCK 3308 is an additional embodiment providing for monitoring input/output control panels (e.g. being display screens) which allows users to monitor and/or control activity of the entire the house. In this embodiment, the control panel(s) can control any receptacle unit or downstream circuitry.

This external CPU in BLOCK 3312 enables co-ordination and is different from the CPU's referred to in BLOCK 3306-1 which illustrates an embodiment using plug receptacles (having outlets), and from BLOCK 3306-2 which illustrates in-line voltage and/or current monitoring and control receptacles without plug outlets.

The CPU may reside inside BLOCK 3308 in the Control and Monitoring panel(s) or can be self contained.

BLOCK 3312 illustrates database system comprising a CPU (e.g. processor) with a database stored in a memory. BLOCK 3312 may reside inside one of the monitoring control panels or be contained in its own separate box.

BLOCK 3312 acts as the central processing unit ("Brain") acting as an-line CPU and database system (BLOCK 3312) to host all the information, reporting logic and control logic. This CPU 3312 is connected either wirelessly or wired into the system. Each of BLOCKS 3306-1, 3306-2 and 3608 have own CPU and their own logic for their own usage.

However to monitor and/or control overall logic, interface and inter-relationships, the processor unit in BLOCK 3312 acts as an external processor providing control over the system.

BLOCK 3308 monitors the entire system. It illustrates additional functionality of monitoring and control (send messages) including any of the monitoring and/or control panels having segregated information to act upon.

The independent monitoring and control panels BLOCKS 3308-A, 3308-B, 3308-C, and 3308-D are shown as within their own secure area ("fence"). These monitoring and control panels illustrated are independent, enabling them, in an example embodiment if desirable, to be segregated, enabling the monitoring and/or control of specific I/O's. For example, this may be advantageous for use in multi family dwellings, and/or in environments where segregation is required such as business centers where one may want to separate the information, monitoring and/or control of power for different organizations. If sharing the same breaker panel, an example embodiment may segregate the information and/or controlled functions that is shared, enabling the segregation within the entire system.

BLOCK 3310 is a gateway 3310 which in this particular embodiment is connected to at least one of the monitoring units in BLOCK 3308 or may be connected through BLOCK 3312. In this example, the logic may reside at the circuit breaker panel 3301. Alternatively, the gateway 3310 may be connected through the 3306-1 and/or 3306-2. In an example embodiment, the gateway 3310 includes a Wi-Fi module for wireless communication and access to the fence. In an example embodiment, the gateway 3310 (or gateways) is the only way a device can wireless access the fence. In an example embodiment, the monitoring and control panels may be operably connected wirelessly.

BLOCK 3308 connects to the breaker panel and to the gateway 3310. In an example embodiment BLOCK 3308 can also connect through the communication plane to BLOCK 3306-1 and BLOCK 3306-2.

Triggers to launch any actions can be controlled by sensors, a switch or any other mode of communication that can give a command. The communication can be, e.g., smart message that sends identification of who triggered the request to turn something on, then through communication can check data base and perform pre-established action for that individual, based on the data base of BLOCK 3312.

Both receptacle and inline units can be controlled by a mechanical or logical device within the secure "fence". Communications between objects can be controlled as a function of information, parameters, criteria in the database system (BLOCK 3312).

By connecting to the fence a device can have access to "everything". An example embodiment of the fence includes a mini-network of low voltage (input from sensors). Another example embodiment of the fence is communication over the power lines, e.g. the hot power lines or the neutral power lines. Sensor information may be sent through low voltage wires or wirelessly, in example embodiments.

Alternatively, replacing the phase to phase unit of BLOCK 3302) as described in some example embodiments, in an example embodiment there is a neutral-to-ground communication between the electrical receptacles, with or without communication with the circuit breaker panel 3301. The neutral to ground communication comprises inserting a small current over the white (neutral) to the ground in order to establish a communication plane that is not going through breaker system, thereby eliminating the need for phase to phase communication because the neutral and the ground is common to all element. The small current is voltage modulated to encode the desired communication signal. The small current is transmitted over the neutral and returns through the ground.

Neutral to ground communication does not need to go through the circuit breaker panel.

Normally in the industry, communications taking place through inline wiring is interrupted if there is a power failure or disruption. Industry is typically limited to using the 110V carrier to transport a communication message. The disclosed means and processes in accordance with example embodiments eliminates this by inserting a low current over the white to the ground; and use this for communications. Communication between phases is not required with the additional advantage of preserving the communications in case of a breaker tripping event.

Industry is presently doing power line communications mainly by using hot to neutral communication and using the 110 v as a carrier.

This results in problems: a. 110 v carrier is not steady carrier, variation in power is numerous and may cause issues; b. in a breaker box phase to phase communication is a major issue. An example embodiment bridges the hot line power phases on the communications side to ensure phase to phase communications is possible. Traditionally, using the hot as a method of communication, as soon as breaker trips, the devices potentially could lose complete communication.

An example embodiment includes neutral-to-ground as a way of sending data communications. At least one contact is connected to neutral (white) and another contact is connected to ground. A processor is configured to send wired communications over the neutral-to-ground.

The advantages of neutral to ground communications are numerous. There are no phase to phase issues. By adding a separate power supply, for example long life D battery (lithium) or rechargeable battery, the system can supply power if no power is provided by the power lines. Ground to neutral communication is not affected by breaker tripping.

Another example embodiment includes a display screen having a user interface that controls other circuits, not losing communication is important. The system is not limited by the 110 v carrier and the associated limitations/problems. As the system is on Hot-Neutral small DC carrier or, in an example embodiment, RF communication can be done and allow for larger bandwidth to be transmitted.

Extra bandwidth on the power line communication taking place using ground and neutral wiring can be used to transmit data information or be used in isolation (e.g. using different frequencies) as a carrier for different signal(s) including but not limited to wireless (e.g. regardless of protocol such as WiFi, Zigbee, Z-Wave, Thread, Bluetooth etc.).

In an example embodiment, ground-to-neutral is being used as a communication conduit enabling the exchange of information between devices, for example by using a small (perhaps negligible such as <2%) portion of the bandwidth. The rest becoming available to be a carrier of any other information.

In an example embodiment, ground-to-neutral circuit is used as a communication conduit (sending/receiving data). In an example embodiment, a device acts as an interface enabling communications from wireless to communicate with a ground-to-neutral communication circuit. In an example embodiment, ground-to-neutral circuit is used as a wireless extender. In an example embodiment, ground-to-neutral circuit is shared by more than one communication function (e.g. isolation enables this).

With battery/capacitor (supercap) (e.g. lithion ion D battery, having a 20 year life, or a rechargeable battery), communications can be maintained if there is a power failure and/or breaker trips.

An example embodiment includes insertion of small DC current over neutral and ground. Then sending data over the DC current. Another example embodiment includes insertion of an AC signal over neutral to ground. Another example embodiment includes insertion of a RF modulation signal over the neutral-to-ground. For example, broadcast service such as Bell's service offering "Bell Fibe"™ is broadcasting their TV signals over WiFi. An example embodiment uses the disclosed system to broadcast TV signal(s) within homes over the neutral-to-ground, thereby decreasing the significant powerful radio waves current used.

Furthermore, Wifi would not be required when the converter incorporated a communication chip, complete TV broadcasting can be done in the home using the neutral-to-ground network.

As well, generally there are access points whereby someone will try to cover large areas with few access points (e.g. one). There are health issues related to high power electromagnetic wave emissions. A person may be affected by waves/radiation. There is need to solve wireless radiation. There exists a need to reduce signal strength while providing wireless communications sufficient to satisfy increasingly higher speed requirements. Reducing signal strength to provide coverage for smaller distances such as five or ten feet may be advantageous.

An example embodiment includes power line communications whereby the described electrical receptacle acts as a repeater, access point, mesh network node, etc. The RF signals are sent to a receptacle that is configured to be emitting from the wired connection backbone. A suitable protocol such as a Thread protocol can be used in a pipe (repeater). Each receptacle is configured to operate in a similar manner, for example as a pipe, repeater. An example embodiment includes using power line communications whereby each electrical receptacle is a signal line distributor, reducing strength of RFI, EMF. Access to the network is "localized" rather than transmitting over wide areas, sending data and acting as pipe. In another example embodiment a custom chip is used within the electrical receptacle that has Wi-Fi functionality and a processor of the electrical receptacle integrates the wireless communications within the backbone fence.

Another example embodiment is a neutral-to-ground communication device that comprises a plug that plugs into an electrical outlet. The communication device can further include an Ethernet port or other wired interface so that further communication devices can communicate over the neutral to ground power lines, via the communication device. The communication device can further include a wireless (e.g. Wi-Fi) module to wirelessly communicate with further communication devices, enabling those communication devices to communicate over the neutral to ground power lines. The communication device can be an Access Point, router, etc., in an example embodiment.

The access to the wired network backbone can move with the user. As the device of a user is accessing the particular Wi-Fi module and changes rooms, the same Wi-Fi signal comes from another electrical receptacle. The access point follows the user/device.

One aspect of this system is that there is a low cost device with power safety. This means that low signals are used instead of Wi-Fi related higher radiation.

Existing industry systems do not bypass the breaker on breaker panel using Ground to Neutral. Breaker only opens the hot in the industry systems. An example embodiment of the communication system is bypassing the breaker by using neutral to ground communications. Traditionally industry goes through line voltage, hot, for a single hot line phase.

In an example embodiment, the communication over the power line does not use the hot, as it is not using 110 v for communications; rather neutral to ground is used. In another example embodiment, communication between the electrical receptacles over a low voltage lines also bypasses the breaker.

In an example embodiment, a communication device includes a first contact configured for electrical connection to a downstream power line; a second contact configured for electrical connection to ground; a processor; and a communication subsystem configured for wired communications over the neutral power line to the ground by sending an AC signal over the downstream power line. The communication device may be a circuit breaker panel, a junction box, or an in-line control and monitoring unit.

The downstream power line may be a neutral power line, or a hot power line.

The wired communications may continue when a circuit breaker of a breaker panel opens a hot power line. The wired communications may bypass a circuit breaker panel.

In an example embodiment, a communication device includes a first contact configured for electrical connection to a neutral power line; a second contact configured for electrical connection to ground; a processor; and a communication subsystem configured for wired communications over the neutral power line to the ground by sending an AC signal over the neutral line. The communication device may be a device comprising a plug for plugging into a plug outlet, or an electrical device having a plug outlet. The communication device may be a circuit breaker panel.

The neutral power line may be a downstream power line. The wired communications may continue when a circuit breaker of a circuit breaker panel opens a hot power line. The wired communications may also bypass a circuit breaker panel.

A great deal of bandwidth is therefore available in neutral-to-ground communications to replace wireless. Rather than using wireless, the system is transmitting data using the described neutral-to-ground communications. An example embodiment includes replacing wireless in rooms by using extra bandwidth available in the described neutral-to-ground communications.

By establishing communication neutral-to-ground, the system is establishing a communication pipe while using only a very small percentage of it (in bits versus gigabits). Accordingly, have large excess bandwidth enabling the system to distribute internet to all the outlets that have communications in them. In each electrical receptacle (in-line or smart receptacle) there is a wifi (wireless) chip to provide communications in a room, which acts as a repeater. Similar to switching from one cell to another when driving a car; mobile devices can have the same handover operability for the rooms in a house. Rather than blasting wifi throughout a house, the system can use communication points of the communication fence to supply wifi to one room. Each room can have their own wifi.

An example embodiment is not restricted to using "a portion" of the neutral-to-ground circuit and the "remainder" being used for a means of creating wifi repeating. An example embodiment uses neutral-to-ground entirely; and another example embodiment uses the "remaining" bandwidth left over after a very small portion of the bandwidth is reserved for receptacle-to-receptacle monitoring and control communications.

An example embodiment includes distributed repeaters on neutral-to-ground circuit without using some of the technology features described herein (e.g., smart receptacles, tamper resistance, units). In another example embodiment, the neutral-to-ground communication is embodied by using a communication device that has a plug, and the neutral line is accessed through the neutral prong or pin of the plug, and the plug also has a ground prong or pin. In an example embodiment, the communication device is configured as an access point for wireless and/or wired access to the fence. In another example embodiment, the communication device is part of a load or appliance that is accessing the network through the neutral prong or pin. Another example embodiment does so in combination with the technology features described herein.

Typical devices in the industry, for example those that are plugged into a wall or Ethernet, do not neutral-to-ground. Industry is accustomed to sending data communications over 110V or low voltage wires, they have not traditionally considered communications over neutral-to-ground as the industry would not put 110 v through neutral-to-ground. And so the industry did not typically consider sending low voltage communications over neutral-to-ground.

In an example embodiment, the hot power line circuitry (110 v circuitry) is bypassed by the power line communication network. In an example embodiment, the neutral-to-ground circuit is used as a communications carrier using low voltage current. The neutral-to-ground circuit is used for the devices to talk to each other, as well as for external access (e.g. Internet, receiving a broadcast or RF signal).

An example embodiment does not require having to link all kinds of phases. In a warehouse, there can be many phases, e.g. 12 daughter panels with 2 or 3 phases in each. The neutral-to-ground circuit is common to all of them.

The modulation of the data, and sending current is described further. A driver sends current. Modulation of current and changes on that current that sends data/information. On neutral-to-ground, the device can be configured to send communication signal that is almost equivalent to point to point RF. In another example embodiment, the device is injecting a small DC current for communications over neutral-to-ground. Another example embodiment includes insertion of an AC signal over the neutral-to-ground. There is no 110 v being affected here. The device is configured to send a message on current travelling over neutral-to-ground or, in an example embodiment, an RF signal. The RF signal is transported over a small DC current. Traditionally, on 110 v they are modulating data. The device eliminates the need to communicate on line voltage or wirelessly. As well, the communication network backbone does not require special wiring. It is desirable to use existing power lines to create wireless network. No need to use Ethernet or line voltage lines.

A specialized chip can be used by each electrical receptacle which will receive the neutral-to-ground communication, the complete bandwidth of gigabyte(s) and on other side of chip it can then transmit full gigabytes into a room. Typical industry chips are not available for neutral-to-ground.

An example embodiment includes a means or process which takes data which is coming from neutral-to-ground, and re-transmits it through wireless, or vice-versa. An example embodiment uses a wireless-enabled chip to transmit through wireless. The chip takes data that originates from neutral-to-ground and re-transmit through wireless. A combination chip takes communications coming from neutral-to-ground and converts (transmits through) to wireless (wifi, zwave, zigbee), Bluetooth etc.

An example embodiment is a circuit board for installation to a device, comprising: one or more contacts for electrical connection of the circuit board to at least one power line including a neutral power line, respectively; a communication subsystem configured for communication with the device and configured for wired communication over the neutral power line to ground; and a processor configured to communicatively connect the communication with the device with the wired communication over the neutral power line to the ground. A microchip having a packaging with pins can contain the circuit board.

Referring still to FIG. 32 and FIG. 33, an example embodiment is a dry contact switch that results in a series of activities from the electrical receptacles (e.g. smart receptacle or in-line unit). A processor or microcontroller can be used to implement the functionality. An example embodiment uses dry contacts which can be shorted to effect activities over extremely long distances. For example, a large manufacturing assembly might cover 1-3 km. The system uses the fence backbone. For example, at every e.g. 10-20 feet, there can be provided a panic button in parallel allowing any of a few hundred panic buttons to send a "stop" message.

By shorting the two wires connected to two pins of the processor, and instead of inline in the circuitry the two pins are shorted triggering information to be sent to one (or more) of the receptacles or inline units. This can include a preset task or tasks assigned to a closed circuit. So by shorting the two pins of a processor, a set of instructions can be executed by processor (or indirectly via at least one other processor). In example embodiments this results in immediate shut down for safety purposes.

Furthermore this would allow for typical security system to be connected to entire system through a single receptacle or in-line power unit, at that point, keypad, iris scanner, fingerprint scanner, voice-face recognition can be configured to transmit over twisted pair and the processor of that specific on line controller or receptacle can send information to the CPU 3312 and trigger pre-programmed instructions.

Industry systems normally go to mechanical response versus to any of the power on the circuit(s) to be controlled. Industry systems often use line voltage (at wall switch), the live 110 v lies there. On the other hand, in some example embodiment the switching is low voltage or dry contact. Example embodiments can provide for cheaper installation and longer distance that can be covered.

The dry contact switch refers to shorting two pins of a processor. In response, to the shorting, information is sent to another device (e.g. down the line) so that something takes place as a result. The shorting of 2 wires within the system, in an example embodiment, results in a consequential action that has been pre-determined. For example, the processor in the receptacle or inline unit, when the 2 pins are shorted, triggers a preprogrammed series of information to be sent to database system (BLOCK 3312), which when receives these instructions triggers series of events. For example, in a manufacturing plant when someone hits the panic button, everything stops. This is different from existing industry panic buttons which are connected to live power, and not through an electrical receptacle as in example embodiments.

An example embodiment is a system which intelligently deals with shorting. The shorting triggers an action. Upon a short, a processor is specifying a series of activities to be performed (based on database information). In traditional industry cases, it's usually one power line action as a result of a short. An example embodiment includes sending data down over a communication line upon detection of a short. An example embodiment implements a power control sequence in response to the short. Hitting a button may trigger a series or sequence of other shut downs. In an example embodiment, controlling the electrical receptacle itself can be a result of a short.

The receptacle that includes the dry contact switch can stay live in example embodiments. The short of the two pins on a single receptacle can send a message to a device that is unrelated to that specific receptacle. The device can be another device that is contained in the entire system. By shorting the 2 pins on the processor of that receptacle, it can effect the closing/opening of something on another receptacle or device depending on what has been programmed.

In an example embodiment, the shorting of the pins triggers a message that the receptacle is to send another message(s). When message is received by the processor, it does database check to the database system (BLOCK 3312) that, based on condition detected, establishes and controls one or more receptacles and/or devices to be shut down (or what should be turned on; such as siren, sound). The triggering is low power or no power at all (e.g., dry contact, short).

The button does not necessarily have power in it, it is a short without a reference voltage. Note by shorting 2 pins on a processor, an action can be dictated or preprogrammed. In an example embodiment, that action is to communicate with the main CPU 3312 (FIG. 33) and tell the main CPU 3312 that there was a dry contact shut down by shorting the two pins. The main CPU 3312 in turn reacts to effect a major shutdown, when this occurs, to trigger "self destruct" sequence (shut down). A set of instructions which have been preprogrammed (or input in real time) are executed. The concept is that the dry contact is not only for that receptacle (as that receptacle might stay alive).

An example embodiment is a shorting of a device does not necessarily result in shutting down the particular outlet where the short took place.

An example embodiment is shorting of a device for anything other than shutting off an outlet directly related to the short. An example embodiment includes communication means that a short took place, which triggers other activities, not necessarily shutting power at the outlet. The communication can be either through low voltage sending information or just having dry contacts that by shorting them actions/instructions are triggered.

In an example embodiment, the low voltage is connected to Iris scanner, before entering room scan Iris, system recognizes the person, etc. Two pins on processor which allows twisted pair to be connected to. Any time the two twisted pairs are shorted a message is triggered which is sent to the database system (3312) to determine and activates the next action. This includes but not limited to acting as a panic button; or turning on specific lights; or based on identifying information, turning on or not turning on power to specific outlets. Some example embodiments are not limited to 2 dry contacts, can be more in some example embodiments.

Having two dry contacts which as a result of shorting allows the system to perform series of activities, sending information that contacts where shorted, to the database system (BLOCK 3312) where there are pre-determined set of actions to be taken based on the contacts having been shorted, e.g., not necessarily having anything to do with that particular outlet. The outlet can be configured for simply sending information to the power line phase that the particular short took place.

Reference is still made to FIG. 33, wherein examples of smart appliance and interaction with the smart receptacles 3306-1 and/or in-line units 3306-2 will now be described.

In appliances, example embodiments incorporate all described safety features of the described electrical receptacle outlets as well as communication ability to outlets/inline devices; and as well communicate to other appliances.

An example of a smart appliance is an oven having a camera. Based on face recognition, the oven won't be allowed to be turned on if it is a child who is recognized. The appliance is live, but the power button or use of oven is not permitted if facial recognition detected kid. Other devices can be used, such as biometric reader, finger print scanner, recognizing a mobile communication device and its associated identifier.

Example embodiments implement further safety features. The appliance, when turned on by the button, does not get any power from the electrical receptacle if the user is recognized to be a child. Other devices can be used, such as biometric reader, finger print scanner, recognizing a mobile communication device and its associated identifier.

In the case of an in-line unit 3306-2, in an example embodiment, a computer is hardwired, and the computer is provided a power profile of entire room, which can be controlled by the computer.

Typical industry breakers cannot communicate that the breaker has tripped. An example embodiment uses breakers communications that a breaker has tripped.

In an example embodiment, a power monitoring and control unit can be embedded in the circuit breaker panel 3301 in the same manner as embedded in an appliance, and upon trip, the circuit breaker panel 3301 can send message to entire system or to external unit/medium via the gateway unit, that the breaker has been tripped.

In an example embodiment, when an appliance wishes to be turned on, a message is communicated to a smart receptacle 3306-1. The smart receptacle 3306-1 is configured for testing if there is no power, concluding that a breaker has been tripped, e.g. voltage or current not at a specified level or within a threshold, or no voltage or no current, and communicating a message that breaker has tripped. It is possible to identify which breaker using information of knowing which circuit does not have power, since that is the hot power line phase that the electrical receptacle is installed.

An example embodiment includes monitoring current and voltage and determining that a breaker has been tripped, and sending such information or outputting to an output device, e.g. display screen.

As the inline fence communication is not breaker sensitive in example embodiment (the receptacle is sensitive for power, but not for communication) in the event that someone tries to plug a load into a receptacle or turn on a load from an inline control unit and no power is available, then the electrical receptacle can send message to an in-house screen, or wirelessly to an external source like a cell phone or user's device or to a monitoring station, that no power is available, e.g. "check breaker".

In an example embodiment, referring still to FIGS. 33, 3306-1 and 3306-2 can determine that a breaker was tripped and can send a message "trip breaker". Alternatively, the communication device can be embedded in the breaker and the breaker itself can send message and based on logic in breaker it can be configured to also send out the reason for the tripping.

An example embodiment includes a breaker (or circuit breaker panel) that is configured to transmit information generated within breaker. The described the technology for electrical receptacles can be incorporated into a breaker in an example embodiment. For example, the breaker can communicate its load, potential power availability before a trip, allowing for reports to be done, on screen or printed of the entire power consumption circuit by circuit, or communicated to a monitoring system. An example embodiment includes adding breakers as communicating devices within the Internet-Of-Things (IoT) market. An example embodiment includes a breaker configured for collecting the information related to the tripping. An example embodiment includes the breaker communicating that information. An example embodiment includes the breaker being within the secure communication fence.

FIG. 33 illustrates communication within an appliance. As appliances are able to be connected via a smart receptacle and/or inline communicating unit, not only from power standpoint, but also communication standpoint. The system (BLOCK 3300) does not preclude communication via a power line. Further, the inline power monitoring and control board can be incorporated in an appliance; thereby enabling communications with the other receptacle (in-line units, smart receptacles, breakers).

In the case of an appliance having a battery system the power monitoring unit can be configured to detect 100% battery charge and shut down battery charging from the system. The electrical device can stop the power and send message ("unit fully charged"), the industry does not have such communications in theirs. The electrical receptacles stops providing power (e.g. deactivates the applicable TRIAC) in response to the battery being fully charged.

In an example, this does more than protecting against over charging, the system stops charging and continue automatically when there is a decrease in battery, and when the plug is plugged in.

FIG. 34 is a communications diagram, which illustrates an example embodiment. FIG. 34 is a block diagram of the possible communication activities deriving from electrical activities that are self triggered or remotely triggered within the integrated system illustrated in FIG. 33.

BLOCK 3410 illustrates a gateway control unit which acts as middleware or a hub, in that it can connect input source to another existing external controlled system. In an example embodiment, the gateway control unit 3410 describes the functionality of the gateway 3310 (FIG. 33). In an example embodiment, the gateway control unit 3410 is the only way in which external devices can be authorized to access the fence, either wired or wirelessly. Applicable passwords and/or IEEE 802.11 protocol implementation can be used to verify and authenticate access to the fence. In an example embodiment, the gateway control unit 3410 can be configured as an authentication server, such as a Radius and/or AAA server.

Whereas BLOCK 3410 illustrates activity triggering outside a fence; BLOCK 3400B illustrates command sent by a unit contained within the fence. BLOCK 3400A may be a user input; BLOCK 3400B may be a sensor input; BLOCK 3400-A may be from an external input source such as manual input, mobile device, existing control unit, etc.

BLOCK 3406 shows that a Smart Receptacle or an in-line control unit (in example embodiments with or without communications capability) may be activated in multiple ways:

BLOCK 3406-C illustrates a receptacle having a load connected to it. This triggers the communication activity of sending power to the actual unit. Alternatively the triggering of the activation of the receptacle can be done by an external device, 3406-A whether a sensor or a switch, or any capable device.

The same device may either activate a receptacle, or an in-line control unit in 3406-B.

Upon the activation of an inline control monitoring unit or a plug receptacle, Block 3402 illustrates that a message can be sent (3402-C) over wire or over wireless.

3402-A shows the case of wired with an older breaker panel but incorporating phase to phase communications from FIG. 33 (BLOCK 3302) whereby one device per phase can be installed to link communication between the phases.

In an example embodiment, a message is sent to the CPU of the database system 3312 which retrieves from its database the actions required upon either a receptacle being activated or the inline control.

This information is used by one or more of the display panel units (BLOCK 3400A being equivalent to BLOCK 3308 in FIG. 33).

In order to inform one or more users or one or more systems, that a specific receptacle, for example, was activated. Furthermore upon sending a message to an external device or system, the system may wait for confirmation or further instructions.

The triggering can be done using inline control monitoring as illustrated in BLOCK 3406.

The logic determines whether it was safe to activate or not.

The inner logic inside the CPU of the two apparatus (either or both Smart Receptacles or in-line control & monitoring units) are determining whether or not it is safe to proceed, or by connecting to the CPU unit shown in 3302-D.

Where 3400A or B the message may come from a display panel unit in which case it is sent over wired or wireless to the unit control processor, which has to run a safety check to see if its safe to power the specific plug receptacle or inline control unit receptacle. If it is safe, then in the logic of 3406 a message is sent to the plug receptacle or the inline control receptacle unit via wire or wireless (3406) and at that point the information to start the downstream control is sent.

3400-C shows a list of potential control actions. 3404 lists potential downstream items that may be remotely controlled; e.g. lighting, appliances, electrically powered apparatus.

Accordingly, this enables the turning on-off, or activating or de-activating, dimming and/or augmenting, and the sending of messages.

In an example embodiment, there is a complete series of triggers that can launch any of the actions. These can be controlled by sensor(s), switch(s) or any mode of communication that may launch a command. Two wires transport a signal which may be triggered by a simple switch or smart message information which identifies the person who sent the request to turn something on, then based on information about individual appropriate actions can be taken.

Both receptacle and inline unit may be controlled by logical device within the fence. Logic in CPU 3312 can be configured to determine the action(s) to be taken.

By connecting to 110 v circuitry, all information is available.

An example embodiment also may include low voltage network within the system (inputs from sensors in blocks 3306-1 and 3306-2 may be low voltage). May send communications wirelessly or through low voltage wire. All the apparatus are all connected through ground, neutral and connection to a 110 v phase. In an example embodiment, communications between devices are going through the breaker panel 3301 to communicate with each other.

Figure 35:
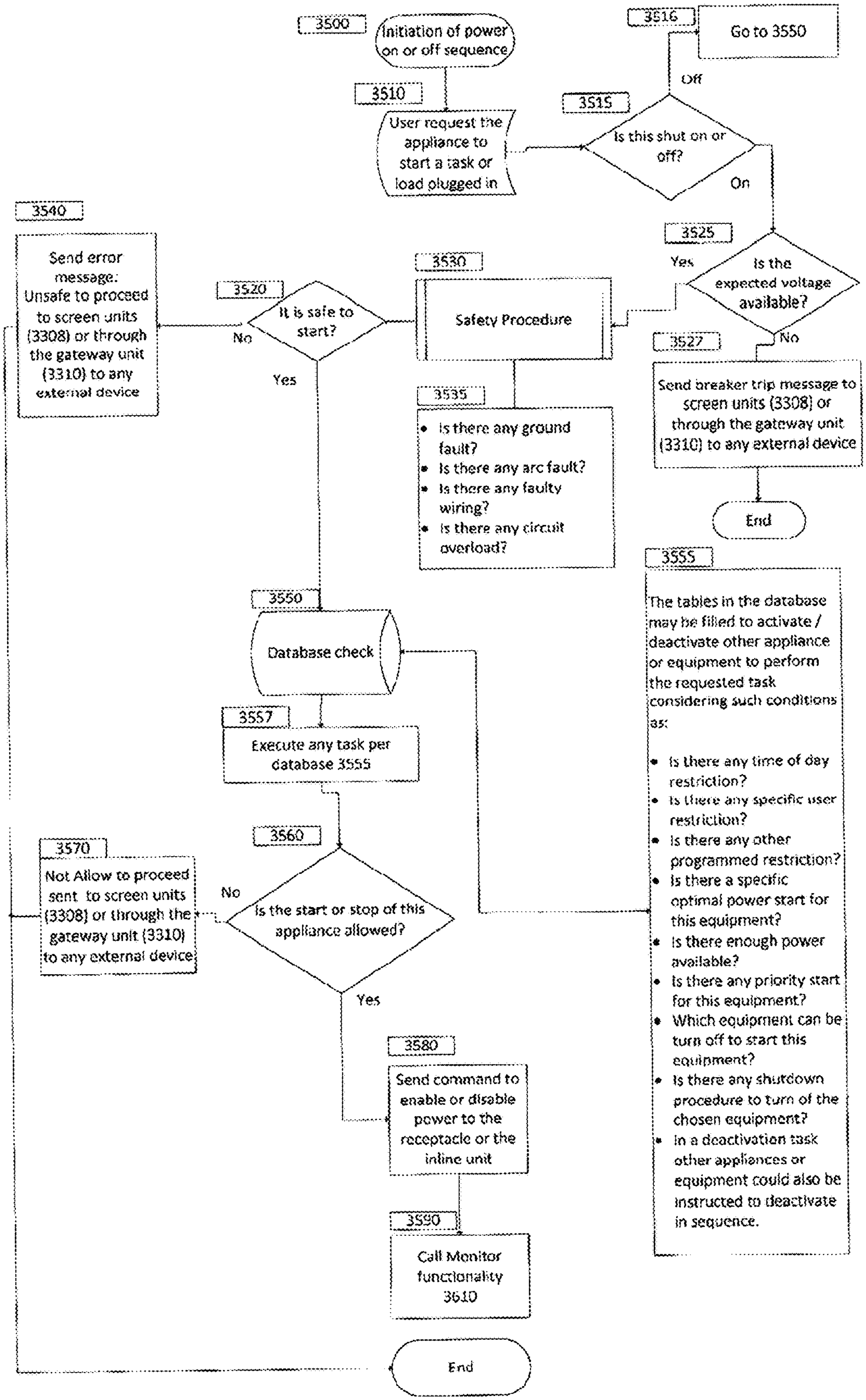
FIG. 35 illustrates a processing task flowchart of initiation of power upon a user-initiated or load request.

FIG. 35 illustrates a processing task flowchart of criteria and activities related to initiation of power upon a user-initiated or load request (Step 3500). At the first step 3510, a request has been initiated (for example from an input screen, or remote gateway, or switch on a wall to turn on or off power to the circuit of a receptacle or an in line monitoring and control unit; or a plug is plugged in to a particular receptacle, or request for the downstream on a receptacle.

For example if there is a single string of lights, the entire string can be turned off remotely. Each circuit is independent so data base can include instructions to power and/or de-activate power for a particular circuit on a receptacle (such as upper outlet, lower outlet or downstream) or in line unit. Turning on or disconnecting power may be triggered by a number of events, including but not limited to: plugging or unplugging a load; sending a command to an in line unit; or sending a command to the downstream of a receptacle or in line unit.

In addition to processes to be initiated upon the turning on of power, there are circumstances as well, upon which it may be desirable to have initiation of processes which take place upon disconnection of power.

Devices may be unplugged for a variety of reasons. Although the action of unplugging a load may not be prevented, a message (including but not limited to audio, display, video etc.) can be transmitted to other devices, outlets, receptacles, in line monitoring and control units, and user(s) (or to a cell phone, an alarm monitoring company, etc.) communicating that a particular critical device has been unplugged; for example in the case of a critical device such as a dialysis machine, artificial respirator, etc. being unplugged.

Similarly, if such device(s) is hardwired into an in line control unit rather than being plugged into an outlet or receptacle, a communication might be initiated and for example an affirmation response or a security password might be required prior to permitting the power to the device to be disconnected.

Step 3515 establishes whether power is being turned on or off. If power is being turned off, the process continues to the power down sequence. Step 3560 considers safety issues (including but not limited to ground faults, arc faults, faulty wiring, over current etc.) related to turning on or off equipment and then proceeds to step 3580 which will enable or disable the receptacle or in line monitoring and control unit, or specific circuit of each. If at step 3515 power is being turned on, then the next step proceeds to 3525 to see if power to the receptacle is available. Step 3516 checks the database at step 3550.

If yes, proceeds to a first set of safety procedures; 3520 send message that it is unsafe to start (3540). If safe to start, proceeds to 3550 for a data base check. At step 3557 database commands are executed; if any of these commands are a start or a stop, then proceeds to step 3560; otherwise the process continues to step 3570. If it's allowed, the process continues to proceeds to step 3560, to enable the power. Once power is enabled, the circuit becomes monitored by the process in FIG. 36.

Once a load request has been initiated, at step 3525, the voltage is verified to be as expected; for example, 110 v or 220 v (or within an acceptable range of the expected voltage. Should the voltage not be as expected (block 3527), a message is sent to inline display screen(s) or through the gateway to any external device indicating that the breaker is tripped. In an example embodiment, the circuit breaker is tripped, and/or the power to the outlet is disabled. In an example embodiment, there is a system measuring a voltage on a circuit, and upon determining that the voltage is not within an acceptable voltage value or (predetermined) range, communicating that the breaker has been tripped.

If the power is as expected, the process continues to block 3530 to test for one or more safety conditions. At step 3520, should any of the illustrated faults in block 3535 (examples only) be established, then it is determined that it is not safe to start, and the process continues to block 3540 whereby an appropriate error message notification is transmitted to an e.g. display screen (3308) or through a gateway unit (3310) to any external device. At this point power is not provided to the appliance or load which may have been plugged in.

At step 3520, if it is determined that it is safe to proceed to initiate power, at 3550 a database check is performed (as illustrated with examples in block 3555) providing criteria determining whether the particular outlet or appliance should be powered, whether other equipment or appliances should be powered or have their power disabled, whether a particular sequence of turning power on or off (de-activated) should proceed, and more.

Following the database check (Block 3550), at step 3560 if the start of the particular appliance or load is not permitted based on the database check, then step 3570 proceeds, transmitting an appropriate communication to a displace screen (3308) or through the gateway unit (3310) to any external device. Providing of and/or disabling of power to outlets, receptacles, devices, and/or inline units proceeds according to the database criteria established and identified in 3555.

Following the database check (Block 3550), at step 3557, should any load or device require power, then the 3500 routine can be initiated on a sequence of its own for the particular device(s) identified in the database.

Following the database check (Block 3550), at step 3560, if the start of the particular appliance or load is permitted, then at step 3580, a command is sent to activate power to the receptacle or the inline unit. In an example embodiment, information related to the activation may be communicated to any output means such as an inline display units (3308) and/or through the gateway unit (3310) to any external device.

Figure 36:
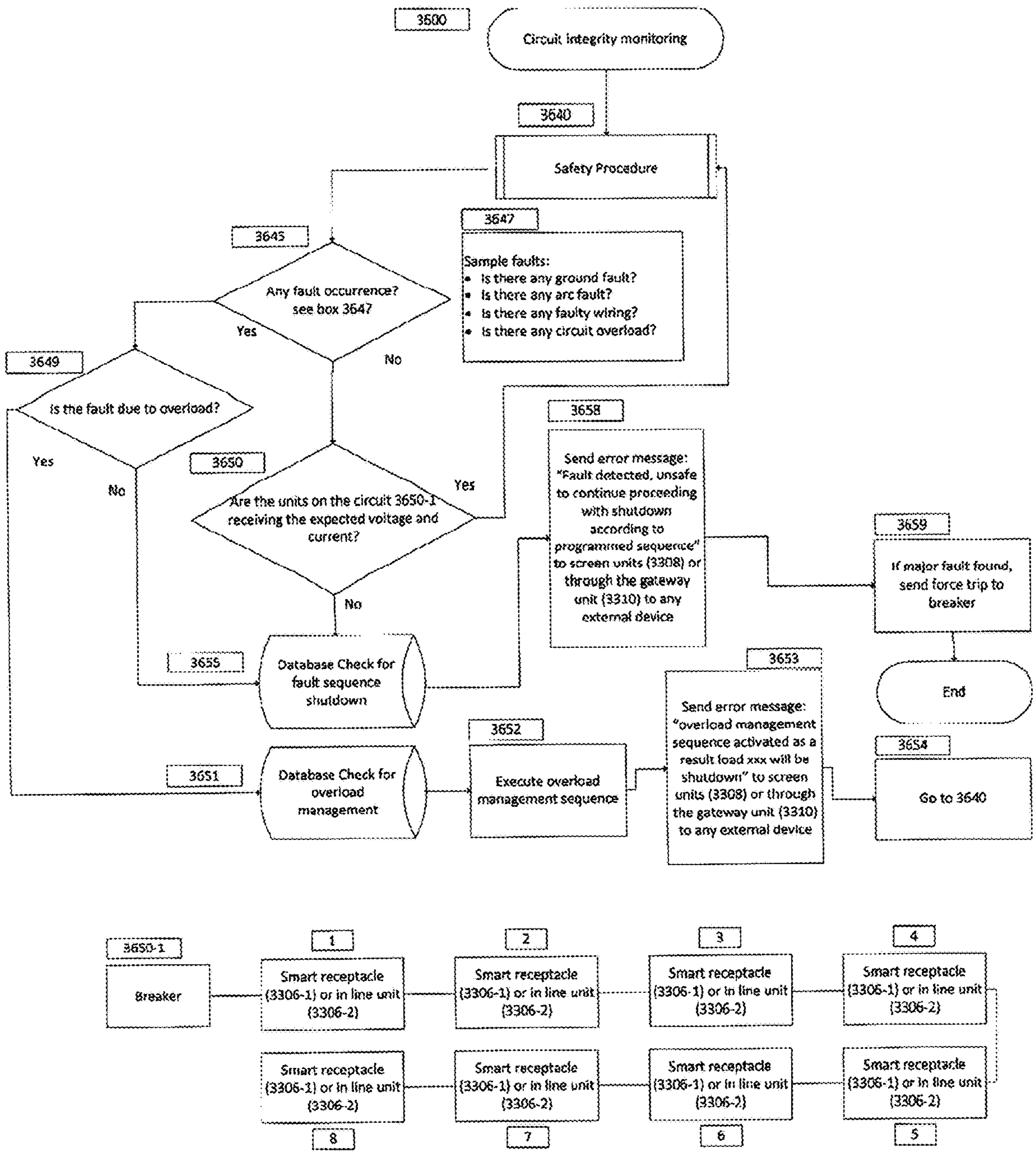
FIG. 36 illustrates a processing task flowchart of ongoing monitoring of the integrity of power line circuitry and response to fault(s), and block circuit diagram of an associated system.

Upon power being activated the processes outlined in FIG. 36, to monitor the ongoing integrity of the circuit is initiated. The processes in FIG. 36 apply to all units which may have been activated as a result of the database check at step 3550 as illustrated in 3555.

In FIG. 35, the process constantly waits for load request(s) and for the occurrence of possible faults (e.g. Gfi, Afci, faulty wiring, overcurrent, etc.). Block 3555 is organized by different categories of information in a database that is being checked. Block 3555 a set of possible instructions preprogrammed in a database (alternatively, dynamically input by user) to allow or disallow turning on either an appliance or plug load.

For example: there can be groups for specific appliance in discussion such as time of day or specific user restrictions or based on the circuit availability information or specific power requirement for that equipment. If there is not sufficient power available for that specific equipment, is there a priority list that can shut down temporarily other equipment to provide sufficient power for this equipment/appliance.

In an example embodiment, the system can therefore implement an "acceptable" overload. This differs with some existing standards or factor-of-safety industry practices that require conservative breaker selection, since those methods cannot react quickly or cut off power at the particular fault.

If there is no issue, e.g. wiring not heating up, integrity of circuit is ok, the system operates as no longer. In other words, the system design is no longer bound by existing 80% "safety" standards. Some example control of the breaker trip may even exceed 100%, for example go to 105% (acceptable "overload").

Referring again to FIG. 33, note that there are loads that are downstream to the receptacles. A smaller version of power control and monitoring unit can be further than downstream into electrical components and talk directly to the load (e.g. appliance).

In an example embodiment, a toaster can have low voltage battery controlling circuitry without power, and upon time to start toasting can be configured to talk to the receptacle. This can have advantages: limiting power consumption to minimum; providing outstanding safety as although appliance is connected, it would not receive power until required (and power safety features). There are additional green energy savings (besides safety).

All power control and monitoring can be concentrated on single circuit and applied to the appliance which becomes arc fault, ground fault, surge, over current etc protected as well as supplying power to the appliance itself.

Any appliance, engine, pump, anything functioning with electricity, can be equipped with functionality, subset of micro circuitry. Bringing households, commercial, industry—closer to complete power control. Circuit gets closed as lever is brought down (live) but electricity is always there with possibility of getting electrocuted. For example, a knife closes the circuit. As soon as toast pops back up, there is no longer any power provided by the electrical receptacle. In the present case, a utensil accessing toast would have no possibility of shorting circuitry as power is off. Circuit can be embodied in any appliance.

An example embodiment is an appliance decides when to turn power on from the electrical receptacle. A battery can be used to keep logic control alive. There is no 110 v until toaster lever pushed down; then within few milliseconds when lever up again, sends message that power no longer needed. To prevent a person from being electrocuted, when lever off, the toaster communicates with plug and gets power when needed only. The circuit board can have small battery to keep logic on. Until lever is at the bottom, there is no power. In an example embodiment, toaster can communicate through the ground-to-neutral communication phase (if it has ground). The toaster can configured to send low dc voltage to keep logic control of the plug up.

Example embodiments can require one circuit board, rather than the multiple circuit board devices described herein. The device needs only one, in an example embodiment.

An example embodiment is a means enabling an 'appliance' (e.g. toaster) to have safety features and not be powered until the processor of the electrical receptacle decides it is ok to do so based on safety features or other criteria, and upon said decision activate power to the appliance.

An example embodiment is an appliance comprising of a CPU monitoring current and/or voltage having communication means to receive external instruction to turn power on.

Other appliances or loads can be used in other example embodiments, and are not limited to a toaster, for example. Extend one step further the "no juice until needed" by bringing it to the appliance.

Since there is unit to unit (receptacle or inline units) communication. Circuit starts at breaker, all receptacles talk to each other; and from one to the other they know the current that the other one is expecting. If not getting what is expected, then there is a wiring issue and can establish preprogrammed events.

Conditions, actions based on conditions, profiles. When there is means to identify a person, the system (electrical receptacles) can be customized to that person's needs. The system can restrict others based on their profiles, so that power access to an electrical receptacle is restricted. For example, an appliance such as a stove or oven can be configured with a camera or biometric reader to identify the person who is turning on the appliance. The identification of the user can be verified against the database system (BLOCK 3312). For example, the person turning on the appliance may be a minor that is under 18 years old, and appliance will request the electrical receptacle to turn on power, and the electrical receptacle will not activate power upon receiving the instruction. Similarly the electrical receptacle will activate power to the receptacle if the person is authorized (e.g. authorized adult). The database can be stored as a white list and/or a black list, in example embodiments.

In an example embodiment, the CPU of the electrical receptacle knows the current on the circuit when a device is being plugged in, so if exceeding 15 A when plugging in a device, do not activate the electrical receptacle and can send message to closest screen unit that have exceeded capacity of circuit (e.g. total 15 A). When another device is plugged in, while not allowing the "offending" device to be plugged in, the another device may be activated with power if permitted.

The system can recognize power losses, and identify which wires have a problem. An example embodiment is an apparatus within a circuit talking to each other, preventing overload and electrical fires by monitoring current all the way through. Even if improper wiring (too small gauge) the system can identify and then eliminate potential electrical fire. Electrical fires, accompanied by power losses, the CPU of the electrical receptacle know where power has issued and so does not turn power on. With the described systems, a designer can exceed 80% of 15 A safely, and the system can prevent overload specifically.

In an example embodiment, an electrical device includes: a plug outlet comprising a first contact configured for electrical connection to a first hot power line having a first phase and a second contact configured for electrical connection to a second hot power line having a second phase, a first switch connected to the first contact in series relationship with the first hot power line, a second switch connected to the first contact in series relationship with the second hot power line, a processor configured to control an activation or a deactivation of the first switch and the second switch, the switches being in a deactivation state as a default when there is a plug in the plug outlet, the processor configured to determine that electrical conditions are safe, and in response activate the first switch and the second switch to distribute two-phase power to the plug, wherein the plug is from an electric vehicle.

In example embodiments, using a processor can be used to optimize power sent to device. For example, deliver specific wattage based on voltage and current the device wants to receive. This provides modification of the signal in real time. The electrical receptacle can be configured to optimize and deliver power actually sent to device to its performance characteristics. For example, if an engine works best at 12.3 A at 110 v; if voltage fluctuates to 120 v, the electrical receptacle can be configured to reduce to 11.7 A, for example. The electrical receptacle can dynamically always ensure target power is provided to engine for example.

In an example embodiment, the electrical receptacle can be configured to control both voltage and current delivered; therefore constantly modify and send what's ultimately and optimally required. For example, skipping phase, or even injecting additional current from a power source to compensate.

For an appliance, in an example embodiment, the electrical receptacle can attenuate or enhance based on voltage variation. If current is optimal then any traditional system would work; but if power fluctuates, the described electrical receptacle can deliver specific power, and control current and can let voltage fluctuate, and make sure power never changes with respect to a target power.

Another example embodiment includes attenuating or enhancing (increasing) wattage to optimize use of appliances, using an electrical receptacle.

Another example embodiment provides further protection when within the appliance:

for example the feed from the wire is encapsulated in a waterproof environment so that when the 110 v (example) circuit is opened no person can get electrocuted as it still is not closed by the water infiltration to live wires. One aspect is that the high voltage side is isolated so that the water penetration cannot close the circuit.

Rather than destroying the circuit of the toaster (frying the circuit) the circuitry detects the ground fault and shuts down (e.g. stays "off", doesn't turn on the triac) the power to the toaster. For an appliance such as a hair dryer, line voltage side is completely isolated If GFI the low voltage side gets disconnected completely.

In an example embodiment, one set of instruction that can be preprogrammed. One step further is a smaller version of a circuit board and providing with communication unit to appliance manufacturers. For example, a toaster can be equipped with system. It would have zero power until push lever all the way down, coordination between the appliance safety system of the toaster and the circuit board can be achieved either with prioritization or timing. Then toaster would communicate with the plug (e.g. request 110 v). When toast comes out, it communicates in milliseconds and it becomes tamper proof.

Devices, appliances (toasters, oven, etc.) can be safe with power not being turned on unless there is no safety fault. An example embodiment is a safest appliance whereby power isn't turned on unless no fault. An example embodiment is the appliance is communicating with the outlet.

An example embodiment allows different receptacles and/or inline units to talk to each other and also verify that the voltage and current expected to arrive is actually arriving; and if not, then declaring that there is a fault and the cause/reason, and communicating that that reason should be investigated. Therefore shutting down and, in an example embodiment, sending a message to investigate. For example, faulty wiring, faulty equipment, etc. Until this is resolved, the power will not be turned back on.

Step 3510: examples of sending a request to equipment/appliance to start a task includes but is not limited to turning on elements for toaster; turning on elements of a stove; turning on lights. If someone plugs in an appliance in a receptacle, this makes the switch turn on and requires an action.

Sending trip to breaker: In the database, if an event is of such magnitude that it's safer to turn entire circuit off. Refer 3300 which refers to 3306-1 and 3306-2 which illustrates on a single circuit smart receptacle and inline communications module can be interspersed, mixed matched.

FIG. 36 illustrates a processing task flowchart (3600) of ongoing monitoring of the integrity of power line circuitry and response to fault(s), and associated block circuit diagram (3650-1). Block 3640 is a starting point describing ongoing monitoring facility of circuit integrity. The process loops monitors for faults, including but not limited circuit overloads, until a fault is found. If fault is found, then step 3645 proceeds with a data base check at block 3655, which initiates a fault sequence shut down. If fault detected at step 3645 is an overload, at step 3649 the entire circuit is examined. Both occurrences trigger access to the data base but different sections. However, one is searching for a string sequence shutdown 3655; the other is looking for information related to alternative priority access to available current on the circuit 3651.

Example, if equipment on the circuit can be temporarily cut off, to give another plugged in device priority. After step 3652 a user may be informed of an action taken (step 3653) after which the integrity of the circuit is re-established therefore returning to step 3640 (step 3654).

For example, in a kitchen, should a device, appliance require power, but such power would exceed circuit safety considerations or specifications, then a refrigerator can be turned off for a few seconds or minutes, and then be turned back on again, when there is sufficient current. Accordingly, data base information may provide either a specific shut down sequence due to an electrical fault, or the circuit load balancing and/or prioritizing can take place if there is an overload. In the data base for example with medical equipment one can have a priority sequence for certain equipment over others which are not as dangerous to shut off, or for a limited time, etc. The disclosure herein can also be applied to load leveling and peak shaving applications. Upon detection of a fault, at step 3658 a message can be sent to a display screen or gateway.

In case of power overload, a circuit balancing message can be communicated (3653) that temporarily a particular piece of equipment had its power disabled in order to allow another specific load to be powered (as specified in the data base) and prevent circuit overload. The data base can include sophisticated If/Then conditions.

Step 3659 examines and acts upon if a major fault is detected. If so, a force trip can be sent to the circuit breaker causing it to trip.

In an example embodiment, on one side continually monitor if there is a new load request. If there is, then call subroutine at step 3510. If there is not, continue monitoring. At same time, constantly monitor the safety of the circuitry (e.g. arc fault, ground fault, faulty wiring, etc.). In order to do so, constantly monitor if all the units along a circuit are receiving the expected voltage and current based on the circuit loads; if true, then loop back to 3640; if false make decision at step 3649 which can go to 3655 and do a database check (step 3655) to check for the shutdown sequence required based on the event that was monitored. At step 3658, send a message to the closest screen or any unit programmed through the gateway that has been pre-programmed to receive that message. In case of major fault the first unit in the circuit sends a force trip to the breaker at which point the circuit is fully shut down. In order to be re-established it needs to go back to step 3510 procedure for restarting. Step 3658 sends an error message. Step 3659 sends force trip to the breaker.

Decision step 3649 can determine if the fault is due to overload, if so step 3651 checks database for overload management task or sequence of tasks. Step 3652 executes overload management task or sequence, step 3653 sends applicable error message, and then step 3654 proceeds to step 3640, e.g. continuous monitoring.

System 3650-1 in FIG. 36 explains how the circuit integrity actually works and the relationship between each and every one of them. When the breaker (3301, FIG. 33) is intelligent, it becomes a device within the fence as illustrated FIG. 34. The breaker 3301 would be the first one in line, in an example embodiment. In the event that the breaker is smart breaker with the circuitry described herein, the breaker is part of the secure fence communications network.

In FIG. 36 and system 3650-1, intentional tripping of the breaker can also be implemented. Smart breaker would not need to control the receptacles 1 to 8. It can communicate directly with appliances/loads in an example embodiment.

Cross-interaction can be implemented. Normally a breaker trip and would result in shutdown of everything. In the present case the system can be configured to shut down certain receptacles based on load created issues; without tripping breaker.

FIG. 36, beginning at 3600 discloses ongoing circuit integrity monitoring. The intelligence being on all the equipment, e.g., receptacles and/or inline units having a CPU monitoring and controlling current and voltage. The circuit allows for a complete monitoring and acting on all possible events that can occur on an electrical circuit; including but not limited to faults such as ground faults, arc faults, overload conditions, etc. In an example embodiment, specific action(s) can be triggered based on a data base preprogrammed action plan. Block 3600 monitors power quality and safety conditions on a continuous basis. Block 3650-1 is a graphic representation of an electrical circuit behind the fence. 3650-1 describes units on circuit receiving expected voltage and current.

FIG. 3650-1 is a representation of an electrical circuit illustrating a receptacle(s) and/or in line monitoring and control unit(s), showing that the voltage and current can be monitored at each and every step, and detecting the fault if the expected voltage or current are not what is expected (e.g. due to faulty wiring). The relationship between receptacles and in line units is primordial. In case of major event, system can force breaker to trip.

If a breaker itself incorporates the processes or means herein disclosed, within the security fence, then breaker device itself can be incorporated within security fence. Monitoring the interaction of every unit in a circuit and being able load balance, shed off load based on data base priorities.

In FIG. 36 at Block 3650-1, the concept of each receptacle or inline unit are ordered in sequence on a circuit and they interact with each other:

They exchange load, voltage, current and safety condition.

From one to the other in sequence with the system it is now possible to calculate expected voltage and current and compare it to actual values and therefore being able to detect abnormal losses, detecting potential hazards and taking action based on the preprogram sequence of event in the database.

Based on the gravity of the fault certain units can be shutdown or a message may be sent to unit 1 to send a trip to the breaker.

In the event that the breaker is equipped with the logic and communication circuitry than it becomes part of the calculation and string of actions.

In all event, messages can be sent to the monitoring screens (3308) or to the gateway unit (3310) for external apparatus depicting the events and their gravity.

This functionality can also be used for load measurements and prevent breaker trips, preserving the integrity of the entire circuits and unexpected shutdowns.

Step 3640 continuously monitors both safety and load requests (step 3510, FIG. 35). As long as there are no issues detected at step 3645, another decision is made at step 3650 which can proceed so that the monitoring will continue (3640) continuously monitoring if there is a load; if request for new load it will call on 3525 (FIG. 35). The information at 3640 will know the load went down; but went down in the expected manner (not a fault). Decision step 3650 can also determine that the units on the circuit 3650-1 are not receiving the expected voltage and current, and proceed to step 3655.

The process illustrated maintains the integrity of the circuit; can prevent at minimum unexpected shut downs, unexpected breaker trips; and because of sensitivity of software the electrical receptacle can control the trips far quicker than any breaker can. In the event the breaker does not have logic and communications circuitry inside it, then the first receptacle or inline unit on the circuit will act as a gateway and will have ability to send forced trip to the breaker if required.

Figure 37A:
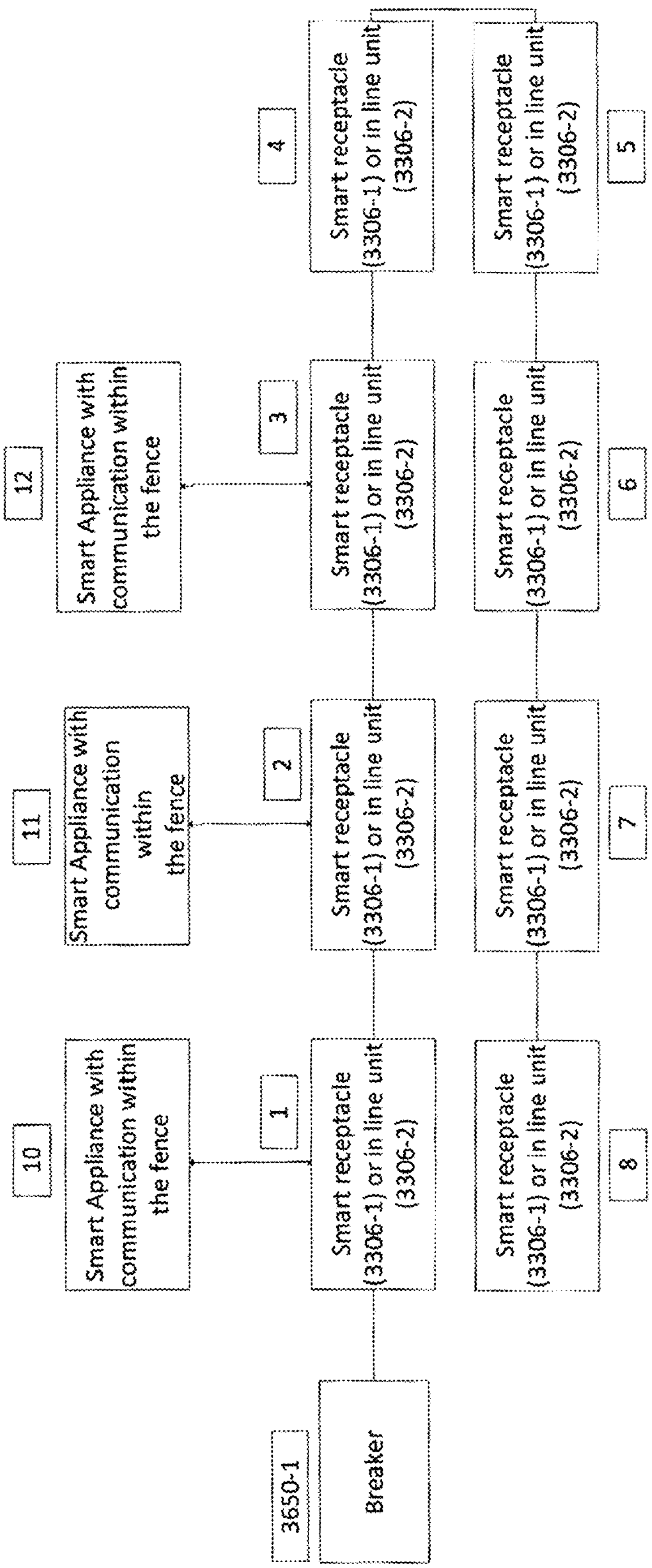
FIG. 37A illustrates a block circuit diagram of another example embodiment of a system which includes smart appliances.

FIG. 37A illustrates a block circuit diagram of another example embodiment of the system 3650-1, which further includes smart appliances. FIG. 37A shows appliances included to network of receptacles and/or in line monitoring and control units. The sensors monitoring the inputs and the outputs of the voltages, can send messages to the local intelligence of the appliance.

Figure 37B:
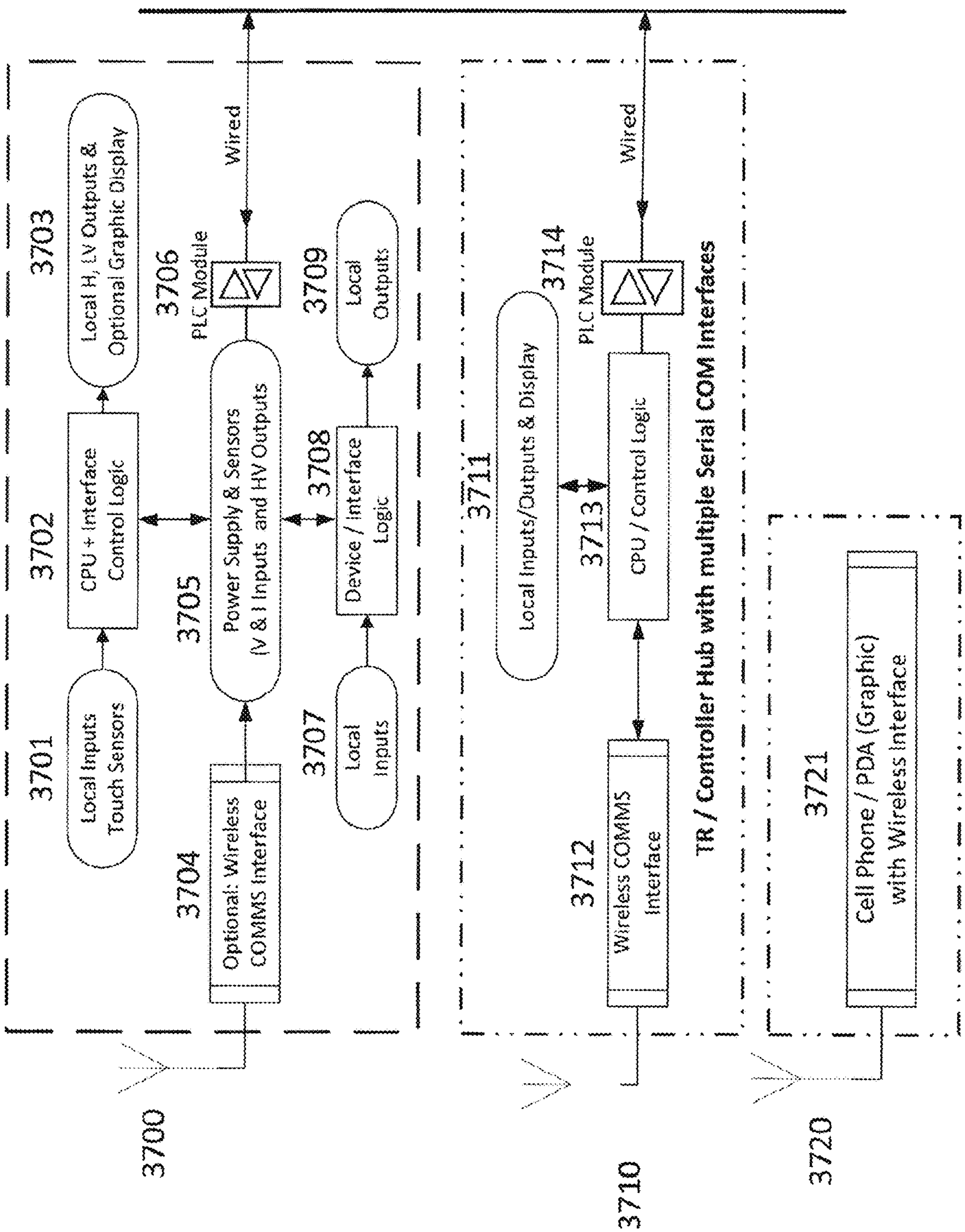
FIG. 37B illustrates an example embodiment of micro-circuitry that can be integrated into an appliance or another powered device.

FIG. 37 illustrates an example embodiment of microcircuitry (e.g. in a microcontroller/microchip) that can be integrated into an appliance or another powered device. Shown are BLOCKS 3700, 3701, 3702, 3703, 3704, 3705, 3706, 3707, 3708, 3709, 3710, 3711, 3712, 3713, 3714, 3720 and 3721. Block 3700 describes another embodiment, namely a minimized version of the circuit board with the capability of being integrated inside appliances. The circuit board includes a processor and memory, and can be contained in a single packaging, for example. The functions that are taking place are similar to the ones taking place in a receptacle, but specific to control a single power input. This can allow the complete monitoring of voltage and current within an appliance, allowing therefore communication of the security fence to be pushed back in one step further into the electric circuitry. It can be used both independently just to monitor power and currents and power faults, or can be used in conjunction with the communication module, thereby allowing it to be used within the communication matrix referred to in FIG. 33, 3306-1F and 3306-2 F, being within fence while having access within the communication matrix.

Block 3710 overall shows the complete functionality of the system that allows for constant monitoring the faults, allowing the added security of making an appliance Ground and Arc fault proof, thereby extending the safety net one step further. Block 3701 indicates an input trigger by a touch sensor. Upon the sensor activation, the CPU engages with the preprogrammed control and through the optional communication unit can request power from the receptacle or in line control unit to the specific appliance.

Message can be sent to a graphic display within the fence referred to in FIG. 33, step 3308, or within the appliance itself on its own graphic display.

Upon database verification as shown on FIG. 35, at step 3510, if it has been established that the power is acceptably delivered, then at this point the system is now one step deeper downstream into the circuitry shown in 3600.

BLOCK 3707, 3708 or 3709 refer to the logic within an appliance and interaction taking place within the circuit. BLOCK 3710 refers to the possibility of interacting with wireless communications interface to use the gateway or any communication interface within fence to remotely start appliances. BLOCK 3720 uses the system gateway (FIG. 33, step 3310) to allow external source(s) to send commands to a specific appliance. The system allows an appliance to be controlled directly remotely (for example, from smart phone devices, tablets or other means).

Figure 38:
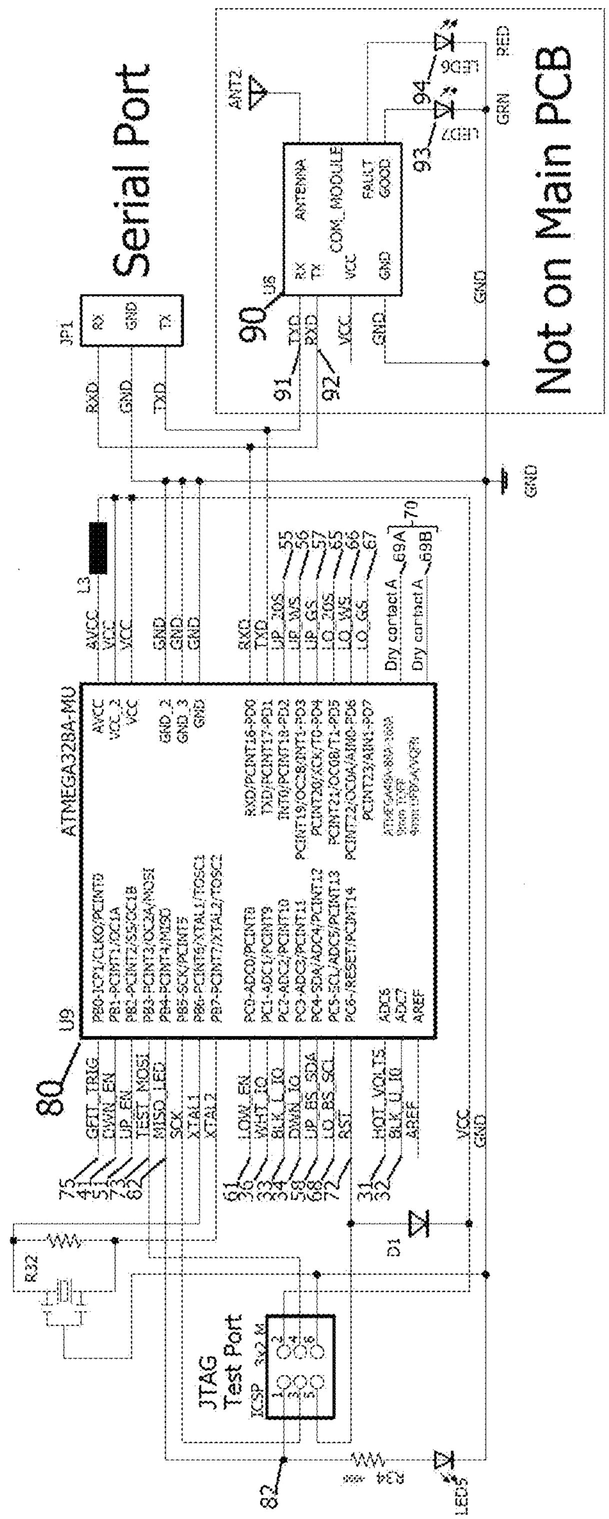
FIG. 38 illustrates a processor having dry contact switches, in accordance with an example embodiment.

FIG. 38 illustrates a processor that implements a dry contact switch that can be manually operated. By shorting each member of a dry contact (pins 69A and 69B in this Figure, set 70), a preprogrammed sequence in the processor can now be applied, triggering an action on FIG. 35 at step 3510; whether it is for a turned on or turned off event; or the triggering of any preprogrammed procedure. An advantage of such a system is the ability to cover longer distances; at that point the processor is configured to detect a short circuit. As long as circuit is opened, no reaction will be triggered. If circuit is already closed, then the opening the processor can be configured to generate a reaction and execute a command(s) within processor of receptacle or in line unit, triggering an action on FIG. 35 at step 3510.

Figure 39:
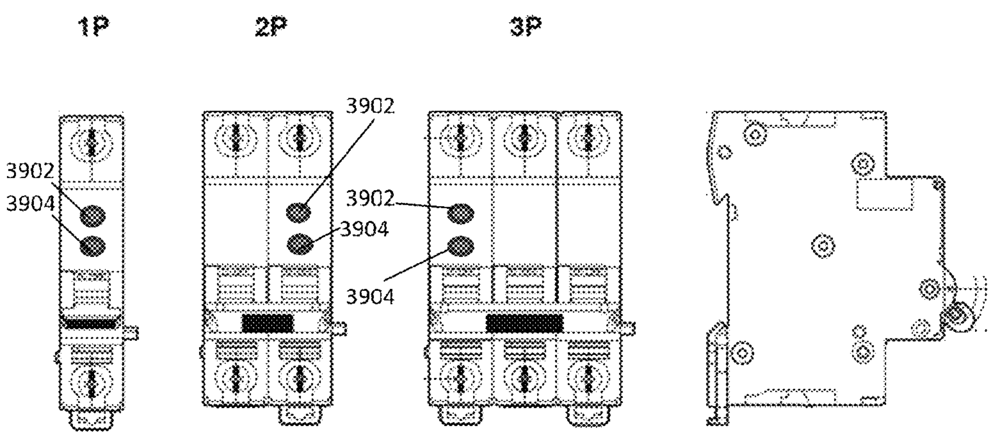
FIG. 39 illustrates side views of a physical representation of single-, double-, and triple-circuit breakers, respectively shown left-to-right, and a front view of all of the breakers, with connectors enabling power line communication, in accordance with example embodiments.

FIG. 39 illustrates side views of a physical representation of single-, double-, and triple-circuit breakers, respectively shown left-to-right, with connectors enabling power line communication, along with a front view on the right that is common to these embodiments. Each circuit breaker is also connected to a hot power line, and opening of the circuit breaker opens the hot power line. In the example embodiment shown, the circuit breaker has a respective connection pin to neutral 3904 and connection pin to ground 3902. In an example embodiment, the circuit breaker can further include the circuit board microcircuitry as described herein, include a processor and a memory. In an example embodiment, the processor can control (open or close) the respective one or more breakers.

By connecting the circuit breaker to neutral and/or ground, power line communication can be achieved. In an example, because the circuit breaker is equipped with the described microcircuitry in accordance with example embodiments, the circuit breaker can be part of the communication fence. In an example embodiment, the circuit breaker is configured to communicate over hot power line to neutral. In another example embodiment, the circuit breaker is configured to communicate over neutral power line to ground. In another example embodiment, the circuit breaker is configured to communicate over hot power line to ground.

In an example embodiment, the signals to the breaker can be used to trigger an opening (tripping) of the particular breaker. In an example embodiment, the signals to the breaker can be used to trigger a closing (reset) of the particular breaker. For example, a processor of the circuit breaker panel 3301 can receive a communication from a downstream electrical receptacle or load to send a signal to open or close the breaker. The signal can be sent over the neutral power line to ground.

An example embodiment is an electrical receptacle for connection at least one power line, comprising: a processor; a circuit breaker having an open state and a closed state, the circuit breaker for connection to a hot power line of the at least on power line, the circuit breaker configured to be in an open state when there is over current or upon command from the processor; and the processor configured to determine that electrical conditions are safe, and in response command the circuit breaker to reset to the closed state. The electrical receptacle can be a circuit breaker panel.

Another industry problem in the electrical world is the difficulty to detect on regular circuitry problems that may occur in future. Early detection can result in significant benefits, eliminating fires, possible shorts, whether from receptacle to receptacle, or from series of receptacles, or receptacles interchangeable with inline power monitoring unit, it is now possible because all receptacles are on same circuit, they can communicate, e.g., unexpected power losses (wires getting frail or exposed), in GFI or AFI can be programmed that based on deemed severity of fault various action can be taken, e.g. command to send force trip to breaker, e.g. trip entire circuit. This can ensure integrity of entire circuit is not compromised.

By having receptacles talking to each other, comparing voltage, current would have more control; e.g. circuit overload. Normally in the industry, once there is too much current, the breaker trips. In the present case by receptacles talking to each other, when too much current is found, no additional loads would be permitted and also can communicate what has happened. Breaker tripping would be limited to real faults. Depending on sensitivity of units, the first receptacle on circuit would trip downstream.

Example embodiments can deliver exact power required. For a 15 amp circuit, an electrician will go up to 80% load design. The described systems in some example embodiments can go beyond 95% because downstream current is monitored, and as soon as load is added to the total, exceeding what would blow the fuse, the user is simply prevented from adding further loads, since the relevant electrical receptacle or plug outlet will not be activated. Multiple devices best to turn off further power being used. The system can allow going to 14.5 A for example without risk. Note that inrush can be passivated and can control overages. The industry does not perform this kind of current monitoring (for whole dynamic measurement control purpose).

Breaker panel is center point of all feeding, breakers tripping. Main breaker or surge protector can trip based on events from outside. Stopping most electrical fires. Appliance based fires would not be considered "electrical fire".

Currently manufacturers are adding $10-$15 of extra cost to reduce power factor and reduce power. The described electrical receptacles can remove quiescent power drain. Can sense power washing cycle is complete and can shut down until user restarts cycle. Use less power, be safer.

The described devices can draw more than 15 A or 80% of 15 A as the electrical receptacle can control the increase of amperage on a circuit. The system can with security exceed these as the device can prevent the addition of local power if too close to max. If not safe, the device does not turn power on for that particular unit; if still safe, then the device activates power. New level of safety where others may trip breakers. The device can even measure temperature to stop power if in a dangerous situation.

Optimizing wattage for appliances: the described devices have more control; e.g. able to supply exact wattage needed to best use an appliance's engineering specs.

Other GFI devices simply look for a current mismatch between hot (black) and the neutral white. If there is a difference, the current must be flowing from the black through a person or a short to Ground.

The circuit is measuring extremely accurately the difference between the Black, White and can also differentiate between individual outlets and the downstream.

The processing algorithm allows the system to extract with a higher accuracy; however as higher accuracy also increases the possibility of false triggering, there are secondary routines which look at the signal to determine if the signals are high enough to cause harm, and are they in a consistent manner that they will cause harm. Apparent GFI faults might not be valid GFI faults. The intelligence determines whether or not there is sufficient voltage difference occurring a sufficient frequency to not be an aberration; rather a legitimate ground fault. And compare this against known profiles to establish legitimacy. Further, an example embodiment includes having a self tester at programmed intervals to test leakage and compare against known amount of leakage, and adjust accordingly. The devices are calibrated at factory more than traditional GFI's in order to maintain greater sensitivity and higher certainty of capturing a safety issue.

Similarly with Arc Faults, these have a leakage component like GFI, but at a higher level. It is recognized that this higher level of leakage is acceptable, unless it is detected certain other attributes which are those of an arc fault. The system can recognize much more valid circuits and remove false triggers that would otherwise occur (e.g. due to a toaster, drill, vacuum cleaner). The system can look for multiple occurrences across different cycles rather than accepting that something occurred only one time; e.g. has to occur with certain repetition to differentiate that this is not a one time event that is characteristic of an acceptable "normal" arc-like signal. To prevent false triggering, the traditional GFCI's or AFCI's have "raised the floor" of what they look for to trigger a trip. They do not look for the other attributes. In example embodiments, the device establishes whether a tripping trigger would be false, or whether a tripping trigger should take place.

Speed & Calibration: The electromechanical nature of the industry's AFCI's, GFI's limit the speed at which they respond and do not have dynamic calibration. Rather they are just simply testing that their circuitry can trip the switch.

Self test: comparing the calibration reference to the measured differences. Currently in normal outlet they rely on the mechanical wiring which generates connection between third prong and screw; however example embodiments have a sensor that senses that one as well enabling checking of the signal. For example, for bad wiring, there should be no voltage drop between black and white; any drop is relative to current. For good wiring, there is no current travelling on ground; if there were, the system can detect it and report bad wiring.

An example embodiment can consider a ground fault that is not a GFI fault. Connections, wiring, plugs, not good zero ohm connection on ground, suddenly starts rising. The device is comparing the ground and safety ground. The processing enables the device to dynamically test all the time the ground path. If the ground path rises and there's any compromise the device can report it, e.g. within half a second, and/or deactivate power, and/or open a breaker.

Another example embodiment is to manually short hot power line to ground. Using the receptacle, one is manually triggering a short. This can be done with a short to ground. A user can manually go to the plug, intentionally short to the ground using a manual switch, and the electrical receptacle and the system will smartly react.

In the disclosed system, an example embodiment is a manual button that shorts hot to ground, that triggers a CPU. An example embodiment is intentionally creating ground fault to trigger an activity. A triggered ground fault can be a trigger of different activities including, in an example embodiment, shutting down receptacle due to the CPU of the receptacle detecting ground fault or GFI fault. Detection of arc fault or ground fault can be used to trigger additional security steps. Existing industry ground fault and arc fault shut themselves down only. The device can shut breakers down, different apparatus elsewhere. For example, if water damage to outlet, can preprogram that other outlets/inline devices should shut down too, or other action taken. An example embodiment includes communicating event happening on one circuit to devices on another circuit(s) (one or more), such as on a different hot power line phase.

Figure 42:
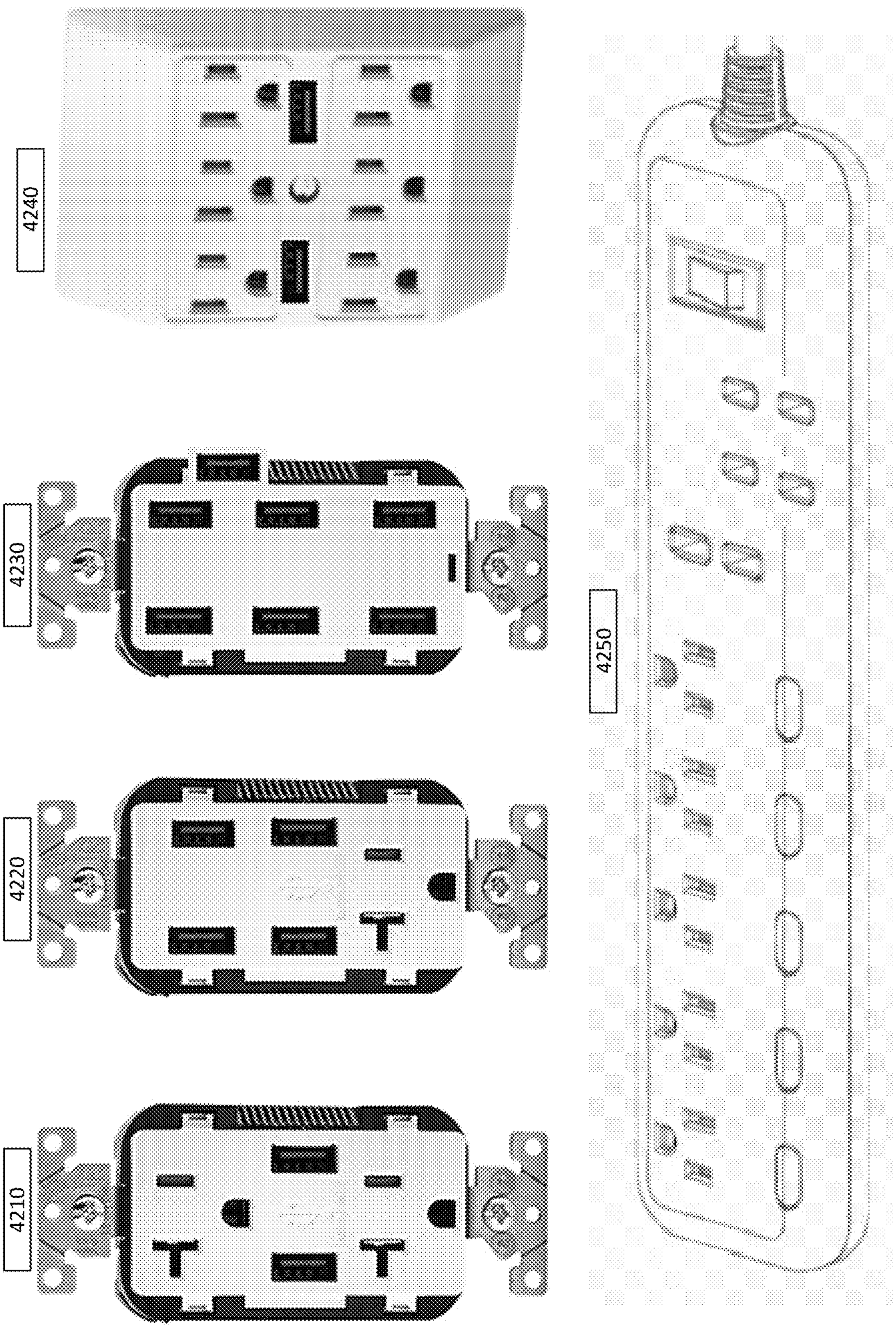
FIG. 42 illustrates electrical receptacles, in accordance with example embodiments.

FIG. 42 illustrates electrical receptacles, in accordance with example embodiments. Receptacle 4210 comprises two plug outlets and two USB outlets. Receptacle 4220 comprises two plug outlets and four USB outlets. Receptacle 4230 comprises six USB outlets. Wall adapter 4240 includes prongs (not shown here) for plugging into an electrical receptacle, and comprises multiple (e.g., six shown here) plug outlets and two USB outlets. Extension cord 42 (e.g. also known as power adapter or power strip) comprises multiple (e.g., five shown here) plug outlets and multiple (e.g., six shown here) USB outlets. Extension cord 4250 comprises multiple plug outlets, multiple USB outlets, and a hard power switch. Other combinations of plug outlets and USB outlets can be used in other example embodiments.

Another example embodiment uses Universal Serial Bus (USB). With the power line communication technologies within the fence, there is excess bandwidth. Some of that bandwidth can be used for networking purpose and using a USB connector as an access point for computer networking and Internet sharing over the power line network.

Usage for USB connection includes any or all of:

1. Traditional: presently used to charge through USB to device. For example, the electrical receptacle further comprises a AC/DC converter.
2. Data access: accessing through the receptacle or inline control unit, data on USB stick.
3. Communications through power line network.

An example embodiment uses the excess bandwidth of the communication pipe 4110 to exchange network data. Using USB port as a point of access for data connection, Eliminate wall wart and plug directly into electrical receptacle. Instead of using for charging only, use also for communications within the wired network. Applies to USBs, micro USBs etc. This may replace twisted pair systems or the Ethernet multiplexing systems in some example embodiments. All providing USB to plug. Instead of powerline communication inside of computer that requires industry to adapt a specific technology, a computer can use a regular USB cable to be used with the receptacles that are configured with the USB features.

An example embodiment is an electrical receptacle for connection to power lines, comprising: a first contact and a second contact configured for electrical connection to a hot power line and a neutral power line, respectively; a communication subsystem configured for wired communication over a wired network with one or more further electrical receptacles; a processor configured to communicate via the wired network; at least one Universal Serial Bus (USB) plug outlet to receive a removable USB memory device; wherein the processor is configured to access the removable USB memory device when the removable USB memory device is plugged into the USB plug outlet.

An example embodiment is an electrical receptacle for connection to power lines, comprising: a first contact and a second contact configured for electrical connection to a hot power line and a neutral power line, respectively; an AC-to-DC converter configured to output DC based on AC input from the hot power line; at least one DC plug outlet configured to provide the output DC from the AC-to-DC converter; a controlled state switch to control power to the DC plug outlet; at least one current sensor to detect signals indicative of the hot power line or the output DC; and a processor configured to control deactivation of power to the switch in response to receiving a communication or in response to the detected current of the current sensor being indicative of ground fault, arc fault or over-current conditions.

Figure 41:
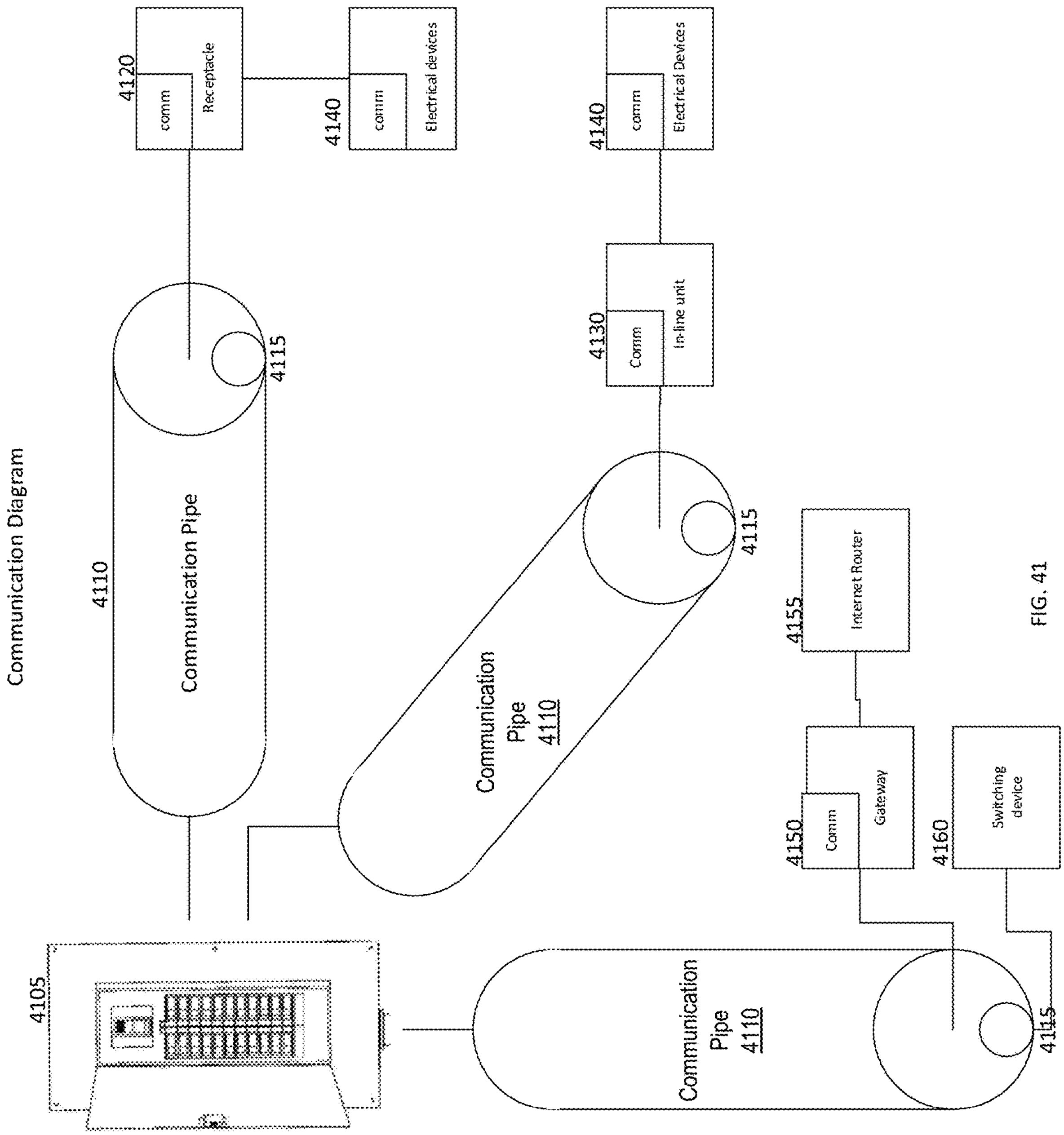
FIG. 41 illustrates a block circuit diagram of another example embodiment of an integrated control and monitoring system that includes power line communication over one or more power lines.
Figure 46:
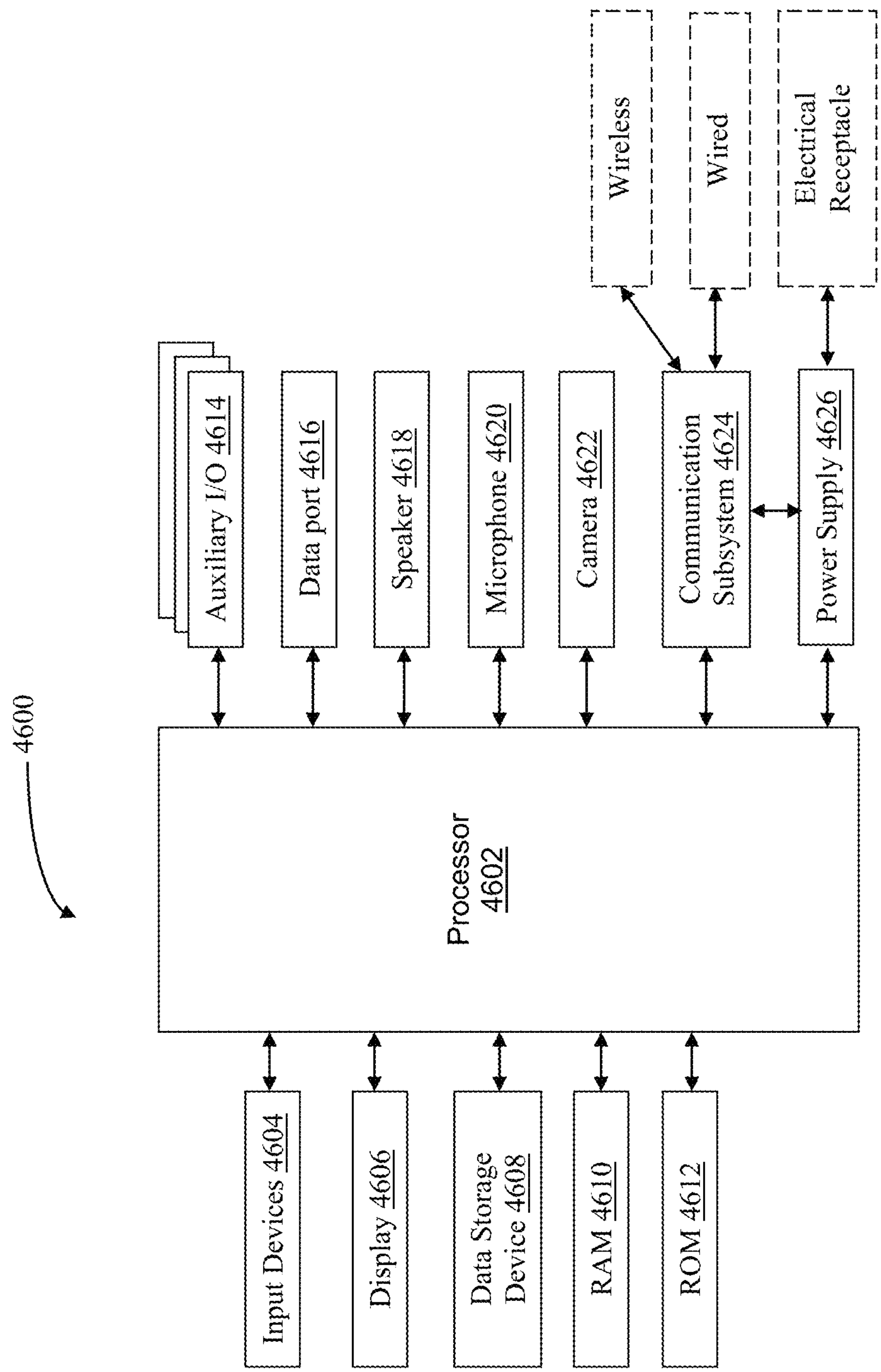
FIG. 46 illustrates a block diagram of a voice input/output appliance in accordance with an example embodiment that can be used for integration with the system of FIG. 33 or FIG. 41.

FIG. 46 illustrates a voice I/O appliance 4600 in accordance with an example embodiment, that can be used for integration with the system of FIG. 33 or FIG. 41, for example. Current industry examples of voice input/output appliances are Amazon Echo, Apple HomeKit, Samsung Smarthings, Google Home. These appliances can implemented virtual assistant services/software such as Google Assistant, Alexa, Siri, etc. These appliances can be configured to be the appliance 4600 in accordance an example embodiment. In another example embodiment, these appliance can be equipped with the described micro circuitry to enable additional functions and features.

The appliance 4600 includes a processor 4602 and a plurality of interface or user interface devices such as input devices 4604, display 4606 (e.g. touch screen), auxiliary I/O 4614, data port 4616, speaker 4618, microphone 4620, and camera 4622. The appliance 4600 can further include data storage device 4608 (e.g. memory), RAM 4610, and ROM 4612. The appliance 4600 further includes a power supply 4626 that can connect to an electrical receptacle, e.g. for AC or DC power. The appliance 4600 further includes at least one communication subsystem 4624 that can be configured for wireless communication (e.g. WiFi or short-range such as Bluetooth) and/or wired communication. At least one communication subsystem 4624 can be configured for power line communication through the power supply 4626 to the electrical receptacle, and through power line communication, for example over neutral to ground. Accordingly, the appliance 4600 can access the wired "fence" described herein.

Figure 40:
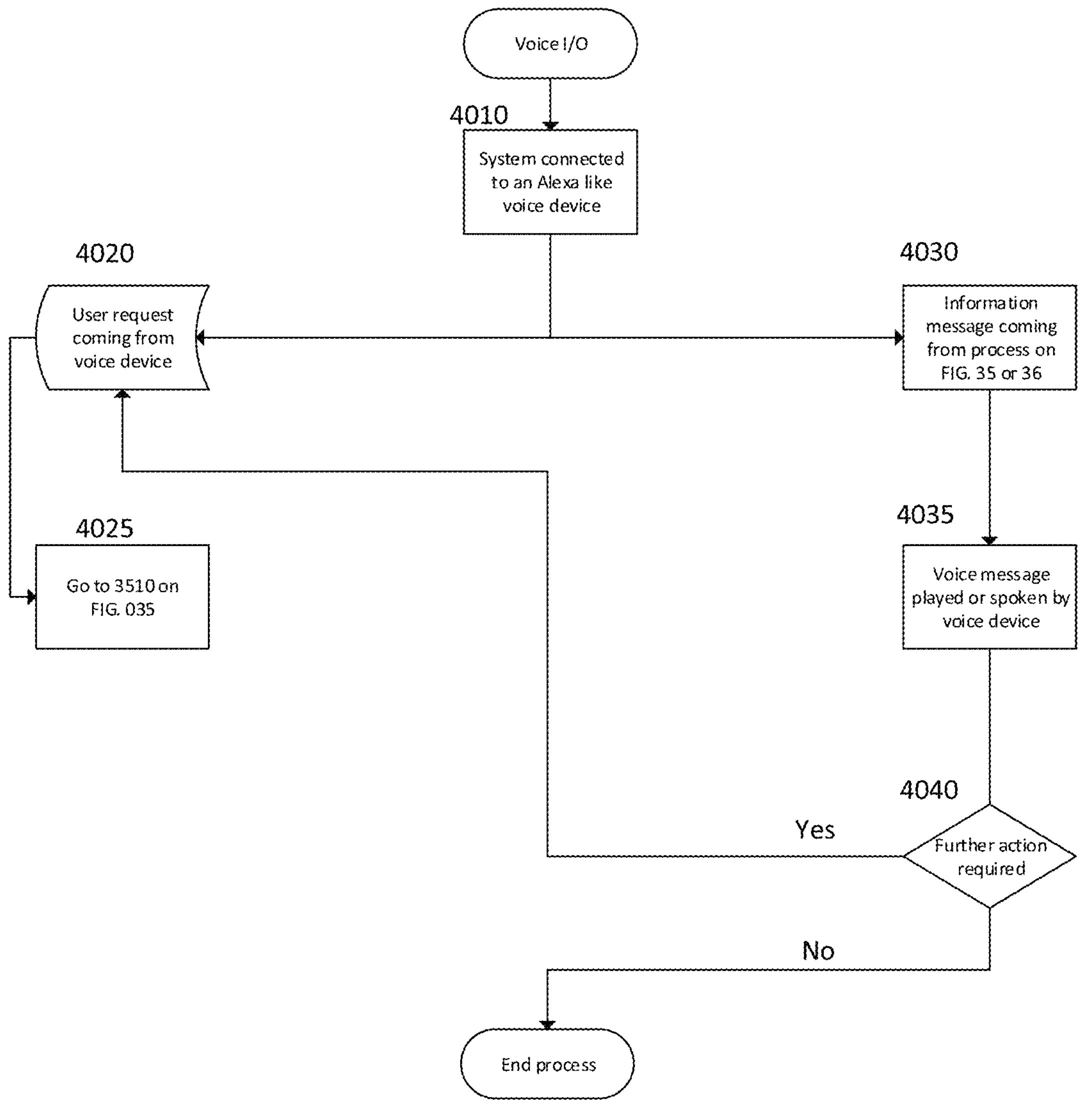
FIG. 40 illustrates a flow chart for operation of an appliance having voice input/output command.

FIG. 40 illustrates a flow diagram of a method for operation implemented though the appliance 4600 having voice input/output command. The method of FIG. 40 can be performed by one of the described electrical receptacles, or in an example embodiment, performed by another device having access to the fence within the wired network or power line network.

In an example embodiment, through the appliance 4600, voice command can be given or status report or messages can be played or converted from text to voice by such a device. This is also applicable for voice to text. Step 4010 mentions that the system is connected to the voice input/output appliance 4600. For example on the voice input side, the appliance 4600 is used to send a command to the system (e.g. dim or turn on light), as in step 4020. Step 4020 takes care of user request. Step 4030 is the output side: if there is a message that usually would be broadcast on 3308, messages can now be played to the user through a speaker of the appliance 4600.

If a user plugs a load anywhere in the premises and the load actually does not turn on, the appliance 4600 can be configured to state that request was denied and a reason. The appliance 4600 can be further configured to supplement this output by also sending a message to the display screen. Example reasons include e.g. Gfi, Afci, faulty wiring, overcurrent, etc., and the output can also accompany an identification of a receptacle or load that is affected by such occurrences.

In an example embodiment, the message can be sent to the appliance 4600, that in turn can send message to a device of the user (e.g. mobile phone). For example, once the appliance 4600 is activated and a user request takes place, the process at step 4025 goes to step 3510 (FIG. 35) in the same fashion where plugging a load or typing a message on screen like 3308, it starts a new request for a load (which started at step 3510).

From FIG. 35 or FIG. 36, there is a message that needs to be broadcast, that can therefore be output as a voice message that is played by the appliance 4600 at step 4035.

At step 4040 question is asked by the appliance 4600 if further action is required. If so, user will be prompted with question to input at step 4020 and the answer triggers back to step 4025 (e.g. step 3510 in FIG. 35). If no further action, the process is ended.

The appliance 4600 is a voice I/O that receives command or broadcasts a message expecting a response, and triggers action based on processes described herein. This can include, for example, control, monitoring, safety and/or communication with electrical receptacles, inline control units, breakers, other loads, devices enabled with communication chip over power line communication, etc.

FIG. 40 shows two conditions depending on input or output. In case of input it is a user request, which then triggers based on step 3510. In case of output, it is coming from FIG. 35 or FIG. 36 and there may or may not be further action required. E.g. "is there anything else that can be disconnected based on something not allowed"; "is there another circuit that could be used"—an entire interaction triggered by message. User has possibility to reply through the appliance 4600 for further actions, e.g. at step 3510.

The appliance 4600 can include a calling and/or messaging feature. The appliance 4600 can include a selfie camera and the appliance 4600 can include a 7-inch touchscreen. The appliance 4600 can include a control to a TV, or can be integrated within a TV, in some example embodiments.

An example embodiment uses a voice interface to communicate through the described smart receptacles (or in line control units), having additional information and commands. An example embodiment allows the appliance 4600 to communicate to other IoT devices and/or the Internet through power lines.

An example embodiment of the appliance 4600 has communications from these devices through power line communication to make the appliance 4600 safer. Wired communications through the power line communication, to the database system (BLOCK 3312). An example embodiment provides data communications through a wired interface prior to a wireless, wired, phone communication.

For example, the voice command "turn light 3D on" when connected to the wired communication, the appliance 4600 can be configured to send command to the database system (BLOCK 3312) and turn off lights, etc.

In an example embodiment, the appliance 4600 can be configured for communicating with the entire house, the commerce or the industry in a secure fenced environment. By being within the fence the appliance 4600 can control without being exposed to the outside and therefore not being an access point for hackers, therefore maximizing safety.

In an example embodiment, all communications are through power line communication, even if initiated through smart devices (including sensors or appliances or the voice input/output appliance 4600).

Therefore, in an example embodiment, there is provided the equipment of sensors/appliances with a microchip/circuit board allowing for safe power control and allowing to become an integrated communication interface for the functionality described herein.

The appliance 4600 can be instructed through sensors detection that certain areas are empty and in turn ask if the user wants to shut off the lights, or any other connected devices upon preprogrammed time, send a no answer message to the database system (BLOCK 3312) and trigger the appropriate set of command from data base information.

The appliance 4600 becomes the voice format (input/output) equivalent of a display screen.

In a hybrid system, the appliance 4600 can also be connected outside the fence through gateway units controlling other parts of a legacy system using one or more other communication protocols.

FIG. 41 illustrates a block circuit diagram of another example embodiment of an integrated control and monitoring system that includes power line communication over one or more power lines. By using power line communication the system is creating a communication pipe 4110. Within the communication pipe 4110 is contained one or more channels 4115 that is part of communication pipe that are reserved by the system for specified data communications, completely spectrally isolated from rest of the communication pipe 4110 for security reasons. In an example embodiment, the power line communication is over neutral to ground.

In an example embodiment, the backbone for communication plane is the breaker panel 4105 that acts as the crosspoint or hub that connects different members and communication pipe(s) 4110. The circuit breaker panel 4105 becomes a hub or switch by inserting a network switching device, such as a device that can accommodate bus communication. An example embodiment includes a breaker panel acting as a network hub. The circuit breaker panel 4105 can include a main circuit breaker that has a maximum rating.

In receptacle 4120 this refers to a legacy regular receptacle equipped with communication microchip/circuit board where all of the described functionality resides.

At load 4140, this can comprise an electrical device incorporating the communication chip allowing communication to receptacle (or other devices). Can be configured to communicate with the electrical outlet and request power when needed. In response, the electrical outlet provides output power when conditions are safe.

An example embodiment includes insertion of communication microchip/circuit board between an electrical receptacle and a communication pipe 4110. Communication board is actually creating the communication pipe 4110 over at least one of the power lines. An example embodiment is means comprising of communication chip, communication pipe and receptacle. An example embodiment is a single circuit adaptor that plugs into a regular receptacle giving it now all the protection of the tamper resistant electrical receptacles including communication functionality.

Communication pipe 4110 has one or more channels 4115 as part of in-fence communication. Communication pipe 4110 can have reserved or designated one or more channels, reserved for purposes of electrical receptacle communication, control and/or monitoring. A channel can be a carrier frequency or frequency band. Rest of Communication pipe 4110 is not part of in fence communication and can be used for any other means of communication (Internet, RF cable signal, etc.). For example, if there is a legacy system, the communication pipe might be used to communicate with the legacy system.

In an example embodiment, communication pipe 4110 can be used to communicate through the gateway 3310 in FIG. 33. Can be connected to internet router 4155 for connection to the Internet. The unused portion outside of the one or more channels 4115 can now be used for Internet connection.

Router 4155 is connection to outside world from all the electrical receptacle 4120 or in-line unit 4130.

An example embodiment is an electrical receptacle for connecting to at least one power line, comprising: a communication subsystem for communicating over at least one of the power lines, at least one channel over the at least one of the power lines being reserved for control and/or monitoring of one or more electrical receptacles or one or more loads operably connected to at least one of the power lines; a processor configured to: communicate over at least one of the reserved channels over the at least one of the power lines.

FIG. 41 shows three separate communication pipes 4110 because in-line unit 4130 and electrical receptacle 4120 can talk to each other or through the one or more channels 4115 portion of the communication pipe 4110. Multiple pipes (three shown) illustrate communication being able to take place with non-fence to be connected to inline control system (intelligent junction box) or as well be used for internal connection between devices.

An example embodiment is an intelligent junction box having communications in it. For example, the intelligent junction box includes intelligence, communication and power control, by enabling communications other than using communication ports and twisted pair/Ethernet, rather through the described embodiments the breaker panel 4105 acts as hub. Because incorporating I/O enabling computers to connect 4120 and 4130 the system can be used for replacing the use of other switching devices.

Switching device 4160 can be a network switching device, for example. In another example embodiment, the switching device 4160 is in or at the breaker panel 4105 or sub-panel.

The one or more channels 4115 can also be referred as a secure pipe within the unsecure secure pipe and being the only fenced part of the communications part. It is the in-fence secure communication part of the communication pipe 4110 and allowing the rest of bandwidth to be used for other communication mode; e.g. replacing network apparatus.

For conventional Internet wifi, the wireless router listens and selects slots to use. Known partition rate based on specs. Selects extra bandwidth based on fitting in empty slots.

The wired power line communication in example embodiments can do certain communications on the line (e.g. like AFCI). For example the electrical receptacles can generate certain noises to understand signatures (valid AFCI-like events, but not AFCI events). Certain attributes unique to AFCI.

Using ground and white it is totally safe. White and safety grounds are always connected, not affected by hot line breakers.

The system is connected to the black, get power from the black and can pick up 'hot volts' that gives wave forms on the black. This gives the system built in clock reference.

In an example embodiment, the communication network over the neutral to ground stays up when power is off. For example, if have UPS situation (respirator at home, etc.), need orderly shut down, e.g. bank of servers instead of collapsing, shut down based on power down priority sequence. And send message to all users remotely advising user(s). Can be used for voice over IP in emergency situations such as 911.

In an example embodiment the microchip/circuit board does the power conversion. Instead of converter blocks that plug into wall. The technology can be inserted in any appliances/devices that has a 3 pin connector and replaces the converter. The appliance/device can get straight 110 v out of a receptacle or an inline unit straight to the device, instead of going into 5 v converter. Can use a flat connector with 3 prongs to wall.

The microchip/circuit board has power conversion. In an example embodiment, for example line voltage in and downgrades it out to either 5 v or 3 v DC. The microchip/circuit board enables greater control over power than most power converters used alone. In another example embodiment, the communication chip can be used in both the converter unit and in the device, itself.

The power control is more precise due to the usage of all the processing that resides on the board. Can convert 110 v AC to 3 v DC. The board also can control preciseness and can also rectify, e.g. if too low, bring it back up, e.g. brownout. In order to maintain wattage, when voltage varies, the board can use current to keep wattage stable. The board can use the processor/cpu to deliver more consistent low voltage power to the devices, while blocking surge. An example embodiment includes cleaning, filtering, controlling consistency of low voltage power, e.g. cheaper than industry using rectifiers.

Another example embodiment includes remote resetting of receptacles, e.g. tripped due to AFCI, GFI, overcurrent, etc. For example, the receptacle may be hard to reach, behind fridge, ovens, washer dryers (220 v), etc. Because of the described powerline communication technology the system can remotely reset ground faults from one of the communication screens or any other devices link through the gateway system. This is useful in difficult to reach areas. The power system analytics would not restart the devices if the fault is still present, the remote reset would be safe. This can be used to safely and remotely reset circuit breakers contained in the breaker panel.

An example embodiment is an intelligent junction box, comprising: a first contact and a second contact configured for electrical connection to a hot power line and a neutral power line, respectively, and each configured for downstream electrical connection to a respective downstream power line terminating at a load; a controlled state switch connected in series relationship between the hot power line and the respective downstream electrical connection; a communication subsystem for communicating over at least one of the power lines; and a processor configured to control an activation or a deactivation of the controlled state switch in response to receiving a communication over at least one of the power lines.

An example embodiment is an intelligent junction box for connection to power lines, comprising: a first contact configured for electrical connection to a hot power line from a main circuit breaker of a circuit breaker panel; a plurality of controlled state switches to activate and deactivate power from the hot power line to a respective downstream power line; and a processor configured to maintain activation of all of the controlled state switches when a total current of all downstream power lines is less than a total rated capacity of the circuit breaker panel and when one or more of the downstream power lines exceeds an individual rating of the respective downstream power line.

Figure 43:
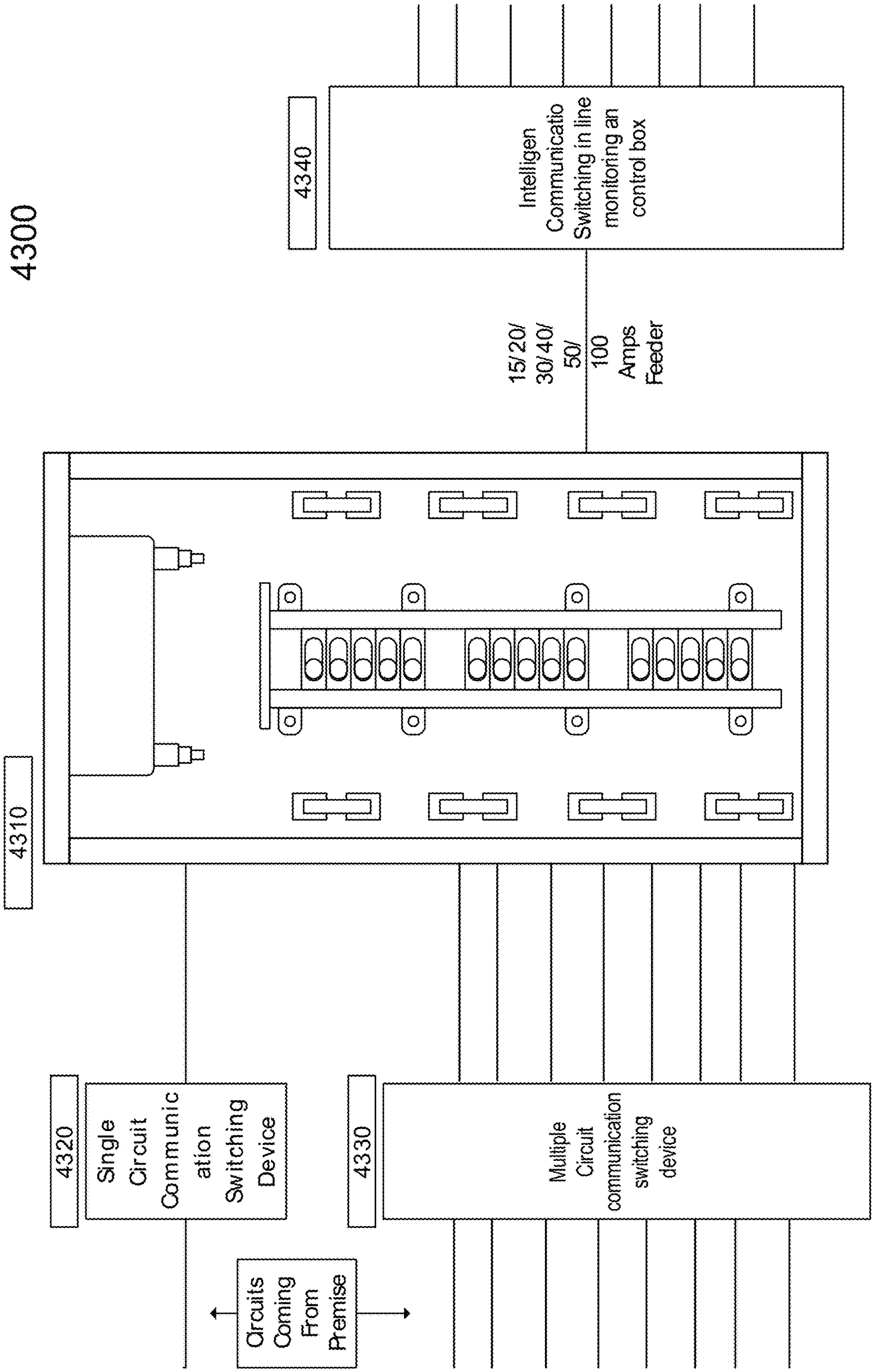
FIG. 43 illustrates a block diagram of a system in accordance with an example embodiment, that includes at least one circuit communication switching device for a circuit breaker panel.

FIG. 43 illustrates a block diagram of a system in accordance with an example embodiment, that includes at least one circuit communication switching device for a circuit breaker panel. The system includes end-to-end communication (as opposed to a bus) using switching devices.

Single circuit communication switching device 4320 is single circuit communications device. In an example embodiment, there are 5 or 6 of these devices on a single system circuit. For example, a user may choose not use communications switching on an appliance such as a washer/dryer/fridge, and implement this embodiment on one circuit.

Multiple circuit communication switching device 4330 illustrates multiple circuits coming in, multiple circuits going out; e.g. one-to-one without power switching. It is a single switch using power line communications. The power (black and neutral power line) is passed through. The device 4330 is wired in traditional fashion, including white/neutral and ground. Communication is allowing switching on a circuit by circuit implementation. Diagram is for G-N wiring for communication purposes. Note that the communication is not limited to G-N communication and can be used with any type of power line communications in an example embodiment. Terminating devices can be configured or modified to use ground-neutral. Terminating devices include wallwarts (power adaptors). These are within phase devices using power line wires.

The system 4300 of FIG. 43 may includes switching devices, for example, one channel switching device 4320 and several channel switching devices 4330. The switching devices allow the system 4300 to use regular extension and have communication switching at the panel level 4310. For communication purposes, each circuit of system 4300 may have its own respective individual address, such as a mac address The circuit breaker panel 4310 may be used as a cross point. Instead of using circuit breaker panel 4310 as a hub, the system 4300 provides communication switching level outside the power crosspoint at circuit breaker panel 4310 for switching and managing communications between different circuits. In an example embodiment, the circuit breaker panel 4310 may include a main circuit breaker that has a maximum rating. The circuit breaker panel 4310 may include a number of contacts for electrically connecting incoming public utility power lines to downstream power lines. The incoming hot power line is connected via the main circuit breaker.

In another example embodiment, the system 4300 may either communicate either between 2 or 3 of these communication devices 4320, 4330, 4340 (for example), or provide linkage via a communication link between 2 or 3 of these communication devices 4320, 4330, 4340 (for example). In the latter case, the circuit breaker panel 4310 does not provide communication functions, and the in-line control and monitoring units become equivalent to a sub-panel. In another example embodiment, the circuit breaker panel 4310 also provide for communications capacity, e.g. data communications within wall between 2 or 3 of these communication devices 4320, 4330, 4340

Traditionally subpanel provide for wires coming in for re-distribution. In an example embodiment, the communication switching devices 4320, 4330 may be retrofit to existing circuit breaker panel 4310, rather than by adding a subpanel. In an example embodiment, the control box 4340 is a new device that is separate to the circuit breaker panel 4310.

The control box 4340 may include a single power line as input from the breaker panel 4310, and a plurality of downstream power lines as output. The control box 4340 may include a plurality of solid state switches, one for each downstream power line. The control box 4340 may be configured to ensure that the total load does not exceed the capacity of the circuit breaker panel 4310. Each individual downstream line may potentially exceed the individual line rating, so long as the total load does not exceed the circuit breaker panel 4310.

An example application of system 4300 is for electrical cars. Instead of adding a sub panel, system 4300 may provide the functions and have advantage of providing communications. Any of the communication devices 4320, 4330, 4340 can also be connected to the car and talk to the electrical system in the car (e.g. provide communications therein).

Another example application of system 4300 is a second house (e.g., or pool house) which can run wire supporting high current requirement, such as 50 AMP wire, to a 50 AMP box in pool house. The system 4300 may be used for commercial/industrial facilities: for example, if a multi-units resident has a tenant in each unit, the control box 4340 may be used to provide output to multiple units. In an industrial application, for example, system 4300 may replace subpanels without changing any of the existing wiring, and therefore easily retrofit in existing environment. As well, system 4300 provides communication switching within the system 4300 and creates a secured communication network.

The intelligent communication switching inline monitoring and control box 4340 may also provide load control across multiple circuits.

Since the system 4300 does not necessarily need breakers, the control box 4340 may have dynamic exchange provided it complies with the wiring code. Control box 4340 may distribute the total current to different output lines based on the needs, as long as the total current capacity of the output lines remains within total wiring capacity of the control box 4340. For example, control box 4340 may provide one line with 18 A current and another line 12 A current. Therefore, control box 4340 provides flexibility in the output current to each circuit, and is not limited to 15 amp output current. The control box 4340 may share the total input current amperage among the output lines and provide load management between circuits, for example, one exceeding 15 A and another less than 15 A. The system 4300 may include a database, which may have a table that records the power supply priority of the circuits, and actual consumption of the electricity of the circuits at different time periods, such as the peak hour electricity consumption of each circuit. As such, the control box 4340 may supply the electricity based on the needs of the circuits.

For example, if an appliance (e.g. fridge) can operate at a lower current for a certain time, the control box 4340 may allocate a lower amperage to the circuit of the appliance while directing the additional amperage to other electrical devices.

Box 4340 shows intelligent switching and may function as distributing intelligent sub panels. The box 4340 may be placed on the ceilings, floors, or other places of a facility. In regular conventional houses, all the amperage is on dedicated runs and dedicated circuits. For example, if a HVAC system needs a 30 A circuit, then 30 A is blocked out of the 200 A. In an example embodiment, with the flexibility and dynamic power control provided by the box 4340, a lower total rated main circuit breaker may be used.

The breaker system 4300 of FIG. 43 may fix the amperage based on a dedicated circuit. The system 4300 may also provide load management. The panel 4310 providing electrical switching at 200 A becomes the master panel. The system 4300 may be a power management system and a data management system. The system 4300 allows dynamic power and load management as described above. The system 4300 may be used in a house that includes dedicated runs (each electrical device connected directly can be switched individually). the house may include applications for heavy current load, e.g., heating, air conditioning, lighting systems.

Since the system 4300 can have more than 200 A allocated in the house because of dynamic load management, the system 4300 can now increase the number of home runs into these boxes 4320, 4330, 4340. For example, each receptacle is connected to a output circuit of box 4340. Boxes 4310, 4320, 4330, 4340 reduce the needs of wiring. the system 4300 also allows to assign priorities as to which circuit to be turn off if the current needs of the load exceed the power supply. As well, boxes 4310, 4320, 4330, 4340 may also provide full switching capacity from telecom standpoint.

In an example application, the system 4300 may be used to replace alarm systems by controlling the power supply and providing wire management for example, to the alarms, such as evacuation alarms etc.

By providing complete load management, communication switching and elimination of the need for additional wires except for power wires in house, the system 4300 may also deliver power as needed to electrical devices, such as appliances.

In an alternate example embodiment, there are multiple switching devices 4330 that communicate with each other, and every circuit going through switching devices 4330 may bypass the breaker box 4310 for communication purposes. The network can be power line communication, over the hot power line or over neutral-to-ground in example embodiments.

In addition to dynamic switching and dynamic load management, system 4300 may provide complete power switching on non-dedicated wiring. The power switching is only limited by the gauge of the wire, or amperage rating of wire. Limitation of power switching is the average rating of wire. For example, if the system 4300 installed as a home run may support up to 20 A wire. Together, one or more of the sub-switching boxes 4310, 4320, 4330, and 4340 together form crosspoint. Box 4340 may provide telecom switching for all power line communications, not just Ground to Neutral lines. The system 4300 may only include the main breaker 4310 for switching control, without individual line breakers. The system 4300 may also include the breakers 4320, 4330, and 4340. An example embodiment, the system 4300 may have a load manage daisy chain of a series of electrical receptacles (e.g., in-line and/or in-wall).

Figure 44:
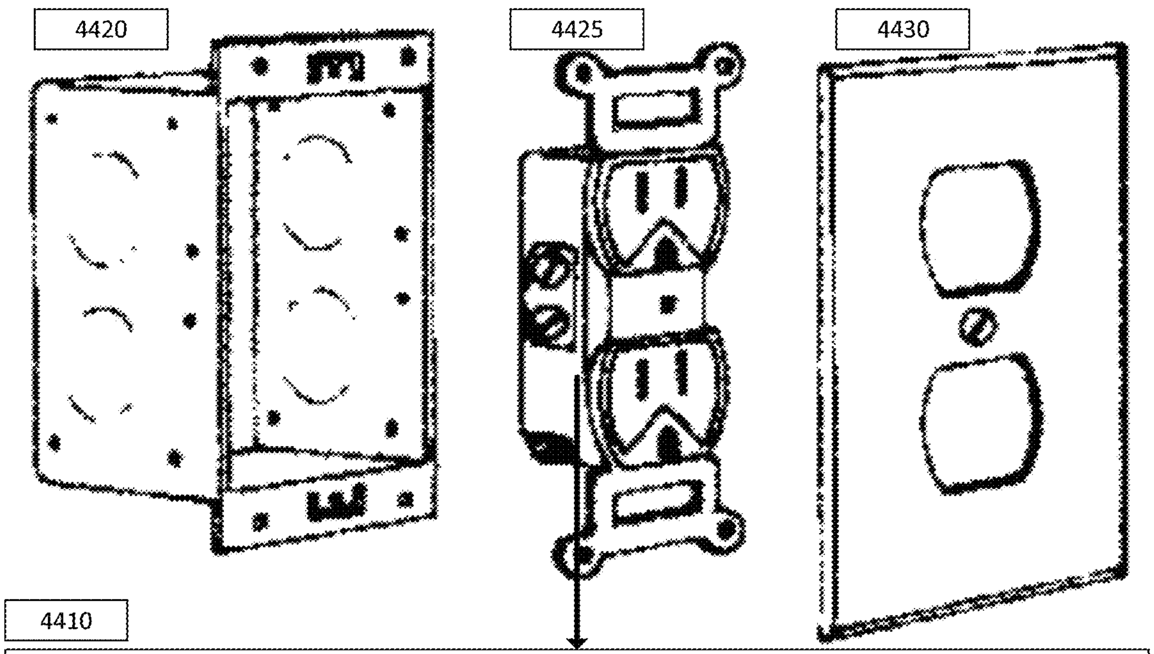
FIG. 44 illustrates an exploded perspective view of an electrical receptacle, in accordance with an example embodiment.

FIG. 44 illustrates an exploded perspective view of an electrical receptacle, in accordance with an example embodiment. The components and features may similarly apply to any or all of the devices shown in FIG. 46, in example embodiments. Box 4410 describes any or all the components (and features) of the electrical receptacle. For the receptacle, box 4410 includes, for example: ac/dc converter, test ports, processors, USB ports, current sensors/meter, serial communication ports, voltage sensors/meter, power control devices, environmental sensors, power connectors, built in flash memory, downstream channel, communication chip/circuits, status led lights, reset/test switches, surge arrestors. Electrical box 4420 represents the electrical box that receives the receptacle 4425. Cover plate 4430 covers the front side of the receptacle 4425.

Figure 45:
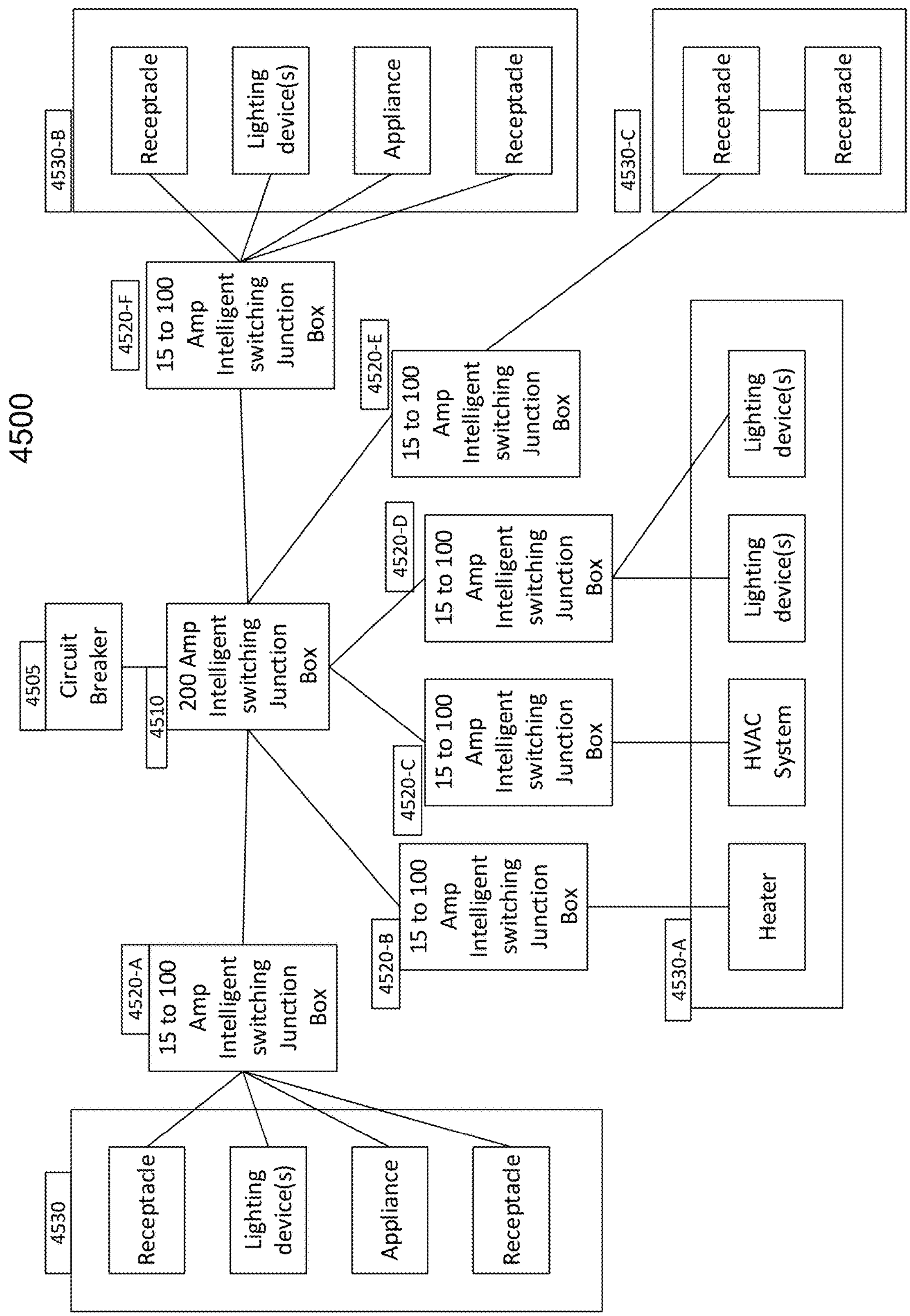
FIG. 45 illustrates a block diagram of a system in accordance with an example embodiment, that illustrates a star topology for deploying electricity to a premises.

FIG. 45 illustrates a block diagram of a system 4500 in accordance with an example embodiment, that illustrates a star topology for deploying electricity to a premise. The star topology illustrates deploying electricity from the public utility power supply to a premise, for example an entire house, business, hospital or industrial property. The circuit breaker 4505 receives power supply from utility company at a 200 Amp intelligent switching box 4510. Switching box 4510 is not only for distributing power but also providing communications services. Box 4510 may provide communications and manage the load, such as for providing dynamic load management, for the entire topology. Box 4510 may dynamically manage the power supply and allocate load as needed.

Box 4510 may distribute the power supply to intelligent switching junction box 4520 A-F. Intelligent switching junction box 4520C may include electrical devices, such as HVAC system. As the HVAC systems are seasonal and are not used in winter, intelligent switching junction box 4520C may supply the power to the other devices, such as heaters.

In an example embodiment, sub-switching boxes (4520-A, 4520-B, 4520-C, 4520-D, 4520-E, 4520-F, collectively referred to 4520 series) may support more than 200 A in different temporal combinations. 200 A may be dynamically managed based on rules of priority by switching box 4510, no more than 200 A at one time. 4520 series logically function as a first layer in star topology shown in FIG. 45. Each device shown in 4530, 4530A-C may be directly connected to sub-switching box 4520A-F to maximize flexibility in load management. Sub-switching box 4520A may manage in synchronicity with the other sub-switching boxes (4520 series). Other terminal units are in 4530-A, 4530-B and 4530-C. System 4500 of FIG. 45 may be used to manage additional devices, e.g. load control to single plug or to, smart receptacles, whether hardwired or plug-in.

Sub-switching box 4520-E and sub-switching box 4530-C illustrate having more than one device (receptacle) daisy chained in series and having one of them going back to switching box 4510. Both receptacles in 4530-C are managed by box 4520E as a single unit. The chained in series arrangement reduces flexibility in managing each receptacle in 4530C, but saves wire and thus reduces cost. The electrical devices may be directly linked via a switching box 4510 or 4520 series to achieve maximum flexibility in managing the devices.

In sub-switching boxes 4520 and 4510, there is dynamic power allocation. In an example embodiment, multiple receptacles are daisy chained, still under the load management and power switching because a specific run may for example exceed 15 A. If power switching on non-dedicated wiring is to be completed, the maximum current is only limited by the gauge (amp rating) of the wire, providing flexibility in installation. For example, a limitation of 15 A is an average rating of wire and may be used to wire a premise at 20 A.

For load management and dynamic switching, when the system includes a daisy chain then communication system may still keep communication connectivity.

In an example embodiment, dynamic power allocation of available amperage allows complete load balancing and load management, and allows to save hardware by not activating sections not in use. It may be appreciated that this may require electrical code change. Each intelligent junction box 4510 and 4520 may be viewed as an intelligent breaker box.

Box 4510 can replace a breaker panel and 4520 series can act as a new type of subpanel. Usually in a house one would not have as many traditional subpanels. Cost savings may be achieved by having many of the new types of subpanels herein illustrated spread across, allowing for an easier topology of a true star network where every single device (whether lighting, receptacle, appliance or any other electrically powered device) wired into the system as its own run going into it, thereby maximizing the flexibility of such a system.

An example embodiment includes separately electrical switching, communications switching and combined electrical with communications switching.

FIG. 45 box 4510 and the 4520 series. The intelligent electrical switching junction boxes 4510 and 4520 may be equipped with series of dry contacts and sensors that can replace alarm systems by being able to manage many or all contacts and all sensors (e.g. fire, smoke, etc.). The entire system can easily handle the sensors and the alarms. The intelligent switching junction boxes 4510 and 4520 may receive glass, window, door contacts and manage these in the fenced area and use the gateway to send messages to outside world (including but not limited to an external alarm company). The intelligent switching junction boxes 4510 and 4520 may provide new home monitoring services and generate business for third party alarm companies.

In an example embodiment, the intelligent junction box also acts as a communication protocol switch. Increasing the amperage possibly to 40, 50, 100, 200 amps on that switch, on that intelligent junction box, can eliminate the need for sub panels, and a lot of the wiring in a house or building, An intelligent junction box could be installed on each floor.

A house normally needs 200 A current and may have a 200 Amp panel which may have a plurality of 15 amp lines or individual breakers. If the panel receives 40 or 50 amps, the system 4510 or 4520 only needs 5 or 6 breakers rather than up to 40 breakers. Instead of a 15 Amp breaker, 40 Amps comes in (bigger wire) to intelligent junction box 4510 or 4520. Therefore, intelligent junction box 4510 or 4520 may eliminate the need for any communication wire in a house and might even provide an alternative to traditional wiring of alarm systems. As shown in FIG. 45, a 200 Amp intelligent junction box 4510 may be connected to and distribute the power to a plurality of 15 Amp (or lower) to 100 Amp (breakers and/or other electrical devices or other intelligent junction boxes 4520A-F, and each intelligent junction box 4520 A-F may be connected to one or more loads 4530, and 4530A-C to supply the power, including but not limited to receptacle devices, lighting devices, appliances, heaters, HVAC systems.

In typical communication tree, all wiring in the intelligent junction box 4510 or 4520 may be terminated at a patch panel that is connected to switches. In order to minimize the traffic on wire, the switches know each drop and may direct the respective traffic to relevant drop. In some examples, each drop has a Mac address and/or a TCP/IP address. The switches may maintain a Mac address table or IP address table of each drop, so that the switches may uniquely identify a drop. Therefore, each apparatus may connect to a drop, and receives respective own traffic. This improves the throughput of the traffic since no traffic for other apparatus is carried in the bandwidth.

Therefore, with the switch in the intelligent junction box 4510 or 4520, the data throughput from a first computer to a second computer through a switch may be improved. Other computers in the network do not see the traffic between the first and second computers. By providing communication switching to intelligent junction box, the capacity of intelligent junction box 4510 or 4520 may have the bandwidth use multiplied by 10, 100, or 1000 times as the bandwidth is more effectively used to transmit only relevant data.

In a regular topology, the intelligent junction box 4510 or 4520 may act like a hub. The intelligent junction box 4510 or 4520 has the information of the devices or appliances connected to the intelligent junction box 4510 or 4520. Data switches or routers may be replaced with the box intelligent junction box 4510 or 4520 to provide data routing services. The neutral-to-ground communication may provide sufficient bandwidth to provide data routing services because of a different environment. The 3 wire direct connect system eliminates the need of a Bus Bar.

The circuit breaker panel may have a different configuration, e.g., with none or only a few 15 A circuits. The intelligent junction box 4510 or 4520 may use breakers supporting greater current, e.g., 40/50/100 Amp breakers. The limitation is only on the amperage rating of the individual line wires with respect to particular code standards. Electrical wiring of the intelligent junction box 4510 or 4520 remains the same. In some examples, the intelligent junction box 4510 or 4520 may have a "lollipop" (star) configuration.

In some examples, wires of a sub panel may be included to the intelligent junction box 4510 or 4520. An example embodiment is an intelligent subpanel with communication switching. For example, a) for power, b) for communications, and/or c) for both. 4510 and 4520A-F may be one, two or three phase.

The intelligent junction box 4510 controls the power output up to a full load of 200 Amps. The intelligent junction box 4510 or 4520 is no longer circuit dependent, for example with the star topography. The intelligent junction box 4510 or 4520 may wire to a physical section and distribute the power supply to intelligent junction boxes 4520A-F from the physical section.

In some examples, a circuit box or a communications module may be included in the intelligent junction box 4510 or 4520 to provide electrical communications and may receive connection that would normally receive 15 A. A set of wires may be included in the circuit box or communication module. The circuit box or a communications module may provide 15 A, 20 A and output 15 A, 20 A circuits. The circuit box or the communications module may be a pass-through for power supply and intercept only the communication traffic.

In an example application, alarm systems typically require multiple contacts. In an example embodiment, the alarm system may be integrated into single wiring, for example, by wiring the alarm system to a receptacle or to a switch nearby. Devices for alarm systems may be placed into the described receptacles, or infrastructure.

In some examples, the intelligent junction box 4510 or 4520 may include one or more inline control boxes. The intelligent junction box 4510 or 4520 may be configured to receive one or more contacts, sensors and to replace physical panel, and to communicate with a processor, such as a CPU to manage the intelligent junction box 4510 or 4520, the devices and elements therein.

The intelligent junction box 4510 or 4520 may be used to monitor a premise, such as an entire house which traditionally have been zone driven, often combining daisy chain windows, and zones. The intelligent junction box 4510 or 4520 may substantially eliminate wiring with other devices in house other than small run between contacts and a plug or a contact and a switch. In the example of FIG. 45, six intelligent junction boxes 4520 are connected to intelligent junction box 4510. The topology of having intelligent junction box 4510 as a master box and six intelligent junction boxes 4520 as subs reduces wire runs. Short runs to the subs and only a few runs into box 4510 from six intelligent junction boxes 4520. Alternatively intelligent junction box 4510 may be used separately form the 4520, and electrical Devices may be wired directly to connect to the 200 A intelligent junction box 4510.

FIG. 46 illustrates a voice input/output system 4600 in accordance with an example embodiment. The system 4600 may include a processor 4602. The processor 4602 may connected to one or more input devices for receiving external information, a display 4606 for output information, a data storage device 4608, a RAM 4610, a ROM 4612, one or more auxiliary I/O 4614, a data port, a speaker 4618, a microphone 4620, a camera 4622, a wireless or wired communication system 4624, and a power supply 4626. The power supply 4626 may communicate with the communication subsystem 4624. The power supply 4626 may supply power to electrical devices, such as electrical receptacle, appliance, lighting devices, HVAC systems, or heaters. The power supply 4626 may also supply power to the systems described above in FIG. 33 or FIG. 41.

The voice input/output system 4600 may use secured network via wireless or wired communication system 4624. In some examples, the wireless or wired communication system 4624 may include a gateway for the system 4600 to access to external network.

Figure 47:
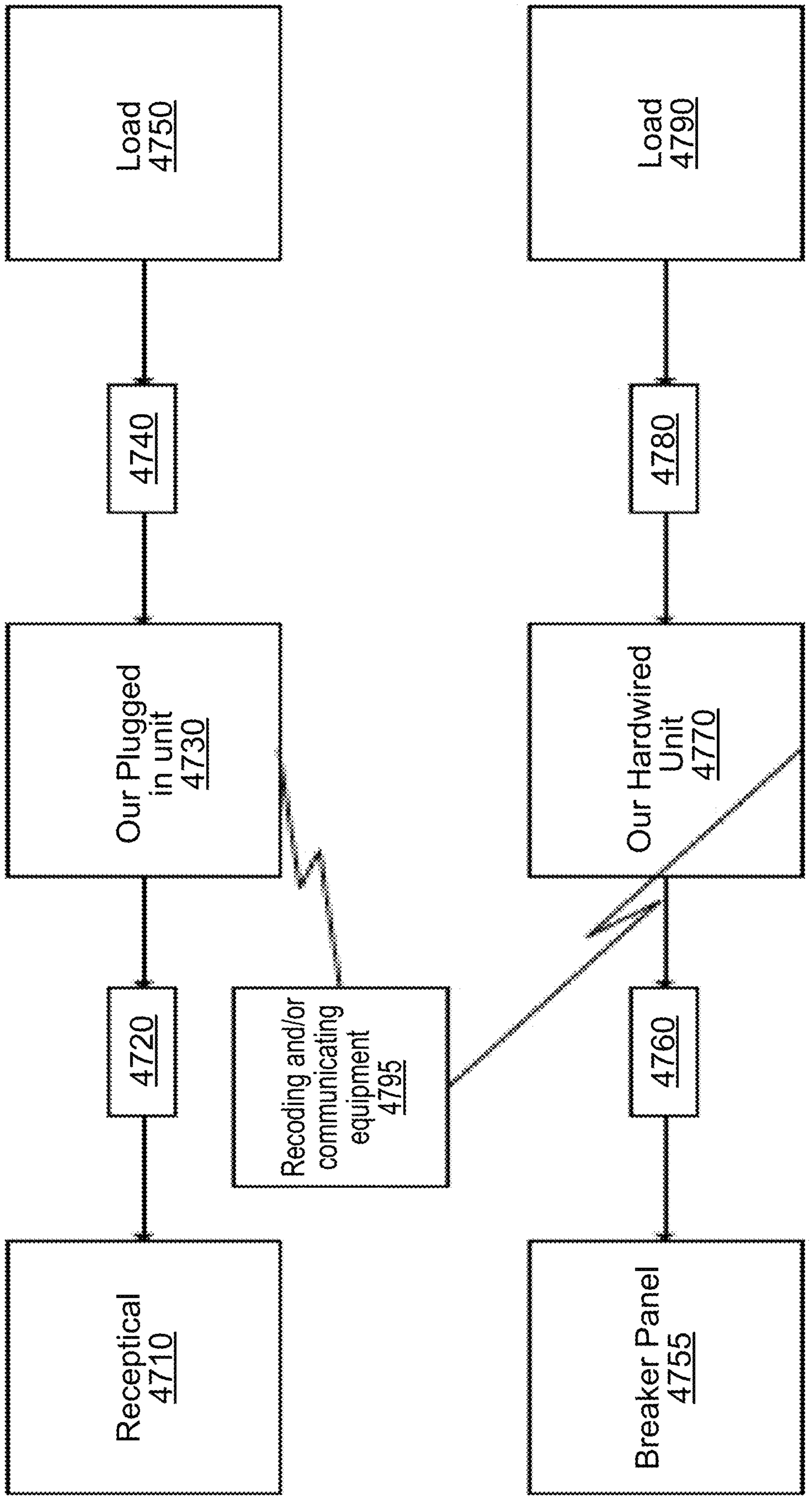
FIG. 47 is a block diagram illustrating two embodiments of the one circuit monitoring unit, plugged in and hardwired.

FIG. 47 illustrates two embodiments of a circuit monitoring unit, one is plugged in and one is hardwired.

In the first embodiment, a plugged-in unit 4730 is plugged in series with a receptacle 4710 by using a cord 4720. The load 4750 is plugged in the unit 4730 using a cord 4740. The unit 4730 through a communication link is connected to a data recording and communication unit 4795 for controlling the plugged in unit 4730 and/or monitoring/reporting the status of the plugged in unit 4730.

In the second embodiment, a unit 4770 is hard-wired in the circuit in series using electrical wires 4760 to the power source, such as a breaker panel 4755. The load 4750 is also hard wired and plugged in the hardwired unit 4770 using electrical wires 4780. The unit 4770 through a communication link is connected to the data recording and communication unit 4795 for controlling the hardwired unit 4770 and/or monitoring or reporting the status of the hardwired unit 4770. Each of the units 4730 and 4770 may also have a separate data recording and communication unit 4795. In some examples, the data recording and communication unit 4795 provides a control mechanism which allows for controlling the operation of unit 4730 and/or 4770. 4760 may be connected to an intermediary system rather than directly to a breaker panel.

In some examples, the data recording and communication unit 4795 has a communication port for both receiving data from the unit 4730 and/or 4770, and transmitting command to the unit 4730 and/or 4770 enabling 4795 to control the operation of the unit 4730 and/or 4770. 4795 may be a control device including but not limited to a PLC machine or a computer.

In some examples, the data recording and communication unit 4795 has two ports, one data port for receiving data from the unit 4730 and/or 4770, and one command port for transmitting commands to the unit 4730 and/or 4770 to control the operation of the unit 4730 and/or 4770.

In some examples, the data recording and communication unit 4795 includes a processor or a computer. Wires may be used to connect the processor with the communication port, or with the data port and command port. An API may be used to for the communication between the data recording and communication unit 4795 and the plugged-in unit 4730 or the between the data recording and communication unit 4795 and the hardwired unit 4770. For example, the API may be used, over the communication link, both to receive information, such as performance statistical data or acknowledgments, and to control the operation of the unit 4730 or unit 4770 by sending commands to the unit 4730 or 4770.

In some examples, the unit 4795 includes one or more transducers, rather than induction transformers, to convert AC current to DC current, to measure the DC voltage transmitted on the links 4720 and 4740, and to report the measured DC voltage.

In some examples, the unit 4795 includes one or more hall-effect sensors for measuring the current by transfusing the current into voltage. The ADC only measures voltage. As such, signals need to be first transfused into voltage signals, and the ADC then measure the voltage signals. The ADC may determine or calculate the measured voltage for example, based on the scale of the unit used. In some examples, the current, 10 amps, is first converted to a voltage, for example to 1.73 volts. The ADC may then measure the voltage and calculate RMS (average), and then can measure the current. Based on the scale of the unit used and the units measured, the ADC may determine the voltage value such as 1.73 V. The ADC uses the measured voltage, such as 1.73 V, to represent the current, such as 953 milliamps.

The signals may be voltage or current. When voltage of the incoming AC is measured directly through a resistor grid, the voltage of the hot line is directly measured by using the register divider dropped down to 3 volts for measurement in the ADC. The ADC only measures the signals. Therefore, it is necessary to have a separate processor to control the operation of the unit 4730 or 4770.

In the example of FIG. 47, the measurement and control of the signals are conducted by the unit 4795. Signals are transmitted to the unit 4730 and 4770 from the receptacle 4710 and the breaker panel 4755, respectively. With the communication links that connect the unit 4730 and 4770 with the unit 4795, the unit 4795 measures the signals and controls the operation of the unit 4730 and/or 4770. The units 4730 and/or 4770 may be measurement and building automation equipment from a number of manufacturers such as Mircom, Johnson Controls, or Siemens to name a few.

In an embodiment, a metering device may be used for a power distribution cabinet distributing power through a plurality of electrical wires. Each wire is driven by a line Voltage. A method of operating the metering device includes providing for a plurality of current transformers on aboard, each current transformer generating a current signal Voltage responsive to a current of an electrical wire through the current transformer, providing for a plurality of connections on the board for a plurality of different line voltages; and arranging said plurality of current transformers in physical correspondence to power outputs of said power distribution cabinet.

In a metering device for a power distribution cabinet distributing power through a plurality of electrical wires, each wire driven by a line Voltage, said metering device having a plurality of current transformers, each current transformer generating a current signal Voltage responsive to a current of an electrical wire through said current transformer, and a plurality of connections for a plurality of different line voltages, a method of calibrating said metering device.

Generating within said metering device a calibration number from an energy reading of a reference metering device and a metered energy reading of each current transformer and corresponding electrical wire mapped to be driven by one line voltage whereby said metered energy is rapidly calibrated.

In a metering device for a power distribution cabinet distributing power through a plurality of electrical wires, each wire driven by a line Voltage, said metering device having plurality of current transformers, each current transformer generating a current signal Voltage responsive to a current of an electrical wire through said current transformer, and a plurality of connections for a plurality of different line voltages, a method of calibrating said metering device comprising: generating within said metering device a calibration number from an energy reading of a reference metering device and a metered energy reading of each current transformer and a line Voltage.

A metering device for metering energy delivered on a plurality of electrical wires, said device comprising a plurality of current transformers, each current transformer arranged to generate a signal in response to current on one of said plurality of electrical wires; at least one Voltage connection for a line Voltage of said one of said plurality of electrical wires; and circuitry connected to each of said plurality of current transformers and said at least one Voltage connection, said circuitry sampling said current transformer signal and said line Voltage to measure instantaneous energy delivery over each one of said plurality of electrical wires, each one of said plurality of electrical wires and Voltage mapped by programming to one of a plurality of meter accounts monitored by said metering device; whereby said metering device is capable of monitoring energy delivery to a plurality of customers.

In a metering device for a power distribution cabinet distributing power through a plurality of electrical wires, each wire driven by a line Voltage, said metering device having a plurality of current transformers, each current transformer generating a current signal Voltage responsive to a current of an electrical wire through said current transformer, and a plurality of connections for a plurality of different line voltages, a method of operating said metering device comprising: mapping a current signal Voltage of at least one of said plurality of said current transformers in said metering device to a line Voltage driving an electrical wire associated with said at least one current transformer; and metering energy by product of said current signal Voltage and said line Voltage according to said mapping.

The method of the above storing said mapping into nonvolatile memory.

In a metering device for a power distribution cabinet distributing power through a plurality of electrical wires, each wire driven by a line Voltage, said metering device having a plurality of current transformers, each current transformer generating a current signal Voltage responsive to a current of an electrical wire through said current transformer, and a plurality of connections for a plurality of different line voltages, a method of operating said metering device comprising: programmably mapping a current signal Voltage of at least one of said plurality of said current transformers in said metering device to a line Voltage driving an electrical wire associated with said at least one current transformer; metering energy by product of said current signal Voltage and said line Voltage according to said mapping for one of a plurality of meter accounts monitored by said metering device.

Figure 49A:
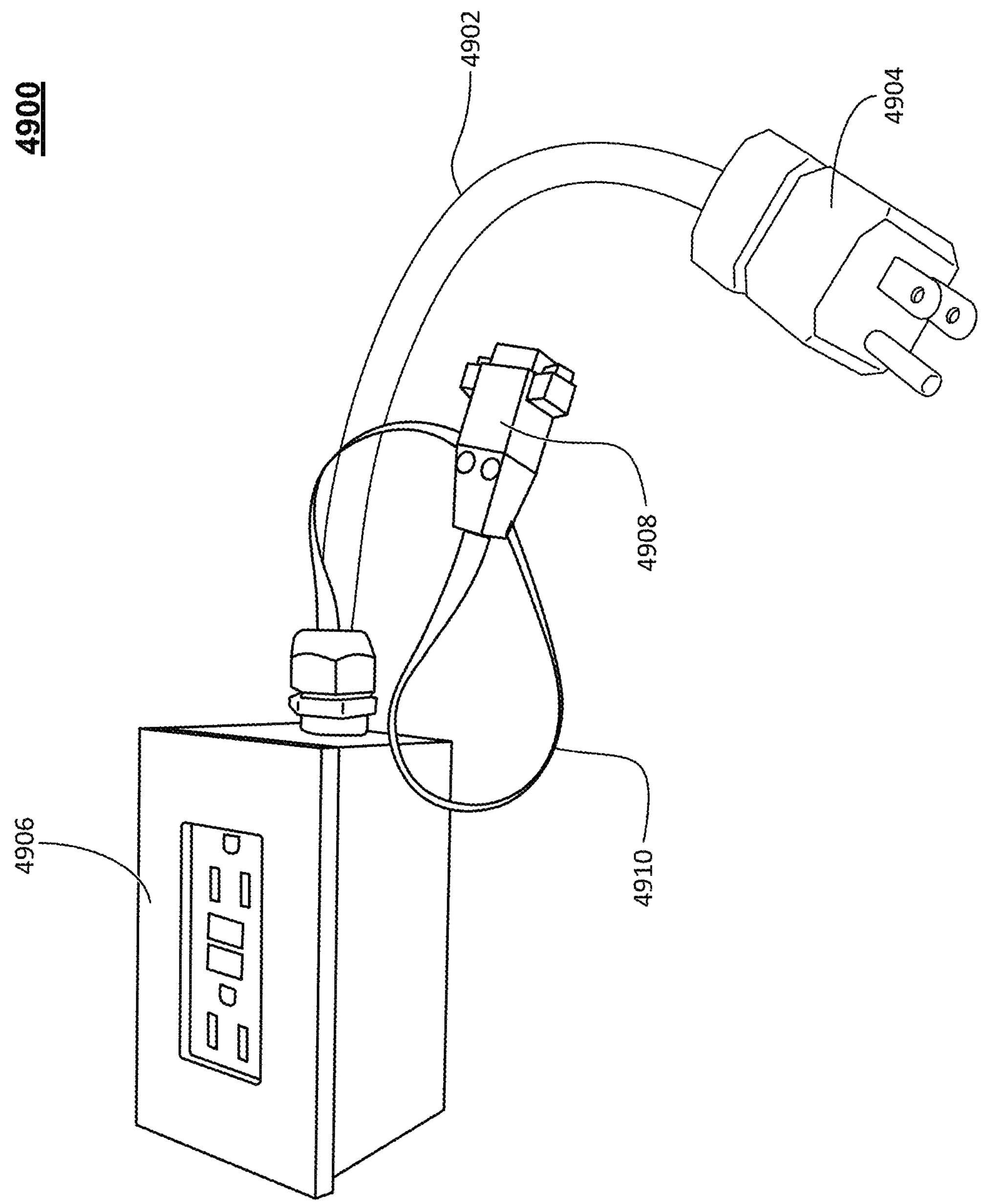
Figure 49B:
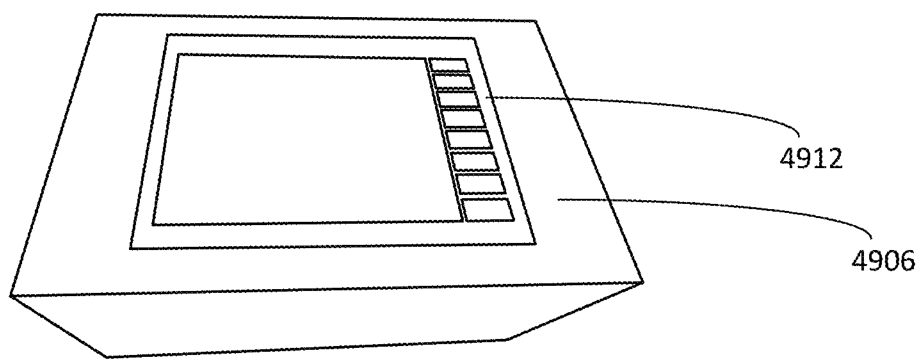

FIGS. 49A and 49B illustrates an exemplary extension cord. In FIG. 49A, an extension cord 4900 comprises: a cable 4902 having a first end portion and a second end portion; a power input end 4904 terminating the first end portion of the cable 4902; a power output end 4906 terminating the second end portion of the cable 4902; at least one sensor (not shown) positioned at the second end portion for detecting signals indicative of the cable 4902; a solid state switch (not shown) in series relationship with the cable 4902 at the second end portion of the cable 4902; a processor (not shown) configured to determine, based on the detected current, that there is a ground fault, arc fault or over-current condition, and in response cause the solid state switch to deactivate. The processor may be connected with the power output end 4906 via a connector 4908 and a cable 4910. The processor may control the operation of the power output end 4906 via the connector 4908 and the cable 4910. FIG. 49B illustrates an example of a display screen 4912 that is integrated with a casing of the power output end 4906 of the extension cord 4900.

In some examples, the processor is configured to cause the solid state switch to activate when there is no ground fault, arc fault or over-current condition. The processor may also be configured to cause the solid state switch to deactivate in response to receiving a manual command.

In some examples, the solid state switch and the at least one sensor are in a same packaging or a same circuit board. The solid state switch and the at least one sensor may also be in the same packaging or the same circuit board as the power output end. The at least one sensor may be in series relationship with the cable at the second end portion of the cable 4902. The at least one sensor may comprise a current sensor for detecting current and/or a voltage sensor for detecting voltage. The at least one sensor may detect signals of a hot power line of the cable 4902. The at least one sensor may detect signals of a neutral power line of the cable 4902.

In some examples, as illustrated in FIG. 49A, the power input end 4904 comprises a male end, and the power output end 4906 comprises a female end. In the example of FIG. 49A, the power output end 4906 may also comprise at least one or a plurality of plug outlets. Each of the plurality of plug outlets may individually controllable by the processor.

Traditionally, in the example of a breaker panel, the live power wire is connected to the breaker panel, the neutral wire is connected to a bus bar at the bottom of the panel, and the ground wire is connected to a separate bus bar, such as on a side inside the panel. The industry generally does not separate out distinct inputs for ground, and connects all of the ground of a circuit to one common bus bar.

Figure 48:
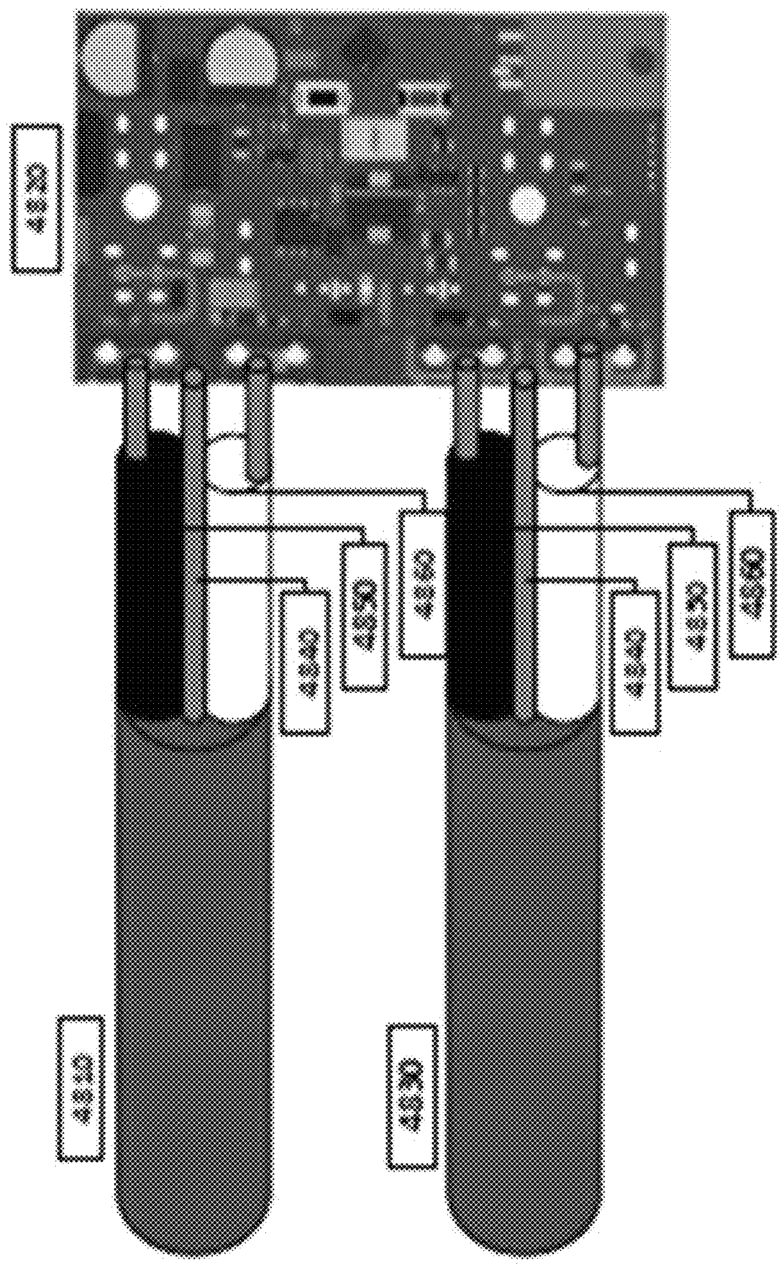
FIG. 48 illustrates a circuit module with its wired input and output.

In the examples of FIG. 48, separate ground connections are used to connect with each of the module 4820 or a circuit. In FIG. 48, the wires 4840, 4850, and 4860 connect to respective terminals that are connected to separate the buses of the module 4820 internally. The module 4820 may include filters. As illustrated in FIG. 48, the two neutral wires 4860 and the two ground wires 4840 are separately connected to two different isolated connectors of the module 4820. The connectors may be bus bars. With this arrangement, the module 4820 or a circuit reduces wires by wiring internally between the connectors and other circuits within the module 4820.

The module 4820 may also connect to one or more breaker panels, for example, from the opposition side of the connectors. In some examples, the module 4820 may also be included in a breaker panel.

The module 4820 may also be used in test circuits to generate the current leakage by connecting the live power wire to the connector connected to the neutral wire.

The industry uses the two wires (live power and neutral) into the transformer, and determines whether there is a magnetic imbalance between the live power and neutral widings. With module 4820, only the live power wire is connected to one sensor and the neutral is connected to a different sensor. Therefore, the live power and neutral wires are connected to two separate sensors, rather than connect to one transformer. In the industry case, once the power lines leave the transformer, they are merely used to source downstream loads and are not individually sensed.

The breaker panel may be used in the Breaker companion module 4820, inside the breaker panel and/or in power and communication switching device.

The ground wires 4840 has dual purposes: In the input 4810 of the module 4820, the ground wire 4840 acts both as an earthing return and a communication conductor; In the output 4830 of the Module 4820, the ground wire 4840 is for the earthing return. At the output 4830, all grounds are common and attached to the master earthing ground return. The master earthing ground return is a circuit that provides for power control within the module 4820. The output 4830 may be on a bus and common to the master earthing ground. At output 4830, ground is common in order for the ground not be a floating ground.

The input 4810 of the module 4820 includes incoming insulated wires, in the example of FIG. 48, the input 4810 contains three wires: wire 4850 as the insulated live wire, wire 4840 as ground wire that may be connected to the module 4820 individually and has a dual purpose of earthing the return and acting as a communication conductor as described above, and wire 4860 as the insulated neutral wire.

In some examples, the electrical noise associated with the electrical current may be filtered when the current is input from the input 4810. The wires 4840, 4850, and 4860 each may be connected to a filter before connecting to their respective bus bars. By filtering the electrical current, the noise of the electrical current is eliminated before the current is transmitted over the different bus bars so that cross noise between different wires 4840, 4850, and 4860 may be prevented; as well, filtering out the noise allows cleaner spectrum and faster data transmission.

The output 4830 in the example of FIG. 48 comprising insulated wires, the live wire 4850, ground wire 4840, and the neutral wire 4860.

The ground wire 4840 of the output 4830 provides earthing return. The ground wire 4840, similar to other common ground systems, is electrically connected to a master ground, for example, the ground of a building, including a residential, commercial building.

In some examples, the input 4830 may be connected to a breaker panel. if the module 4820 is used to form a breaker panel, the ground wire 4840 is connected to the master grounding bus of the breaker panel.

Figure 50A:
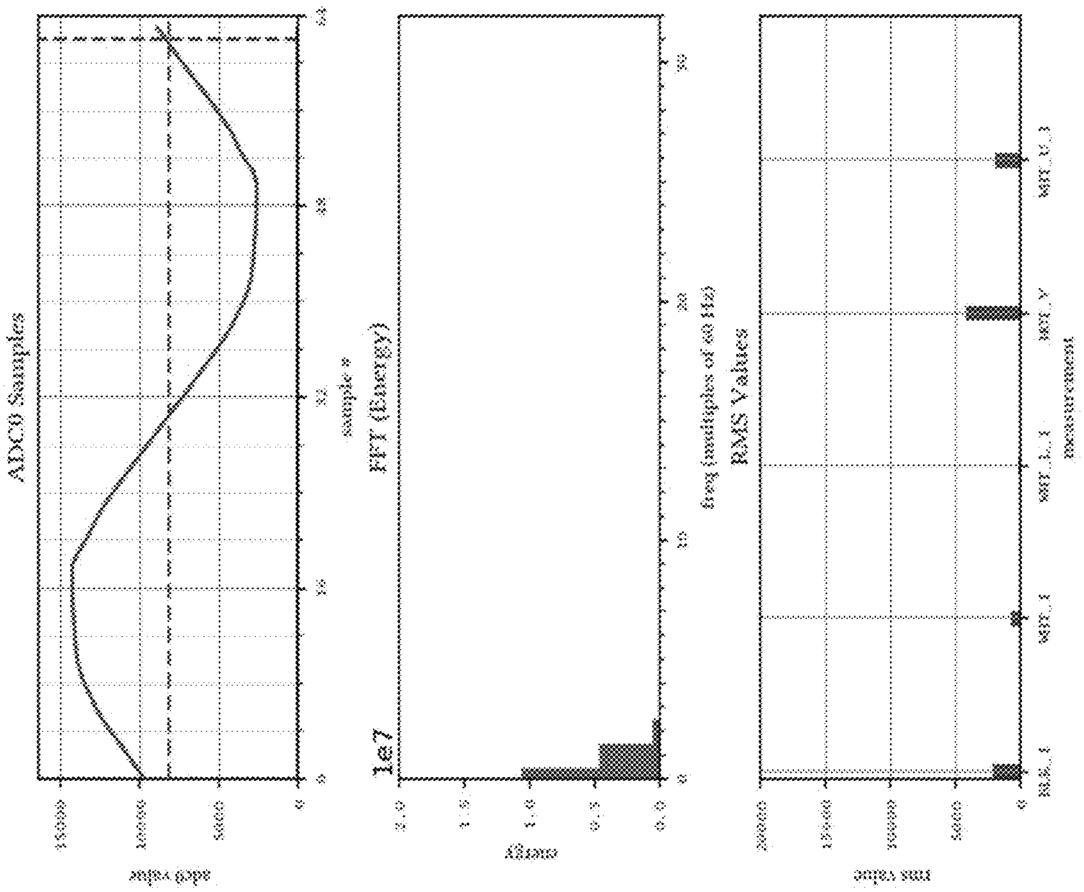
FIGS. 50A, 50B, and 50C illustrates exemplary data and commands available for display on the monitoring screen, or for communication, in accordance with example embodiments.
Figure 50B:
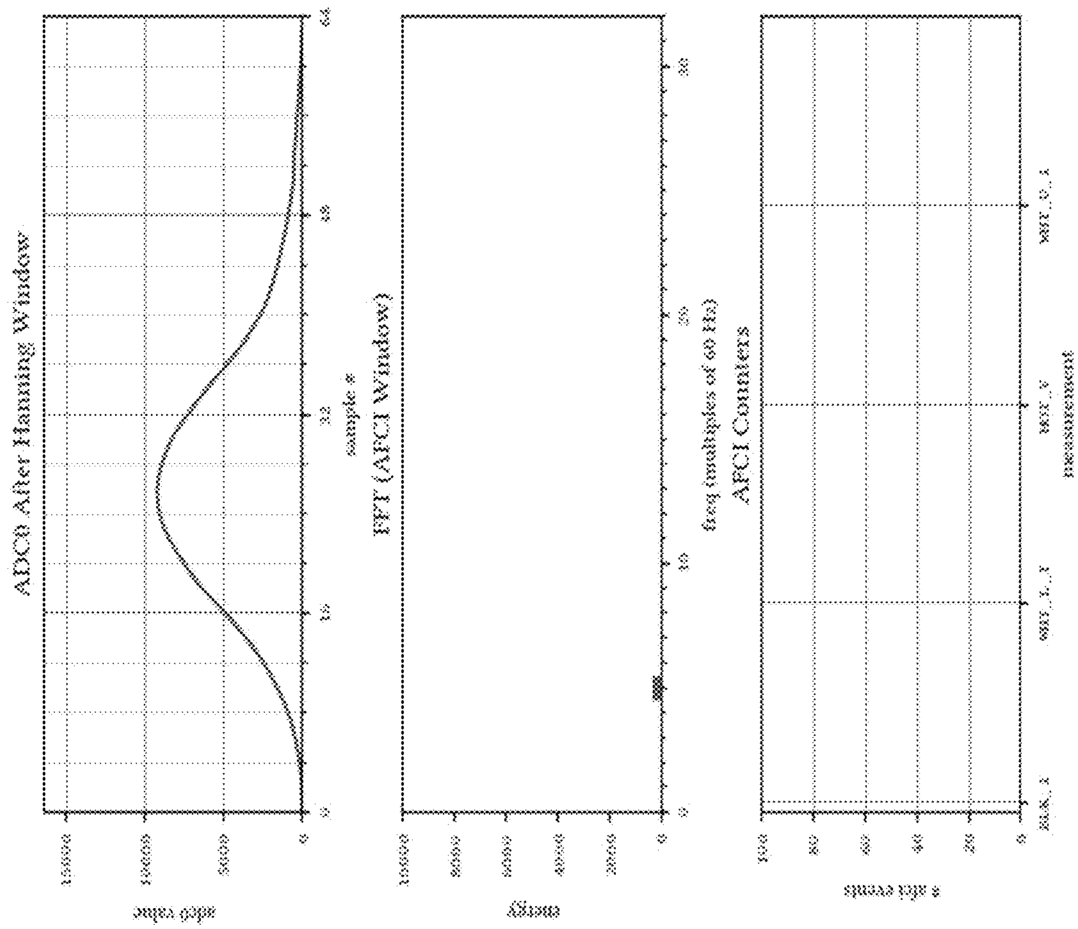
Figure 50C:
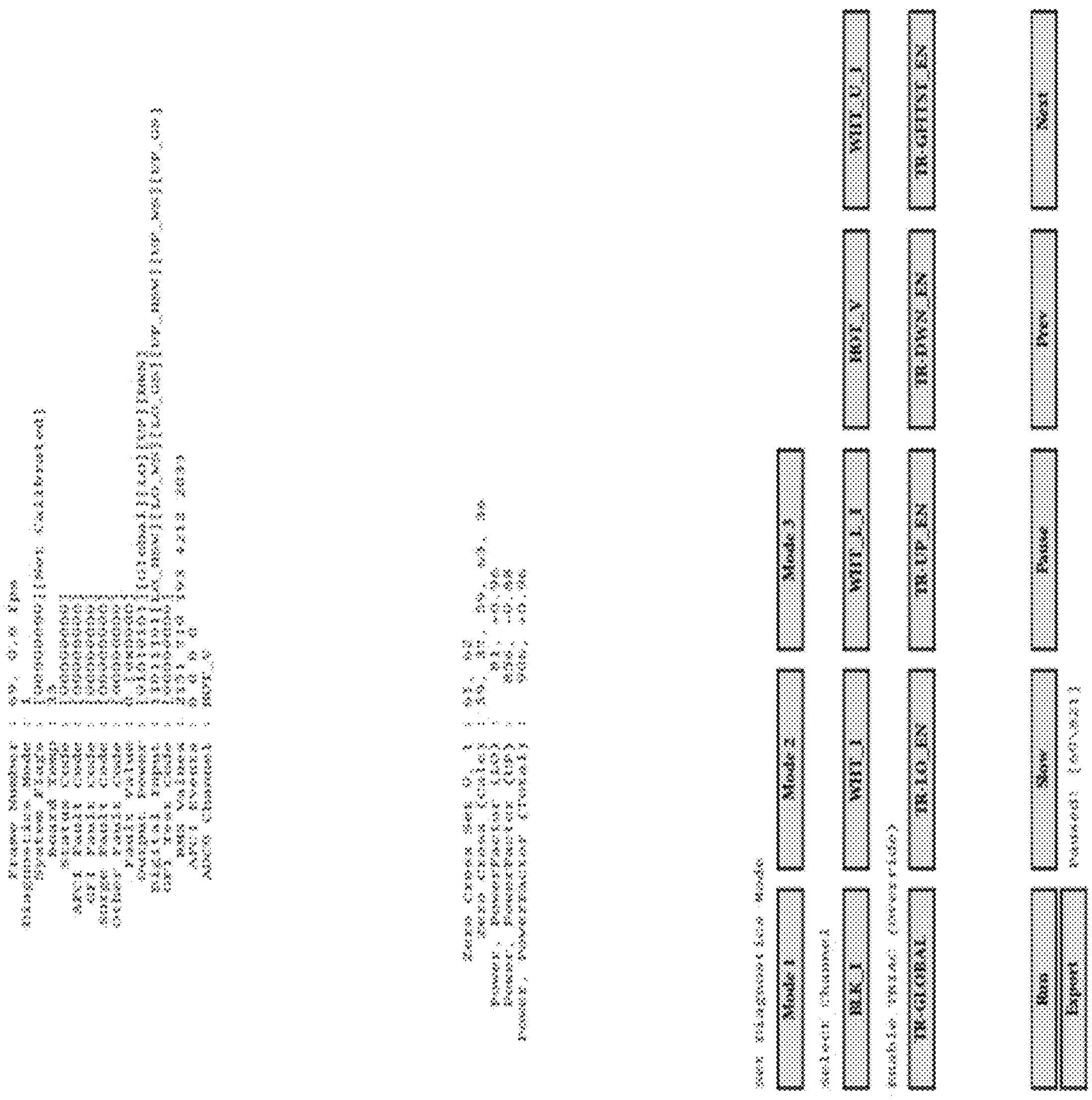

If the module 4820 is used to form a switch, the ground wire 4840 is also connected to a master ground bus that is connected to the master ground, so that the module 4820 is connected to the master ground. By connecting to the master ground bus, messages may be extracted without having a floating ground FIGS. 50A, B and C illustrates examples of the parameter settings and data which are detected or calculated by the device, which can be displayed on the monitoring screen 5204 of applicable electrical products, including but not limited to receptacle devices (with or without outlets, corded, portable and/or direct-wired), extension cords, branch circuit feeders in a breaker panel, an electrical junction box that is adjacent to the circuit breaker panel, an in-line power receptacle, a metering device, or an intelligent junction box. Parameters and controls may be used to diagnose applicable electrical products. FIG. 50C illustrates a first set of exemplary parameters and controls, and FIGS. 50A and 50B display measurements or analysis results according to the first set of parameters and controls. FIG. 50A illustrates the sampling values generated by ADC, the FFT analysis results, and RMS values of different channels associated with the different electrical lines, such as the white line, black line, and the hot power line. Similarly, the parameter settings and data can also be displayed onto the display screen 4912 of the extension cord 4900 (FIG. 49B), in an example. Note, the actual content shown in FIGS. 50A, 50B and 50C is not intended to depict scientific accuracy, but rather represents an illustration of what kind of data can be displayed in an embodiment. In another embodiment, Information could be displayed, collecting data over an extended period of time showing multiple AC cycles.

As illustrated in the example of FIG. 50C, parameter settings may be displayed. Frame number denotes the frame rate of the recording, for example, frame number 69 at some frame per second recording speed. Diagnostic Mode indicates the mode of operation such as mode 1. The modes will be described in greater detail below. System flag to show whether the system is calibrated, for example not calibrated. Board temperature indicates the temperature of the electrical board, such as 33 degrees. Status code is used to indicate the operation status: for example, all zero's means that there is no fault. AFCI fault code, GFCI fault code, surge fault code, other fault codes and fault value collectively indicate the current value that caused the trip. Output power indicates the powers that are turned on; e.g. global power and downstream are the only ones illustrated as turned on in the example of FIG. 50C. Digital input indicates the pins that have been plugged in. RMS values indicates values of black current, return current, upper receptacle current, and lower receptacle current. AFCI event indicates number of times that the arc has been detected while it was turned on or powered on. ADC0 channel indicates the power line pursuant to which the information is provided, for example, HOT-V indicates hot voltage line. Zero cross set 0, 1 and Zero cross (Calc) are the voltage zero cross, then black current and white and their zero cross. Based on Zero cross set 0, 1 and Zero cross (Calc), the Power Factors may be determined. Power factor (UP), Power Factor (LO) are calculated based on zero cross values.

Under a specific mode; Select Channel allows to control different subjects, such as including but not limited to black, white, upper receptacle, lower receptacle, and hot volts. The commands can be issued using Modbus to make the selection, for example by setting the mode, and channel number etc.

As illustrated in the examples of FIGS. 50C, there may be three or more diagnostic modes, such as, mode 1, mode 2, and mode 3. Different modes are associated with different data. API may be used to switch the mode of the diagnostic information. For example, in mode 1, voltage data and Fast Fourier transformation, frequency analysis and related information may be collected and displayed. In mode 2, information related to time domain signals for voltage, current, white currents may be collected and displayed. In mode 3, voltage information is not available, but other power analysis information, such as zero crossing, power factor measurements etc., may be collected and displayed. By switching to different modes, different information may be collected and displayed.

With the different modes, information may be multiplexed depending on the requirements of the master. Different modes may be used to display information of different subjects of interest. In some examples, in mode 1, voltage and its frequency analysis of related information are produced. If the black current, or total current is of interest, mode 1 may be switch to black current to show time domain black current data and along with it the FFT, the frequency analysis and related information.

The API can be used to manually or automatically set the current threshold, which can be a standard or non-standard current threshold value.

An example embodiment is an electrical circuit interruption device including: a contact configured for electrical connection to a power line; a solid state switch for in-series electrical connection with the power line; a sensor to detect current signals indicative of the power line; a processor configured to: set a settable current threshold value, and deactivate the solid state switch in response to the detect current signals of the power line exceeding the settable current threshold value.

In an example of the electrical circuit interruption device, the settable current threshold level is a standard current threshold value. In an example of the electrical circuit interruption device, the standard current threshold value is 15 A/20 A or 16 A/32 A, 50 A, 100 A, 200 A or more. The standard current threshold value may also be values in the international standards, or a customized value, a predetermined value, or a controlled value or input. In an example of the electrical circuit interruption device, the settable current threshold level is non-standard current threshold value. In an example of the electrical circuit interruption device, the setting is performed by the processor based on the detected current signals. In an example of the electrical circuit interruption device, the setting is performed by the processor based on a database stored in a memory accessible by the processor. In an example of the electrical circuit interruption device, the settable current threshold level for the setting is received by the processor by way of received input. In an example of the electrical circuit interruption device, the received input is received from an Application Program Interface, a user input device, a second electrical receptacle device, or a computer device.

Reference to breakers, circuit breakers, and circuit breaker panels may be interchangeable used or interchangeable as to their functionality as described herein, as applicable. An in-inline electrical receptacle may be synonymous with an intelligent junction box, in example embodiments. The disclosed concepts are applicable to in-wall electrical receptacles, power strips, power bars, extension cords, receptacle adaptors, circuit breakers, circuit breaker panels, in-line electrical receptacles, junction boxes, and other devices to facilitate provision, safety, and control of electrical power from power lines to downstream loads. Such receptacles may or may not include plug outlets for a matching plug, or other output connectors such as fixed electrical wiring, terminal screws, sockets or pins. Reference to neutral-to-ground can be used interchangeably with ground-to-neutral, depending on the perspective of the particular device. While a North American 110V 60 Hz receptacle is exemplified herein, the disclosed concepts are applicable to other international receptacles or devices. Similarly, the disclosure is not limited to plug blades as the mating means for the receptacle outlet but is applicable interchangeably to other plug configurations such as found in other international standards. Moreover, although the present disclosure has been exemplified in a single phase alternating current context, the disclosure is operable in the contexts of direct current and multiple-phase systems.

Examples of solid state switches or controlled state switches include insulated-gate bipolar transistors (IGBT), MOSFETs, and TRIACs they would be included in a module similar as the one shown in FIG. 48.

As illustrated in the example of FIGS. 51A-51D, an electrical device 5101 for separated power lines. The utility 5110 provide electrical power to the electrical device and the Earth ground 5112 provides an earth ground. The utility 5110 may include a power line 5113, a neutral power line 5114, and a ground line 5115. In some examples, the utility 5110 may first connected to a main circuit breaker 5116 for protecting the electrical device 5150.

Figure 51A:
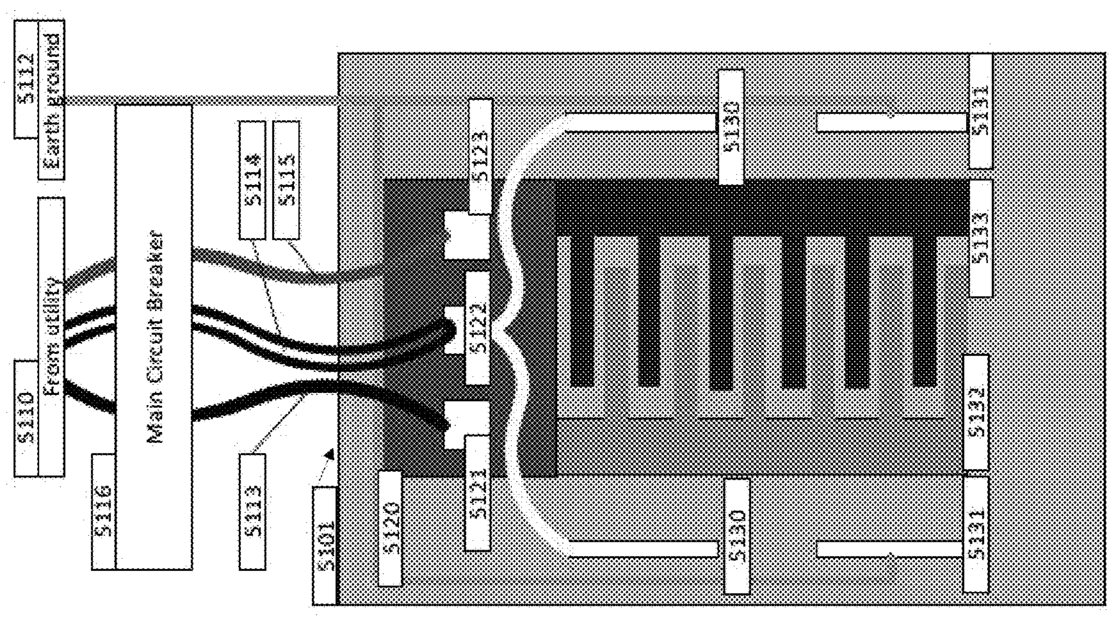
FIGS. 51A, 51B, 51C and 51D are diagrams illustrating evolution history of breaker panels including example embodiments.

In the example of FIG. 51A, the electrical device 5101 may be a circuit breaker panel, an electrical junction box that is adjacent to the circuit break panel, an in-line power receptacle, a metering device, or an intelligent junction box.

Figure 51B:
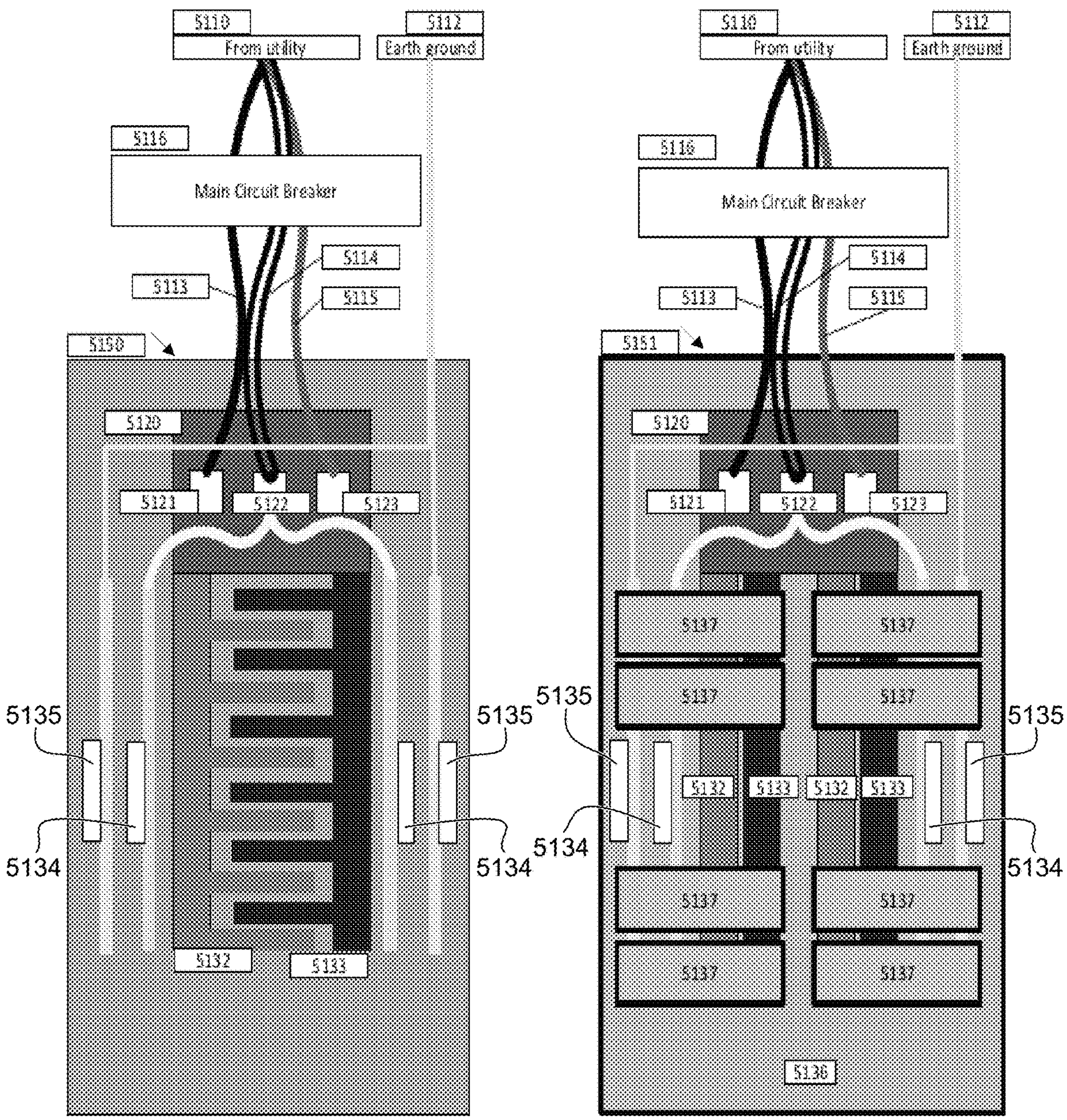
Figure 51C:
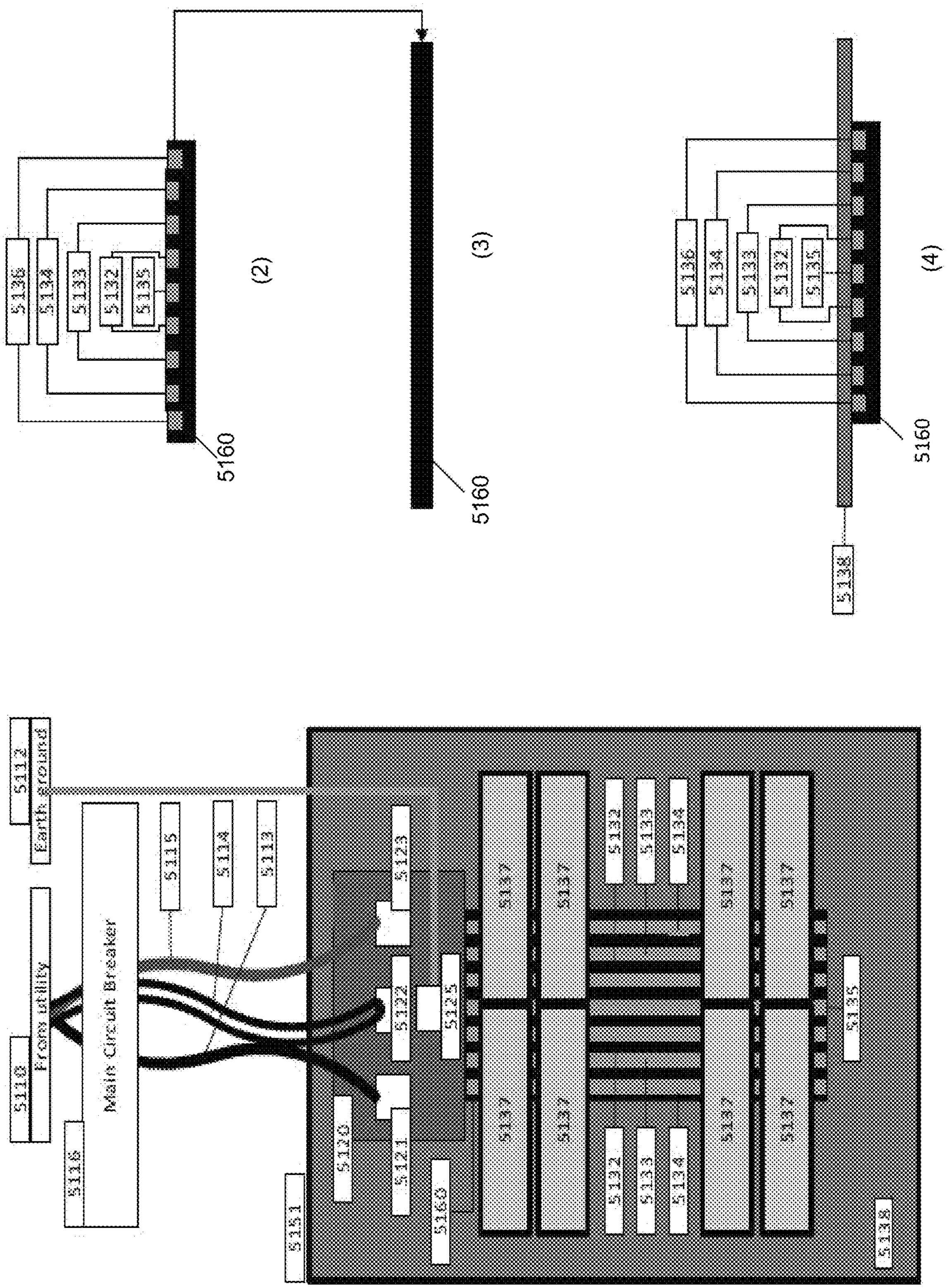

In the example of FIG. 51B, the electrical device 5150 may have a circuit breaker connected to the neutral and to ground. In some examples, the electrical device 5151 may have a circuit breaker connected to the neutral and to ground using a PCB connected to a socket. In the example of FIG. 51C(1), the PCB may connect to the socket via a plastic encased rail, and the PCB may connect to the socket via a plastic encased rail. The casing of the panel may be a standard casing with the attachments for securing the wires coming from the field. The wires from the field may be directly connected to the sockets 5137 to the PCB modules hosted in the sockets 5137. The sockets may include a module 4820 as illustrated in FIG. 48. The electrical device 5150 may include a rail or bus bars block 5135, for example, to provide a common ground to the electrical device 5150.

The casing of the panel may be a standard casing with the attachments for securing the wires coming from the field. The wires from the field may be directly connected to the sockets 5137 to the PCB modules hosted in the sockets 5137.

In the examples of FIGS. 51A-51C, the isolation connecting block 5120 is an example of a two phase arrangement. The isolation connecting block 5120 may also have one phase or three phases. The isolation connecting block 5120 may include but not limited to a plurality connectors or contacts 5121, 5122, 5123 and 5125. In the example of FIGS. 51A-51C, the connector 5121 is connected to the live power line 5113, the connector 5122 is connected to the neutral line, and the connector 5123 is connected to the ground line. And the connector 5125 is connected to the earth ground.

The railing system 5160 of the electrical device 5151 may include 5-9 connectors. In the example of FIG. 51C(2), the railing system 5160 includes 9 connectors for a three phase arrangement. The rails 5136 may be removed in a two phase arrangement. In a one phase arrangement, both the rails 5136 and 5134 may be removed. In some examples, one of 5132, 5133, 5134, 5135 and 5136 rails may be in first and second railing systems 5160, one rail may be used per row of the sockets 5137. The rails 5132-5136 may be bus bars.

FIG. 51C(3) is a side view of the boarder of the railing system 5160 showing the side encasement of the railing system. The bottom end of the railing system 5160 may be capped, and the top end of the railing system 5160 may be connected to the connecting block 5120.

In the example of FIG. 51C(4), a main motherboard 5138 may be included and placed on top of the railing system 5160 with a socket system or a Breaker clip top of the PCB placed on the mother board 5138.

Figure 51D:
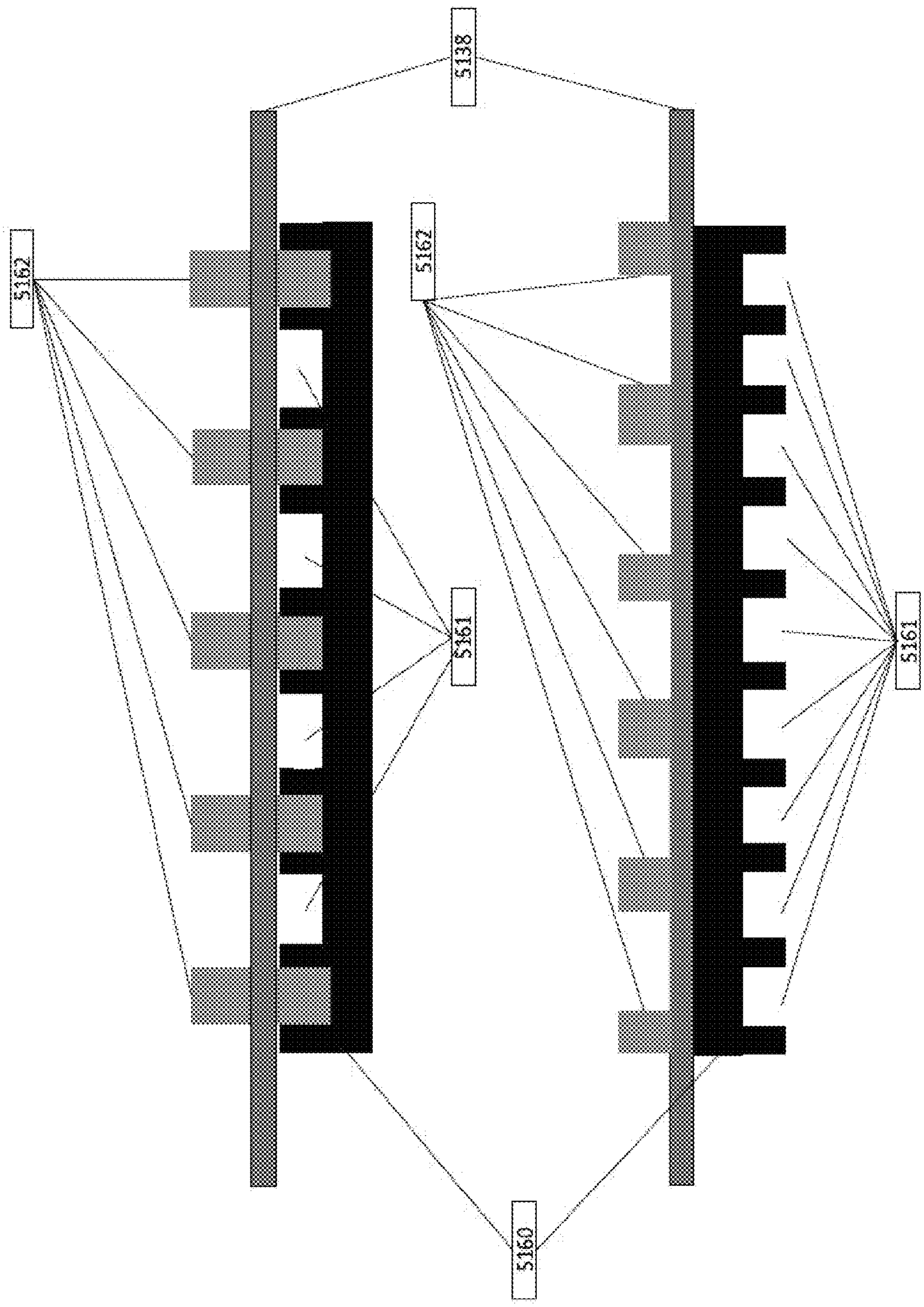

FIG. 51D illustrates an example of the rail system 5160, which includes a plurality of air gaps 5161 for dissipating heat generated by the rail system 5160 or the mother board 5138. For example, the hot air heated by the rail system 5160 or the mother board 5138 may be dissipated through the air gap.

In some examples, the electrical device 5101, 5150, or 5151 comprises: a plurality of electrical devices 5137, each electrical device 5137 comprising a first contact 5121 for electrical connection to a respective upstream hot power line 5113, a second contact 5122 for electrical connection to a respective neutral power line 5114, and a third contact 5123 for electrical connection to a respective upstream ground line 5115; each electrical device 5137 comprising a fourth contact 5132 for electrical connection to a respective downstream hot power line, a fifth contact 5133 for electrical connection to a respective downstream neutral power line, and a sixth contact 5134 for electrical connection to a respective downstream ground line; a bus 5135 for electrically connecting all of the downstream ground lines.

The electrical device 5101, 5150, or 5151 may further comprise at least one sensor in series relationship between one of the upstream power lines 5113 and one of the downstream power lines for detecting signals. The at least one sensor may include at least one current transducer.

Each electrical device 5137 may include a switch in series relationship between the first contact 5121 and the fourth contact 5132, for controlling conductive connectivity between the respective upstream hot power line 5113 and the respective downstream hot power line, responsive to the signals detected by at least one of the sensors.

The at least one sensor may include a respective sensor for each electrical device 5137 in series relationship between the first contact 5121 and the fourth contact 5132 for detecting signals indicative of one of the respective hot power lines, for controlling at least one of the switches.

The at least one sensor may include a respective sensor for each electrical device 5137 in series relationship between the second contact and the fifth contact for detecting signals indicative of one of the respective neutral power lines, for controlling at least one of the switches.

Each electrical receptacle may include a respective filter or diode in series relationship between the third contact 5123 and the sixth contact 5134, for filtering or one-way conductive connectivity from the respective upstream ground line to the respective downstream ground line.

The electrical device 5101, 5150, or 5151 may further comprise at least one communication subsystem configured for wired communication over at least one of the downstream power lines with reference to the downstream ground line. The one of the respective downstream power lines for the wired communication may be the respective downstream neutral power line, or the respective downstream hot power line.

The electrical device 5101, 5150, or 5151 may further comprise at least one communication subsystem configured for wired communication over at least one of the upstream power lines with reference to the upstream ground line.

The electrical device 5101, 5150, or 5151 may further comprise a circuit board that contains the plurality of electrical devices, the circuit board include the bus for the electrically connecting of all of the downstream ground lines.

In some examples, the bus comprises a rail 5132, 5133, 5134, 5135, or 5136. In some examples, the bus the bus is for connecting to earth ground.

The electrical device 5101, 5150, or 5151 may further comprise a second bus 5131 for electrically connecting all of the downstream neutral lines without connecting to the upstream neutral lines 5114.

The electrical device 5101, 5150, or 5151 may further comprise a plurality of circuit boards, wherein a first circuit board includes the bus and a second circuit board includes the second bus 5131.

The electrical device 5101, 5150, or 5151 may further a plurality of circuit boards, wherein a first circuit board includes the bus and a second circuit board includes the first contact 5121 for electrical connection to the respective upstream hot power line 5113.

Figure 52:
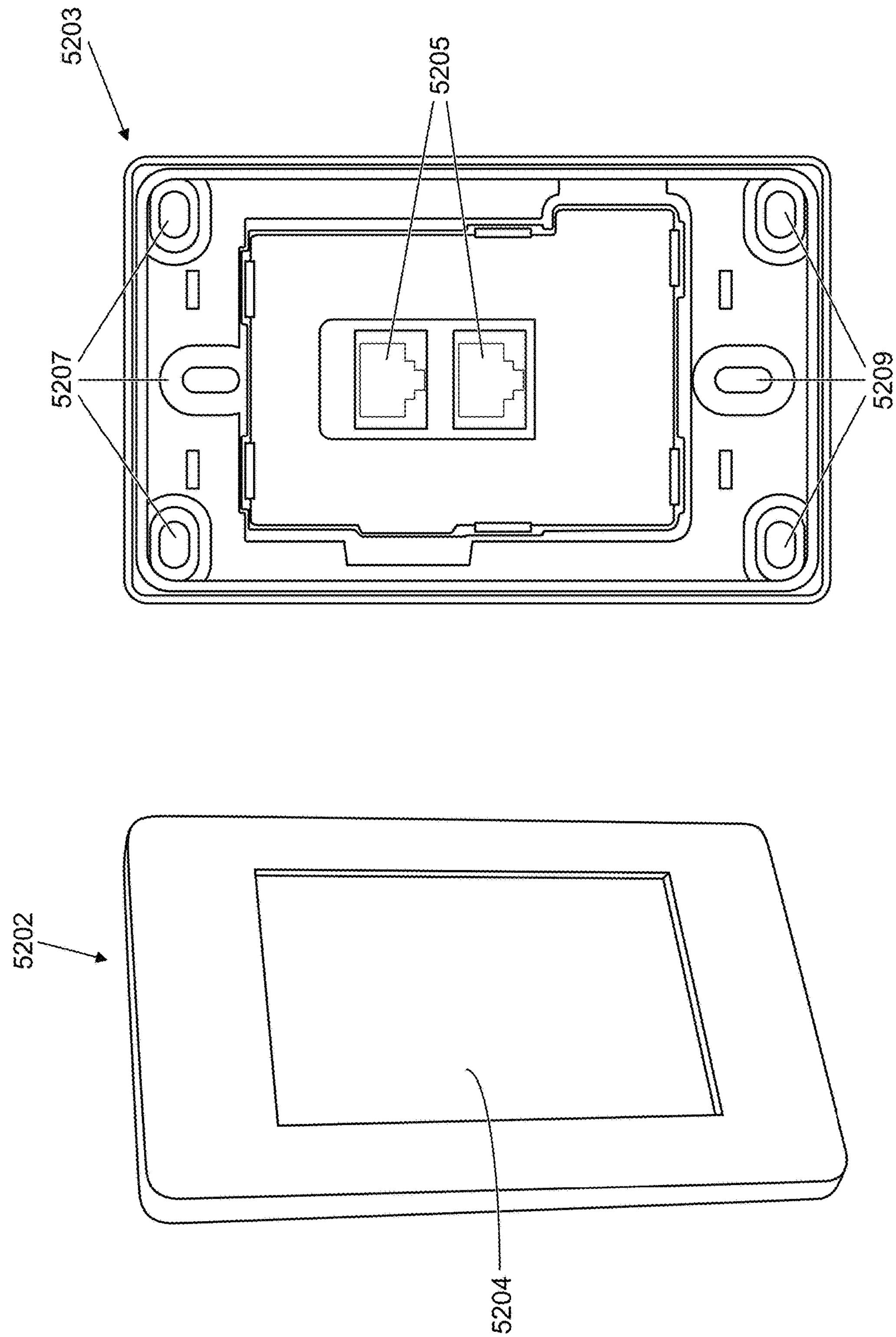
FIG. 52 is a front view and a rear view of a RS485 display screen.

A RS485 connected display screen 5200 may include a cover 5202 and a base 5203. FIG. 52 illustrates a front view of cover 5202 and a rear view of a base 5203 of a RS485 display screen 5200.

Figure 53:
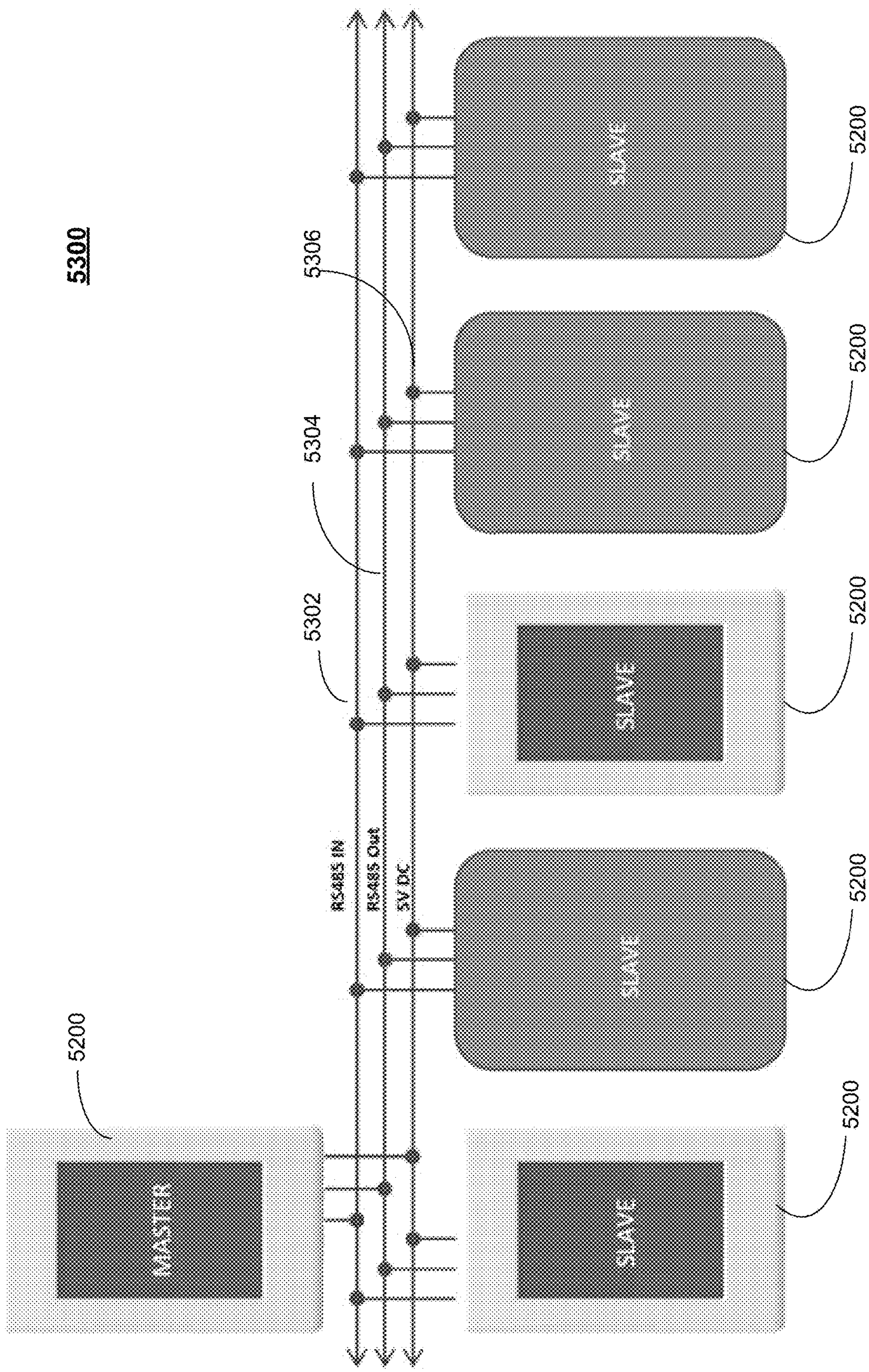
FIG. 53 is a block diagram illustrating a number of RS 485 screens network.

As illustrated in FIG. 53, a number of display screens 5200 may be connected via serial communications ports (or interfaces) such as RS485 or USB, to form a display screen network 5300. In the example of FIG. 53, the display screen network 5300 includes a master RS 485 display screen 5200, and five slave RS 485 display screens 5200. Each RS 485 display screens 5200 is connected to a RS485 in signal line 5302 for slave RS 485 display screens 5200 to receive input signal from the master RS 485 display screen 5200, a RS485 out signal line 5304 for slave RS 485 display screens 5200 to transmit signals to the master RS 485 display screen 5200. The 5V DC line 5306 supplies 5V DC to the master and slave RS 485 display screens 5200.

The RS485 display screen 5200 may be mounted on the wall and the RS485 display screen 5200 may be Display- Control Mod Breakers. The RS485 display screen 5200 may have a Display/Control Module (DCM) 5204.

As illustrated on the rear view of the RS485 display screen 5200, the Display-Control Module (DCM) 5204 is configured to be mounted in to a standard light switch metal electoral box (single gang), which enables quick and easy installation in to a wall. The Display-Control Module (DCM) 5204 may be mounted into an enclosure or panel, and may have a wide range of uses for different applications. The DCM 5204 may be mounted without an electrical box. In some examples, DCM 5204 has two holes for the RJ35 cables 5205 and at least two fasteners, such as two mounting screws for in one of the upper three mounting holes 5207 and in one of the lower three mounting holes 5209 to fix the DCM 5204, such as on a wall. In use, the cover 5202 may be clipped on or removed from the base portion 5203.

The DCM 5204 may include a 3.5" 320×480 TFT LCD Display, a processor, a Resistive Touch, micro-SD memory storage, a Real Time Clock, 4 wire RS485 serial Interface which can act as either Master or Slave RS 485 display screens 5200. The display, Resistive Touch, micro-SD memory storage, Real Time Clock, and 4 wire RS485 serial Interface are electrically connected with the processor. The processor may contain a Crypto Authentication security engine for securing the data transmissions, and support an Optional Wi-Fi module for wirelessly communicating the data with a wireless receiver, such as a computer, a tablet, or a smart phone.

The DCM 5204 is typically connected, by a single RJ-45 cable, to the other devices, such as a circuit breaker panel, an electrical junction box that is adjacent to the circuit break panel, an in-line power receptacle, a metering device, or an intelligent junction box. The cable uses 2 of the 4 pairs of conductors to carry a full-duplex RS485 serial data stream. For example, one pair of conductors receive data and the other pair of conductor transmit data. The other 2 pairs of conductors may supply 5V DC to power the DCM device 5204.

Other communication ports and interfaces may be used. As well, converters may be incorporated, such as RS485 to USB or Ethernet; and cabling such as CAD5 or CAD6 may be used. The application may use wireless communication to and/or from the display(s).

Figure 54A:
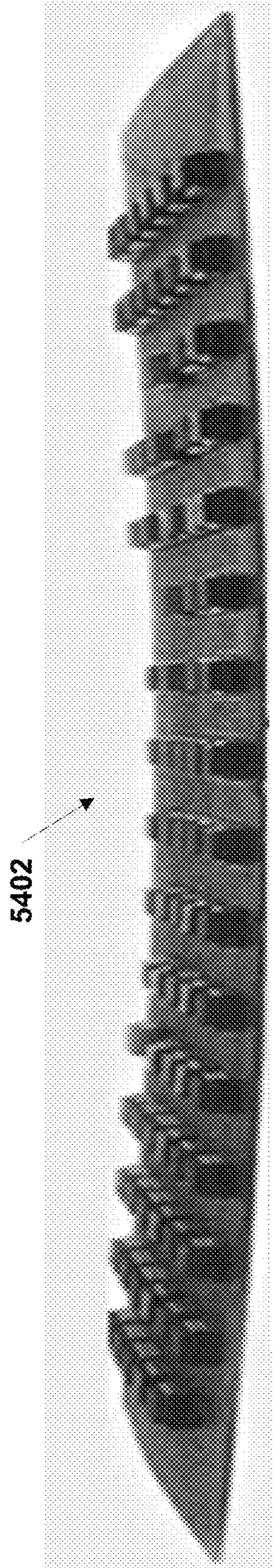
FIGS. 54A and 54B illustrate exemplary embodiments of circuit boards shown in FIGS. 51A-D.
Figure 54B:
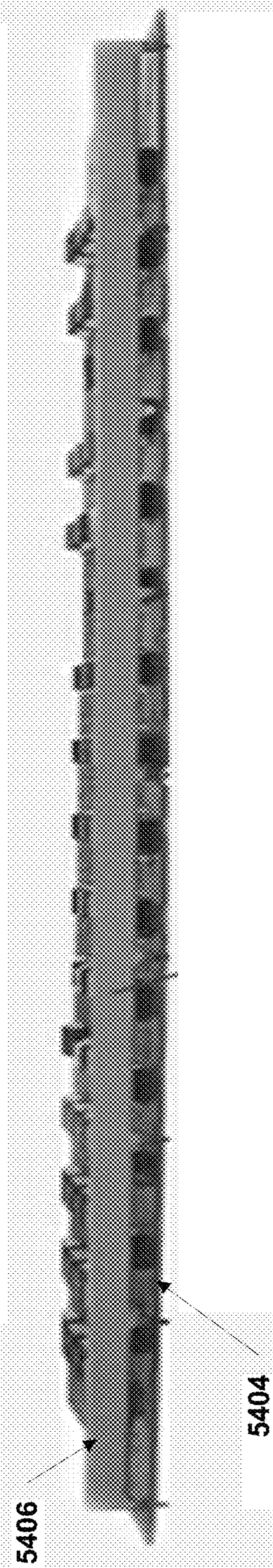

FIGS. 54A and 54B illustrate two exemplary power breakers or distributed panel modules. FIG. 54A illustrates a first power breaker or distributed panel module 5402. The circuit board of the module does not include a stiffener. FIG. 54B illustrates a second power breaker or distributed panel module 5404 on which a powder coated busbar 5406 covers some of the electronic components placed on the circuit board. In some examples, the busbar 5406 provide wide traces to enable the busbar 5406 serve as a high voltage power rail on the circuit board to provide the high amperage. The circuit board may be a PCB.

Figure 55:
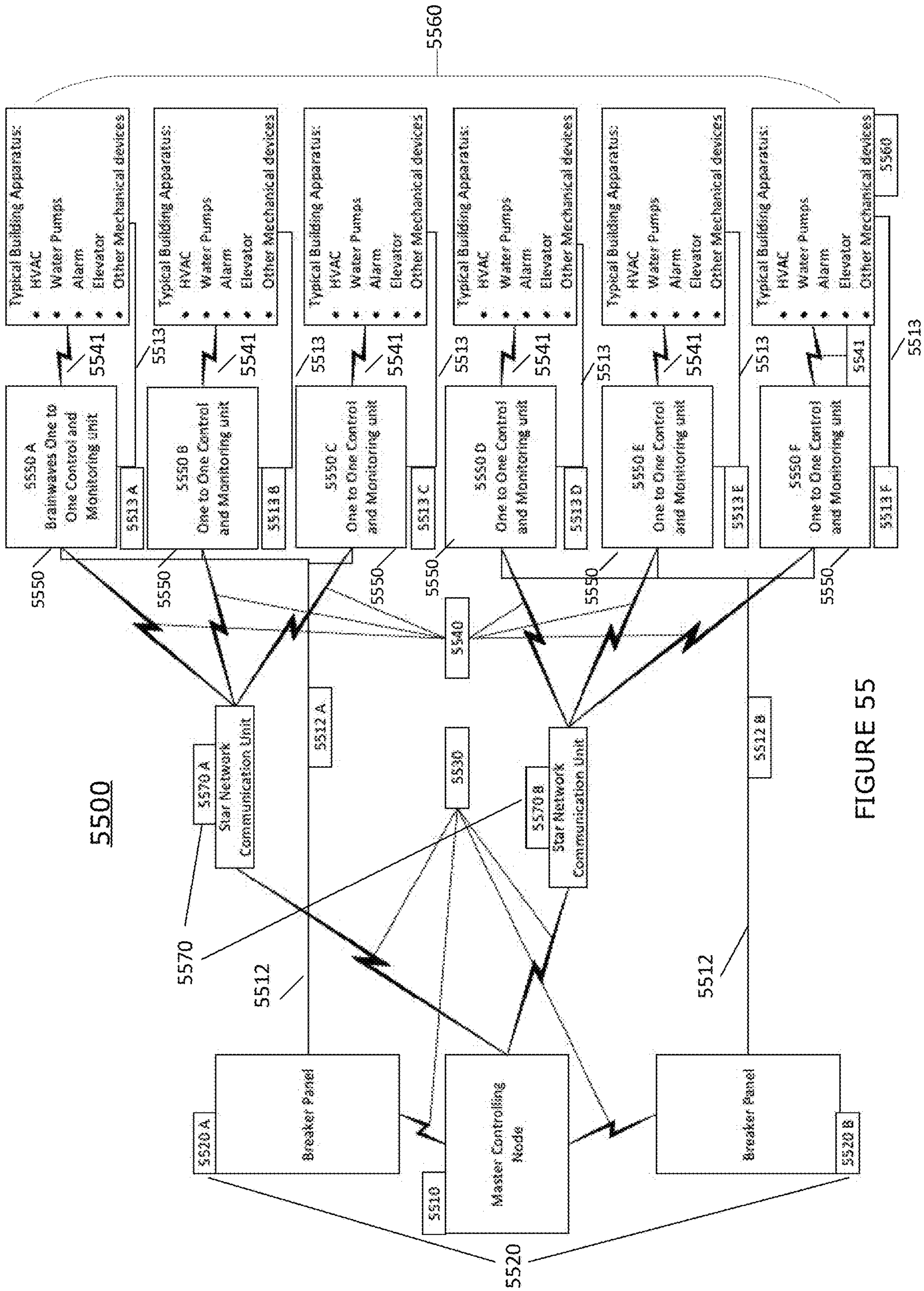
FIG. 55 illustrates exemplary embodiments of a building management monitoring and control system.

FIG. 55 illustrates an example of a power supply monitoring and controlling system 5500. The system 5500 may be used, for example, for monitoring and controlling power supply of a building. The system 5500 may be a PLC application system. The system 5500 may include one or more master controlling node 5510, one or more breaker panels 5520, one or more star network communication units 5570, one or more control and monitoring units 5550, one or more electrical devices 5560. The master controlling node 5510 may selectively control power supply to the electrical devices 5560 connected therewith, for example, by switching on or off the power supply from the breaker panels 5520 to one or all of the electrical devices 5560.

The Master Controlling Node 5510 monitors and controls the building management monitoring and control system 5500. In the example of FIG. 55, the Master Controlling Node 5510 communicates with two breaker panels 5520A and 5520B and two Star Networks Communication Units 5570A and 5570B. In some examples, the Master Controlling Node 5510 may communicate with one or more breaker panels 5520, and/or with one or more star network Communication Units 5570. In some examples, system 5500 may only include the master controlling node 5510 and control and monitoring units 5550, and the master controlling node 5510 may directly communicate with one or more Control and Monitoring units 5550 with the breaker panels 5520 or star network communication unit 5570 via the communication links.

The Master Controlling Node 5510 receives information from one or more breaker panels 5520, such as from 5520A and 5520B. In some examples, each of the Master Controlling Node 5510 may connect to up to 16 breaker panels and/or star network communication units 5570. The breaker panels 5520 may receive power input from the utility company. In some examples, the Master Controlling Node 5510 may operate as a power switching device. If the breaker panels 5520 are appropriately configured, the Master Controlling Node 5510 may be managed by a database, and an entry in the priority table that manages the order of the priority may control the power switching. The Master Controlling node 5510 may communicate with the breaker panels 5520, for example, by receiving information from the breaker panels 5520, and/or sending commands to controls the delivery of the power to one or more of the breaker panels 5520. For example, the Master Controlling node 5510 may control the breaker panels 5520A and 5520B to supply electricity to different electrical devices 5560 with different amperages.

In some examples, the master controlling node 5510 may include a processor for controlling the system 5500. The master controlling node 5510 may use Linux operating system.

In some example, the system 5500 may include more than one master controlling node 5510. Each Master Controlling Node 5510 may be connected with and control multiple star network Communication Units 5570, and/or breaker panels 5520. Each of the star network Communication Unit 5570 may have various network configurations. Each Star Network Communication Unit 5570 may connect or control one or more control and monitoring units 5550. In some examples, the control and communication unit 5550 may include a processor configured to send, through the star network communication unit 5570, a communication that one of the circuit breakers 5520 has opened or tripped to the master controlling node 5510. In some examples, a star network communication Unit may connect up to thirty-two or more units of control and monitoring units, depending on hardware limitations. The limitations are hardware driven and may be modified to handle up to 255 devices.

Various communication links may be used in system 5500. In the examples of FIG. 55, links 5540 may provide communication links between 5570 and 5550 using for example RS485 communications. In the examples of FIG. 55, the Star Network Communication unit 5570A is connected to each of three control and monitoring units 5550A-C by a communication link 5540; the Star Network Communication unit 5570B is connected to each of three control and monitoring units 5550D-F by a communication link 5540. Each of the Star Network Communication units 5570A and 5570B may connected to fewer than three control and monitoring units 5550. The Star Network Communication unit 5570A and 5570B may control the respective control and monitoring units 5550 connected thereto. 5540 is the communication Link using Power line communication.

System 5500 may also include communication links 5530 each for connecting the Master Controlling Node Block 5510 to the Breaker Panel(s) 5520A and 5520B, or to the Star Network Communication Unit(s) 5570A and 5570B. The communication links 5530 provides communications between the Master Controlling Node Block 5510 and the Breaker Panel(s) 5520A and 5520B, or to the Star Network Communication Unit(s) 5570A and 5570B. The communication links 5530 may use TCP/IP communication protocols. The communication links 5530 may be power lines In some examples, the measurement data from the start network communication units 5570A and 5570B and the breaker panels 5520A and B, are transmitted to the master controlling node 5510 and the control data from the master controlling node 5510 to the start network communication units 5570A and 5570B and the breaker panels 5520A and 5520B may be transmitted via the links 5530.

The system 5500 may also include links 5541 each for connecting a control and monitoring units 5550 to one or more electrical devices 5560. The links 5541 may be used to transmit data between the control and monitoring units 5550 and the electrical device 5560. The data may include control data from the control and monitoring units 5550, and measurement data from the electrical device 5560. The control and monitoring units 5550 may process the received data form the electrical devices 5560, and then transmit the processed data to the star network communication unit 5570 connected with the control and monitoring units 5550. The control and monitoring units 5550 may transmit data received from the electrical devices 5560 to the star network communication unit 5570 connected with the control and monitoring units 5550. In the example of FIG. 55, the system 5500 includes six communication links, each connecting the electrical devices 5560, such as the sensor(s) of the electrical devices 5560 to the Control and Monitoring Unit(s) 5550, such as 5550A-F. The sensors may include, but is not limited to, temperature sensors, monitoring friction sensors, vibration sensors, motor/engine noise sensors, smoke detection sensors, CO detection sensors, water flood detection sensors, and other sensors, which may directly or indirectly related to the electrical devices 5560 or the environment.

Power supply links 5513, such as 5513A-F, provides the electrical connections, between the Control and Monitoring Units 5550A-F and the electrical devices 5560. Power supply links 5513 may be electricity cables. Each of the power supply links 5513 may deliver electricity from a control and monitoring unit 5550 to one or more electrical devices 5560. The electricity provided by the control and monitoring unit 5550 are received by the control and monitoring unit 5550 from the breaker panel 5520 via the link 5512.

In some examples, the electrical devices 5560 may be configured in a star network topology by connecting to the star network communication units 5570. The system 5500 may monitor and control the electrical devices 5560 and report information regarding the operations of each of the electrical devices 5560. In the example of FIG. 55, electrical devices 5560 are examples of, but are not limited to, typical devices that may be connected to other electrical equipment, alarm systems, or devices that may be monitored such as HVAC, water pumps, elevators, escalators, alarms, electrically driven mechanical devices, etc. In some examples, each electrical device 5560 may include sensors, such as sensors for use in a building, for monitoring the status of the devices 5560. The system 5500 may operate with one or more of the electrical devices 5560. The electrical devices 5560 may be distributed in different units of a building or in different places of a facility.

For illustration purposes three Control and Monitoring Units Blocks 5550A-C are connected to one breaker panel Block 5520A and three other Control and Monitoring Units Blocks 5550D-E are connected to another breaker panel Block 5520B. Alternatively, the system 5500 may be designed to operate with fewer or more electrical devices 5560, fewer or more Control and Monitoring Units 5550, and/or fewer or more breaker panels.

One or more breaker panel connections 5512 each may be used to connect one the breaker panel 5520A or 5520B to one or more control and monitoring units 5550. In the example of FIG. 55, 2 breaker panel connections blocks 5512A and 5512B each may be connected to one or more control and monitoring units 5550. For example, breaker panel connections 5512A is connected with control and monitoring units 5550 A-C, and breaker panel connections 5512B is connected with control and monitoring units 5550 D-F.

Breaker panel connections 5512 A and 5512B provides electrical connections from the breaker panels 5520A and 5520B to the electrical devices 5560 via the Control and Monitoring Units 5550 A-F. Breaker panel connections 5512A and 5512B connected with the breaker panels 5520A and 5520B, respectively, may be configured as one, two or three phases. The Control and Monitoring units 5550 may use Triacs or IGBTs, or relays of the Control and Monitoring units 5550 for controlling the delivery of power to the devices 5560.

The control and monitoring unit 5550 may be connected to one or more breaker panels 5520 for receiving power supply from the breaker panels 5520. In the example of FIG. 55, control and monitoring units 5550A-C are electrically connected to the breaker panel 5520A via block 5512A and control and monitoring units 5550D-F are electrically connected to the breaker panel 5520B via block 5512B. Each of the control and monitoring units 5550 A-F may connected to one or more electrical devices 5560.

In an example embodiment, there is provided an electrical device 5500 comprising: at least one circuit breaker 5520 for connection to at least one hot power line, and each circuit breaker 5520 configured for a downstream electrical connection to a respective downstream power line 5512; a communication subsystem 5570; and a processor configured to send, through the communication subsystem 5570, a communication that one of the circuit breakers 5520 has opened or tripped. The communication may include identifying which particular circuit breaker 5520 has opened or tripped.

In another example embodiment, the communication subsystem 5570 is configured for wired communications over the hot power line. The wired communications continue when the one circuit breaker 5520 opens one of the power lines. The at least one circuit breaker 5520 may comprise a switch. The switch may comprise a solid state switch.

In another example embodiment, the at least one circuit breaker 5520 may comprise a mechanical breaker.

In another example embodiment, an electrical receptacle device comprises a contact configured for electrical connection to a power line. The contact may be configured for downstream electrical connection to a downstream power line. The contact may be configured for connection to an electrical outlet. At least one sensor is used to detect at least voltage signals indicative of the power line. A processor is configured to determine from the detected voltage signals that a series arc fault has occurred on the power line. In some examples, in response to said determining, the processor is configured to send a communication that the series arc fault has occurred. The electrical receptacle device may comprise a switch in series connection with the power line, where the processor is configured to, further in response the said determining, opening the switch. The at least one sensor may further include at least one current sensor to detect at least current signals indicative of the power line, wherein the determining is further based on the detected current signals.

Current may or may not be affected during a series arc fault depending on the particular load of the system. For a smaller load such as a light bulb, the current may not show much of a variance, if at all, because the value of the current itself is so small. In a larger load, the current variance will be detectable during a series arc fault. A threshold current value can be used to differentiate between a small load and a large load, In another example embodiment, the power line comprises a hot power line or a neutral power line or a ground power line.

Figure 56B:
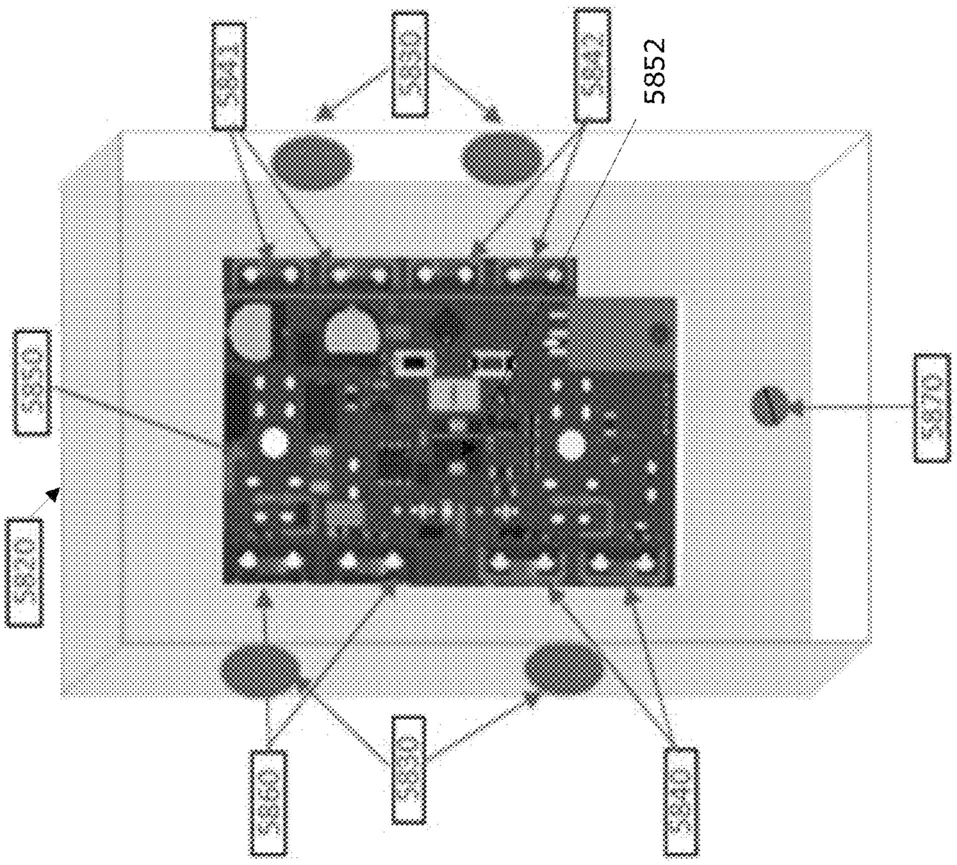
FIGS. 56A and 56B illustrate exemplary embodiments of a cover and a box housing of a junction box.
Figure 56A:
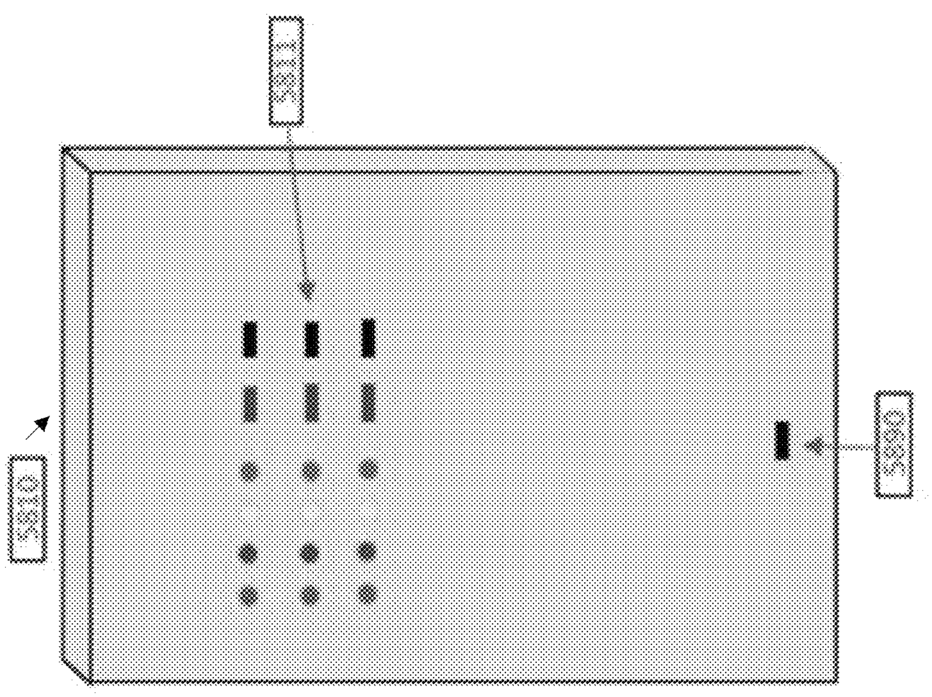

FIGS. 56A and 56B illustrate a junction box 5800. The junction box 5800 includes a cover BLOCK 5810 and a box housing BLOCK 5820. In use, the cover BLOCK 5810 is configured to cover the box housing 5820. The cover BLOCK 5810 may incorporate LEDs for indicating the status of various conditions of the junction box 5800, such as active, not active, occurrence of a fault (series or parallel arc fault, ground fault, and more). The box housing BLOCK 5820 houses a power control and analysis module 5850. The line power input, including line and neutral wiring, and optionally ground wiring, may connect to the power control and analysis module 5850 at conductors, such as metal clips 5860. Line power may be output at least one of the output channels 5840, 5841 and 5842. More or fewer output channels may be included in the power control and analysis module 5850. The cover BLOCK 5810 may also include controllers or actuators, such as test and reset buttons for each output channels.

The block 5810 may include a plurality of indictors to show the status of the junction box 5800, such as the output channels of the power control and analysis module 5850. In the example of FIG. 56*a*, three rows of LEDs indicate the 3 output channels 5840, 5841 and 5842. The block 5810 may also include test and reset buttons for each of the channels 5840, 5841 and 5842.

The block 5810 may also include a communications port BLOCK 5890 for the junction box 5800 to communicate with an external device. A communications channel may also be incorporated directly at box housing BLOCK 5820.

BLOCK 5830 represents a single line voltage input channel, including black, neutral and ground wires. Blocks 5840, 5841 and 5842 represent 3 different output channels 5840, 5841 and 5842.

The amperage output from output channels 5840, 5841 and 5842 for this embodiment may be 15 amps or 20 amps.

BLOCK 5830 may be pass-through holes that include strain reliefs. The input and/or output wires may pass through the holes as input power for connecting to the input terminal 5860 inside the box 5820, or wires with power output from the power module 5850, such as wires forming output channels 5840, 5841 and 5842, may pass through the holes to output the power from the junction box 5800. Conductors 5860 represents wiring clips in which black (live) and white (neutral) wires are inserted of the line wire from the breaker panel or any other feeder.

On the output side, each of the 3 output channels 5840, 5841 and 5842 is monitored independently by a microprocessor 5852 on the power control and analysis module 5850 and the microprocessor may indicate the status of the output channels 5840, 5841 and 5842 on the outer surface of the cover block 5810.

The example in FIG. 56B is configured for one line voltage input, and three outputs (line voltage, neutral return and ground). However, there may be only one line input and one output channel; the microprocessor 5852 may be configured to monitor one or more input channels and output channels 5840, 5841 and 5842. The output channels 5840, 5841 and 5842 may supply power to electrical devices or components, such as lights, plug outlets, and switches. In a star network, each circuit or load (or multiple downstream loads) may be connected to any one of the output channels 5840, 5841 and 5842. Multiple junction boxes 5800 or modules 5850 may interact with each other, and one output channel of one junction box or one module 5850, rather than supplies power to the its own output load(s) or circuit, may become the input channel to another junction box or module 5850, and a master-slave relationship between the junction boxes or modules 5850 may be formed in other configurations and embodiments.

For example, one junction box 5800 or a first module 5850 of junction box 5800 may have two output channels and a third output channel may lead to an input channel of a second junction box 5800 or a second module 5850. As such, two junction boxes 5800 or modules 5850 may result in 5 output channels to expand the output capacity of the junction boxes. Alternatively, 2 separate modules 5850 of a junction box 5800 may provide multiple channel outputs, such as, but not limited to, 4 output channels, 2 per module 5850.

The amperage of the output channels 5840, 5841 and 5842 may be 15 and/or 20 amps. The amperage of each output channel 5840, 5841 or 5842 may also be pre-set locally or remotely by the factory, the user, or a computer. In some examples, the upper limit of the current output from the output channels 5840, 5841 and 5842 may be a lower amperage such as 2 or 3 amps, for example, to protect certain equipment for example, or an amperage higher than 15 or 20 amps (e.g. 50, 100, 200), for example, to enable the box 5800 to act as a power switch for controlling the power to loads and/or circuits. In some examples, box 5800 may be a power switch for controlling power supply for other module(s) in a star network embodied in other boxes 5800 or transmitting to other modules 5850, for independent power definition and control.

Three output channels 5840, 5841 and 5842 are illustrated in the examples of FIGS. 56A and 56B. One or more output channels 5840, 5841 and 5842 may be monitored, such as delivery of power from each channel, optionally displayed and/or communicated, and controlled, through one or more communication interfaces, such as a communications port 5890, including RS485, Ethernet, USB etc.

The junction box 5800 may also include a ground mechanism 5870 in the box housing 5820, such as a ground screw to provide ground to the box 5800.

Figure 57B:
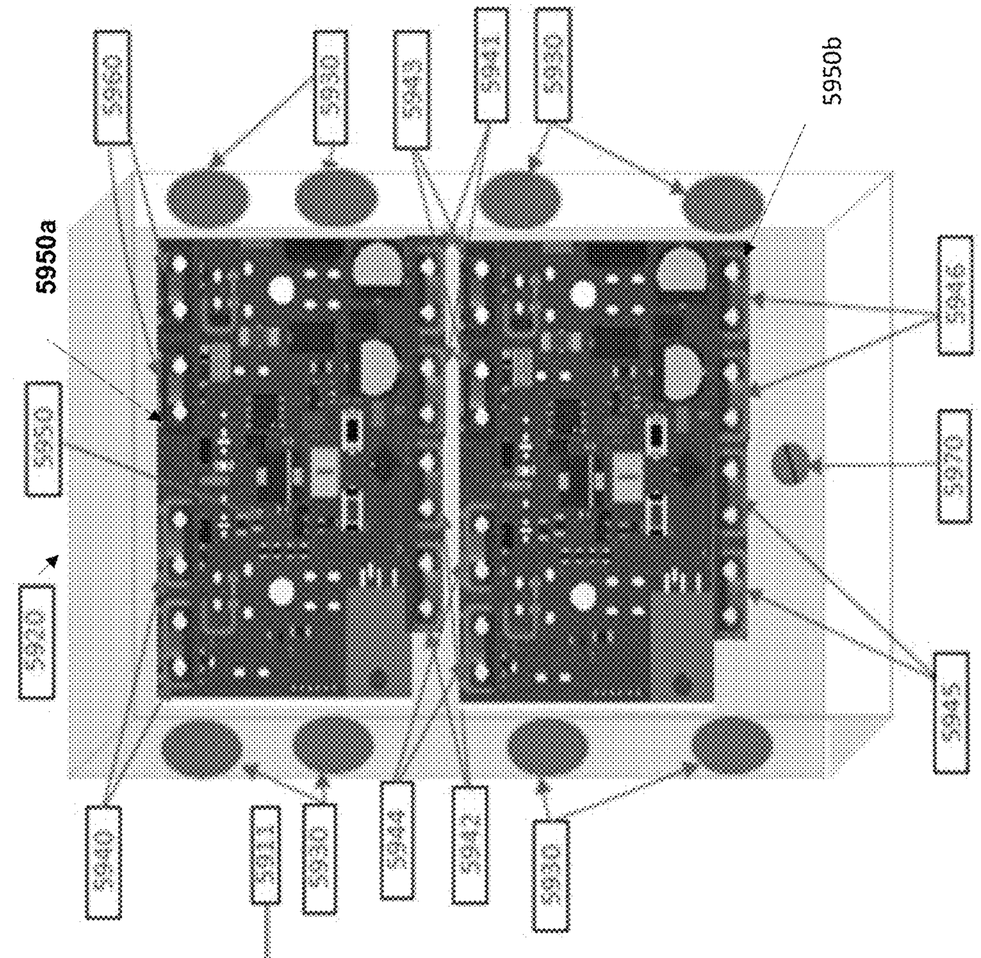
FIGS. 57A and 57B illustrate further exemplary embodiments of a cover and a box housing of a junction box.
Figure 57A:
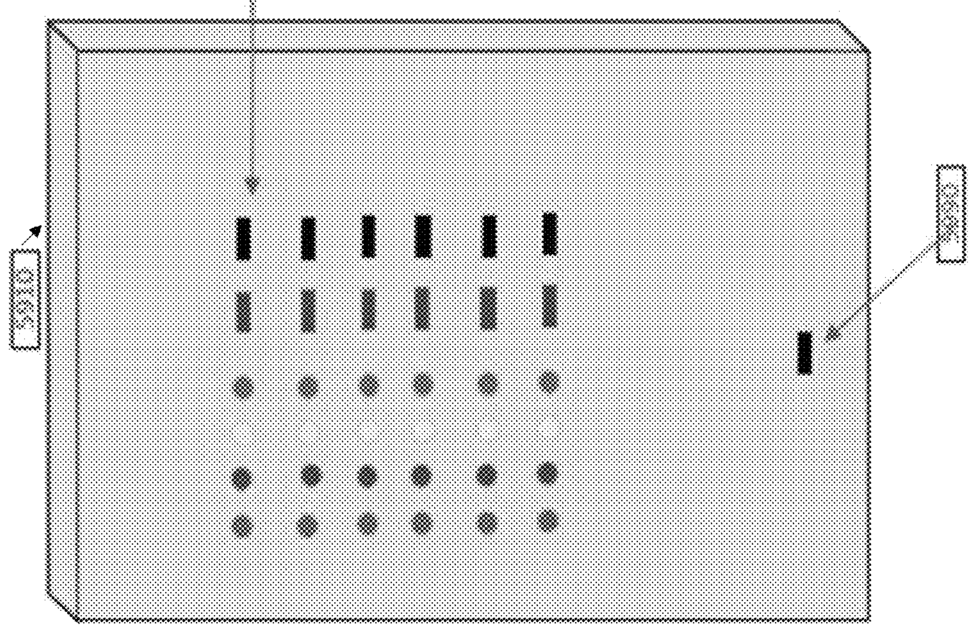

FIGS. 57A and 57B illustrate another example of a junction box 5900. The junction box 5900 includes a cover BLOCK 5910 and a box housing BLOCK 5920. The cover BLOCK 5810 may incorporate LEDs for indicating the status of various conditions of the junction box 5800, such as active, not active, occurrence of a fault (series or parallel arc fault, ground fault, and more). The cover BLOCK 5810 may include a communication channel 5990. The cover BLOCK 5910 may also include controllers or actuators, such as test and reset buttons for each output channels.

The box housing BLOCK 5920 houses a power control and analysis module 5950. The line power input, including line and neutral wiring, and optionally ground wiring, may connect to the power control and analysis module 5950 at conductors, such as metal clips 5960. Line power may be output at least one of the output channels 5941, 5942, 5943 and 5944. More or fewer output channels may be included in the power control and analysis module 5950. The box housing BLOCK 5920 may also include a ground mechanism 5970 such as a ground screw to provide ground to the box housing block 5920.

In the example of FIGS. 57A and 57B, the power control and analysis module 5950 is the 2-board assembly 5950*a* and 5950*b* that work similarly as 5850 in FIG. 56B. The combination of both boards 5950*a* and 5950*b* may provide either up to 5 output channels 5940, 5941, 5944, 5945 and 5946. The output channel 5942 serves as the power fee for inputting power to the input channel 5943 on the second module 5950*b*. In this case, channel 5942 may control the input of the second module 5950*b*. In some examples, each of these two power modules 5950*a* and 5950*b* may act as a 2-circuit assembly with each having a maximum of 3 output channels, for example, output channels 5940, 5941 and 5942 on the first module 5950*a* and output channels 5944, 5945 and 5946 on the second module 5950*b*.

The input power line would be connected to block 5960 on the module 5950*a*. The block 5960 also supplies power to the second module 5950*b*. In some example, input power line may separately connect to BLOCKS 5960 and 5943 to respectively supply power to both modules 5950*a* and 5950*b*.

The block 5930 represents a single line voltage input channel, including black, neutral and ground wires. BLOCK 5930 may be pass-through holes that include strain reliefs and has the same function as Block 5830 described above.

FIGS. 58A-58G illustrate an exemplary duplex outlet receptacle for preventing glowing contacts, which are known to be a cause of fires. When glowing contacts takes place, there is no arc as the conductors are touching each other, there is no spark as the mechanical connection is solid, and there is no overload or leakage, as would otherwise be present in 5 mA ground leakage present with ground fault detection. Optional downstream connections are illustrated to improve on the safety of wiring connections, for downstream use, which for example are relevant to AFCI and GFCI electrical fault detection.

Glowing contacts occur at the receptacle when the wires are insecurely looped around screws or the looped connections become loose. When the contact pressure has not been properly completely secured, a glowing contact takes place through the hairline surface touching between the screw terminal and the metal backing—the contact pressure being small and the conductor surface also being a small cross-section. The glowing takes place because the conductor's resistance is too high, as the current flows through that very small area.

Glowing contacts inside of an electrical box hosting a receptacle are not visible and thus are more important than at the end of a cord of an appliance or device such as a light bulb, hair dryer, electric drill, toaster, vacuum cleaner, etc.

In an electrical receptacle, traditional industry typically wraps the wiring loops around a screw and the screw provides conductivity. Whether wire is inserted through holes in the back, or the wiring is looped around the screw, the wiring contact can become loose, potentially causing a dangerous glowing contact electrical fire risk.

A need exists for an improved means of connecting wires, providing a larger surface of conductivity and improved strain relief to minimize possibility of a contact becoming loose.

The need exists to provide discontinuance of power should there be "glowing contacts". These may take place at many levels whereby connections may be loose, at the wiring connections in receptacle devices or at the end of cords connected to appliances on the load (e.g. light bulb, hair dryer, electric drill, toaster, vacuum cleaner, etc.).

It is desired to detect glowing contacts, to reduce the risk of fires caused by glowing contacts, and even to eliminate glowing contacts at a receptacle outlet, through mechanical design embodiments herein illustrated in FIGS. 58A-58G. The mechanical designs may prevent looping of the wires at the contact point(s) and attachment of wires externally to the receptacle, eliminating bad connections. As well, without the glowing contacts, the plastic will not melt as device discontinues the delivery of power if temperature increases, thereby reducing another potential fire risk caused by glowing contacts.

The mechanical design in the examples of FIGS. 58A-58G illustrate a mechanical separation of the black and white wiring, such that looping of wiring is not permitted during installation, thereby eliminating the majority of the causes of loose connections at the receptacle outlet level. Without looping of wiring, the occurrence of glowing contacts are significantly reduced.

The disclosed connector assembly comprises a front clip, back clip and a screw that applies a force, whereby the design ensures that the screw cannot be in contact with the inserted wire, is not used for conductivity but rather as a pressure means. In another embodiment, another pressure means could be used. Other fasteners can be used instead of the screw in other examples.

Illustrated is embodied in an electrical receptacle but can be applied to other devices, including but not limited to adaptors, junction boxes, cables, power plugs and breakers. The gripping means integral to the structure, is a significant improvement over traditional means whereby wires are inserted and held in place with minimal strain relief and security, and are easy to pull out.

Disclosed is an insertion method/means through a channel, whereby the wire itself has a larger contact surface area, contact is made with a larger surface area of a metal screw terminal, comprising of two components screwed tightly, and one part of the screw terminal being attached on a circuit board, the second part being connected to the first part, and it being attached to a second circuit board.

In the particular embodiment FIGS. 58A-F, the screw terminal is attached to a power sensor board 6090, which itself is attached to a mother board (having a CPU) and part of the screw terminal incorporates four pins which are inserted into the mother board providing connectivity and further rigidity. The sensor board 6090 is a printed circuit board (PCB). The hole of the PCB is offset from the side of the front clip, therefore when pressure is applied from the screw to bring in the back clip, the conductor is slightly bent while being pushed to the front clip providing additional physical resistance preventing the wire to be pulled out without unscrewing the assembly.

Other embodiments are possible with our without downstream means, variations in location of black and white wiring in and out of the electrical device (which need not be an in-wall electrical receptacle, including but not limited to adaptors, junction boxes, circuit breakers, corded devices, load centers, switches and more), and the attachment means of the terminal assembly which need not be attached to any particular circuit board.

The concave channels in at least a first portion of a wiring screw terminal assembly (screw means being one example of a pressure means) provide conductivity contacting the wiring, rather than the screw—and the ridges (teeth) provide additional conductivity and strain relief.

The wires passing through the screw terminal neither touch the screw, nor depend on contact with the screw for conductivity; and accordingly do not touch the screw itself. The wire is not in direct contact with the screw itself, and rather derives its conductivity from the metal screw terminal—the round concave portion of the channel providing the conductivity and squeezing the wire to the front clip.

In addition, and optionally, conductive, metal teeth provide a better contact reducing the resistance and providing additional conductivity (e.g. and breaking up oxidization which may have built up on the surface of the wire) and additional strain relief.

Figure 58A:
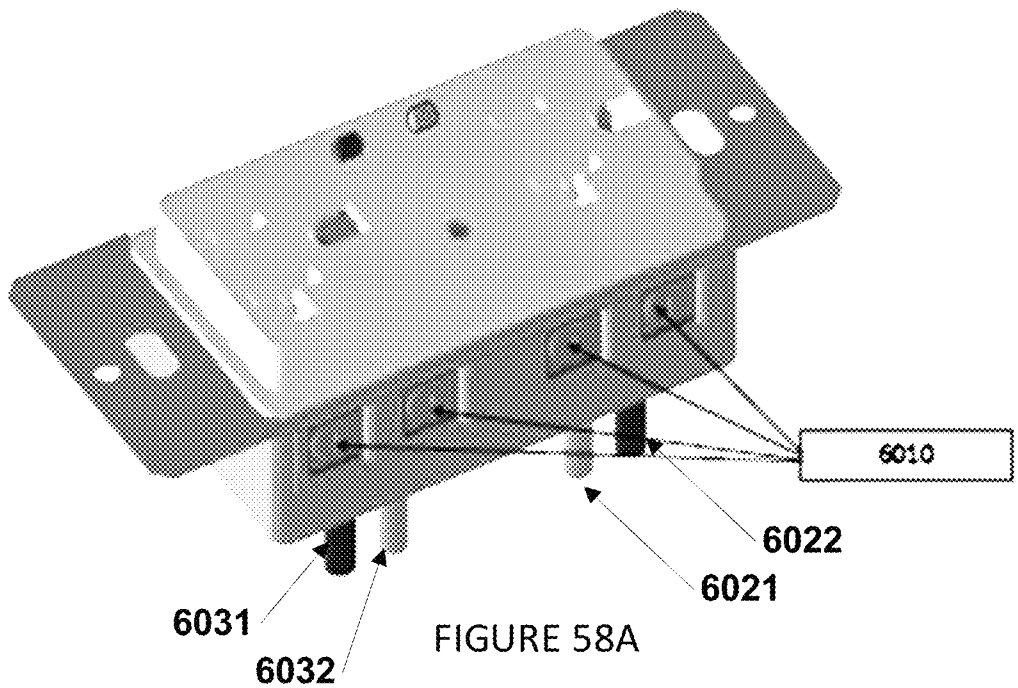
FIGS. 58A-58G illustrate an exemplary embodiment of a duplex outlet receptacle for preventing glowing contacts.
Figure 58B:
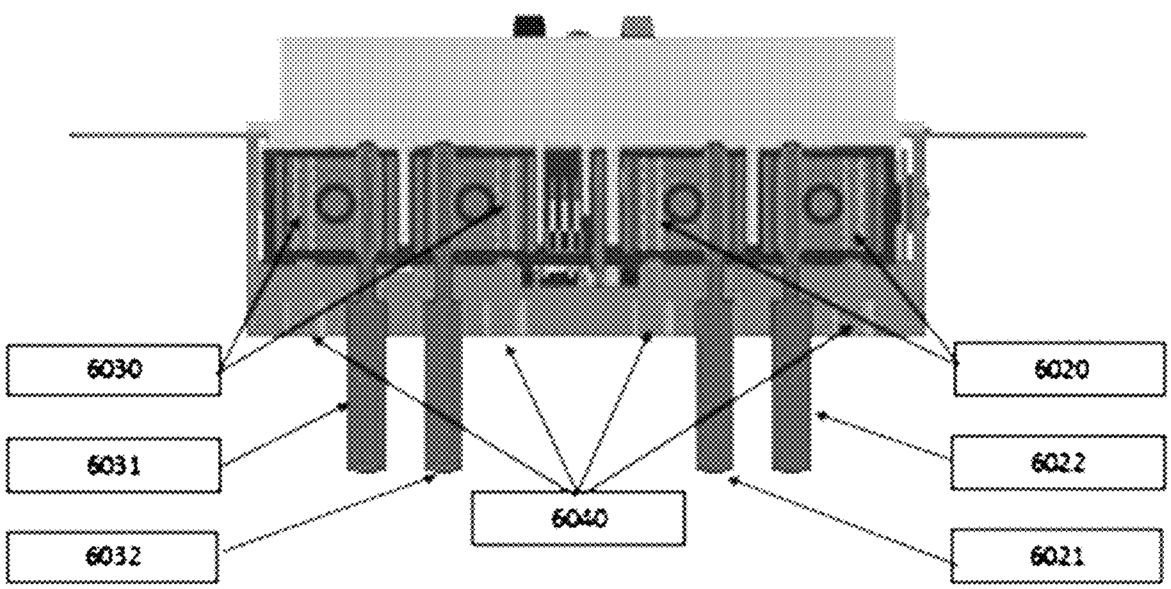
Figure 58C:
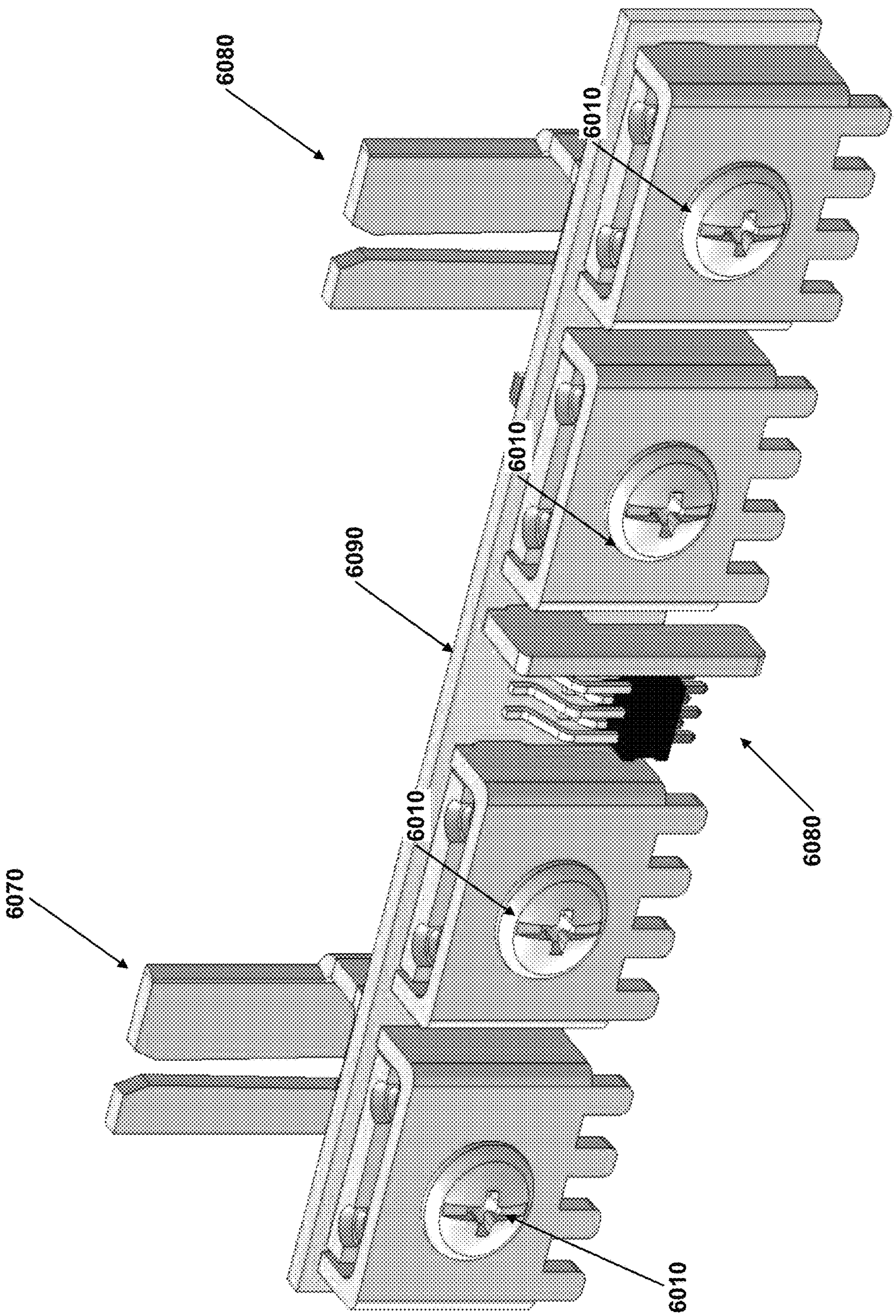
Figure 58E:
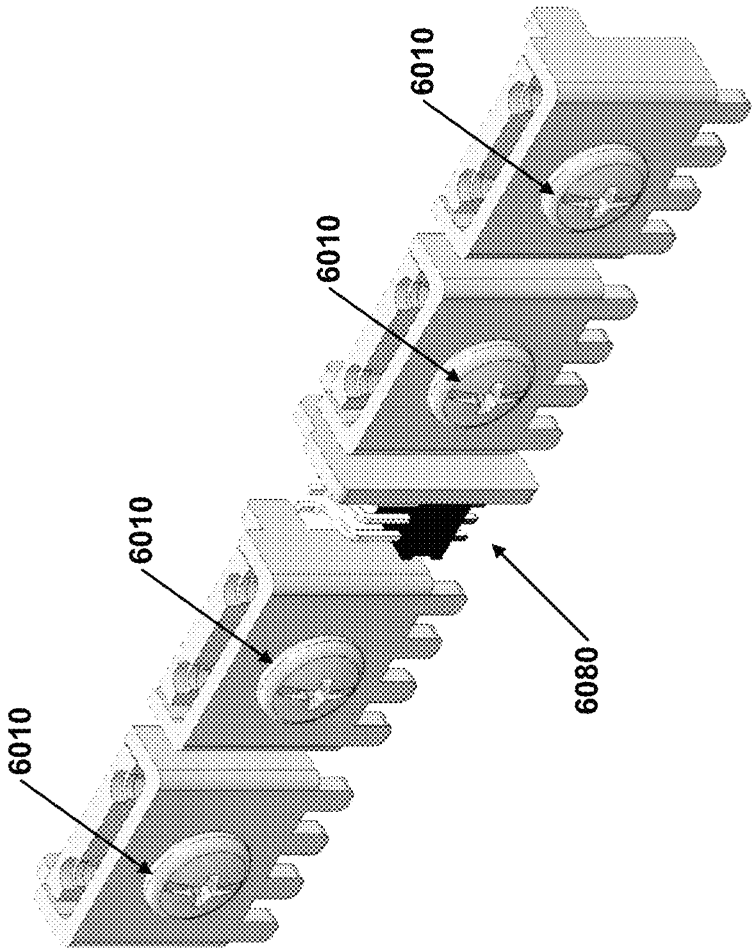
Figure 58D:
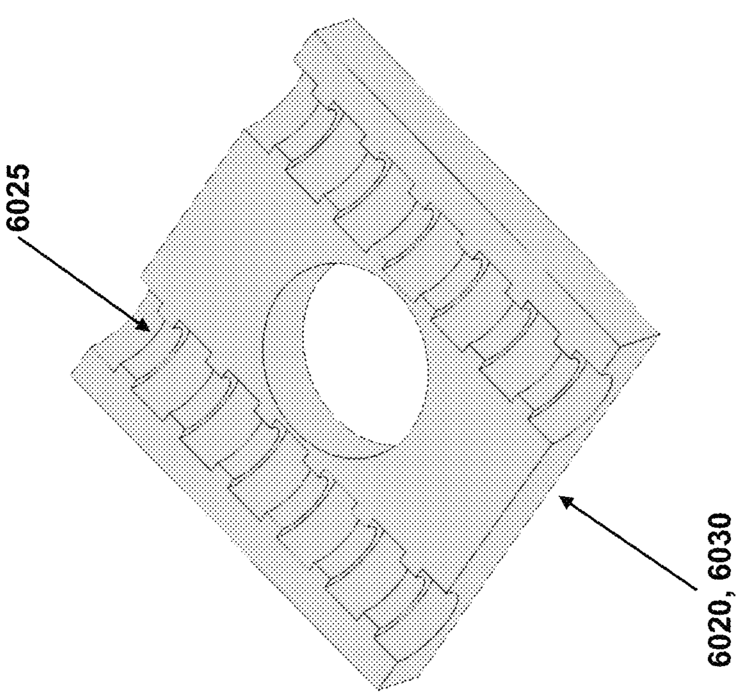
Figure 58F:
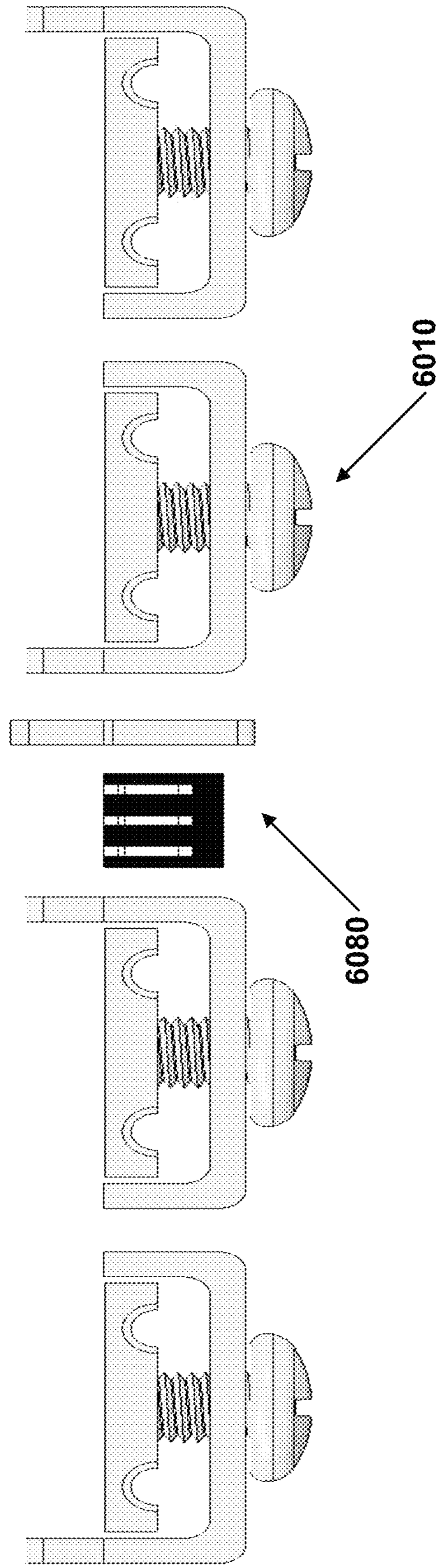
Figure 58G:
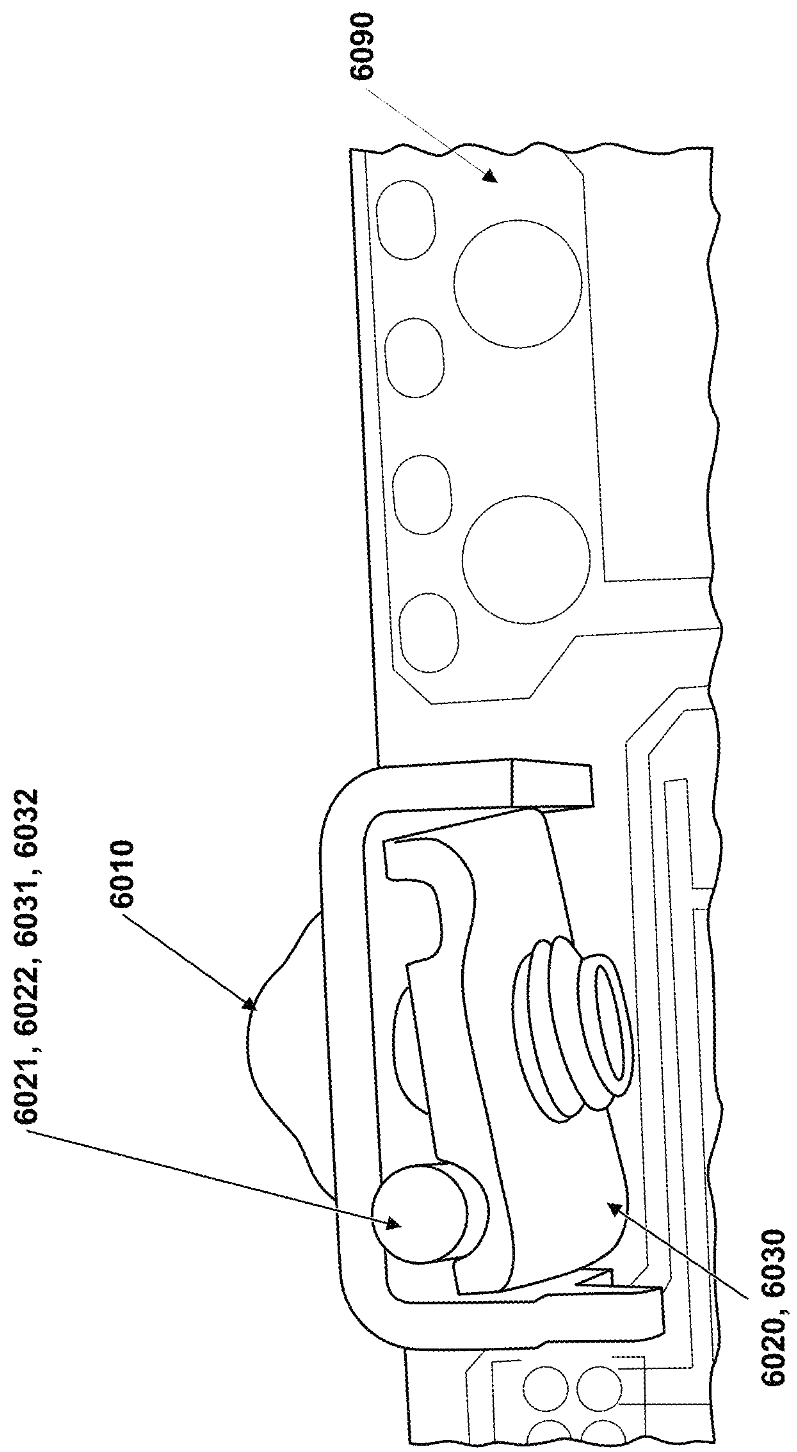

FIGS. 58A-58G illustrate exemplary connectivity of a receptacle FIG. 58A Block 6000. FIG. 58G, Block 6010 points to the terminal screws of the receptacle 6000, the screws are indented inside the casing, as also illustrated in FIGS. 58C and 58G. This arrangement has two major advantages: First, the screw cannot create a short with the electrical housing customary used by code to house any receptacle. Second, the screws do not come out, therefore it is impossible to connect any wires outside the receptacle 6000. This may prevent glowing contacts from faulty connections, a major source of electrical fire.

In FIG. 58B the Block 6040 shows the housing and wire guides for the insulated conductor connecting to the receptacle 6000 (FIG. 58A) and enabling the wires to be installed inside the outlet. This arrangement prevents shorts between conductors, another source of electrical fire. Block 6040 also incorporates mechanical strain relief, as a portion of the insulation enters the body of the receptacle 6000 and provides integral strain relief to the wires entering the receptacle 6000. In FIG. 58F the four screw terminal assemblies illustrated from left to right are for black wire (line), white wire return (neutral), white wire return (neutral) and black wire (line) with each terminal incorporating a second channel for optionally enabling parallel connections. For example, power for lighting might to a switch and then to a light(s), the second hole being used for wiring for another downstream circuit. A ground fault circuit interrupter receptacle device might want to be used whereby wiring goes both to downstream and to lighting. The use of this screw terminal assembly system can be an alternative to, and advantageous over the use of traditional twist-on wire connectors, and provide superior connection with less possibility of loose connections.

In another embodiment, one of the two holes in any of the screw terminals could be covered preventing and limiting entry to only one wire accessing the particular screw terminal.

FIG. 58C also illustrates the embodiment within an electrical receptacle device having two outlets—pins 6070 and 6080 providing white wire returns for each, respectively. Block 6060 is a power bus transmitting energy through the sensor board 6090 to the main board. In this particular embodiment, the back clip FIG. 58D would be attached to the sensor board 6090 and the companion front clip would be attached (seventeen teeth shown) and soldered to a main processor sensor board 6090 (horizontally positioned) providing further rigidity. Blocks 6031 and 6032 jointly are the power feed to the receptacle 6000. Block 6031 shows that the hot feed conductor is connected to the terminal, and Block 6032 shows that the neutral feed conductor is connected to the terminal. Block 6030 shows a space for a parallel connection for both the Hot and Neutral lines, and this is a possible unmonitored connection to one or multiple downstream equipment.

The terminal in the examples in FIGS. 58A-58G allows both the feed and parallel connections. Both feed and parallel connections provide a safe connection as well as maximizing the connection surface with the conductor. In conjunction with the terminal and block 6040, a tunnel is created limiting the possibility for any short from either the feed or the downstream connections. Blocks 6020, 6021 and 6022 are jointly the downstream monitored connection to one or multiple downstream electrical devices. The receptacle 6000 may in this case control and/or monitor the entire circuit. Block 6022 shows the hot feed conductor connected to the terminal, and Block 6021 shows the neutral feed conductor connected to the terminal. Block 6020 shows the connection point for a second monitored connection point for more electrical devices.

FIG. 58D Blocks 6020 and 6030 shows the rear portion of the wire retainer contacts. The rear portion (back clip) defines a channel/recess that is formed with ribbed recesses (teeth) 6025, and this increases the contact area of the retainers to the wire. The formed rear retainer shape wraps around the wire so it is not just a round wire pressed between two flat pieces of metal; as well, the recess is ribbed so it bites into the wire to increase the effective pressure holding the wire. The recess also reduces inherent contact resistance, thereby increasing the contact-to-wire surface area.

As loose connections at connection points in receptacle outlets are eliminated, physical mechanical design in FIGS. 58A-58G prevents the looping of wires and therefore prevents glowing contacts from occurring. This protect the body of the receptacle 6000 from melting as a result of glowing contacts.

When a glowing arc occurs in an electrical receptacles, analysis performed by the processor can be used to detect changes in the root mean square (RMS) over one or more cycles of the power signal. Mean square is first calculated to determine RMS, and mean square can be used instead of RMS in example embodiments as applicable. This analysis is described in greater detail herein in relation to series arc faults.

The mechanical design illustrated in FIGS. 58A-58G discloses a mechanical separation of the black and white wiring, such that looping of wiring is not feasible during installation, therefore eliminating the majority of the causes of loose connections at the receptacle outlet level. Without looping of wiring, the occurrence of glowing contacts are significantly reduced.

An example embodiment is an electrical device including: a conductive housing defining a first channel for receiving a power line, and a second channel; a fastener between the first the second channels for tightening the power line to the first channel, a head of the fastener engaging the power line and the conductive housing when tightened, the head being nested within an exterior of the conductive housing when tightened.

Another example embodiment is an electrical device including: a conductive housing defining a first channel for receiving a power line, a fastener for tightening the power line to the first channel, a head of the fastener engaging the power line and the conductive housing when tightened, the head being nested within an exterior of the conductive housing when tightened.

In an example of the electrical device, the fastener contacts the conductive housing without contacting the power line.

In an example of the electrical device, the conductive housing includes a first conductive part and a second conductive part that collectively define the first channel.

In an example of the electrical device, the first channel includes one or more ribs for crimping contact with the power line. In an example of the electrical device, the fastener is a screw and the head is a screw head. In an example of the electrical device, the power line does not wrap around the screw. In an example, the electrical device further comprises a conductive element conductively connected to the conductive housing for electrical connection to an electrical outlet or for downstream connection.

In an example, the electrical device further comprises a circuit board that comprises the conductive element. In an example, the circuit board includes an opening for receiving direct connection to the power line.

In an example of the electrical device, the power line does not wrap around the fastener. In an example, the electrical device is for preventing of glowing contact between the power line and the conductive housing. In an example of the electrical device, the fastener and the head are conductive. In an example of the electrical device, the first channel is generally perpendicular to the second channel.

Example embodiments of the electrical device are used to detect glowing contacts. In example embodiments, the electrical device captures all the signal data of the power line. Glowing contacts can be detected and tripping can take place—by analyzing the electro characteristics of parameters captured, the voltage, current, the differential current. The glowing contact is detected by looking at differentials and amount of load.

In example embodiments, the electrical device also includes a ground fault detector built in. In example embodiments, temperature sensors are used as well for detecting glowing contacts. A glowing contact that raises the temperature would cause the electrical device to trip; i.e., delivery of power is discontinued.

In an example embodiment, an electrical device, which may be an electrical receptacle, includes a first contact and a second contact configured for electrical connection to a hot power line and a neutral power line, respectively, the first contact and the second contact for downstream electrical connection to a downstream hot power line and downstream neutral power line, respectively; a switch connected in series relationship to the hot power line; at least one sensor configured to detect signals of the hot power line and/or the neutral power line; a memory; a communication interface; and at least one processor configured to execute instructions stored in the memory for: i) automated control of an activation or a deactivation of the switch in response to the signals detected by at least one of the sensors, ii) control of the switch in response to receiving a communication over the communication interface, iii) processing raw information of the signals detected by the at least one sensor to arrive at processed information, and storing the raw information and the processed information to the memory, and iv) sending at least the processed information through the communication interface. The processing raw information of the signals includes calculating power factor. The processing raw information of the signals may include performing frequency analysis, such as Fast Fourier Transform (FFT). The processing raw information of the signals may include calculating output power. The automated control may be for power distribution control and/or safety control.

The at least one processor may include a programmable logic controller (PLC) configured to have preprogramming to perform the automated control; the communication interface comprises a serial communication interface for wired communication to the at least one processor; and the at least one processor executes a MODBUS protocol over the serial communication interface to: receive command through the serial communication interface for the preprogramming of the PLC, receive command through the serial communication interface for the control of the switch, and send at least the processed information through the serial communication interface. The at least one processor may execute the MODBUS protocol over the serial communication interface to send the raw information of the signals from the memory through the serial communication interface. The at least one processor may be configured to determine a condition of the hot power line or the neutral power line from the signals detected by the at least one sensor, and perform any one of i)-iii) set out above in response to the determined condition. The at least processor comprises a universal asynchronous receiver-transmitter (UART) for communication over the communication interface.

In some example embodiments, the PLC is configured to execute other protocols other than MODBUS, for example Backnet protocol.

The switch may be controlled to achieve a specified power factor to the downstream hot power line by comparing the calculated power factor to the specified power factor. The specified power factor may be achieved by cycle stealing and the partial power output may be achieved by cycle stealing.

The at least one sensor may comprise a current sensor; the processor is configured to control deactivation of the switch in response to the detected current of the current sensor output indicative of ground fault, arc fault or over-current conditions. Each of the at least one sensor is in series relationship to one of the power lines. The switch may be controlled to achieve a partial power output.

The downstream electrical connection may be to a plug outlet of the electrical device.

The downstream electrical connection may be to a second electrical device.

The electrical device may further include a second switch connected in series relationship to the neutral power line.

The memory may include a first buffer and a second buffer, and the at least one processor is configured to store the raw information to the first buffer and store the processed information to the second buffer.

An example embodiment is an electrical device, for example a metering device, configured for distributing power, which includes: a first contact, a second contact, and a third configured for electrical connection to a hot power line, a neutral power line, and a ground line, respectively, the first contact, the second contact, and the third contact for downstream electrical connection to a downstream hot power line, downstream neutral power line, and downstream ground line, respectively; a switch connected in series relationship to the hot power line; at least one sensor configured to detect signals of the hot power line and/or the neutral power line; a memory; a communication interface; and at least one processor configured to execute instructions stored in the memory for i) automated control of an activation or a deactivation of the switch in response to the signals detected by at least one of the sensors, ii) control of the switch in response to receiving a communication over the communication interface, and iii) storing raw information of the signals and/or processed information of the signals to the memory.

The at least one processor may be configured to send the raw information and/or the processed information through the communication interface. The power distribution device may be a power distribution cabinet. The communication interface may be a wired communication interface.

There can be 3 categories of arc faults: Parallel Arcing: between black wire (live) and ground; Parallel Arcing: between black wire (live) and white wire (neutral); Series Arcing: within a black wire, or within a white wire. Industry AFCI's will trip on shorts (results in overload), overload (overcurrent) and leakage rather than actual arcs. They measure the residual energy of the difference, and detect arcs on that basis. As the industry does not detect series arcs directly, the existing fault detection mechanisms respond once there has been sufficient electrical damage to create a ground fault before tripping.

As the AFCI technology traditionally used in the industry looks at current differentials, AFCI breakers, for example do not trip until detecting current overload, they have limitations in being able to detect, e.g.: i) one type of parallel arc; namely, between the black and white; and ii) two types of series arcs; namely those that occur between the black and black, and between the white and white. The industry presently detects indirectly that a series arc fault has occurred.

As the current can stay the same on the black (phase line) or the white (neutral line—return path) wire experiencing a series arc, despite a series arc taking place, traditional means and methods based on identifying current imbalances will not recognize that an arc in series took place (until it is too late that a flame may have already ignited).

Traditionally, the industry use analog only, measuring current differential using magnetic circuits, affected by magnetic fields. Detection of arc faults or ground faults is based on examining differences in the magnetic field. Traditional industry leaves the signals in analog only, amplifying the differential and using it to activate the switch.

Ground fault (GFCI) testing involves differential between the black and the white; e.g. leakage to the ground.

When discussing Arc Faults, the industry often refers to there being a differential in currents; namely between the black and the white there being a 70 milliamp differential current. They are referring to the RMS (averaged) value difference.

The problem with this approach is that if you are looking for a difference between the averages of the black and the white, you won't find any; e.g. RMS value difference will be zero.

Industry electromechanical devices work on thermal effects of the currents. They don't look at the waveform, rather averaged net effects of the current. They basically respond to the "effective" value, not how it is varying. They are measuring the magnetic effect of the leakage current. Traditional industry does not look at the wave form.

In example embodiments, an electrical device digitizes the analog input. Furthermore, the electrical device uses analog for the differential data. RMS (root mean squared) averaging has an equivalence to an equivalent DC. As the current is varying the electrical device finds out what equivalent effect would be if there were a DC circuit there. The RMS value measures the effectiveness of the current, irrespective of its variation.

Parallel Arcs may take place between: i) black wiring (live) to ground, or ii) black (live) to white (neutral). Traditional industry may only consider arcing between the black and the ground. But if arcing is happening between the black and the white, the differential current will be zero because the same current going through the black comes back through the white. The industry may not be capturing parallel arcs taking place from black to white because it will not have a differential current. Rather than having a differential current, it will have a signature in the current. There will be irregularities in the current. But if you measure only RMS values, this will not be detected. Without examining the wave form of the current, this parallel arc between the black and the white won't be detected. Similarly, a certification body measuring the difference in the current between black to the white, will not see any differential current. However, a differential current will be detected only if the arc is between the black and the ground which is a parallel arc, in which case there will be a leakage (differential) current between the black and the white because the current leakage is to the ground.

Series arcs can occur as well. Example embodiments include electrical devices, including receptacles and circuit breakers, for detecting a series arc fault and providing circuit interruption in response.

Series arc fault occurs when the arc occurs within the black or within the white wires; e.g. it is in series to the load. The traditional industry cannot determine by examining magnetic fields using traditional electro-mechanical means that there is a series arc, as there is no leakage current in a series arc. If an arc takes place in the black wire going into a load, the load will draw appropriate current and there won't be any differential between the black and the white. Similarly for a series arc within the white. Example embodiments can detect these by analyzing the waveforms on the applicable power line.

Traditional arc fault interrupters are really detecting leakage current, and they create the leakage current by melting the insulation waiting for a different fault condition to occur before tripping. Whether at the breaker level (e.g. breaker feeder, Combo) or at the AFCI receptacle level (e.g. outlet circuit AFCI, Portable AFCI, Cord AFCI and Leakage Current Detection and Interruption (LCDi)), the industry is doing an inadequate job as they are not properly measuring and detecting arc faults in series. Primarily this is because they are measuring current when an arc jumps across a single wire ("series"). As the current has not leaked to the ground, they don't detect the occurrence of a series arc. Detecting series arcs on the basis of insulation first being melted can be dangerous as it could start a fire in a hazardous environment.

If there is a leakage the present industry technologies will detect the arc; but if there is no leakage, they will not. As leakage is always between the black and the ground, you can measure the difference between the black and the white and this difference between them will be the "leakage" that flows to the ground. Leakage can happen through a short circuit as well as parallel arcing. Leakage is not relevant for series arcs as series arcs occur as a break within the same wire or at a loose connection. Overload current is not leakage current, as there is no leakage where there is no current imbalance.

Example embodiments of the electrical device do not require there to be leakage for detection of the series arc fault. In contrast, in traditional industry devices leakage is the only way existing AFCI breakers and receptacles detect a parallel arc fault (leakage is not relevant for detection of series arcs in example embodiments).

To detect series arcs and/or parallel arcs between line and neutral, AFCI breakers and receptacles, may rely on the breakdown of the insulation creating a leakage or surge. The arc on the black wire causes the insulation to melt exposing its metal. Then it melts the neutral wire next to it. When the current flows between black and white, there is no limit for it until the AFCI breaker, or MCB trips because of overload. It becomes a parallel arc, but there is no current differential. It will not be tripped by traditional receptacle(s).

Parallel arc between black and neutral is not detected by industry devices. In traditional industry devices, the AFCI devices can detect the parallel arc between live and ground, which is in effect a ground fault, e.g., 70 milliamp if no load, 5 milliamp if load. Traditional industry device detect a leakage current which is the same as AFCI, and trip in response.

For live and neutral, when there is arcing, the current just keeps on building as there is no limit as to how much the current can keep building up. At some point, there is effectively creating a short between live and neutral (fire could have started). The traditional industry devices may detect this extra surge of current that goes beyond the 15 Amp limit ("overload") and hence the traditional AFCI will trip. The traditional AFCI does not know why it is being tripped (namely merely because current is going beyond 15 amp limit). Really, the traditional AFCI is sensing the short circuit, also evidenced by the metal guillotine test where the metal creates a short between the line and neutral—which gets captured as the flow exceeding 15 amps. AFCI devices are tripping due to over-current for the black-neutral, rather than directly detecting a parallel arc. The certification testing is really checking the shorting.

The danger is that if there are conditions of arcing between live and neutral whereby the current does not reach 15 amps (to cause tripping), then the arcing will continue and won't be detected by the present devices on the market. Traditional industry does not trip based on one wire having an arc, rather they wait for the arcing to cause enough damage to melt the insulation on both wires so that the arcing can properly form between the live and the neutral causing a short—then they trip it.

Traditional industry MCB's (Micro Circuit Breakers) trip for over current. When there is a short, current builds up and when it exceeds 15 Amps, the breaker trips. MCB's protect against shorts, but they don't catch leakage. Arcing can cause extensive damage without exceeding the current rating of a breaker. A less than 15 amp arc between live and neutral can cause a fire. Depending on detecting the melting of wiring and/or enclosures, is not a reliable means for fault tripping. Traditional industry MCB's will not trip if there is arcing (between live and neutral) without an extra surge of current over 15 Amps or overload. The actual current rating of the MCB may not be exceeded.

Traditional arc fault breakers and receptacles would not necessarily have been an improvement over the MCB's. In traditional industry devices, series arcs are not detected as there is no current imbalance, differential on the single black or white wire. In traditional industry devices, parallel arc faults between black and white trip by detecting overcurrent—which may not take place as there may not always be arcs that are so high that they will exceed the current limit. Parallel arcs between black and white are not being detected by traditional industry arc fault breakers because there is no leakage there during this type of arc and as there is no overcurrent. The only way they could "detect" it, is if the current exceeding 15 amps is being caused by arcing. What all this shows is that it may not always be true that a parallel arc will result in the tripping of traditional breaker (MCB or AFCI) due to overcurrent.

Further, traditional industry GFCI devices would not have detected these faults either. Traditional GFCI and AFCI rely on detecting known current differentials (e.g. imbalances), but they do not quantify it as there is no actual measurement (the whole thing is analog, so there is no digital conversion of the voltage or current). Although existing AFCI devices detect leakage, they are inadequate in detecting parallel arcs occurring between the black and the white where there won't be current imbalance. As an example, a light bulb plugged into a receptacle may not be arcing—it is drawing a constant current which is coming in through the black phase wire, going through a receptacle, going to the bulb and returning via the white wire (neutral). If a series arc occurs in the black or white wire, the current isn't leaking to ground and it is not shorting.

Although series arcs can occur anywhere, in the black or white wire it usually occurs at the terminals due to a loose contact. In this instance of arcing due to loose connections, voltage changes, causing the current to get modulated, which would not be exhibited/result as a difference between the white and the black currents (e.g. no differential change) and therefore arcing would not be detected by traditional industry devices—which, had there been a current imbalance, such arcing could otherwise have been detected by the traditional comparative means and methods used to detect arcs.

Situations may arise whereby a wire from a breaker panel to a receptacle, or via a junction box, has a splice in the wire somewhere along the line, or the screw on the breaker (or on a receptacle as wires are being connected on the back side) hasn't been tightened down adequately in which case that contact is not making a good contact. Accordingly, if the contact isn't making a good contact, in the case of a nominal load like a light bulb, there may not be significant current drawn and the traditional arc fault means of examining current will not detect the arc fault. With example embodiments of the electrical device, there will be less chance of a loose contact due to mechanical structures.

Traditional industry AFCI's look at the differences between black and white, not at RMS variation. For example, for a hair dryer, there is a variable speed motor, the current will vary and there is no arc indicated. If the industry looks at absolute RMS values, they won't be able to do much. The load will be varying load so they will trip falsely.

Example embodiments of the electrical device have arc fault detection. Using voltage change as the indicator the electrical device both detect arc faults and do so earlier than the traditional devices. Traditional industry devices depend on current as the marker for tripping, and will trip as they really depend on secondary events such as grounds, shorts which can be too late.

Regarding traditional industry AFCI breakers, if current changes, the current changes equally on both black and white and not one versus the other. Even in case of a parallel arc fault on the black and the white, the AFCI will not trip because there is no differential or imbalance.

Traditional industry looked at GFI type imbalances. The traditional GFI may perceive that there is balance current going into and out of it. This is because the current differential that it is measuring are both staying the same. There's not a difference between the white and the black.

The traditional industry only looks at current for series arc faults, and believes that there are always two arc fault voltage spikes within each cycle, representing the fault.

In example embodiments of the electrical device, when the series arc fault occurs, it is not the waveform that particularly has an arc and the spike, but rather the whole waveform gets squished. The value of the voltage itself goes down, and there is no spike. There is no change in the signature in FFT. This is evidenced in FIGS. 60-1A to 64-1B which show that when the arc occurs there is not much variation in FFT. This means that there are no spikes in the voltage. As evidenced in FIGS. 60-1A to 64-1B, the whole RMS of the voltage value goes down and lasts for seconds. The whole waveform shrinks and there is no spike in it.

As shown in FIGS. 60-1A to 64-1B (actual arcing and corresponding signatures) that when the arcing happens, the arcing lasts for seconds or tens of seconds, and the voltage signature that you see there, you don't see the Batman ears and those kinds of spikes, because if there were any spikes in the voltage, they would have shown on the FFT. Nothing appears on the FFT because what is happening is that the whole RMS value is going down (from 4,000 it goes to 1,600 counts) which means that the RMS value goes down without causing the Batman ears. This means that if a device is only doing FFT analysis, it won't catch the series arc. The device needs to look at the erratic voltage changing over time.

Traditional industry shows voltage changing over every cycle ("Batman ears")—which does not work.

For traditional industry devices, when a series fault occurs, the device does not detect the series fault. Rather they wait for the series fault to melt the insulation thereby creating the parallel fault, leakage fault, or short circuit and then they detect the leakage fault and they trip it. They also won't detect an arc on a 2-conductor wire (white and black) as there is no leakage. In that case, the device will wait for the overload because if it is pure shorting, they are hoping that it will be sufficiently bad to indirectly cause tripping.

Example embodiments include arc fault test and measurement equipment. The API enables the device to observe what is happening with both current and voltage, and voltage varies significantly and erratically with series fault when there is a series arc.

Example embodiments include equipment for testing arc faults in series, by measuring voltage and taking action (creating circuit interruption) when there is a significant and erratic voltage change resulting from the series fault, and wherein the voltage change occurs over a number of the waveform cycles. The arc fault test and measurement equipment incorporates real time measurement of voltage over a number of cycles.

Example embodiments are directed to an apparatus, system and method for monitoring, collecting and processing current and voltage information in real time in order to provide superior detection, identification, differentiation and response to series arc faults, as well as controlling the delivery of power. Advanced devices and processes enabling control of current and voltage, as well as enabling both user or computer-controlled variation of current and/or voltage limits as markers of fault limits (including but not limited to overcurrent/overload parameters) upon which to trip, or determine alternative power activity, is described.

The circuitry and/or processes can be embodied in branch feeder breakers ("breakers") and receptacles including but not limited to: outlet circuits (with or without loads); in-wall receptacles or external receptacle devices (including but not limited to wall adaptors; extension cords, corded devices, portable receptacles, corded or hardwired devices, junction boxes, Corded AFCI devices and devices offering Leakage Current Detection and Interruption (LCDI) Protection (e.g. a device provided in a power supply cord or cord set that senses leakage current flowing between or from the cord conductors and interrupts the circuit at a predetermined level of leakage current), companion products for breaker panels and more).

Example embodiments include devices and processes for identifying and accordingly reducing false tripping.

An example embodiment is a monitoring, display and controlling device and process, which can be integrated in the devices described above, under the direction of a software API incorporating a communications interface.

Example embodiments relate to a circuit board that incorporates a computer processor with on board current and voltage sensing, which measures, monitors and controls current and voltage in real time on an individual receptacle outlet, plug load basis.

Example embodiments include comprehensive real time current and voltage sensing and power delivery system which uses a computer processor to recognize valid fault conditions was developed for individual loads, eliminating the weaknesses of current electrical fault detection technology, and providing superior measurement, detection & control of over current, both over & under voltage, surges, ground faults, and arc faults.

Example embodiments include devices and methods for detection of series arc faults by identifying erratic voltage drop (signature analysis) and optional performing frequency analysis such as FFT, in either or both the voltage and current domains.

Figures 1B, 59:
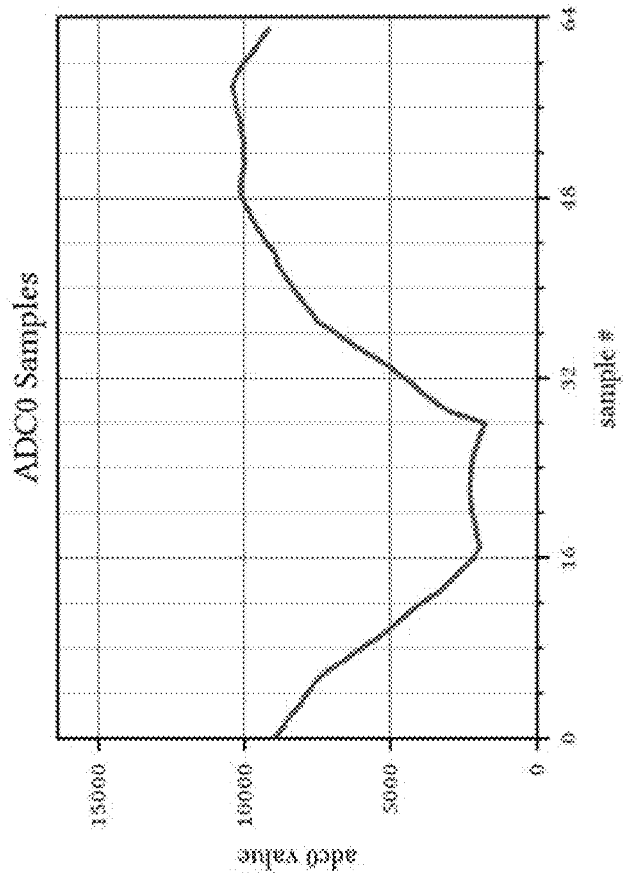
Figures 1A, 59:
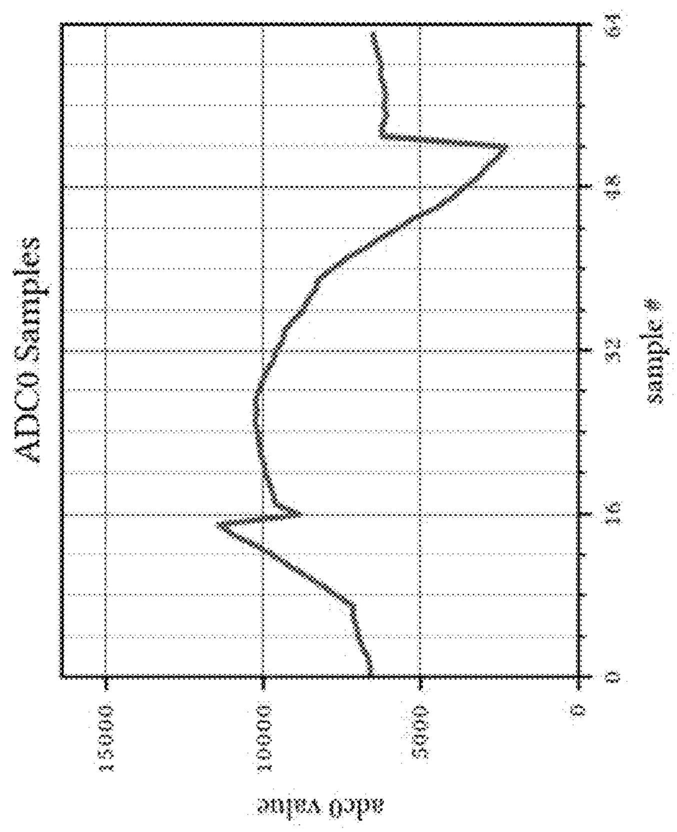

FIGS. 59-1A and 59-1B represent one cycle of sinusoidal waveforms (or sine wave) of voltage in an AC Circuit, illustrating a parallel arc fault. 60 such cycles occur in one second (60 Hz). A similar sine wave or sinusoidal mathematical curve may describe current.

Figures 2B, 59:
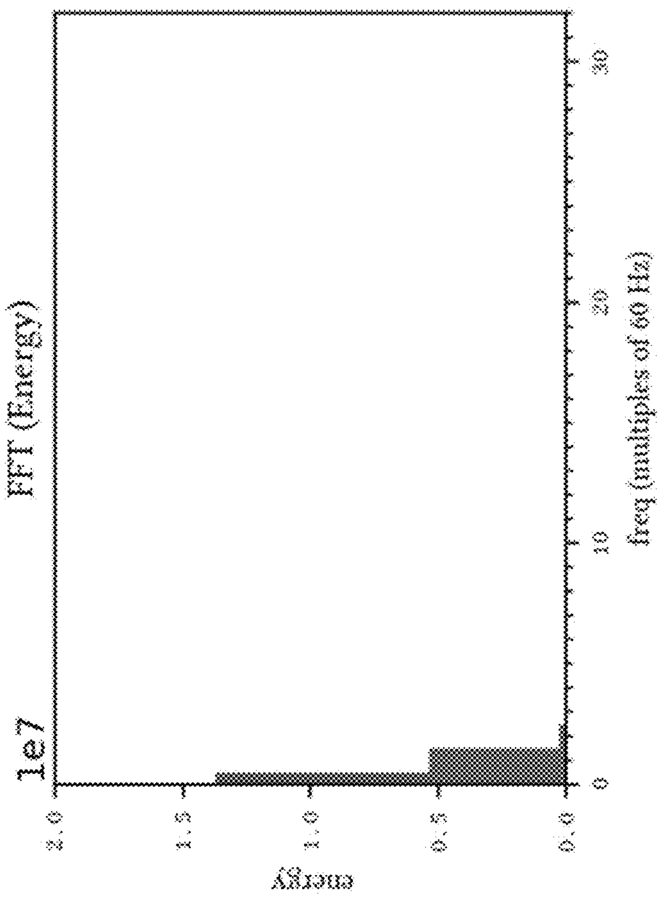
Figures 2A, 59:
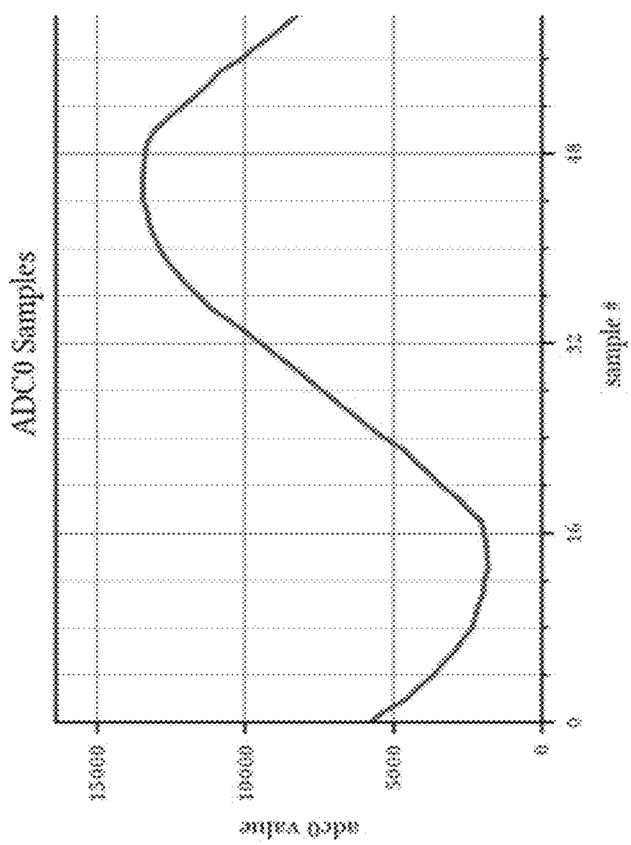

FIGS. 59-2A and 59-2B illustrate FFT values of a normal (non-fault) power line signal, for example 60 Hz. The FFT value of voltage which does not change much.

Figures 3A, 59:
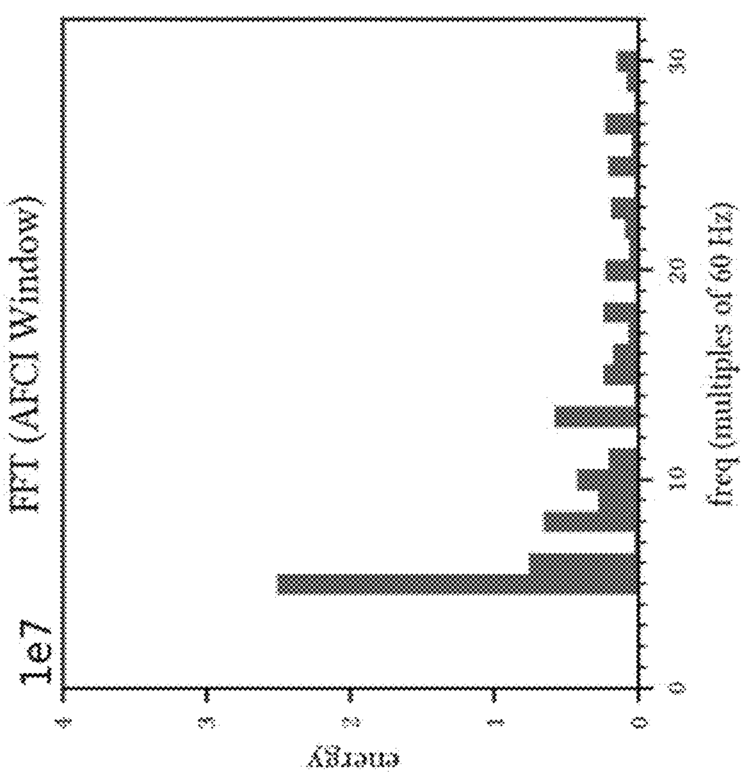
Figures 3B, 59:
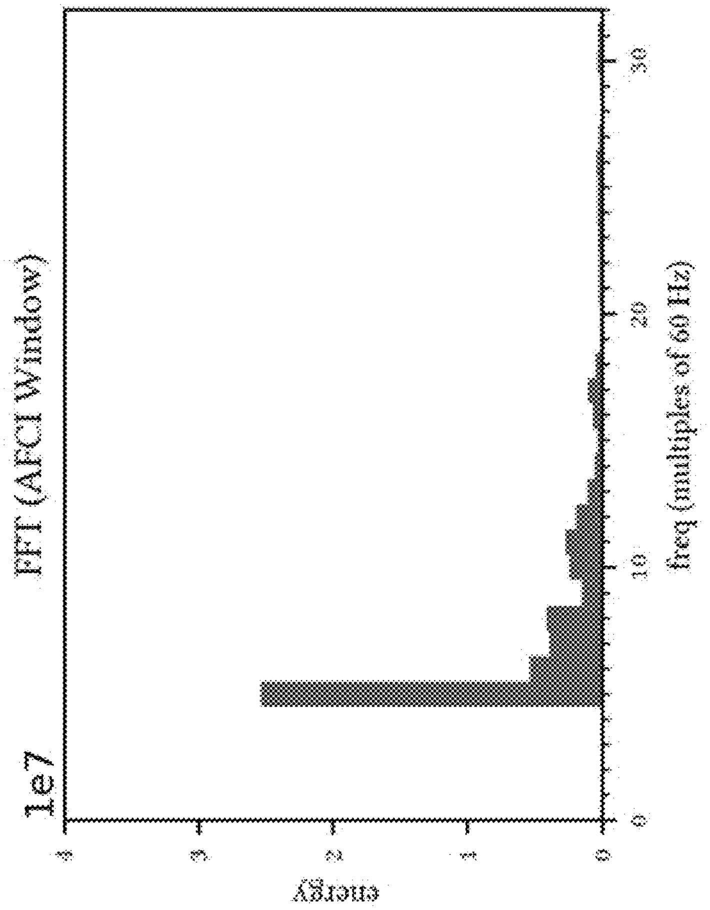

FIGS. 59-3A and 59-3B illustrate FFT charts showing different frequencies: 60 Hz, 120 Hz, 180 Hz and so on up to 1,920 Hz (based on an example of taking 64 samples per cycle). FFT is within one individual cycle and when a parallel arc related spike occurs, its voltage and current FFT will show a huge line/bar. The first one will be very strong as the first one represents the fundamental frequency component of 60 Hz. The other two to the right are artifacts of the windowing function (they are not really present there). They are 120 Hz and 180 Hz.

These "side lobes" are an artifact of doing the FFT. Anything higher has been removed, e.g., using the hamming window whereby the artifact does not show up at higher frequency than 180 Hz or 240 Hz. We have selected these parameters for the purposes of this illustration, so that anything over 240 Hz has to be related to arcing. And that's why we eliminate the first 4 or 5 frequency components in terms of the fundamental frequency; the first 5 bars we ignore, and we take everything from there onwards, to the end of the graph (higher frequencies over the fundamental frequency of 60 Hz).

FIGS. 60-1A, 61-1A, 62-1A, 63-1A, and 64-1A are photographs of the progression of a series arc. When the voltage dropped, it did not drop for only part of the cycle, rather for 1 or 1.5 seconds, meaning that the whole voltage line went down. The progression of the arc continued for tens of seconds.

Figures 1A, 60:
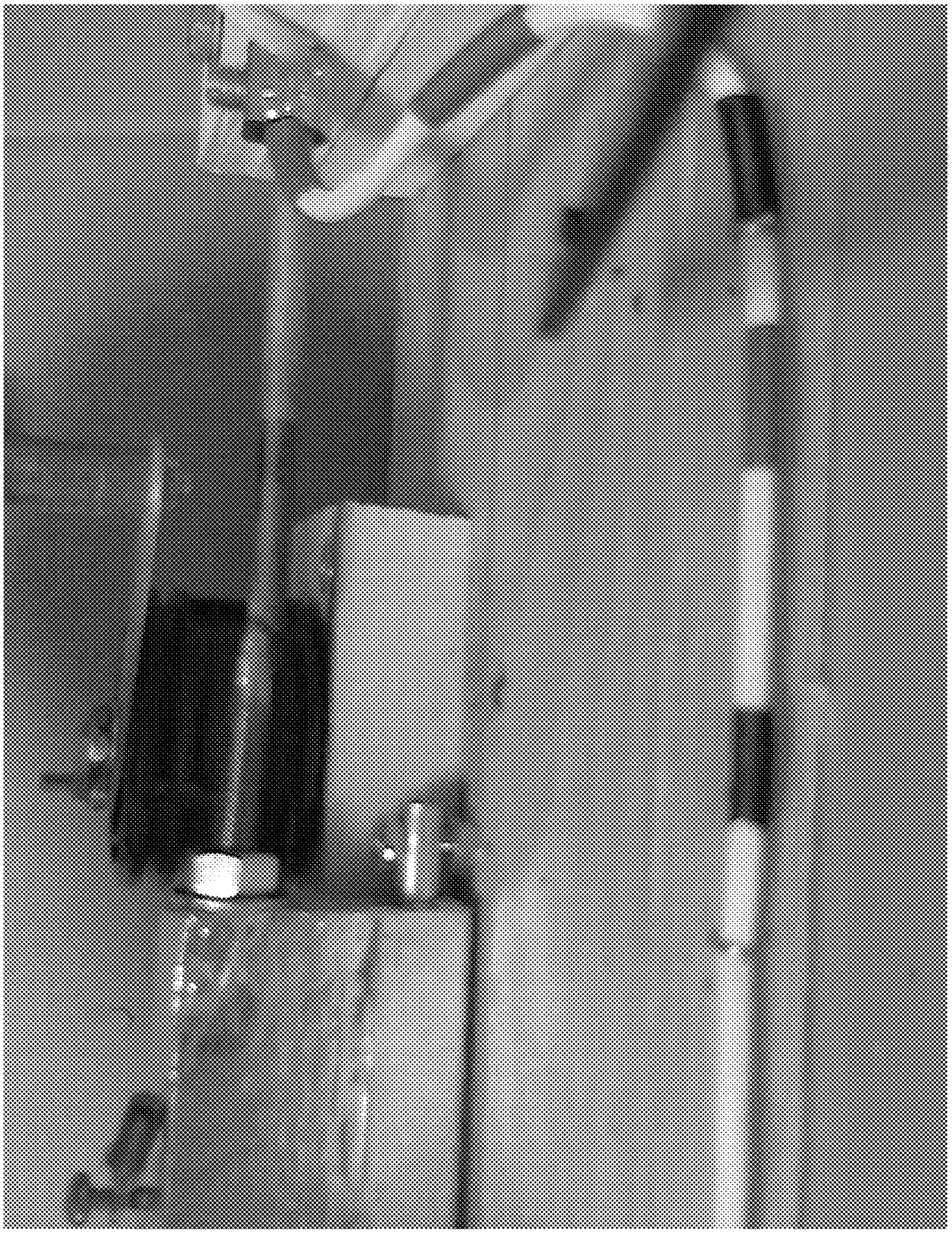
Figures 1B, 60:
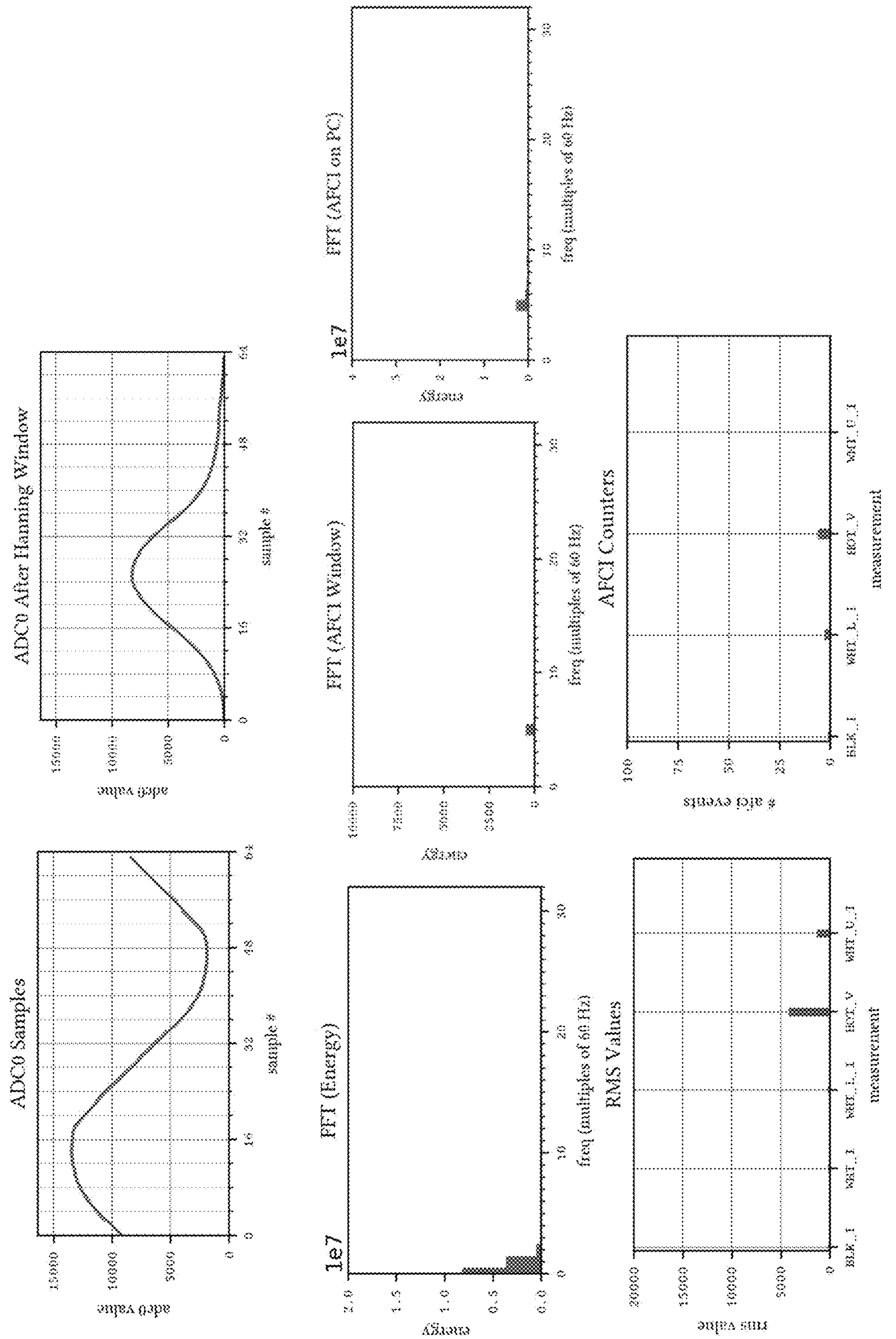
Figures 1C, 60:
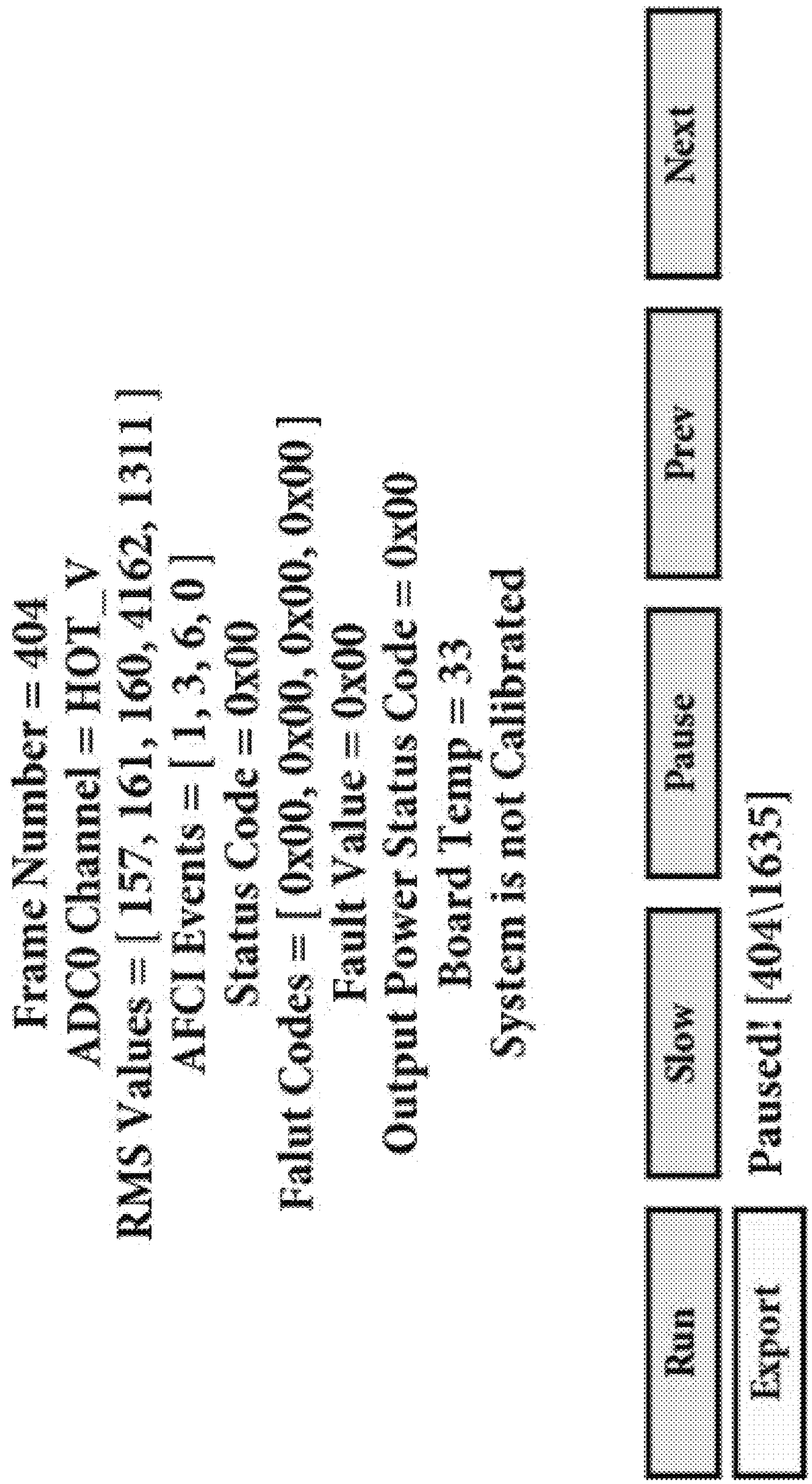
Figures 1A, 61:
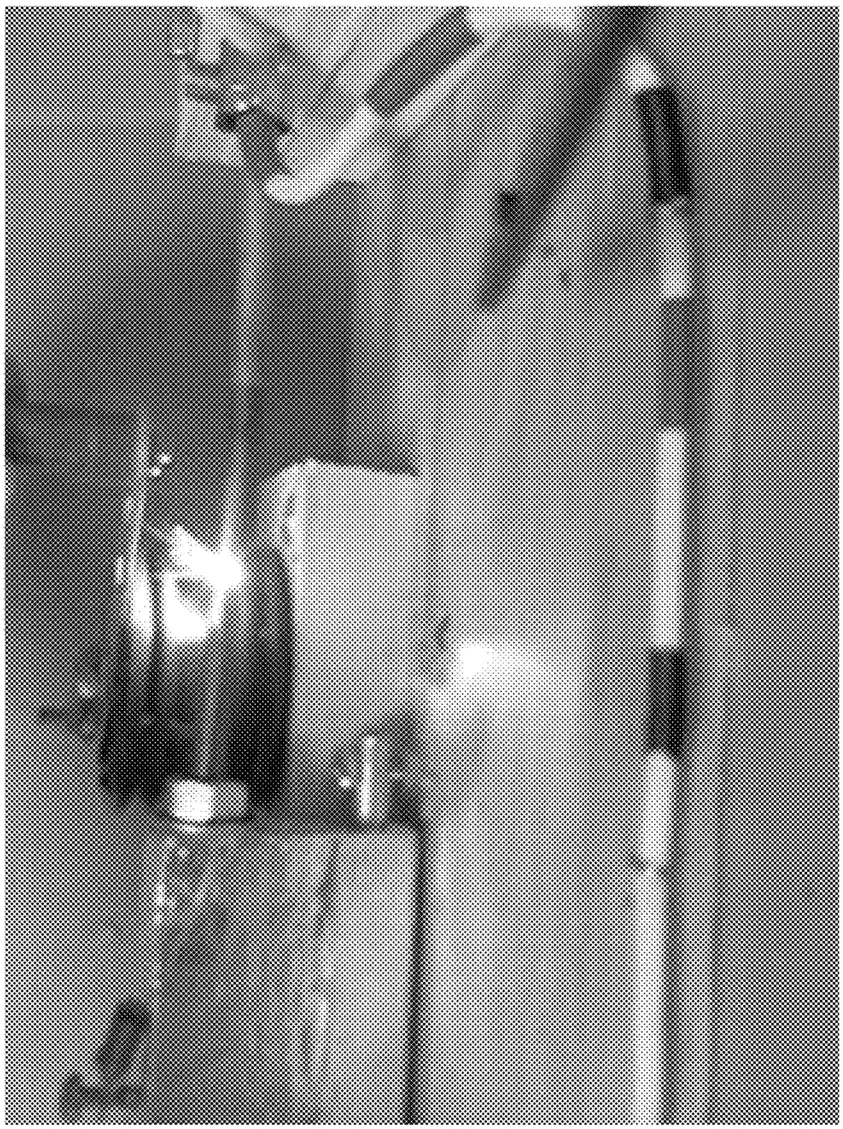
Figures 1B, 61:
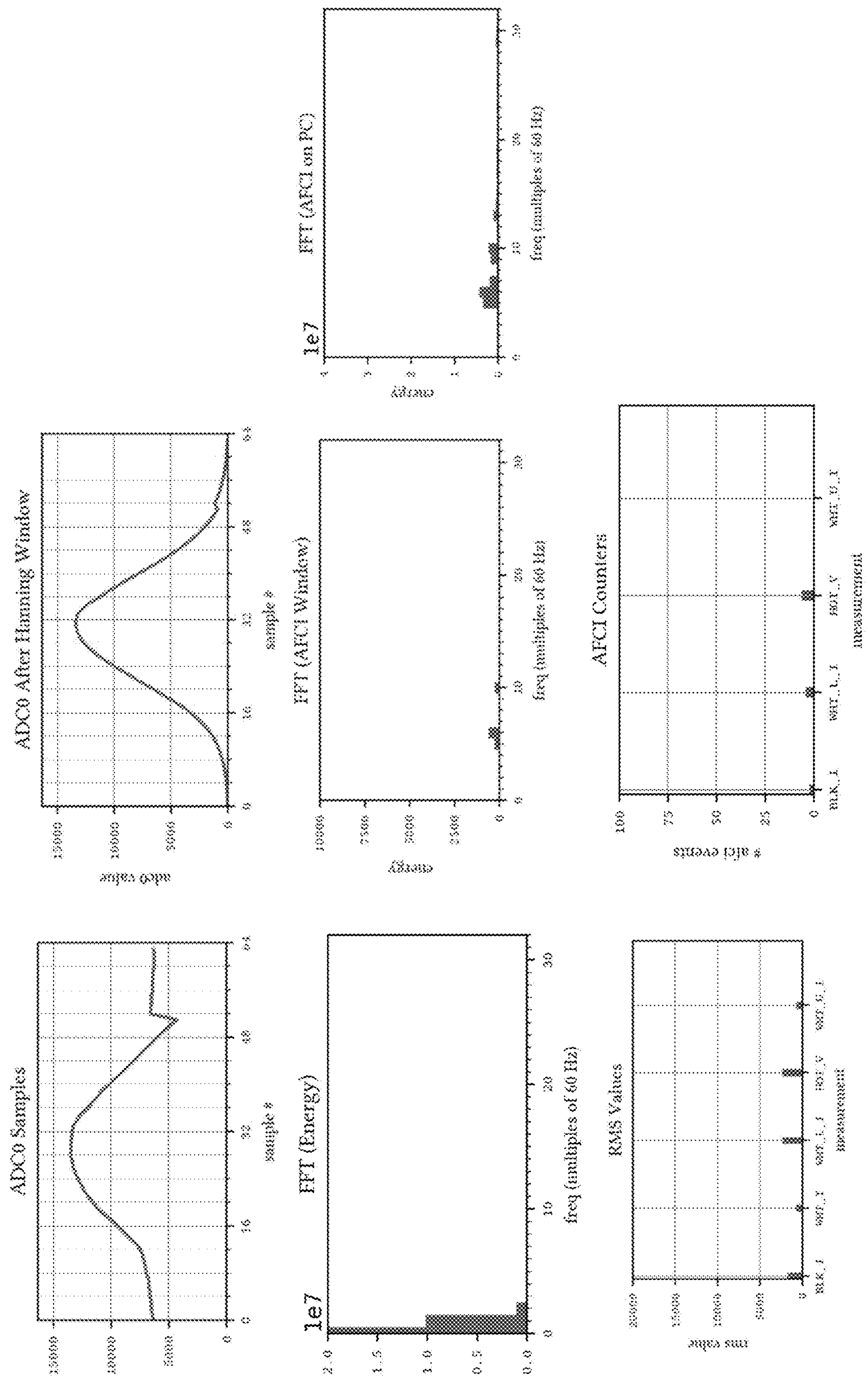
Figures 1C, 61:
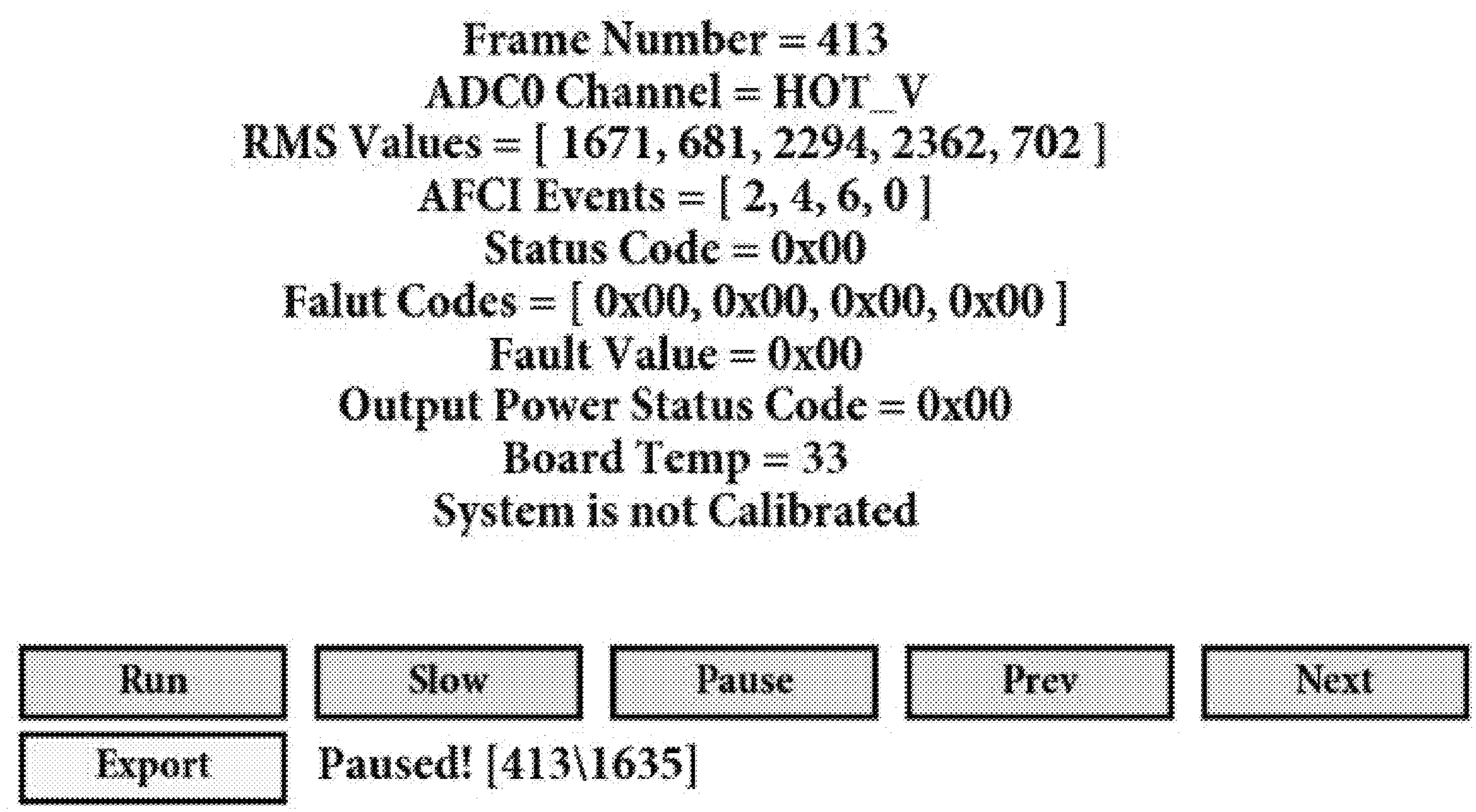

FIG. 60-1A is a photograph of an Arc has not started yet. Everything is normal, where the contact is made. FIG. 61-1A is a photograph of an arc starting to appear. FIG.

Figures 1A, 63:
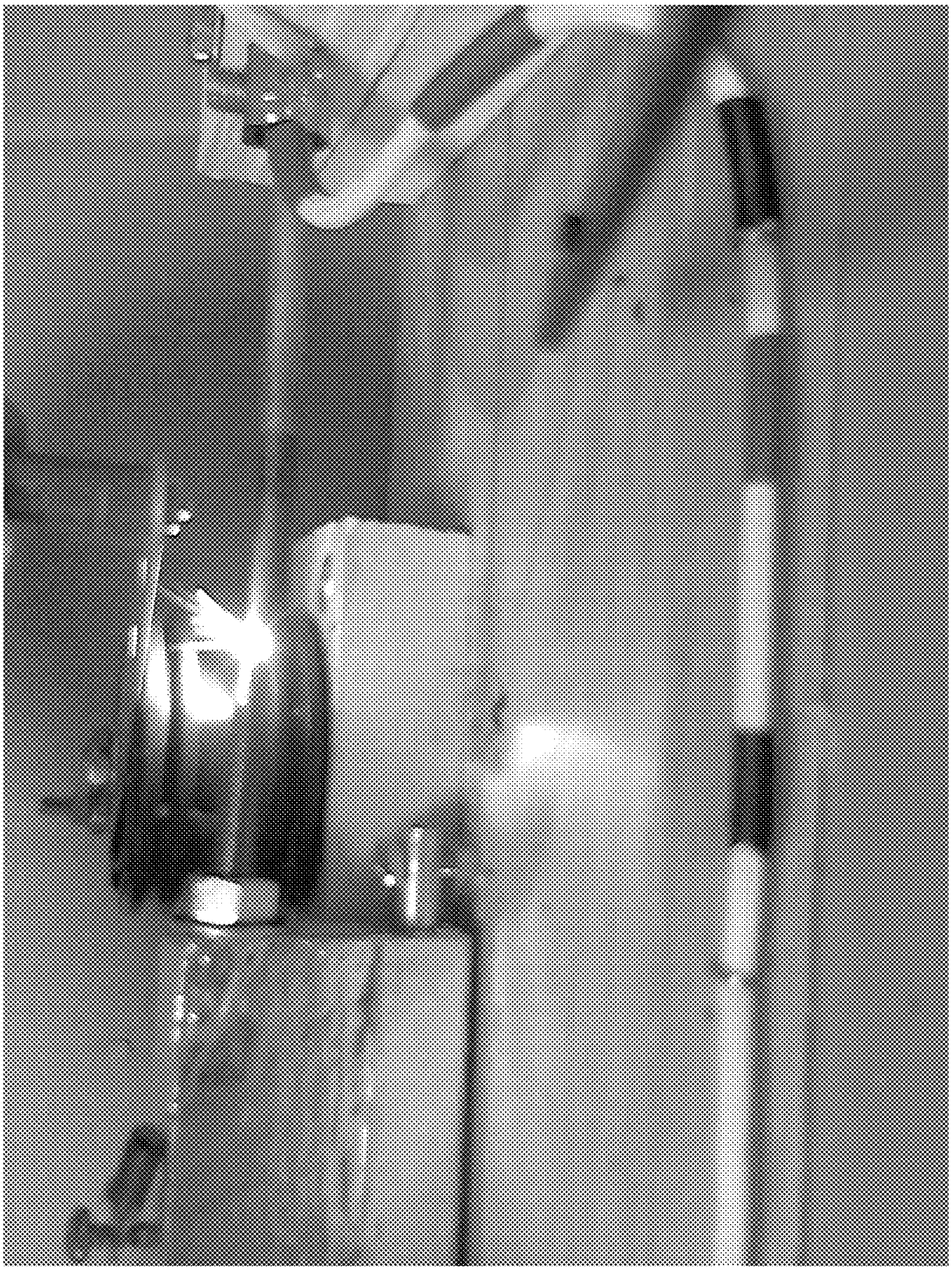
Figures 1B, 63:
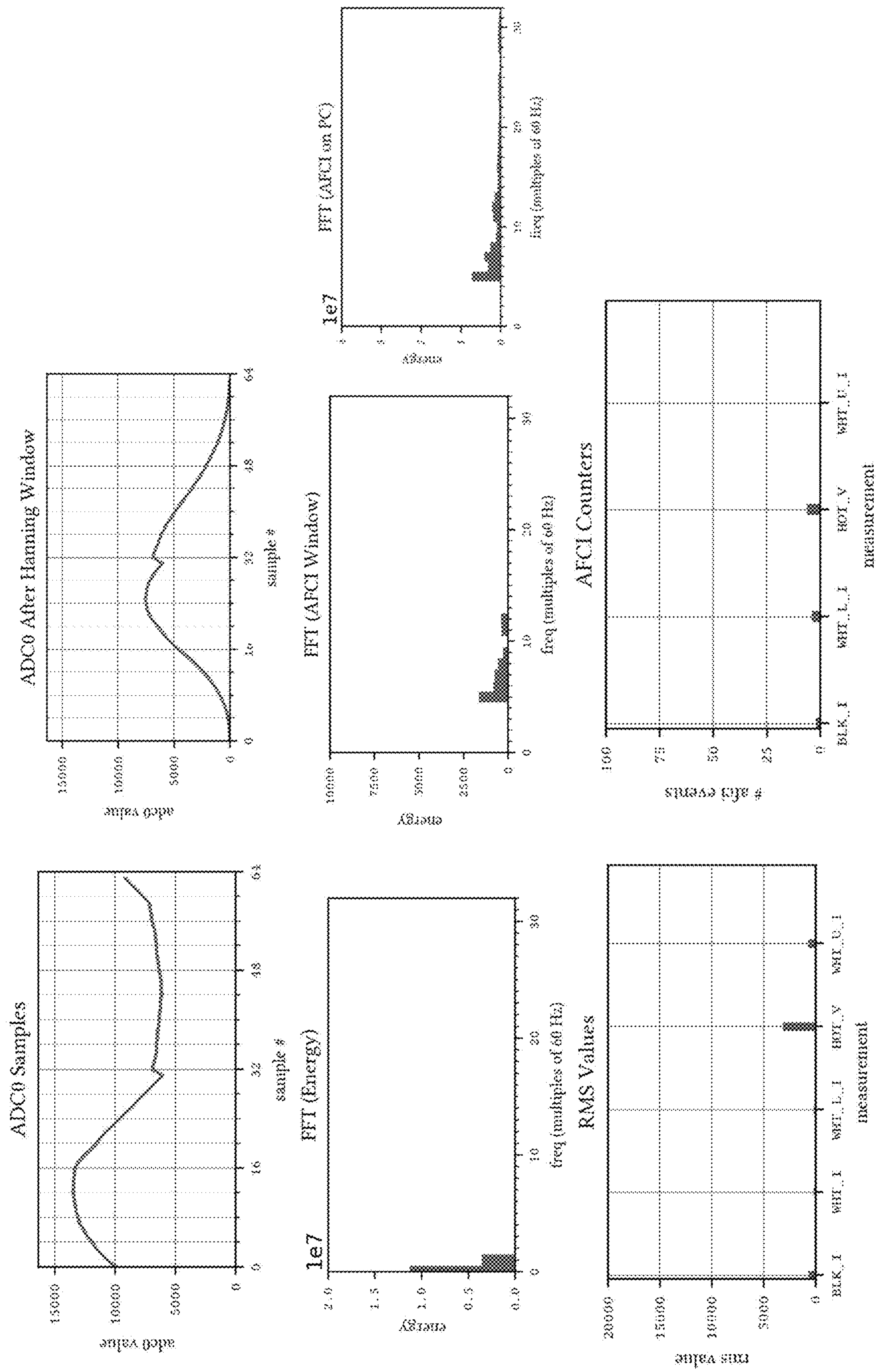
Figures 1C, 63:
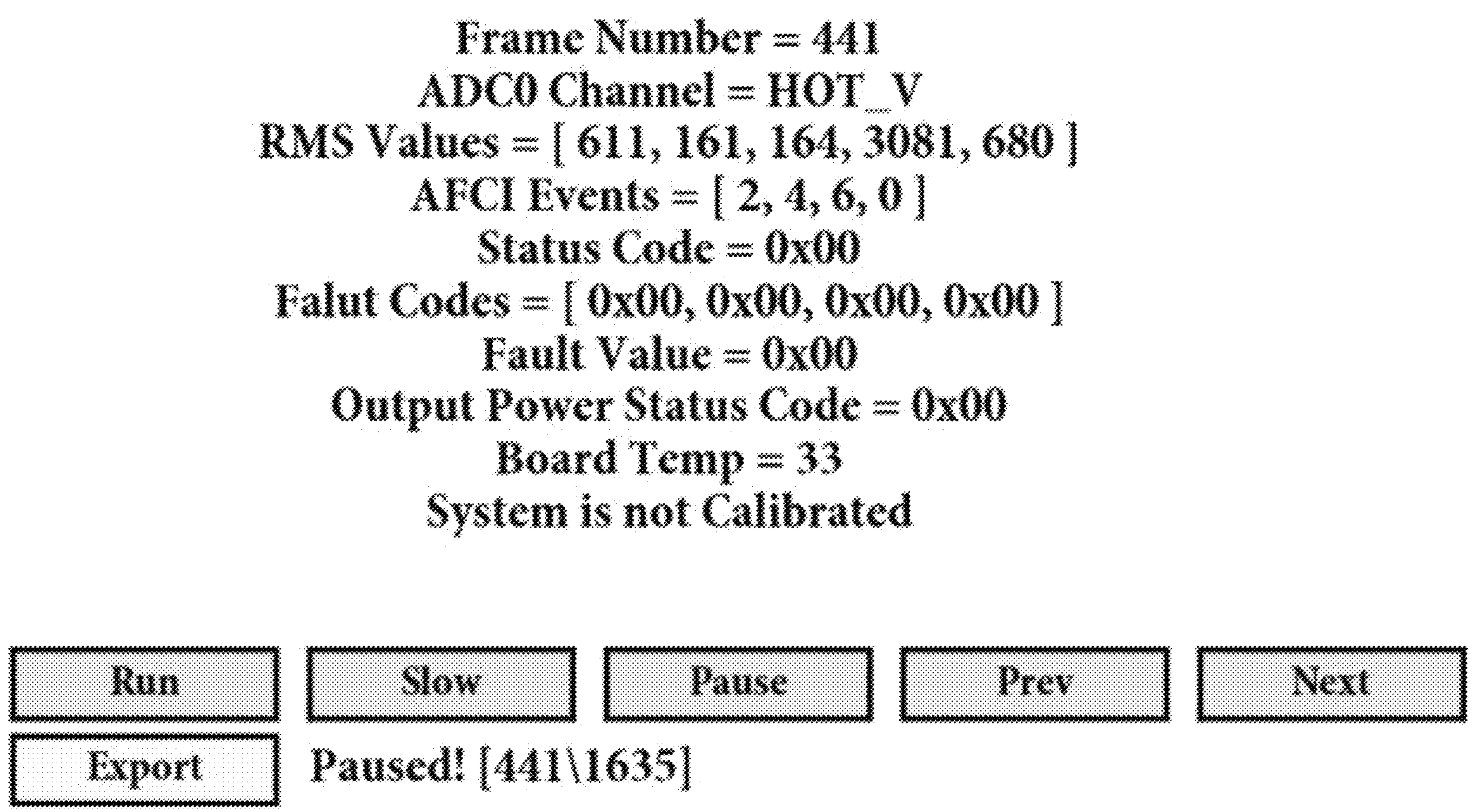
Figures 1A, 64:
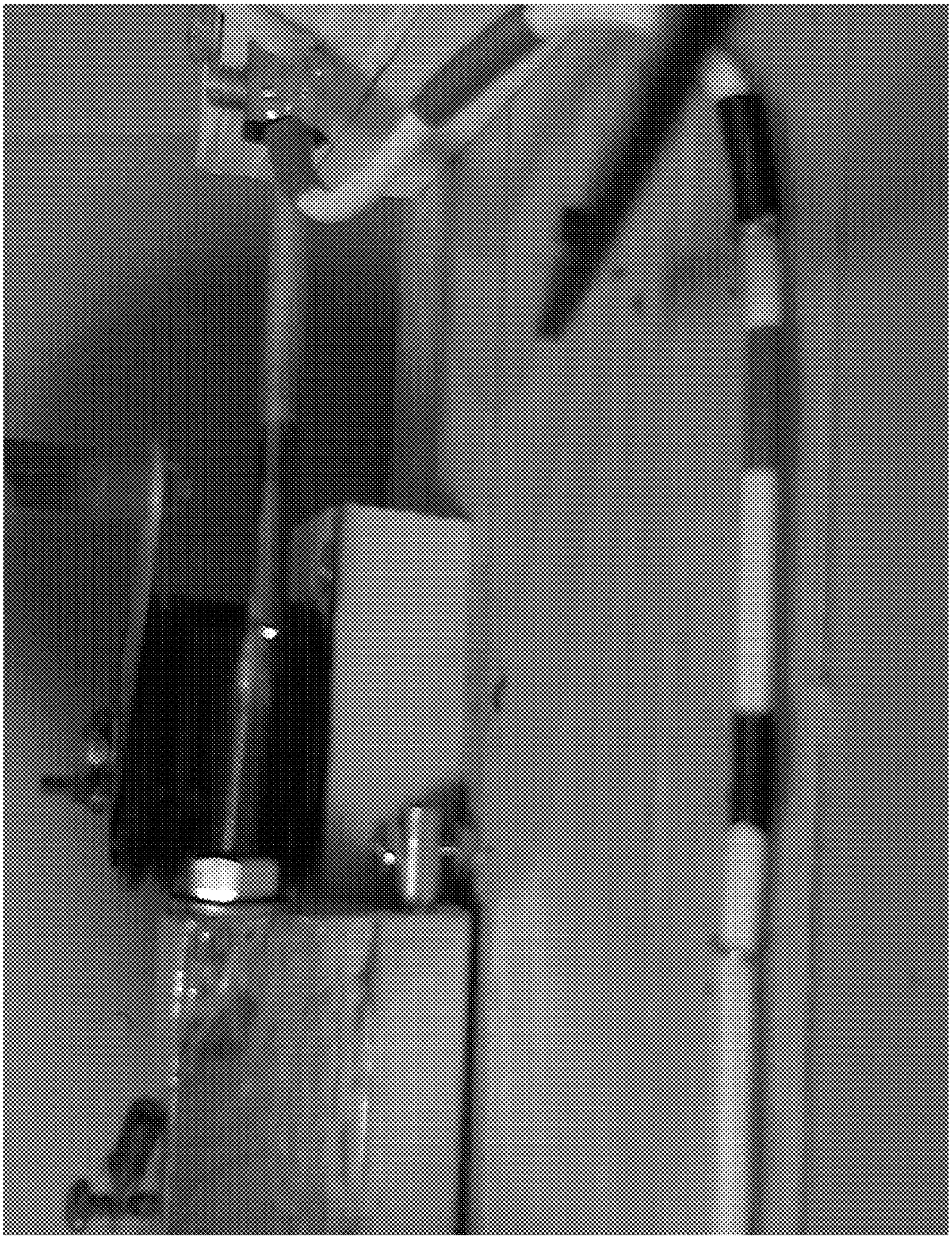
Figures 1B, 64:
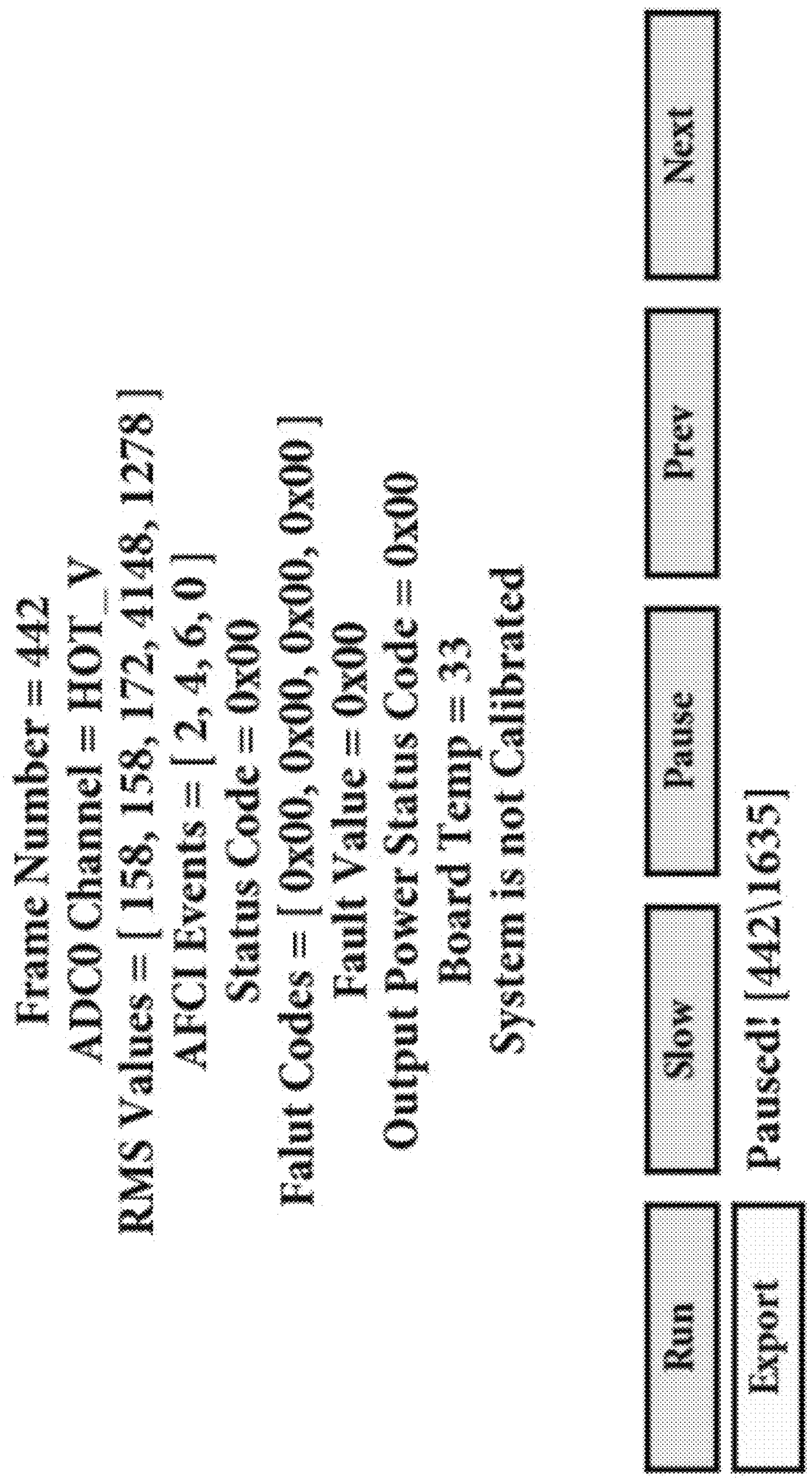

62-1A is a photograph of the arc in full motion. FIG. 63-1A is a photograph of the arc diminishing with glowing contacts. FIG. 64-1A is a photograph of the arc finished, the conductors are back to normal.

Figures 1A, 62:
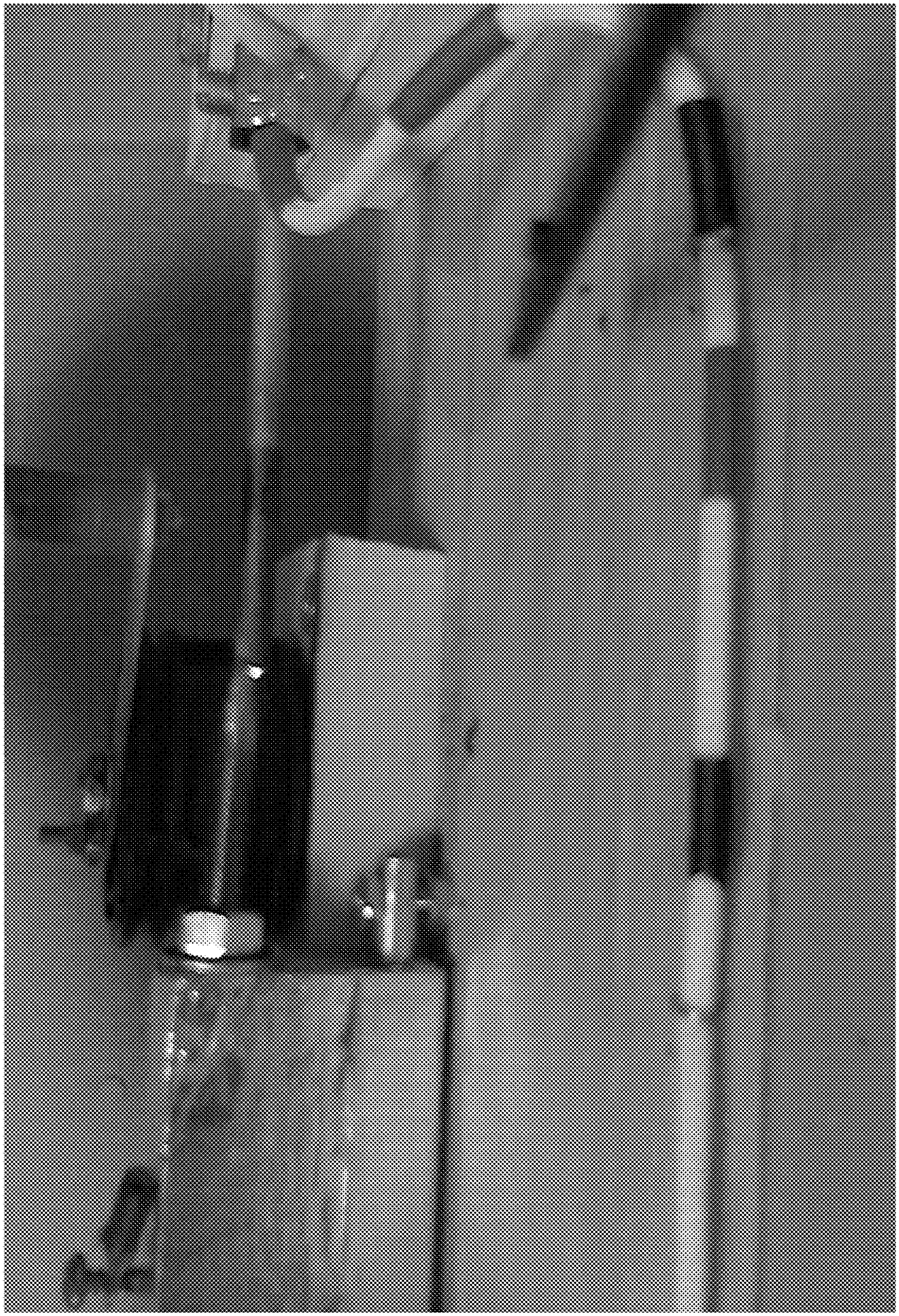
Figures 1B, 62:
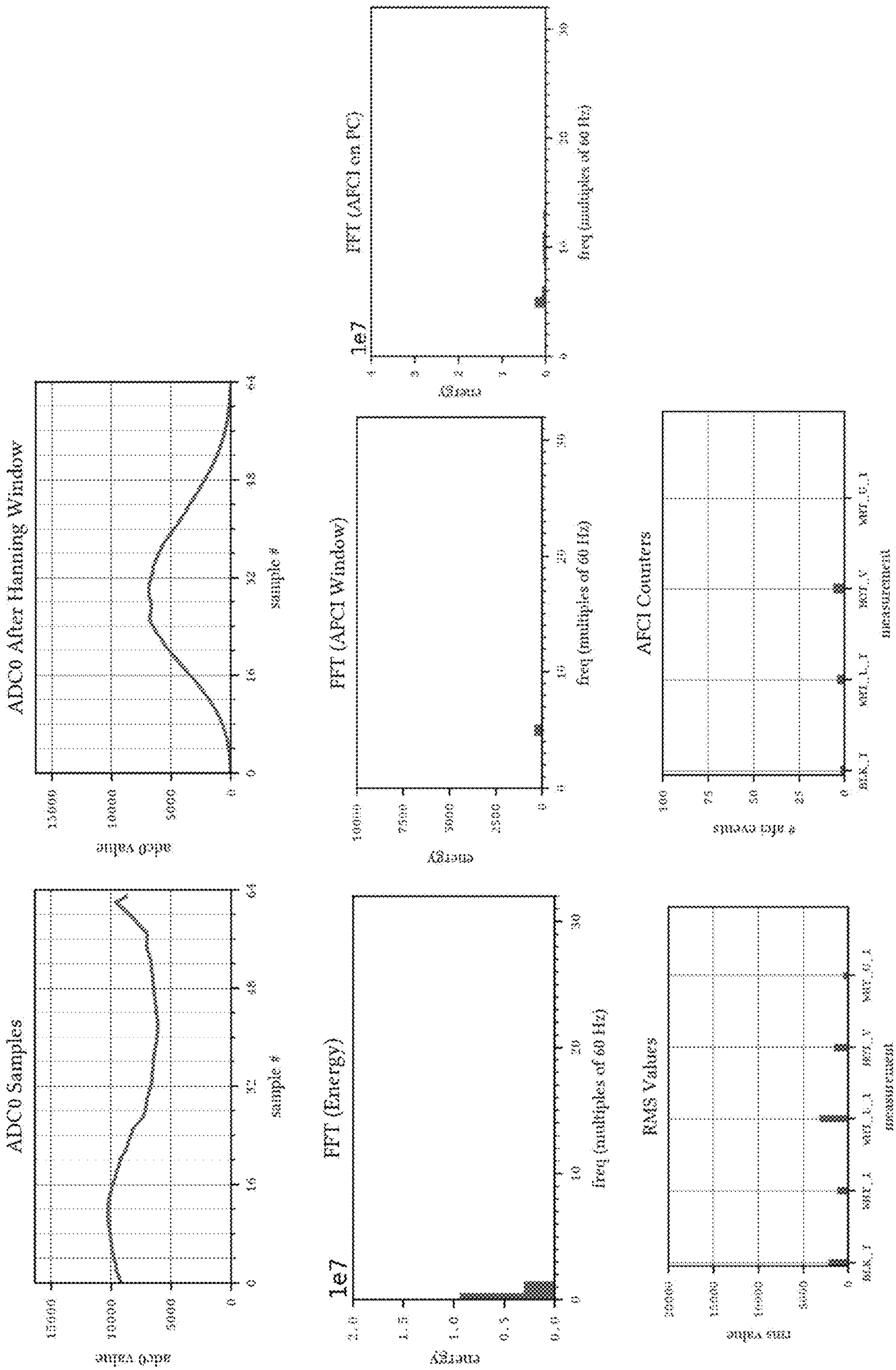
Figures 1C, 62:
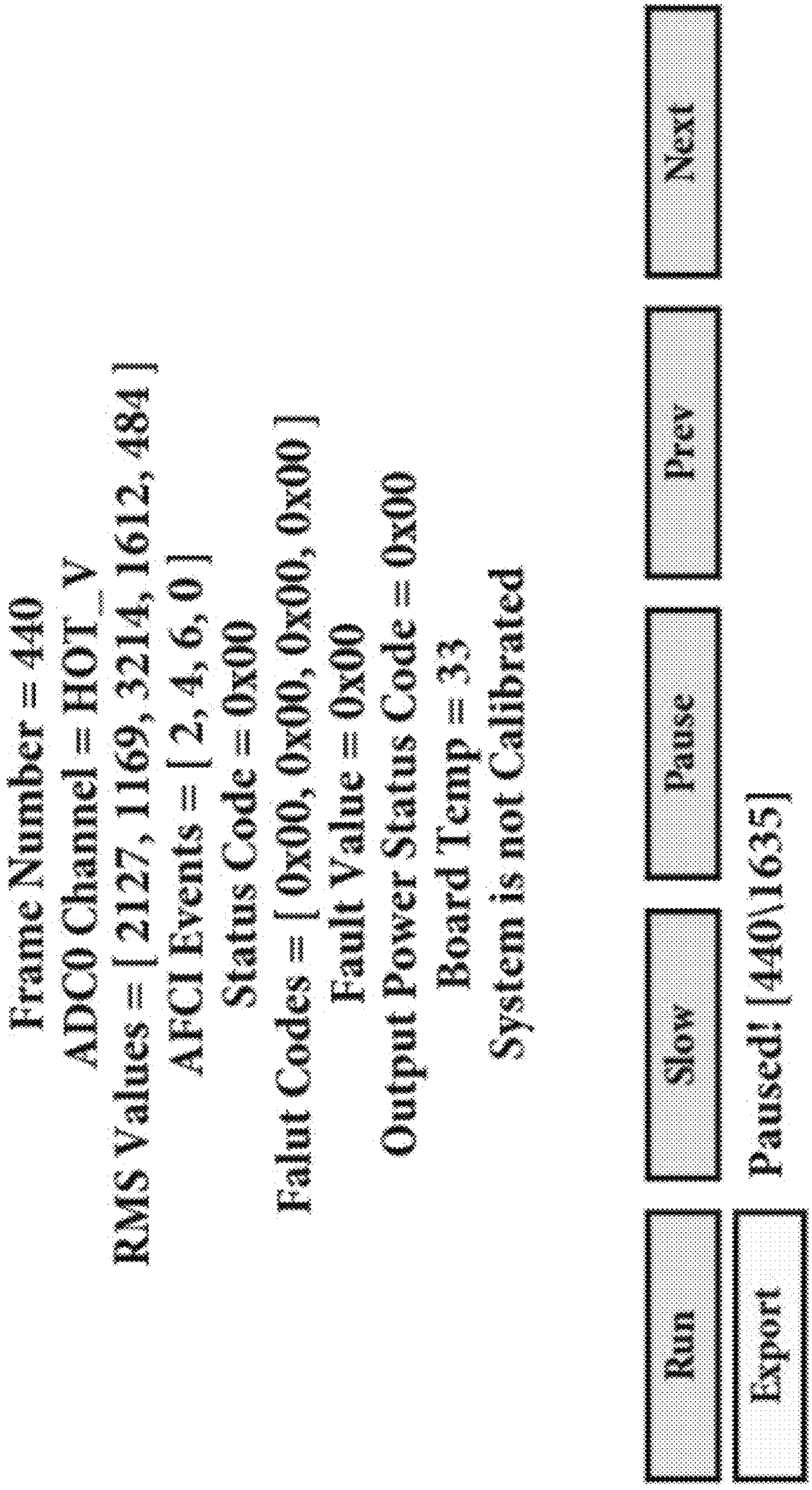

FIGS. 60-1B, 61-1B, 62-1B, 63-1B and 64-1B are sinusoidal waveforms of RMS voltage values sampled, FFT bar graphs, and fault related counters. FIG. 60-1B shows that at first, the voltage is in its full AC wave form. The corresponding Voltage RMS value is 4,162. FIG. 61-1B shows that as the arc starts to appear, the AC waveform starts to break, indicating a voltage drop from an RMS value of 4,162 to 2,362. There is not much activity in the FFT window/chart. FIG. 62-1B shows that when the arc is in full bloom, the whole waveform is smaller, indicating a further voltage drop from 2,362 to 1,612. Nothing appears in the FFT domain as there is no frequency change. FIG. 63-1B shows that at the ending stage of the arc, the waveform increases back from its previous low of 1,612 back up to 3,081. There is little activity in the FFT domain. FIG. 64-1B shows that when there is no more arc, the waveform has returned to normal with a corresponding voltage RMS value of 4,148. There is no activity in the FFT domain.

FIGS. 60-1C, 61-1C, 62-1C, 63-1C, 64-1B are data values received for various functions, results from processing of data and mode and channel controls.

Example embodiments of the electrical device can calculate both RMS and FFT for both voltage and current.

Example embodiments of the electrical device can calculate Fourier Transforms, for example FFT. Normally any equipment or load is connected to line voltage, e.g., hair dryer, washing machine. If voltage drops a little bit, in order to maintain speed of motor, the current goes up because it needs more energy (current) to operate. In the case of arcing, the current is not steady. As the air creates resistance, the current is jumping across the air gap, the draw is low.

The FFT of voltage signals does not show a significant change for series arc. Therefore, detecting series arcing only based on FFT of voltage signals is not feasible under series arc. If current drawn is very high, it is not true that it will be sufficient to detect a series arc. The FFT will show some effect, but it isn't enough to distinguish from normal conditions.

Voltage drops for a series arc, because of the air gap is in series with the load. Voltage is shared between the load and the air gap. For a series arc, FFT will vary, but not significantly enough to be detected. FFT showing erratic behaviour definitely is an indication of an arc, which must be a parallel arc. If voltage drops erratically across cycles, then it must be due to an arc fault. If doesn't show up significantly in the FFT domain, it is a series arc.

In a series arc, RMS voltage value changes erratically. So sometimes the voltage goes down to 90 v, 70 v, then come back to 110 v, then go down depending on how strong the arc is. If not stable at 110 v for one cycle, then it counts as an arc (e.g., FIG. 60-1B, 1 count on the AFCI Counters graph, see row 3 column 2, "HOT_V").

In a period of ½ second to 1 second, if the RMS value of the voltage changes, going down, up, down, up, then the electrical device of example embodiments knows the voltage is changing "erratically" and a result of a series arc.

Usually, each height of the bar is the amplitude or calculation of that particular frequency; e.g. 60 Hz or 120 Hz or 180 Hz. So each bar represents the amplitude corresponding to that wave that is contributing to that actual waveform.

There are no frequency indicators under the series arc. The frequency components don't change. There are not any variations in the frequency analysis of voltage under those conditions.

The voltage being "erratic" means deviation from the RMS from one cycle to another. For example, 110 volt varies without any discernible pattern, rather than it goes slowly down, then slowly up. There is no pattern. 110 v to 70 v, then to 90 v, then to 65 v, then back to 110 v. Because of the arc, there is no pattern to the variation.

In series arc, the air resistance in between the break is very high (resistance is high) so the voltage drops. As the resistance is not constant, the voltage drop varies when the arcing is happening. And that's when we see the voltage changing erratically because of the high resistance nature of the gap. The voltage doesn't change, it remains stable. The voltage develops some kinds of spikes depending on how the arcing is happening. Those spikes are typically captured in the frequency domain because the spike implies that there are more sine waves present of higher frequency. In academia they call this typical arcing, the spikes are present in the waveforms of voltage and current.

On the other hand, for a parallel arc, it is not expected that the voltage will go down and change erratically. For a parallel arc, the electrical device will see spikes and capture those in the FFT.

If the electrical device sees voltage drop without FFT, then it is evidence of a series arc.

If the electrical device does not see voltage drop and sees FFT activity, then there are spikes in the voltage; and if these happen for long (e.g. over 5 cycles) it's a real arc fault, but if less than 5 cycles then it probably is not a harmful arc and it is a safe situation; accordingly, the electrical device will not trip.

Voltage dropping and frequency showing anomalous FFT behavior (response) is indication of an arc. Example embodiments of the electrical device can distinguish between a parallel arc versus a series arc.

When there is normal current flowing, the electrical device of example embodiments detects the voltage sine waves responding to the AC current. When see more than one frequency present with significant contribution, the electrical device of example embodiments detects that the waveform is not regular (e.g. is irregular) and therefore harmonics are present which is abnormal by itself, and it is most likely the result of arcing.

Whenever there is an erratic voltage drop across cycles, it is a series arc. When such voltage behavior is taking place and the FFT response is observed, it is most likely a parallel arc.

For parallel arcs, voltage is connected to the load using the same conductors. So a parallel arc will not be associated with a drop in voltage assuming the supply is "stiff" (the power coming in from the utility company is staying steady) which it usually is. There is a parallel load forming which is same as air gap. Depending on the stiffness, the voltage most likely will not drop across different cycles. The FFT might show irregularities in the voltage domain. When the voltage regardless of dropping or not, shows an anomalous FFT response indicative of a parallel arc. In the case of a parallel arc, the FFT will be much stronger because there is no limiting factor. It is just creating a short between black and white, or black and ground. For parallel arcs between black and white, the voltage will be the same, but the current will vary erratically, and the FFT of the current will also show some variations; e.g. change, erratic variation.

For series arc, the FFT will not show a significant deviation simply because the amount of current that is involved in the arc will be low, whereas in the case of parallel arc, there is no limit as to the amount of current it can take.

A parallel arc can occur from Black to Ground. An arc from Black to Ground is called leakage (black current goes to ground but not sufficient to trip traditional industry MCB (unless overload). Shorting means that the black is physically connected to the ground. Current will build up significantly and cause the breaker to trip because of the overload. When there is a short connecting the black to white, the traditional industry MCB will trip because of the overload. Shorting can also occur connecting black to ground, but the current does not return through neutral. A short because an overcurrent at the breaker; leakage may or may not, depending on strength; for example leakage of 6 or 7 milliamps will not show as an overload.

In a parallel arc, the Batman-ear type spikes in the voltage domain may or may not show. Will show up in the current domain as there will be high frequency components.

Regarding parallel arcs, when the frequency domain shows variation, this is a known phenomenon. But not for a black to neutral parallel arc, as they won't see a current differential and therefore won't detect the arc. So the invention is overcoming that they cannot detect black to neutral parallel arcs; e.g. by using FFT (which existing art does not do at all because they don't measure actual values), we can detect parallel arcs between black and neutral.

The differential is the difference between the current and it is measured in RMS rather than the waveforms or amplitude and frequency. The spikes are indicated through FFT and therefore we would expect the RMS to stay the same as there is no change in the current between them, In case of parallel arc, the arc between black and neutral won't exhibit a differential, but the waveform will in fact show the spikes. And this case in not caught by the industry because they look only at the differential. However, the academic world describes this arcing as the spikes in the voltage waveforms. Nobody is using that description, but they are looking at the differential current in their products.

For real devices or loads that will be connected to the electrical receptacle (e.g. hair dryer, brush motors where there's arcing, etc.), these kinds of spikes are going to be present for almost every kind of load that is connected. The solution is to identify different types of arcs to establish the harmless variation in the spike.

Therefore, there is a need to define the actual nature of the arc, understanding which spikes are relevant and which do represent actual arcs and which do not.

Based on looking at the spikes and then corresponding variations in the RMS values of the voltage and of the current, the electrical device can determine are and are not an arc, as well as the type of arc. The combination of the spikes and variation in RMS value indicates that it is a harmful arc.

In example embodiments, the electrical device includes the processor, and frequency calculations (e.g. FFT, wavelets), and determining random variations in the RMS value of the voltage by statistical means (the latter combination, indicating to us that it is a harmful arc, as opposed to the normal starting and harmless arcs that happen to the operation of the equipment).

The electrical waveforms, spikes, and variations may be observed. These may be used to draw a reliable conclusion regarding the presence of an arc. Upon drawing a conclusion, the electrical device then causes a "trip", energizing or de-energizing based on what has been explained herein. Example embodiments use a microprocessor to control hardware to energize and de-energize based on the decision process flow.

Series arcs will occur when a conductor is broken. A partially broken wire simply means that resistance will be increased and the temperature will rise; but depending on how much heat there is, and current flowing, the whole thing will just get hot or get complete meltdown. In the case of an LED bulb, there won't be much current draw, so the wire won't necessarily get that hot and break. A series arc can occur when a conductor has broken, e.g., either screw terminal at breaker is loose, or connection gets corroded; e.g. anytime there is a poor connection, or another connection is not proper, or wire breaks.

FIGS. 59-1A and 59-1B represent a single cycle of sinusoidal waveforms (or sine wave) of voltage in an AC Circuit, showing instantaneous voltage over time ("Vt"). 60 such cycles occur in one second (60 Hz). A similar sine wave or sinusoidal mathematical curve may represent current. RMS provides the average of the voltage (or current as the case may be) variation for each cycle.

Current and voltage spikes are shown, represented. In the cycle as what the industry often refers to during arcing as having the appearance of "Batman-like" ears. The spike shows as a higher frequency. This has been the characteristic signature of arcing in the voltage and current domains and continuous in each cycle.

Although 5 channels are illustrated as being recorded: voltage, BLK current, WHT current, upper receptacle, and lower receptacle—and additional channels may be added, such as a sixth channel for recording GFCI leakage signal(s).

In one embodiment, 64 data points are sampled per channel, within each cycle, across the 60 cycles during each second. Voltage varied continuously within each cycle. From the instantaneous voltage values that varied during 1/60th of a second, one RMS voltage value is generated per cycle.

FIGS. 59-2A and 59-2B illustrate FFT values of a normal (non-fault) power line signal, for example 60 Hz. The FFT value of voltage which does not change.

FIGS. 59-3A and 59-3B illustrate FFT values for different frequencies of voltage; e.g. 60 Hz, 120 Hz, 180 Hz, and so on, up to 1920 Hz based on having 64 samples. FFT will show only if there is an inconsistency within a waveform. FFT may could also be illustrated for different frequencies of current.

In example embodiments, voltage and current fluctuations are captured in the frequency domain, computed and processed during frequency analysis (such as FFT and/or wavelet). A parallel arc is accompanied by a drop in RMS voltage and current. Accompanied by fluctuation in FFT establishes that a parallel arc is taking place.

Traditional AFCI analog based technology depending on detecting current differentials. Traditional AFCI analog can capture parallel arc faults between black (live) and ground, based on leakage. Traditional AFCI analog will not capture parallel arc faults between black (live) and white (neutral) based on detecting current differentials, as although the current may be varying, the current remains the same during a parallel arc occurring between the black and the white wires.

Example embodiments of the electrical device can use at least voltage (and sometimes with current) RMS value drop, and voltage and current fluctuations in the frequency domain, enables detections, affirmation and identification of a parallel arc.

FIGS. 59-3A and 59-3B display FFT. When a parallel arc related spike occurs, its voltage and current FFT will show a huge line as illustrated. However, for series related spikes, in FIG. 60-1B the RMS voltage value drop does not show up in the corresponding FFT.

Applicable to both parallel and series arc faults, the accumulation of a count of the number of fault conditions as illustrated in FIGS. 60-1B, 61-1B, 62-1B, 63-1B and 64-1B enables the determination of whether an arc is normal (as for hair dryers, brush motors, etc.) or should be acted upon to de-energize the power to the load.

For example, the presence of less than 5 instances of an arc within one cycle, would indicate that no action should be taken, power should not be turned off—which otherwise could have resulted in a false trip. Over 5 fault instances within a cycle, might indicate that the frequency of the arc is sufficient to trip, de-energize the load, or circuit.

The triggering fault number can be pre-set, predetermined or controlled by input optionally even in real time using a power monitoring, measurement, control means/process such as the API disclosed herein. Similar to voltage and current instantaneous values, RMS values and frequency analysis, the recording of occurrences of fault counts (spikes) takes place within a second, for 6 channels: voltage, BLK current, WHT current, upper receptacle, lower receptacle, and (soon to be added, GFCI leakage signal).

The number of channels can be less or greater, depending on the desired product and/or process application embodiment.

For series arcs, the photographs show the progression of series arcing in FIGS. 60-1A, 61-1A, 62-1A, 63-1A, and 64-1A with the corresponding Voltage RMS values and associated Frequency Analysis. In this embodiment a frequency analysis using Fast Fourier Transform (FFT) illustrates that for during the particular Series Arc, the RMS Voltage values vary erratically in series fault, dropping from 4,162 to 1,612 as the arc went into full bloom, then back to 3,081 as it diminished, and to 4,148 when the arc was gone (FIG. 64-1A the arc had terminated, and the "broken" carbonized rod (graphite) 2 conductors had been brought back together). (The arc could have stop and the 2 pieces of metal become welded).

However, no activity appeared in the FFT domain. This unique characteristic unpublished in the industry is the basis for the detection, identification and differentiation process and means herein described which affirms that a series arc has occurred. Series arcs are not detected by AFCI technologies which are based on identifying current differentials, and which do not measure actual values of current or voltage, nor have the processing means to establish that arcs have not exhibited their spikes in the frequency domain—whether voltage or current. The progression of the arc continued for tens of seconds.

When the series arc occurs, the actual RMS voltage value drops and the drop continues for several seconds. The drop is not within the waveform but rather the whole waveform itself shrinks. This is very peculiar to series arc. RMS value drop can take place in ½ or 1 second, but can continue for tens of seconds. Undetected, the arc will continue until wire melts.

FIGS. 60-1B, 61-1B, 62-1B, 63-1B AND 64-1B illustrate that for series arcs, RMS voltage value drops occurs across multiple cycles, e.g. over a period of time; e.g. the AC waveform itself is dropping. The whole RMS value goes down, and it takes place over ½ second to one second—but continues over multiple seconds, across multiple waveforms. Even though the voltage drop is accompanied by a small distortion in the frequency domain, it is not sufficient to be captured by the frequency analysis alone.

The AFCI Signature comprises of multiple conditions including: voltage, current, frequency changes (for example FFT detects frequencies present, wavelets detect how these frequencies are changing), A series arc can occur in ½ to 1 second; e.g. within one cycle. However, the duration of the series arc can be 10, 20 even 30 seconds, with voltage (and sometimes current) (as exhibited in its RMS value) fluctuating erratically in series fault across multiple cycles.

Determining that a series arc has occurred by only measuring voltage or current fluctuation within a single cycle rather than across more than one cycle or multiple cycles will improperly establish that a series arc has occurred, resulting in false tripping. Moreover, attempting to determine that a series arc is taking place, by monitoring and measuring fluctuations of currents in the frequency domain, will fail at detecting series arcs.

Both measuring current differentials and monitoring spikes in the current domain fail to detect series arcs as there won't be current differentials in a cut black or white wire; and significant current fluctuations won't appear in the FFT, or frequency domain.

The specific unique characteristic of a series arc to vary erratically in series fault in its RMS value, across wave forms is sufficient to determine that a series arc is occurring. Accordingly, it is inadequate to establish a series arc fault condition based on fluctuation occurring only within a single $1/60^{th}$ of a second waveform cycle.

Erratic voltage RMS voltage (or current) RMS values, with no significant presence of FFT values (for either current or voltage) is sufficient to trigger further examination to confirm the presence of a series fault. The continuation of an erratic voltage RMS value drop across more than one cycle is sufficient to indicate the presence of a series arc, upon which to trip the breaker, or de-energize the respective load or circuit (accessed by the receptacle type device).

An example embodiment is an electrical device including: a contact configured for electrical connection to a power line; at least one sensor to detect at least voltage signals indicative of the power line; and a processor configured to determine from the detected voltage signals that a series arc fault has occurred.

In an example, the electrical device further comprises a solid state switch for in-series electrical connection with the power line, the processor further configured to, in response to said determining that the series arc fault has occurred on the power line, deactivating the circuit.

In an example of the electrical device, the solid state switch is a TRIAC.

In an example of the electrical device, the contact is configured for electrical connection to a downstream power line or an electrical outlet.

In an example of the electrical device, said determining comprises the processor determining that the series arc fault has occurred on the downstream power line or a load plugged into the electrical outlet.

In an example of the electrical device, said determining comprises the processor determining that the series arc fault has occurred on the power line.

In an example, the electrical device further comprises a communication subsystem, wherein the processor is configured to, in response to said determining that the series arc fault has occurred, sending a communication that the series arc fault has occurred.

In an example of the electrical device, the at least one sensor further includes at least one current sensor to detect current signals indicative of the power line, wherein the determining is further based on the detected current signals in addition to the detected voltage signals.

In an example of the electrical device, the determining is that there is little or no variance in the detected voltage signals, and is below a specified voltage threshold.

In an example of the electrical device, the determining is that there is variance in the detected current signals, for a load that experiences current above a threshold.

In an example of the electrical device, the power line comprises a hot power line, a neutral power line, or a ground power line.

In an example of the electrical device, the series arc fault is between a hot power line and a second hot power line, or a neutral power line and a second neutral power line, or a ground power line and a second ground power line.

In an example of the electrical device, the series arc fault is between the power line and the contact or a second contact. In some examples, one contact may be electrically connected to a black power line, the second contact may be electrically connected to a white power line. In this case, the contact and the second contact may be two potential points of glowing contacts. The second contact may also connect to a neutral line. A glowing contact may occur at any of the conductors, for example white or the black conductor, when the contact is compromised, such as having a loose connection with a power line.

In an example of the electrical device, the determining from the detected voltage signals that the series arc fault has occurred comprises: computing a frequency analysis of the detected voltage signals, determining that the series arc fault has occurred from the frequency analysis by determining that there is little or no deviation of the frequency analysis.

In an example of the electrical device, the frequency analysis comprises calculating a Fourier transform or a Fast Fourier Transform (FFT) of the detected voltage signals, and analyzing higher order frequency signals of the Fourier transform or the Fast Fourier Transform (FFT) that are higher than fundamental frequency of the power line.

In an example of the electrical device, the determining from the detected voltage signals that the series arc fault has occurred comprises calculating a mean square or root mean square of the detected voltage signals and determining that the mean square or the root mean square deviates from previous mean square or root mean square of previously detected voltage signals.

In an example of the electrical device, the determining from the detected voltage signals that the series arc fault has occurred comprises determining that that the mean square or the root mean square deviation has occurred for more than a threshold number of cycles of the detected voltage signals.

In an example of the electrical device, the processor is configured to, when the mean square or the root mean square deviation has occurred for less than a threshold number of cycles of the detected voltage signals, determine that no series arc fault has yet occurred to avoid false trips.

In an example of the electrical device, the variance is a decrease in the mean square or the root mean square of the detected voltage signals.

In an example of the electrical device, the determining from the detected voltage signals that the series arc fault has occurred comprises calculating a mean square or root mean square of individual cycles of the detected voltage signals and determining that there are two consecutive cycles of decreases in the mean square or the root mean square of the detected voltage signals.

In an example of the electrical device, the determining from the detected voltage signals that the series arc fault has occurred comprises determining whether there is a voltage variance for individual cycles of the detected voltage signals, and determining that the voltage variance has occurred for more than a threshold number of cycles of the detected voltage signals.

In an example of the electrical device, the processor is configured to determine whether there is a voltage variance for individual cycles of the detected voltage signals, and determine that no series arc fault has yet occurred to avoid false trips when the voltage variance has occurred for less than a threshold number of cycles of the detected voltage signals.

In an example embodiment, the electrical device further comprises at least one analog-to-digital convertor (ADC) configured to receive a respective analog signal from the at least one sensor and output a respective digital signal for processing by the processor for the determining from the detected voltage signals that the series arc fault has occurred.

In an example of the electrical device, the at least one sensor is for in-series electrical connection with the power line.

In an example of the electrical device, the series arc fault is a non-continuous arc fault.

An example embodiment is an arc fault circuit interrupter including: a power line conductor; a solid state switch for electrical connection to the power line conductor and configured to be activated or deactivated; an arc fault trip circuit cooperating with said solid state switch, said arc fault trip circuit being configured to deactivate said solid state switch responsive to detection of a series arc fault condition associated with voltage conditions of the power line conductor.

In an example of the arc fault circuit interrupter, the power line conductor comprises a hot conductor, a neutral conductor, or a ground conductor. In an example, the solid state switch is a TRIAC.

An example embodiment is an electrical device comprising: a contact configured for electrical connection to a power line; at least one sensor configured to detect voltage signals indicative of the power line; and a processor configured to sample a plurality of the detected voltage signals within individual cycles of the detected voltage signals, and calculate mean square or root mean square values of the sampled voltage signals for the respective individual cycle of the detected voltage signals.

In an example of the electrical device, sixty four samples are sampled from the respective individual cycle of the detected voltage signals.

In an example, the electrical device further comprises an analog-to-digital convertor (ADC) configured to receive analog signals from the at least one sensor indicative of the detected voltage signals and output digital signals to the processor for the sampling.

In an example, the electrical device further comprises a solid state switch for in-series electrical connection with the power line, the processor further configured to, in response to determining that a series arc fault has occurred from the calculated mean square or root mean square values of the sampled voltage signals, deactivate the solid state switch.

In an example of the electrical device, said determining comprises the processor determining that the series arc fault has occurred on the power line.

In an example, the electrical device further comprises a communication subsystem, wherein the processor is configured to, in response to said determining that a series arc fault has occurred from the calculated mean square or root mean square values of the sampled voltage signals, send a communication that the series arc fault has occurred.

An example embodiment is an electrical circuit interruption device including: a contact configured for electrical connection to a power line; a solid state switch for in-series electrical connection with the power line; at least one sensor to detect voltage signals indicative of the power line and provide analog signals indicative of the detected voltage signals; an analog-to-digital convertor (ADC) configured to receive the analog signals from the at least one sensor and output digital signals to the processor; and a processor configured to determine from the digital signals that an arc fault has occurred, and in response deactivating the solid state switch.

In an example of the electrical circuit interruption device, the determining from the detected voltage signals that the arc fault has occurred comprises: computing a frequency analysis of the detected voltage signals, wherein the arc fault is determined to be a parallel arc fault from the frequency analysis.

In an example of the electrical circuit interruption device, the frequency analysis comprises calculating a Fourier transform or a Fast Fourier Transform (FFT) of the detected voltage signals, and analyzing higher order frequency signals of the Fourier transform or the Fast Fourier Transform (FFT) that are higher than fundamental frequency of the power line.

In an example of the electrical circuit interruption device, the calculating of the Fourier transform or the FFT of the detected voltage signals is performed on individual cycles of the detected voltage signals, and wherein the arc fault is determined to be a parallel arc fault based on the higher order frequency signals over a plurality of cycles.

In an example of the electrical circuit interruption device, the plurality of cycles, rather than only a single cycle (15 milliseconds), are used to confirm that there is a real arcing fault. A single cycle to determine arcing fault may result in false tripping. If an arcing fault occurs in only one cycle, but not the next, the arc fault may be a false one, and the electrical circuit interruption device may not activate a trip.

In an example of the electrical circuit interruption device, the frequency analysis of the detected voltage signals comprises performing the frequency analysis on individual cycles of the detected voltage signals and wherein the arc fault is determined to be a series arc fault when there is little or no deviation of the frequency analysis over a plurality of cycles.

In an example of the electrical circuit interruption device, the determining from the detected voltage signals that the arc fault has occurred comprises calculating a mean square or root mean square of the detected voltage signals and determining that the mean square or the root mean square deviates from previous mean square or root mean square of previously detected voltage signals.

In an example of the electrical circuit interruption device, the variance is a decrease in the mean square or the root mean square of the detected voltage signals.

In an example of the electrical circuit interruption device, the variance is a decrease in a peak voltage of at least one cycle of the detected voltage signals.

In an example of the electrical circuit interruption device, the arc fault is determined to be a series arc fault, wherein the determining from the detected voltage signals that the arc fault has occurred comprises calculating a mean square or root mean square of individual cycles of the detected voltage signals and determining that a variance of the mean square or the root mean square has occurred over a plurality of cycles.

In an example of the electrical circuit interruption device, the arc fault is determined to be a series arc fault, wherein the determining from the detected voltage signals that the arc fault has occurred comprises determining whether there is a voltage variance for individual cycles of the detected voltage signals, and determining that the voltage variance has occurred for more than a threshold number of cycles of the detected voltage signals.

In an example of the electrical circuit interruption device, the at least one sensor is for in-series electrical connection with the power line.

In an example of the electrical circuit interruption device, the processor is configured to decide, for each cycle of the detected voltage signals, whether to activate or de-activate the solid state switch.

In an example of the electrical circuit interruption device, the processor is configured for active power distribution of the power line within each cycle of the detected voltage signals by activating or deactivating the solid state switch. Each cycle may be a ½ or half of the wave form.

In an example of the electrical circuit interruption device, the arc fault is a glowing contact arc fault between the contact and the power line.

An example embodiment is an arc fault circuit interrupter including: hot conductor; a solid state switch for electrical connection to the hot conductor and configured to be activated or deactivated; an arc fault trip circuit cooperating with said operating mechanism, said arc fault trip circuit being configured to deactivate said solid state switch responsive to detection of an arc fault condition between the hot conductor and a neutral power line associated with detected current variation of the hot conductor and neutral power line.

In an example of the electrical circuit interruption device, the arc fault condition is determined based on frequency analysis of the hot conductor and neutral power line.

An example embodiment is an electrical device comprising: a contact configured for electrical connection to a hot power line; at least one sensor to detect at least current signals indicative of the hot power line; and a processor configured to determine from the detected current signals that an arc fault has occurred between the hot power line and a neutral power line or between hot power line and ground power line.

In an example of the electrical device, the determining from the detected current signals that the arc fault has occurred comprises: computing a frequency analysis of the detected current signals of the hot power line.

In an example of the electrical device, the frequency analysis comprises calculating a Fourier transform or a Fast Fourier Transform (FFT) of the detected current signals, and analyzing higher order frequency signals of the Fourier transform or the Fast Fourier Transform (FFT) that are higher than fundamental frequency of the power line.

In an example of the electrical device, the calculating of the Fourier transform or the FFT of the detected current signals is performed on individual cycles of the detected current signals, and wherein the arc fault is determined to be a parallel arc fault based on the higher order frequency signals over a plurality of cycles.

In an example of the electrical device, the determining from the detected current signals that the arc fault has occurred comprises: determining a variation over a plurality of cycles of the detected current signals.

In an example, the electrical device further comprises an analog-to-digital convertor (ADC) configured to receive analog signals from the at least one sensor indicative of the detected current signals and output digital signals to the processor for the determining.

In an example, the electrical device further comprises a solid state switch for in-series electrical connection with the power line, wherein the processor is further configured to, in response to determining that the that arc fault has occurred, deactivating the solid state switch.

In an example of the electrical device, the solid state switch is deactivated prior to current overload of the hot power line.

In an example of the electrical device, the solid state switch is deactivated when there is no leakage to ground or another conductor.

In an example of the electrical device, the at least one sensor is for in-series electrical connection with the power line.

In an example of the electrical device, an in-circuit type of sensor is in series and a non-contact type senor may be used for the ground fault.

In an example of the electrical device, the determining from the detected current signals that the arc fault has occurred comprises: computing a frequency analysis of the detected current signals, wherein the arc fault is determined to be a parallel arc fault from the frequency analysis.

An example embodiment is an electrical device including: a sensor to detect voltage signals indicative of a hot power line; and a processor configured to determine from the detected voltage signals that an arc fault has occurred, and differentiate the arc fault as being a series arc fault versus a parallel arc fault.

An example embodiment is an electrical device including: a contact configured for electrical connection to a power line; a voltage sensor to detect voltage signals indicative of the power line and provide analog signals indicative of the detected voltage signals; a current sensor to detect current signals indicative of the power line and provide analog signals indicative of the detected current signals; an analog-to-digital convertor (ADC) configured to receive the analog signals from the voltage sensor and the current sensor and output digital signals; and a processor configured to sample the digital signals in real time.

In an example of the electrical device, the processor is a microprocessor.

In an example of the electrical device, sixty four samples are sampled from the respective individual cycle of the detected voltage signals and the detected current signals.

In an example of the electrical device, the processor is configured to determine that an arc fault has occurred from at least some of the sampled digital signals.

In an example of the electrical device, the processor is configured to determine that the arc fault is a series arc fault from a calculated mean square or root mean square values of the sampled voltage signals, and that there is little or no deviation in the detected current signals.

In an example of the electrical device, the processor is further configured to compute a frequency analysis of the detected voltage signals, and determine that the arc fault is a parallel arc fault based on the frequency analysis.

In an example of the electrical device, the frequency analysis comprises calculating a Fourier transform or a Fast Fourier Transform (FFT) of the detected voltage signals, and analyzing higher order frequency signals of the Fourier transform or the Fast Fourier Transform (FFT) that are higher than fundamental frequency of the power line.

In an example of the electrical device, the calculating of the Fourier transform or the FFT of the detected voltage signals is performed on individual cycles of the detected voltage signals, and wherein the arc fault is determined to be a parallel arc fault when based on the higher order frequency signals over a plurality of cycles.

In an example of the electrical device, the power line is a hot power line, wherein when the parallel arc fault has occurred over the hot power line to a neutral power line, there is little or no deviation in the detected current signals.

In an example of the electrical device, the processor is configured to decide, for each cycle of the detected current and/or voltage signals, whether to activate or de-activate the solid state switch.

In an example of the electrical device, the processor is configured for active power distribution of the power line within each cycle of the detected current and/or voltage signals by activating or deactivating the solid state switch.

Example embodiments of the electrical device can also prevent false tripping. The count data is sufficient to prevent a false trigger if it indicates a count lower than a pre-determined value. The count indicates the number of spikes which showed up in the FFT which is calculated for every cycle ($1/60^{th}$ of a second). Using the voltage domain signals as a qualifier on the traditional wave forms, enables removal of the false positives which examination of only current would have resulted in. The current signature might suggest an arc fault; for example, brushes in a hair dryer, vacuum cleaner or a motor may be suggesting a similar current abnormality—but it is not a real arc fault. However, if the voltage signature does not exhibit an erratic drop, it can be established that the current signature in fact is not indicative of a real arc fault.

Although example embodiments use various processes of examining voltage, current and frequency analysis which together determine the signature for series and parallel arcs, the particular logical sequence of examination may vary.

An example embodiment is electrical device including: a contact configured for electrical connection to a power line; a solid state switch for in-series electrical connection with the power line; a sensor to detect voltage signals indicative of the power line; a processor configured to determine from the detected voltage signals that an arc fault has occurred, and in response deactivating the solid state switch without false tripping of the solid state switch.

The electrical device in example embodiments can include an API a "soft oscilloscope" (i.e. soft oscilloscope being a built-in oscilloscope function). FIG. 49B illustrates an integrated display of real time data and processed calculations providing a real time representation as to what is taking place in the processor. Ideal for testing, validation, and monitoring current and voltage activity in real time, and/or recording for future use. An API provides a means of getting the information out of the controller. API is important for diagnosing, analysing and presenting the information.

The process of using an API can be used with a communications interface (including but not limited to a communications port or channel); for example a Uart and an RS485 interface are serial communication ports. $I^2C$ ("inter integrated communication"), SPI ("serial peripheral interface") could also be used.

For example, one may want to create a high level device in the same instrument. One controller could request information from another controller through the API without the presence of a communication port to go out; e.g. to transmit information externally (e.g. outside to the data base).

In another specific example embodiment, a star controller can have a power module built-in to the same unit. The power module would talk to the star module using the UART serial communications port directly. There would be an API used by the star controller to talk directly to the power module through a communications interface (e.g. Uart serial communication port in this case—could be Uart, $I^2C$ ("inter integrated communication"), SPI ("serial peripheral interface"). A communication channel may or may not have a port; e.g. physical communications interface. In this embodiment, the API is there with a communication interface, but no communication channel, as such, as it is built into the same unit; e.g. a Uart is not needed when integrated in one device. When communicating externally for example, to a database (or for analysis and/or control) then the communication port is required Optionally, in some example embodiments, a communications means such as a communication interface (such as but not limited to an RS485 serial communications port) can be incorporated to transmit that information to an external device. Protocol standards such as Modbus can be included.

Oscilloscope readings can be provided by the electrical device in example embodiments. The API is a "low speed" oscilloscope function that is into the electrical device to look at the sampled array but developed from the voltage and current sensors, versus traditional oscilloscopes. Memory buffers are used/incorporated to enable oscilloscope type readings. E.g. the electrical device example embodiments has diagnostic buffers (data is continuously coming in, and data being analyzed, and so the data needs to be retained somewhere so it can be sent out).

The electrical device in example embodiments includes memory buffers to generate the oscilloscope functions—corded product with display.

Because of the diagnostic bus, the data is continuously streaming out after every two cycles. So the electrical device is doing the full RMS measurement and all of the related processing.

The electrical device is still recording all electrical signals measured (e.g. electrically derived signals such as current and voltage including but not limited to safety ground sensed voltage and current data) and sending the information out; RMS values and instantaneous wave forms—they come out slowly after 2 cycles. The frame rate is slightly lower, but we get all the data. This can be considered a "low speed" oscilloscope.

An example embodiment is a built in oscilloscope device; e.g. embedding oscilloscope function in a device itself by examining and displaying sample arrays developed from sensors in circuitry. The product embodiment of a measurement device with a display (FIG. 49B), is effectively an oscilloscope.

In example embodiments, the electrical device is an oscilloscope because an oscilloscope is built in to our devices (receptacle and derivative devices) which can capture, measure, display and present the waveforms in real time. The electrical device is configured to do both time-domain waveforms & RMS. The electrical device provides oscilloscope type information, but based on being integrated in device and based on time domain tracking built into the device.

An example embodiment is an oscilloscope electrical device, including a contact configured for electrical connection to a power line; a sensor for in-series electrical connection to the power line to detect signals indicative of the power line; a processor configured to sample the detected signals in real time, and provide oscilloscope information indicative of the sampled signals.

In an example embodiment, oscilloscope information is indicative of the sampled signals. The signals are detected by an oscilloscopes which may have a probe that measures current. The oscilloscopes may be the clamp type whereby the clamp electrically connects to the wire (parallel) and the clamp measures the current. The oscilloscopes may not provide current measurements in series; and electrical connection to the power line is not in series. In an example, the electrical connection for current measurement is in series in that a sensor may be an integral part of the circuit the voltage and current is flowing through the sensor or right under the sensor, depending on whether a direct connect or induction connection method is used.

In an example of the oscilloscope electrical device, wherein the oscilloscope information includes a waveform of the detected signals, further comprising a display screen for the providing of the waveform in real time. In an example of the oscilloscope electrical device, the processor is configured to analyze the sampled signals in real time. In an example of the oscilloscope electrical device, the analyzing includes calculating a mean square or a root mean square of the sampled signals.

In an example of the oscilloscope electrical device, the analyzing includes performing frequency analysis of the detected voltage signals. In an example, the frequency analysis is a Fourier transform or a Fast Fourier Transform (FFT) of the detected voltage signals.

In an example of the oscilloscope electrical device, the oscilloscope information includes information of the analyzed sampled signals.

In an example of the oscilloscope electrical device, the oscilloscope electrical device further comprises a communication subsystem for the providing of the oscilloscope information by transmitting to another device. In an example of the oscilloscope electrical device, the oscilloscope electrical device further comprises at least one analog-to-digital convertor (ADC) configured to receive a respective analog signal from the at least one sensor and output a respective digital signal for processing by the processor for the providing of the oscilloscope information.

In an example of the oscilloscope electrical device, the processor is configured to execute an application program interface (API). In an example, the API includes commands for instructing what mode of the oscilloscope information is to be provided by the processor.

In an example of the oscilloscope electrical device, the oscilloscope electrical device further comprises a solid state switch for in-series electrical connection with the power line, wherein the API includes control commands for manual or automatic power distribution or safety of the power line by activating or deactivating the solid state switch.

In an example of the oscilloscope electrical device, sixty four samples are sampled from the respective individual cycle of the detected signals.

The electrical device in example embodiments is looking at voltage as well as current, if the voltage varies erratically, but current variation is not much, (because the actual value of the current itself is small; e.g. if drawing a few milliamps, would not see much variation—but the voltage will be varying). The electrical device in example embodiments will trip assuming an arc even if the current is not varying much, but the voltage is erratic. This especially true when the load is light (below a current or power threshold). In one embodiment, the disclosed means and processes of examining voltage determine that if voltage starts being erratic, then an arc is taking place, even without the presence of any significant current variance. If an arc takes place only during one cycle rather than more than one cycle, then this would be an indication of a non-hazardous series arc and tripping of the breaker or the circuit should not take place, as it would otherwise result in a "false" trip.

In example embodiments, as the load draws current, or stay static (nominal load like a light bulb), if the contact is a loose contact which isn't making a good contact, the voltage will start being erratic and effectively be doing an arc, but not with any significant current—so therefore traditional arc fault current testing won't detect it. However, the electrical device in example embodiments will detect the series arc fault because it will detect the squishing of the voltage.

The electrical device in example embodiments not only looks at the instantaneous difference in the black and the white but also look at the waveform of that different as well to see if there are additional conclusions from it. When arcing happens the electrical device in example embodiments can see the FFT signature of the difference.

The electrical device in example embodiments can analyse the variations in the differential(s) across time indicating any reliable detection of the occurrence of an arc.

The electrical device in example embodiments brings in the black to voltage and current sensors; and the white to voltage and current sensors. The electrical device in example embodiments then is doing processing on the data as well as measuring voltages and other parameters from the wires.

Another embodiment for testing GFCI addresses achieving better resolution in the circuitry. To address having the large dynamic range, in order to achieve better sensitivity and improved resolution on the current imbalance to detect Ground Faults, an analog circuit is added to do current processing after the current sensors, prior to providing the information to the computer.

An example embodiment is an electrical device or receptacle comprising of: voltage and current sensors (input going into an analog sensor), ADC (digitizer) is between the sensor and CPU, microprocessor, taking current and voltage measurements in real time. The power is controlled and delivered on a real time basis. The power is controlled and delivered by turning on the switch every single cycle. This can be referred to as controlling the delivery of power.

An example embodiment is an electrical device and process enabling information to be extracted from the processor to a higher level decision-making control means/process step, for any purpose, whether for safety or power switching. The electrical device includes an API to extract information from the electrical device. The API is used to extract information and to provide high level control to the electrical device. The API can be used without a physical communication interface in some examples.

Another embodiment of the electrical device is for testing GFCI addresses achieving better resolution in the circuitry To address having the large dynamic range, in order to achieve better sensitivity and improved resolution on the current imbalance to detect Ground Faults, an analog circuit is added to do current processing after the current sensors, prior to providing the information to the computer.

The lack of resolution was not the processor's limitation. Having added the analog circuit is actually increasing the amount of information we have to process. Ultimately it is the analog signal that is being digitized and using it to do calculations. Using two analog signals, namely the black and the white, would not result in the resolution being good enough.

Example embodiments of the electrical device use an analog circuit to measure the differential current between two of the power lines, from hot to ground, allowing the electrical device to do the GFI to required resolution; and allows the electrical device to magnify the differential current.

Traditional industry uses mainly with GFCI in the analog domain, using current transformers. In traditional industry, the device passes the black and neutral on the opposite sides of the transformer and they cancel each other out, and any residual current will tell the device how much differential current there is, and proportional to that you can trip the breaker or receptacle device. The traditional industry device uses the differential itself to drive the tripping circuit.

In example embodiments of the electrical device, the subtraction is done in the analog domain, however that signal is taken in following ADC to do further analysis by the microprocessor which will apply its logic to the digital data.

Instead of measuring the absolute value of the current differences, example embodiments of the electrical device subtracts one current from the other, and measures the subtracted current—rather than measuring the absolute current directly. Therefore, example embodiments of the electrical device are measuring both the absolute current as well as the subtracted value of the current as well.

Example embodiments of the electrical device can detect GFI current as well as leakage current using this analog differential circuit. We have to have an external measurement of the leakage current done separately.

Example embodiments of the electrical device measures differentials, but is measuring using an analog circuit making it immune to magnetic interferences. Example embodiments of the electrical device are measuring the differential in the current between black and white, using the analog sensor which instantaneously tracks the difference between black and white along the AC cycle—so example embodiments of the electrical device are not looking at the difference in RMS (average) values—but looking at instantaneous differences as well, and measuring them using the processor—and are going to be looking at the wave forms of the differences as well.

Example embodiments of the electrical device looks directly at the waveform, and is far more sensitive to the variations that traditional industry may miss as those are looking just at the average values using RMS.

Now, example embodiments of the electrical device are going to be looking at the graph of the differential. If the external circuit is correct, then the differential graph should be steady regardless of how much we change the load. As the electrical device is tracking the differential, if there is an arc there may be a change in the differential; e.g. because of the arc, does the voltage and current go out of phase. For different loads, appliances will likely have different identifiable signatures.

Example embodiments of the electrical device are configured for identifying signatures of different appliances/devices/loads based on analyzing/comparing the differentials. And it doesn't have to be arcs. The differentials is current; voltage has to remain constant (fluctuations happen on the upstream, not at the load).

The differential is the current that the load is returning back. Normally should be equal to that coming in. If not the case, then either the load is taking the current in, or it's feeding the current into the circuit from somewhere.

Definitely the differentials will tell the electrical device of the characteristics of the load. The differential (current) is the difference between the current going in to the load and the current coming out. Normally they should be equal.

Example embodiments of the electrical device are looking at differential values using a huge range in measurement (e.g. using 14,000 counts to measure the difference). Previously we were measuring the complete absolute value using the 14,000 counts (high dynamic range); Example embodiments of the electrical device can measure the difference using the 14,000 counts, thereby effectively having magnified the small difference to such a huge range. Example embodiments of the electrical device look at this value, and because it is magnified, now has control over deciding at what point to trip.

Example embodiments of the electrical device are measuring using our analog measurement engine, and are able to not only measure the difference, but measure the waveform of the difference as well. Example embodiments of the electrical device can look at instantaneous variation in the difference.

The differential circuit can be used by the electrical device for GFCI; e.g. difference between black and the white. The differential circuit can be used by the electrical device for to parallel AFCI between hot and ground. As we are dealing with arcing between the black and the ground, there will be a differential and the electrical device will be able to detect it. It will be applicable to parallel arcing between live and ground because there will be a leakage.

Example embodiments can sample at relatively lower frequency sampling rate, such as 60 Hz up to 1.9 kHz. In order to do FFT at 100 kHz, need to collect samples at 200 kHz range, which means we would need to do almost 100,000 samples in one AC cycle. The electrical device may not have processor speed, nor memory to store that many samples. The smaller sampling rates enables the electrical device to do FFT and therefore analyze the data from a different perspective. The electrical device can operate from sampling rate of e.g. sixty Hz to 1.9 kHz. This has the advantage of having the ability to look at and do the analysis of all the data in the full spectrum in deciding if there is an arc or not. Having in low frequency sampling rate of 60 Hz to 1.9 kHz, collection of data for whole spectrum, Frequency analysis (e.g. FFT), and analysis of that data in the microprocessor; e.g. weighted sum of all the frequencies detected (or area under the curve).

In example embodiments the electrical device is in a low range as it is using the digitized version for frequency detection; e.g. digital converted signal (64 samples) so the max frequency we can detect is up to 1.9 kHz; we detect between 60 Hz to 1920 Hz. When arcing occurs we have seen activity in this range. We cannot go higher than our 1920 Hz because of our FFT.

In an example, the electrical device collects 64 samples of the RMS values per cycle, and then run standard deviation across them; looking at 64 cycles, storing data for 200 milliseconds time frame; if see standard deviation shows some are high peak and others low peak, then it is an arc. If no arcing, then the change in standard deviation will be close to zero. All of them will have the same waveform. The RMS value for each cycle will not change.

In case of arcing, the standard deviation will vary a great deal. Example embodiments of the electrical device notice the standard deviation goes beyond a certain value, e.g. an arcing threshold.

Example embodiments of the electrical device use statistical tools, such as standard deviation, as indicator of variations. Changes in the voltage will be represented by a higher standard deviation in the waveform. Example embodiments of the electrical device are configured for detecting erratic variation of voltage based on standard deviation of the RMS.

Traditional industry devices cannot incorporate the 5 mA differential (which is a GFCI specification) in their AFCI breaker as GFCI requires higher resolution.

Example embodiments of the electrical device can distinguish between 5 mA differential or less. By our incorporating AFCI and GFCI, and tripping at 5 mA, the electrical device is safer than existing traditional industry manufacturers' devices that incorporate 30 mA ground fault interruption.

By having the analog subtraction, example embodiments of the electrical device can trip as low as 5 mA differential, and do not need to digitally subtract subtracting black and white in the microcomputer.

Example embodiments of the electrical device can detect AFCI and GFI faults in the load or extension cord that is downstream or plugged into the electrical device. Traditional industry AFCI breakers cannot detect if an arc event is taking place in an electrical cord of an appliance/device plugged into receptacles. Example embodiments of the electrical device can be an AFCI breaker and detect an arc in a load or cord plugged into the receptacle because there is GFI built in. In Example embodiments of the electrical device, which incorporate GFCI, can detect an arc occurring in a cord plugged into the receptacle.

Example embodiments of the electrical device have high resolution. Traditional AFCI breakers put the ground fault tripping at 30 mA because they are not able to handle a high resolution. Example embodiments of the electrical device incorporate GFI, due to having separated in an analog circuit, the subtraction process rather than the microprocessor doing the subtraction, and being able to deal with high resolution and detecting the leakage current with high resolution.

An example embodiment is an electrical device including: a first contact for configured for electrical connection to a hot power line; a first sensor configured to provide a first analog signal indicative of current of the hot power line; a second contact for configured for electrical connection to a neutral power line; a second sensor configured to provide a second analog signal indicative of current of the neutral power line; a solid state switch for electrical connection to the hot power line and configured to be activated or deactivated; an analog-to-digital convertor (ADC) configured to receive the analog and output a digital signal, and a processor configured to detect a ground fault condition of the hot power line by determining a current imbalance between the hot power line and the neutral power line based on the digital signal from the ADC, for the deactivation of the solid state switch.

An example embodiment is a ground fault circuit interrupter including: power line conductor; a first sensor configured to provide a first analog signal indicative of current of the power line conductor; a neutral line conductor; a second sensor configured to provide a second analog signal indicative of current of the neutral line conductor; a solid state switch for electrical connection to the power line conductor and configured to be activated or deactivated; a ground fault trip circuit cooperating with said operating mechanism, said ground fault trip circuit being configured to deactivate said solid state switch responsive to detection of a ground fault condition associated with current imbalance between said hot conductor and said neutral conductor, wherein said ground fault trip circuit includes: an analog comparator circuit configured to receive the first analog signal and the second analog signal and output an analog signal indicative of a difference between the first analog signal and the second analog signal, an analog-to-digital convertor (ADC) configured to receive the analog signal from the analog comparator circuit and output a digital signal, and a processor configured to perform determining of the current imbalance for the detection of the ground fault condition based on the digital signal from the ADC, for the deactivation of the solid state switch.

In an example of the ground fault circuit interrupter, the solid state switch for electrical connection to the power line conductor may be used with a Triac. Once the Triac is triggered, the solid state switch may be de-activated as the voltage drop to or below zero at zero crossing point. The solid state switch may keep activated if there is no fault condition. In the example where the solid state switch for electrical connection to the power line conductor is IGBTs, the IGBTs may be activated at the top of the cycle, and may be de-activated after a duration, such as a few nanoseconds.

In an example of the ground fault circuit interrupter, the analog comparator circuit comprises a differential amplifier. In an example of the ground fault circuit interrupter, the detection of the ground fault condition by processor includes determining that the current imbalance exceeds a threshold current imbalance and/or that the current imbalance has lasted for more than a threshold time.

In an example of the ground fault circuit interrupter, the detection of the ground fault condition by processor includes determining that the current imbalance exceeds a threshold current imbalance. In an example, the threshold current imbalance is 5 mA or less. In an example, the threshold current imbalance is less than 30 mA.

In an example of the ground fault circuit interrupter, the detection of the ground fault condition by processor includes determining that the current imbalance has lasted for more than a threshold time.

In another example, the electrical device is configured to detect another kind of electrical fault. The electrical device may detect any current and or excessive voltage occurring on or passing to the safety ground. The safety Ground Imbalance Detector (GID) may monitor both the voltage level and any current flowing on the safety ground wire/circuit.

There is a need to detect electric faults, whereby the human body's susceptibility to electric current and voltage can result in individuals experiencing serious electrical shock due to uncontrolled flow of electric current over the earth. Electrical services to residences, commercial establishments and industries need to protect occupants from potentially hazardous electrical shocks. It is extremely dangerous to short the neutral to the ground in a load center, electrical breaker panel and/or distribution box. This can result in hazards current occurring between safety ground and the neutral. Current can fly to the safety ground even if there is no direct connection.

The moment that the load is switched, not all current flows through the neutral. The Safety Ground can pick up current as it has the least resistance.

Breaker panels and distribution boxes (including but not limited to junction boxes), and receptacle devices can be a source location where black and white wiring initially originating from the breaker panel. When wiring is spliced, often wire-nuts or marrettes are used to connect and insulate the splices, which are used for the distribution of power to different loads. It is possible that somewhere on the circuit a marrette joining the white wires can become a glowing or open contact. Once the current cannot flow back through the white, if there is a safety ground connected on or near that line, then the current will travel down that path of least resistance; the white will raise in voltage potential and can dangerously short someone.

Electric shock may be caused by "stray current". And when there is a GFI issue, the current can be significant. If someone shorts the neutral and the ground in a junction box, the whole box can become "hot"/live. Someone touching it would get a shock because the current starts flowing through the ground wire rather than the white. If they short it and/or if somehow the ground wire is disconnected, the whole circuit will be hazardous.

An example embodiment is an electrical device that is a safety ground imbalance detector which detects for any potential hazardous voltage occurring between the safety ground and the white neutral ground, and/or any current that may be flowing. The ground imbalance sensor may include a current sensor and a voltage sensor as a combo sensor. The ground imbalance sensor may also include only one current sensor or voltage sensor to detect safety ground fault. The current sensor (FIGS. 65A, B and C(1) and C(2)) may use induction from the safety ground wire to be described; the voltage sensor is illustrated in FIG. 65D.

The combo sensor detects both voltage and current with respect to the neutral line using the voltage sensor and current flowing on the safety ground using the current sensor. The combo sensor therefore provides greater certainty for detecting a safety ground fault rather than using only one current senor or a voltage sensor. The electrical device is detecting an imbalance between neutral and ground using a voltage and current sensing circuit in conjunction with a special analysis software program.

The voltage and the current may be monitored. A processor may determine whether the voltage level measurements received from the voltage sensor has reached a potentially hazardous level to the user, and if so, take action accordingly.

The electrical device is a ground imbalance detector which detects voltage differences between the safety ground and the neutral. In addition to the current and voltage sensors and sensing already disclosed, such sensors are used as a ground sensor. The electrical device is configured to detect and indicate that the safety ground has been compromised and to shut off the power.

The safety Ground Imbalance Detector (GID) device, as illustrated in FIG. 65A-65E to be described below, may be mounted internally on a main board of the device or externally on the Printed Circuit Board (PCB). The PCB may be connected to the device via a signal cable, such as a communication cable or voltage cable. When mounted externally, the GID and other sensors, including but not limited to water sensor(s), may be monitored by sending the measurement results of these sensors to a processor. The processor may determine whether a measurement result has reached a threshold. Traditionally, the industry AFCIs or GFCIs do not detect if there are any problems occurring on the safety ground. Existing equipment typically does not detect any current or voltage leakage or short circuit, between the white neutral line and the safety ground. Special safety equipment, but not branch circuit breakers and receptacle devices, may be used for this purpose in special electrical environment.

For example, when a 3-prong plug is used to supply power to a metal appliance, the metal of the appliance is traditionally connected to the safety ground which in turn connects to the safety ground in the plug. When voltage leaks to the safety ground to 30 volts or more, this creates a safety hazard.

The industry only deals with stray current leakage from the black, not from other conductors, such as a black and/or red, which may be in opposite phase and which is not going to a GFI. When there is current leakage to the safety ground, the leakage may not be indicated in a normal breaker.

The sensors may measure current of 15 amp or the 20 amp and may be used as safety ground current sensors in a GID. The sensors may also measure current of other amperages based on international standards, or a specified amperage of a specific application. A separate safety ground voltage sensor may also be included in the GID. The GID or a PCB incorporating the GID may include one or more pins or PEMs. A PEM is a type of self-clinching surface mount or stud for providing a reusable mounting point on a thin metal sheet and a PCB. In some examples, the safety ground may be mounted to a PEM, and the PEM may indicate "safety ground".

Figures 65A, 65B:
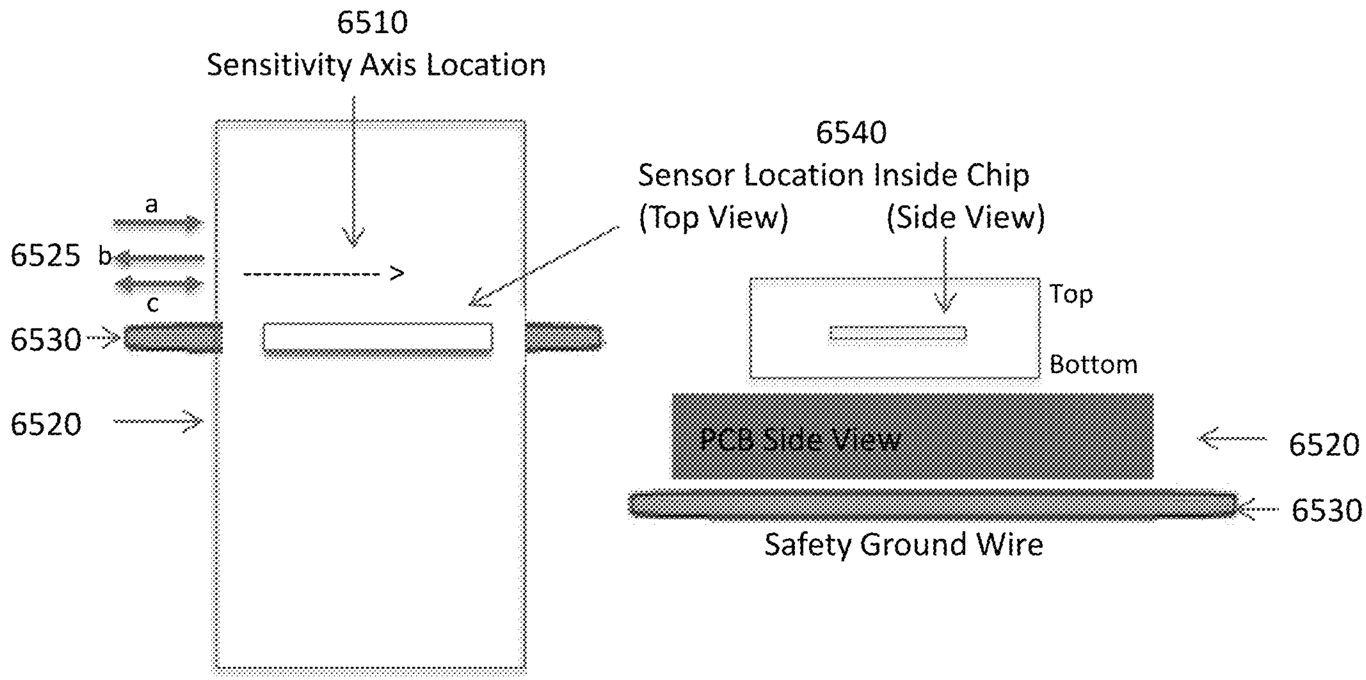
FIG. 65A is a top view of a safety ground current monitoring sensor.
FIG. 65B is a side view of the safety ground current monitoring sensor.
Figure 65D:
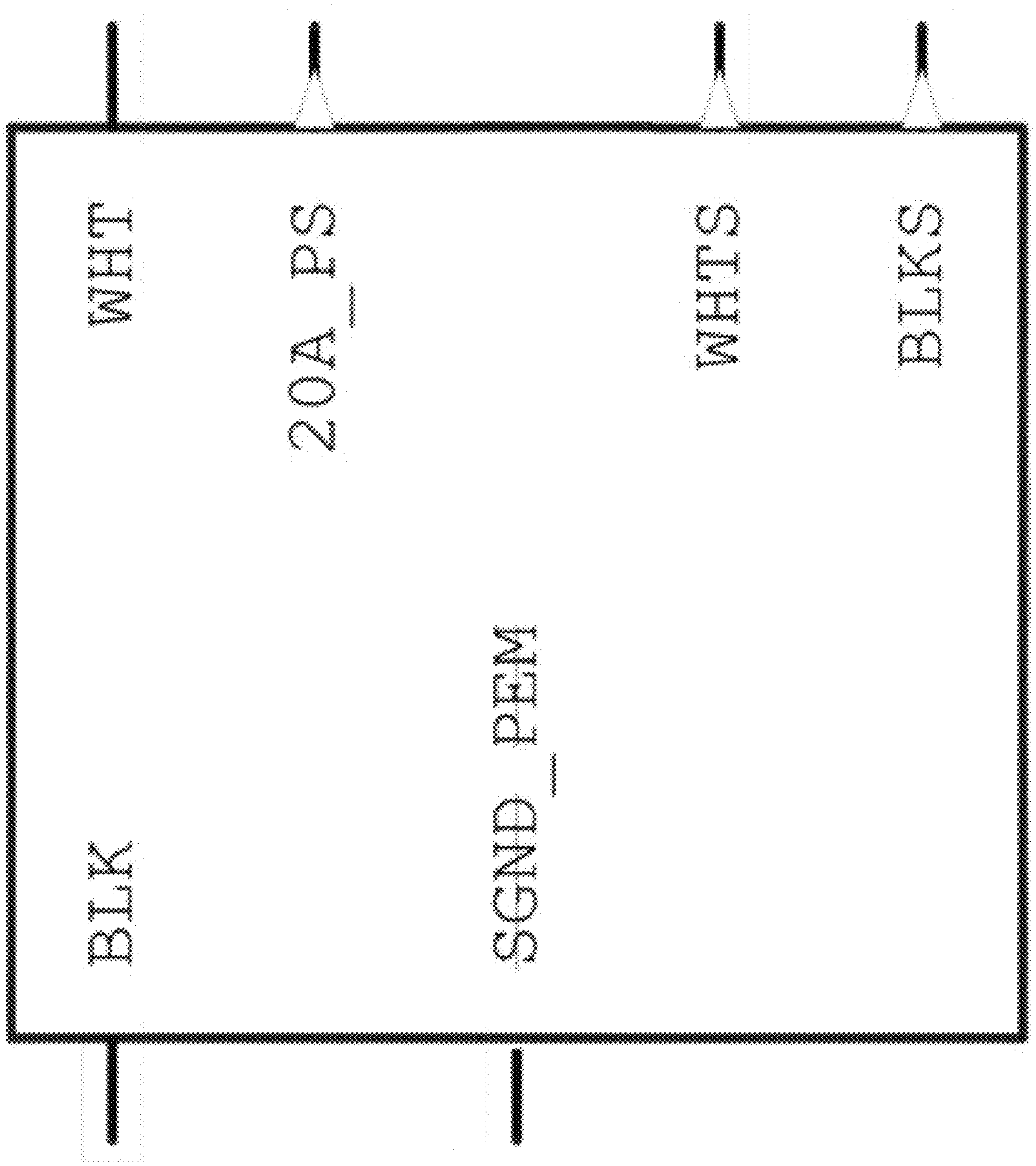
FIG. 65D illustrates a safety ground voltage sensor ("SGVS")

FIGS. 65A and 65B illustrate an exemplary safety group wire current monitoring sensor 6500. The Safety Ground Wire 6530 in FIGS. 65A and 65B is placed beneath the PCB 6520 for the sensor 6500 to detect stray current. The Safety Ground Wire 6530 may also be placed above the PCB 6520, provided that the distance and sensor sensitivity requirements are met and in a controlled position in relation to the sensor 6500. The distance and sensor sensitivity requirements are determined by sensor manufacturer specifications as well as the level of the current.

Block 6510 on the surface of the chip 6505 is a reference line, and illustrates the sensitivity axis which relates to the position for the wire to pick up the magnetic field(s) generated by the current. Since the sensor detects the magnetic field induced by current circulating in the wire, the position of the sensor is important for accurate readings, Block 6520 is the printed circuit board (PCB) placed over the wire 6530. The PCB 6520 incorporates the current sensor chip 6505. The PCB 6520 may carry voltage and signals. This will indicate the level of current or voltage detected. The voltages are read by the processor which performs the analysis.

Block 6525 represents three signal paths directed to the PCB Block 6520, to power the chip 6505 via the path 6525*a*, and to transmit measurement results from the chip 6505 via the path 6525*b*.

The voltage provided on the PCB 6520 may be a low voltage such as 3 volts, or 5 volts. The voltage value may depend on factors including but not limited to sensitivity of the sensor type and the type of conductors used (e.g. bus bars, wires etc.). If long distances are desired, a wire connecting the sensor may not directly connect to a CPU or a processor, but may connect to a local adjacent processor incorporated on the GID circuit. A communications line or channel may be used to connect the sensor with the local adjacent processor for transmitting the measurement results from the sensor to the local adjacent processor. The PCB 6520 in this example may output an analog voltage from path 6525*a* and output a communication signal or measurement data from path 6525*b* to the processor or CPU.

In some examples, Block 6520*b* may output of analog or digital signal from the PCB 6520 to the processor. If the output signal is an analog signal, and ADC may be used to covert the analog signal to digital signal for the processor to process. The strength of the signal may be proportional to the value of the current. The signal may be the magnetic field.

Path Block 6525*c* may connect to the white neutral line. The white neutral inside the circuit ground may be bi-directional as current input and output from the circuit on the PCB 6520. The path 6525*c* may be an internal ground of the sensor 6500 and may be different from the safety ground 6530. Path 6525*c* feeds voltage of the PCB 6520 back to the processor (not shown). The processor may be incorporated on the same PCB 6520.

Block 6530 is the bare safety ground wire beneath the PCB 6520. The other two wires in the three conductor cable (black, white) is not illustrated (e.g. a romex cable).

Block 6540 is an example of a possible location of the current sensor inside the magnetic field sensor chip 6505 which is located on the PCB 6520. The GID sensor has indicators for the placement location related to the conductors.

A plastic clip(s) can be attached to the PCB 6520 so it can snap on to the bare safety ground wire 6530. Alternatively, tie wraps or any suitable attachment means could be used.

In an example embodiment illustrated in FIGS. 65C(1) and 65C(2), the current safety ground wire 6530 is in an enclosure 6569 housing the safety ground current fault sensor module 6500.

In the example of FIGS. 65C(1) and 65C(2), the current safety ground wire 6530 passes through and is incorporated within a channel or tunnel in the box enclosure 6569, at a distance enabling sensing from the chip 6505 on the PCB 6520. The distance is determined by the expected current flow and the conductor type.

The Safety Ground Wire ("SGW") 6530 may be a bare wire with a length, such as 4" to 6". Safety Ground Wire ("SGW") 6530 may be securely fastened in the housing, for example through a tunnel or channel in the housing 6569. The safety ground bare wire 6530 may be inserted through the input hole area 65C-1 and the white wire is inserted in 65C-2. The bare wire is passes through 65C-1 out through the other end 65C-3, and the bare wire 6530 may be attached to a screw. As 6530 is contained securely inside the box in FIGS. 65C(1) and 65C(2), when the screw is tightened, the bare wire 6530 electrically connects the safety ground of the PCB 6520. The ground is still separated and not directly contacted with the PCB 6520. This method facilitate installation as it ensures maintaining a secure fastening of the SGW 6530 in an exact position in relation to the ground sensor chip 6505. Furthermore, during installation, when the two screws for the box are tightened, the GSW is already in its proper place. There are separate openings on the cover of the enclosure 6569 for the screws. The SGW 6530 does not electrically connect with the screws, and this provides electrical safety and electrical insulation/isolation.

The sensor 6500 may monitor multiple downstream grounds, and the conductors originating at the breaker panel. In an example embodiment, the sensors are in the connection point in the breaker panel and may indicate that a conductor(s) brings in the signal.

When the SGW 6530 is connected in the enclosure 6569, for example in a receptacle device, the enclosure 6569 is placed over the SGW 6530 for sensing current flowing through the SGW 6530 without interrupting the current.

The neutral wire is an internal ground; the circuitry on the PCB 6520 may use the neutral as ground. SGW 6530 is the safety ground which connects to the electrical enclosure 6569 by fasteners, such as screws. In this case, the current flowing through the safety ground wire 6530 is physically continuous without interruption.

FIG. 65D illustrates an example of a Safety Ground Voltage Sensor 6600. The voltage sensor 6600 may include pins of BLK, WHT, 20 A_PS, WHTS (white line sensor), BLKS (black line sensor), and SGND_PEM. The PEM (PEM stud, metal pipe-shaped) is the metal from which the voltage for SGND is provided. The PEM is an example of the means for providing safety ground voltage to the voltage sensor. The Safety Ground Sensor 6600 senses the pin SGND_PEM for voltage. Safety Ground (SGND) is not a separate clip, but is a PEM which holds the PCB board, coming from a plate.

Figure 65E:
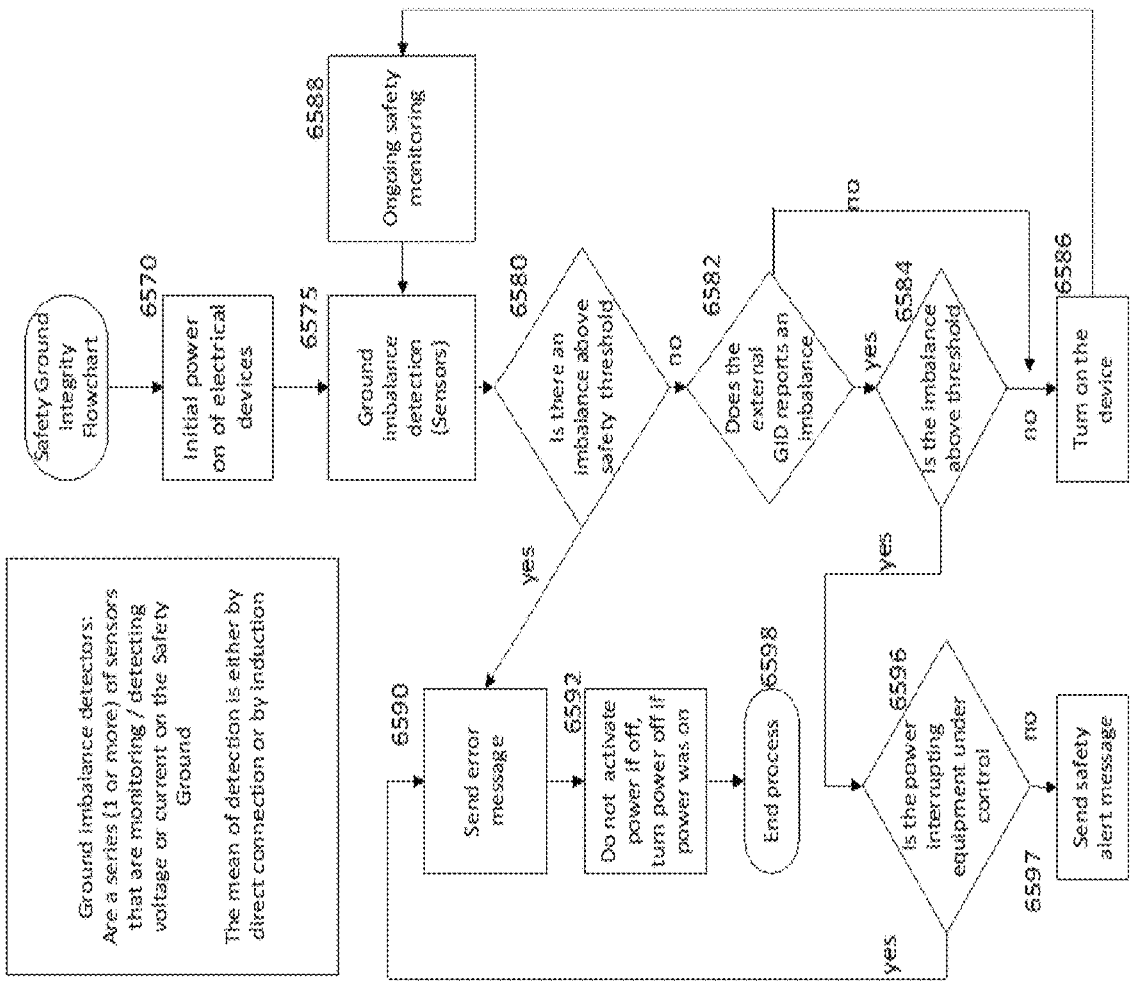
FIG. 65E is a flowchart of exemplary logic of GIDs.

The flowchart in FIG. 65E illustrates logic in which the GID of an electrical device, such as an appliance, is configured to detect and optionally indicate, such as on a screen, whether the safety ground has been compromised. If the safety ground has been compromised, the GID of an electrical device may not turn on the device or not deliver power to the appliance from the next half AC cycle. The detection that the safety ground has been compromised may be achieved by directly connecting to relevant wire(s) or by induction without directly connecting to the wire(s).

At step 6570, power is turned on an electrical device. At step 6575, one or more sensors of the GID may be used for detecting ground imbalance, for example, for current, voltage, or both current and voltage. The processor of the GID may read or receives input from the sensors 6500 and/or 6600. At step 6580, the processor may determine whether there is a sufficient imbalance and if so, whether the imbalance is above a predetermined safety threshold level. If the imbalance is above a predetermined safety threshold level, such as to a hazardous level to human being, the processor at step 6590 may send an error message for display on a screen of the GID device. The error may also be indicated by sound, alert LED light. At step 6592, the processor may further determine where the electrical device is powered on. If the power is not on, the power may not be delivered to the device. If the power is already on, the delivery of the power to the device may be discontinued and the user may investigate the cause of the error. The process is then ended at step 6598.

If the processor determines that imbalance is below a predetermined safety level, the imbalance is deemed not to be hazardous. At step 6582, safety ground fault inputs from external sensors are considered. The safety ground fault inputs may be transmitted to the processor via an external GID link. If the external GID is local to the processor, the sensor may directly detect voltage and communicate with the processor via the external GID link. If the external GID link is remote from the processor, the external GID link may connect to a separate processor for communicating the safety ground fault inputs to the separate processor. The separate processor may then communicate the received safety ground fault inputs to the processor. If processor determines that the external sensors indicate an imbalance above a predetermined threshold at step 6584, and that the power interrupting device is under control at step 6596, and in the circumstance where there may be no possibility of direct control of the external GID, an indication that there is an electrical hazard may be desired, the processor may generate and send a signal and/or alert event at step 6590 to alert external safety ground fault event and perform the operation at step 6592 as described above. External safety ground faults may include, but is not limited to, a breaker panel becoming live, in which case emergency warnings would indicate that only professional electricians or emergency personnel should disable the delivery of power at the breakers. For example, the professional electricians or emergency personnel may need to wear suitable protective clothing, rubber boots, and prover gloves, the professional electricians or emergency personnel may also trip manually the plastic breakers until the source of the safety ground fault is identified.

If the processor determines that the external sensors indicate an imbalance is not above a predetermined threshold at step 6584, the processor may turn on the electrical device at step 6586 and keep monitoring the imbalance at step 6588 and detecting ground imbalance at step 6575.

If the processor determines that the power interrupting device is not under control at step 6596, the processor may send a safety alter message on a screen of the GID device to indicate that the power interrupting device is not under control.

Figure 66A:
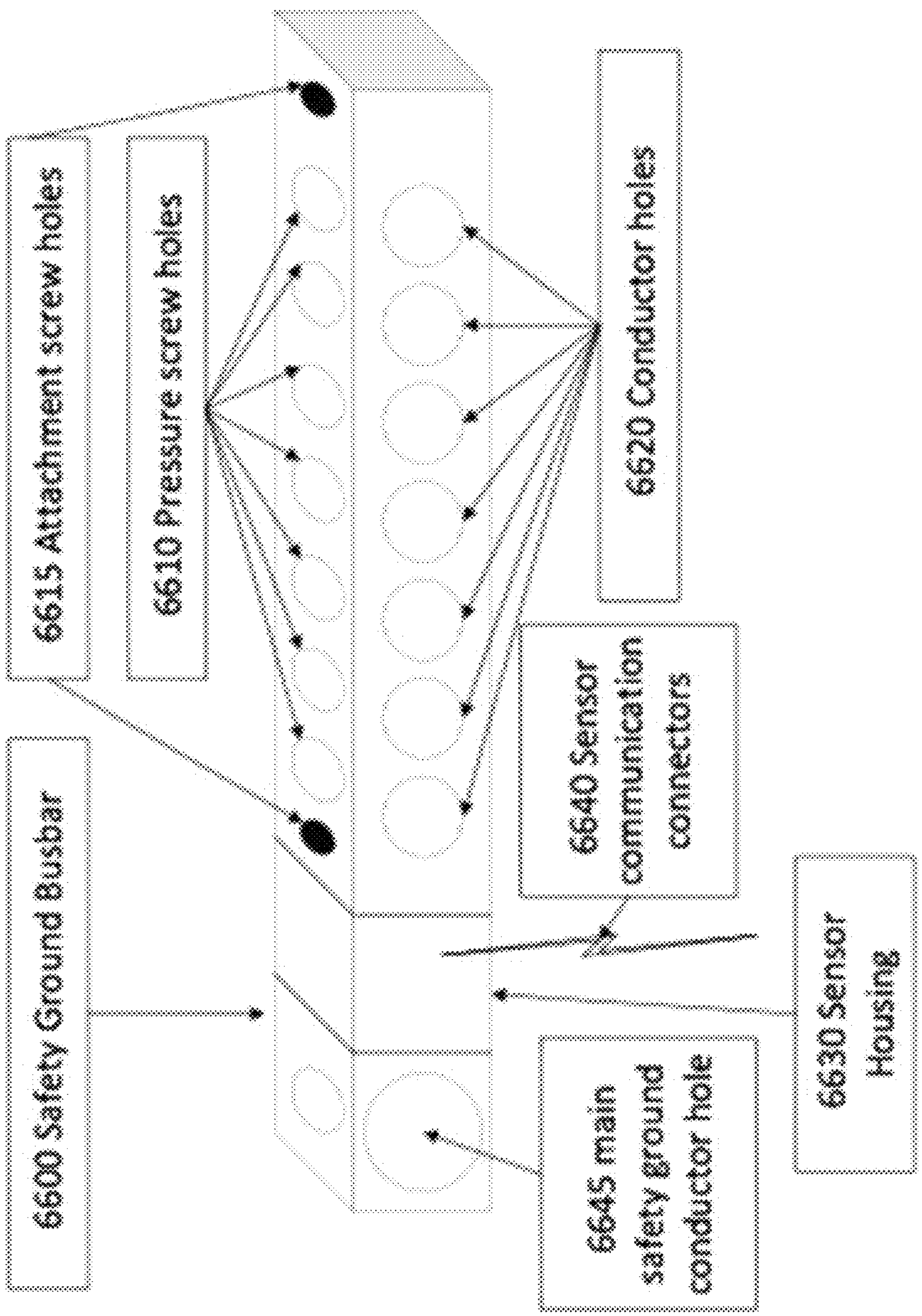
FIG. 66A illustrates a safety ground bus bar, according to an embodiment.

FIG. 66A illustrates an example of a safety ground bus bar 6600. The bus bar 6600 may be a self-contained external GID bus bar. The bus bar 6600 may be a rectangular bar. The bus bar 6600 may include a plurality of screw holes 6610, each for receiving a screw. In some examples, the square bar may have a length of ½", and the screw may be #20 screw. The bus bar 6600 may also include a plurality of conductor through holes 6620, each for receiving a power line or wire. The screw holes 6610 may be perpendicular to the conductor through holes 6620. In use, a power line may be inserted into the bus bar 6600 from one side of the bus bar 6600 and extended out from the other opposite side of the bus bar 6600. The screw may, via a screw hole 6610, secure a wire placed in the conductor holes 6620. In some examples, the safety ground conductors get connected via the connector holes 6620 and the wires are secured via the pressure screws inserted into the pressure screw holes 6610. The bus bar 6600 may also include one or more attachment screw holes 6615 for mounting the bus bar 6600 to an object, such as a panel, a wall, or a cabinet.

A sensor housing 6630 may be formed at an end at the body of the bus bar 6600, and one or more sensors may be housed at a sensor housing 6630. The sensor housing 6630 is a space defined at the body of the bus bar 6600 for securely retaining the sensors or a sensor assembly having one or more sensors. In some examples, the sensor housing 6630 may retain a Ground Imbalance Detection sensor unit, as described above. From the sensor housing 6630, a connector 6640, such as a cable, may be extended out from the sensor housing 6630 for communicating the measurement results of the sensors or sensor assembly to or processing module, for example, a processor. The sensor may be a current sensor, a voltage sensor, or both current and voltage sensors. The measurement results includes the measurement results of voltage and/or current flowing in the bus bar 6600 in relation to the safety ground. The sensor may be used in any equipment with common safety ground connection. The current and voltage sensors in sensor housing 6630 on the safety ground bus bar 6600 are the safest way to detect any current leakage. The monitoring equipment may be programmed to determine safety leakage levels. The monitoring equipment may use the sensor leads 6640 for monitoring the leakage level. The Monitoring equipment may receive a signal indicating the level of current or voltage present. In some examples, the sensor leads 6640 may be replaced with a cable and connector 6650. The monitoring equipment interact with the cable and connector 6650 by receiving at the monitoring equipment a signal indicating the level of current or voltage present.

The bus bar may also include a safety ground conductor hole 6645 for inserting of a conductor to the ground post, such as the cold metal water pipe located before the water meter. The conductor typically is a large braided bare or multi-strand number 8 wire (or larger) which carries any leaking current from the safety ground wire(s) from the respective connections and or devices, into this ground. As leakage current flows, the energy indicated (by the magnetic flux) is compared to a threshold and accordingly an alert may be sent as required.

It is a good wiring practice that when conductors are connected inside a breaker panel, the strain relief that prevents ripping of the wire may be insulated, and the ground wire may contact with the bus bar 6600. In some examples, the connectors may be loose in the breaker panel. Leaving the wires loose may create a short to the enclosure. The safety ground bus bar 6600 is phase independent, and may protect any kind of electrical panel with any current or voltage. As described above, a GID may determine whether a potential hazard is present, and thus protect a user from such hazard.

The bus bar 6600 may replace conventional ground bus bars used in conventional breaker panels, for detecting faults occurring at a premises, such as a residential house or building or a commercial building. A GID described above may be housed inside the bus bar 6600.

The bus bar 6600 may be attached to an object, such as a wall or a cabinet, using the attachment holes 6615. The bus bar 6600 may be directly connected to a safety ground. In some examples, the ground bus bar 6600 may be connected to a breaker panel housing. When the bus bar 6600 is installed, the bare safety ground from the field to the breaker panel may not electrically connected to the breaker panel housing. By insulating the ground bus bar 6600 from the breaker panel cabinet, the cabinet is not part of the electrical circuit. Therefore in a GFI event, a user would not be shocked by touching the panel housing. As such, the safety of an individual is improved.

In some examples, the bus bar 6600 and sensors contained in the sensor housing 6630 may be used on the white power lines. Using GID, the bus bar 6600, or both the GID and bus bar 6600 on a white wire may include an indicator for any ground imbalance. For example, bus bar 6600, or both the GID and bus bar 6600 may be used on the white power line combined with a separate power line, such as a black power line or other power lines, to indicate that there is leakages present. In some examples, the bus bar 6600, or both the GID and bus bar 6600 may be used on the black and red power lines. The bus bar 6600 may monitor a single phase or be used for a single circuit distribution method.

The bus bar 6600 may be used in any equipment with common safety ground connection, or other equipment where there is a common return point for conductors flowing to a single point/return. The bus bar 6600 may effectively be a data collection device for current and voltage by using the sensors or a sensor assembly.

In another example embodiment, a second sensing bus bar 6600 for the white (neutral) conductor may be used for replacing the existing bus bar. In another example embodiment, a bus bar may be used on the white(s)/neutral, the bus bar 6600 may be used as a second sensing bus bar, but for the white/neutral wires, resulting in having an indication of any ground imbalance.

In an exemplary embodiment, a current sensor may be used on the white(s) power line, and a separate sensor may be used on each of the hot phase(s) (Black, Red, etc.). A separate processing module or a processor may be used to receive measurement results from the sensors. A ground fault may be detected, in a similar manner as a GFCI breaker or a GFCI receptacle device, based on predetermined thresholds, or thresholds provided in real time. This embodiment may or may not provide control of the delivery of power, but may send an alarm indicating the presence of leakages. The bus bar 6600 may be used to detect ground fault leakages, and/or power imbalances between the black/red (hot, live power) and white (neutral) for one or more circuits connected to the bus bar 6600. The bus bar 6600 may allow detection of arcs, included but not limited to series arcs, by incorporating voltage measurement results generated by the sensors, i.e. the bus bar and/or lugs with sensors may provide an effective electrical fault detection means; and combined with the processor, power delivery control.

In another example embodiment, the sensors of the bus bar 6600 may be mounted on the red and black live phase wires to monitor the measurement results of both wires, or mounted on red, black and white live phase wires to monitor the measurement results of all three wires.

The bus bar 6600 therefore may provide complete data analysis on existing breaker panels by using the safety ground bus bar 6600 with the existing breaker panels, a white neutral busbar(s) and one or more wire-mounted sensors for hot (live) phases. All of the sensors may be connected to one or more monitoring devices.

Figure 66B:
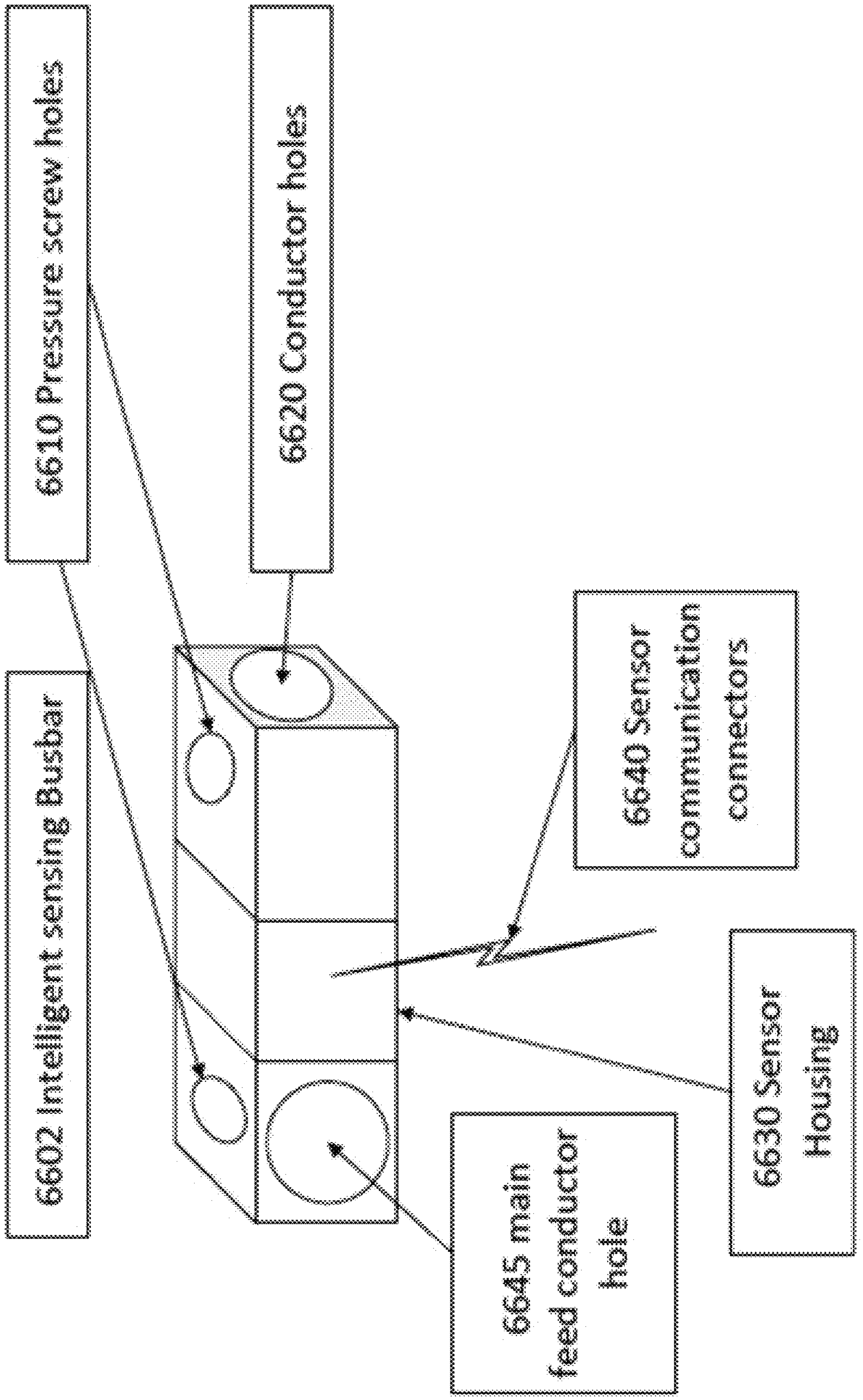
FIG. 66B illustrates an example of an intelligent sensing bus bar, according to an embodiment.

FIG. 66B is an example of an Intelligent Sensing Bus Bar 6602. The intelligent sensing bus bar 6602 may incorporate receiving a wire through a main feed conductor hole 6645, and providing an exit path for the conducting wire through the conductor hole 6620. A jumper cable may be used between the conductor hole 6620 and an existing bus bar.

Figure 66C:
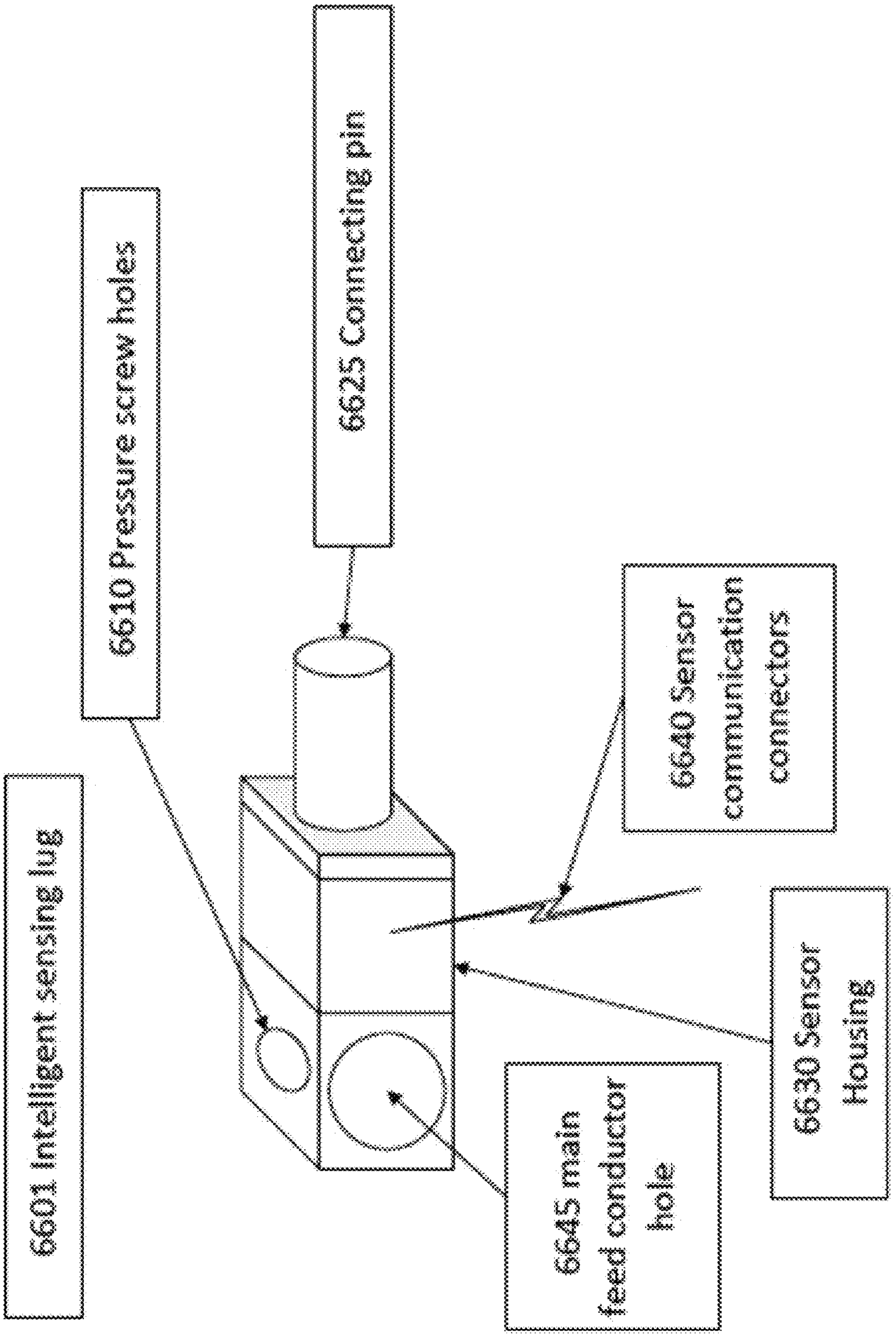
FIG. 66C illustrates an example of an intelligent sensing lug that has a protruding pin.

FIG. 66C illustrates an intelligent sensing lug 6601 that has a protruding pin 6625. In the example of FIG. 66C, the pin 6625 takes the place of the wire in the example of FIG. 66B, and may be installed perpendicular to the bus bar. In FIG. 66B, the wire may be installed parallel to the bus bar or side-by-side to the busbar. For other embodiments, the hole 6645 alternatively may be located at the other end of the sensing bus bar, for example, directly facing opposite the connecting holes 6620.

A feed wire may goes into main feed conductor hole 6645, secured by the pressure screw 6610 and is conductively connected to the pin 6625. Connecting pin 6625 may be inserted into the original hole of the power distribution bus bar, from which the power supply wire was removed.

In other embodiments, the hole 6645 alternatively may be located directly facing opposite the connecting pin 6625.

The connecting pin 6625 may be attached by being tightened by the housing screw, to a traditional bus bar or to a terminal connector assembly.

The intelligent sensing bus bars and lug(s) disclosed herein may be used with hot, neutral and/or ground power lines. The intelligent sensing bus bars and lug(s) may also be configured as one in one out. One per hot phase and one per breaker.

In another embodiment, a unit may be constructed such that a single bus bar may have a single sensor for current and/or voltage coming in and going out, for one or more conductors. A protocol such as Modbus in a serial communication environment such as RS485 and multi-drop RS485 environment in another embodiment configuration may be used to accommodate multiple conductors.

In another embodiment the intelligent lugs 6601 may be used to monitor each circuit coming from the field allowing for circuit independent detection and analysis.

One, two and three phase environments may be dealt with at the intelligent bus bar level rather than the power processing modules herein disclosed. Three of these bus bar modules may be used on each of the three phases, providing advanced energy data monitoring for any and/or all phases.

Figure 66D:
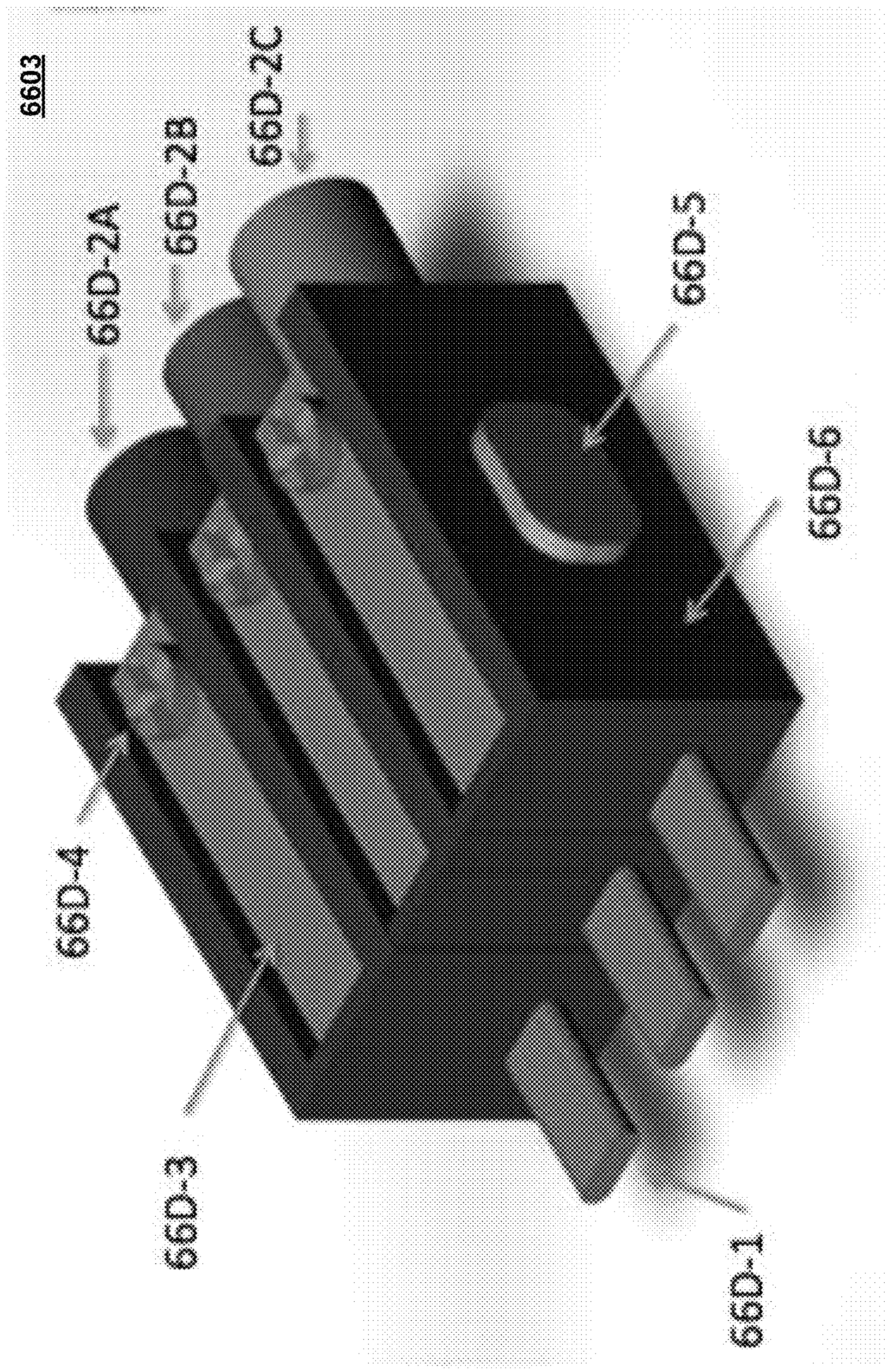
FIG. 66D illustrates an example of a joint three-phase module, according to an embodiment.

FIG. 66D illustrates an example of a joint three-phase intelligent current and/or voltage Sensing/Monitoring Module 6603, which may be used to handle 3-phase power applications, to provide both current, voltage and power synchronization and related waveform information to a power control processor. The module 6603 may be self-contained embodied as the power input portion of a 3-phase power bus bar. Another example embodiment may incorporate lugs.

Block 66D-1 may be power output terminals which may be used to provide the monitored power to either a 3-phase breaker, and/or as an AC contractor power input contacts.

The power output terminals may have holes in which screws may be used to attach the related power output to the each bus bar or simply they slide into the compression screw terminals of a contractor or breaker etc.

Blocks 66D-2A, 66D-2B and 66-2C are incoming power wires, i.e. the black (Phase 1), red (Phase 2) and blue (Phase 3) wires, respectively. Each wire may be secured by a screw 66D-4.

Block 66D-3 is the metal body of the respective power delivery/sensor module 6603. The modules 66D-3 are insulated from each other by an insulating body/casing 66D-6 (the material surrounding each of the modules 66D-3.

Block 66D-5 is the encapsulated electronics of the power delivery/sensor module 6603, the electronic circuitry are encapsulated inside the metal body, where electronic circuitry senses the various currents and voltages flowing through the respective power delivery/sensor module(s). The electronic circuitry is encapsulated to prevent them from being damaged and to ensure the various sensors are maintained in the correct position relative to the respective conductor(s) and sensors. This also ensures the timing and voltage relationship for the internal sensing elements.

Although a three-phase embodiment is illustrated in FIG. 66D, other embodiments may be for single to an n-phase module, which provides a single intelligent current and/or voltage Sensing/Monitoring Module 6603.

In the example of FIG. 66D, the respective power delivery/sensor module 6603 includes three metal bodies 66D-3. Another embodiment may contain 4 Sensing/Monitoring Modules. Where 2 modules are the connected to the incoming 2-phase 110/220 AC power, another to the White/Neutral, and the fourth being the Safety the ground. The respective modules output may be connected to a bus bar/connector strip etc.

Figure 67A:
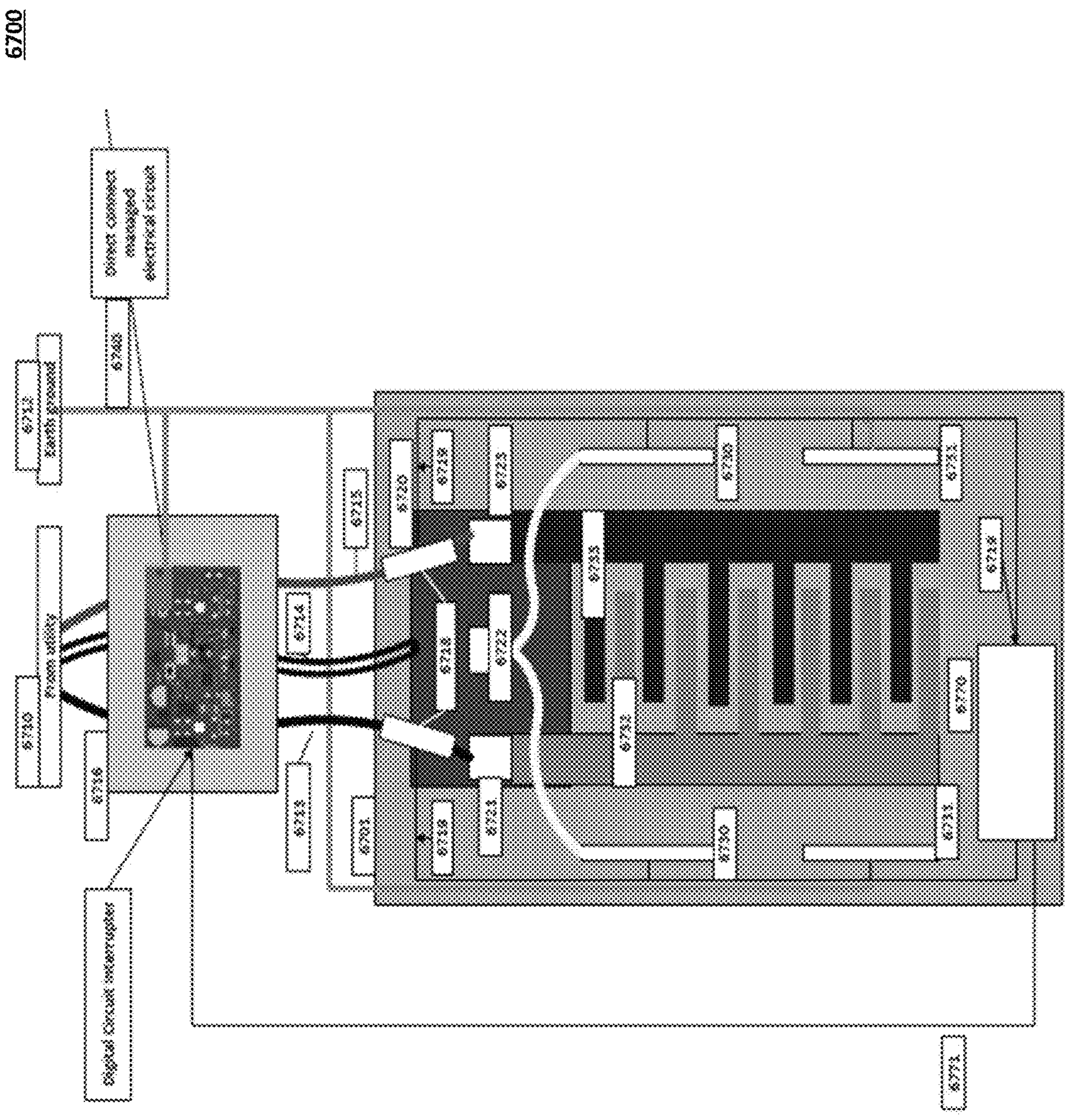
FIG. 67A illustrates a digital master breaker circuit interrupter electrical safety protection system, embodied in a two-phase environment.
Figure 67:
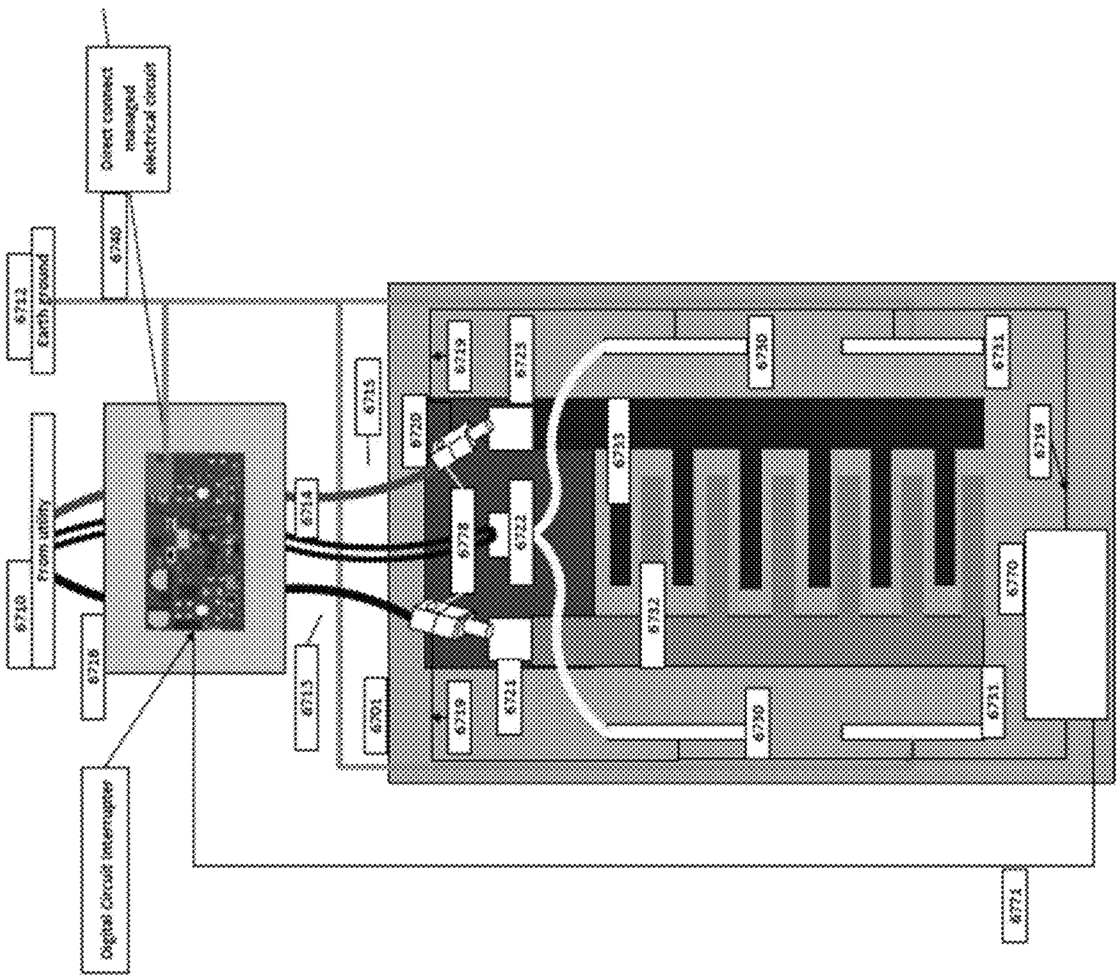
FIG. 67B illustrates an example of a breaker panel incorporating intelligent voltage and/or current sensing lugs, according to an embodiment.

FIG. 67A is one embodiment of an existing analog breaker panel that may be enhanced with sensors that would allow the characterization of the electric profile to maximize safety detection, including but not limited to Arc faults, Ground Faults and other All Safe detection capabilities. The disclosed system and method could be used in both AC and DC environments. FIG. 67 illustrates a digital master breaker circuit interrupter electrical safety protection system 6700, embodied in a two-phase environment.

The digital master breaker circuit interrupter electrical safety protection system 6700 may include a breaker panel 6701 and a digital circuit interrupter 6716. The breaker panel 6701 may include one or more sensing bus bars 6730 for sensing white/neutral distribution wires, and one or more sensing busbars 6731 for sensing safety ground distribution wires.

Block 6701 is the breaker panel. Block 6730 are sensing bus bars for white/neutral distribution wires. The example of FIG. 67 illustrates 2 bus bars 6730. In some examples, the digital master breaker circuit interrupter electrical safety protection system 6700 may include one or more bus bar 6730.

Block 6731 are sensing busbars for safety ground distribution wires. The example of FIG. 67 illustrates 2 bus bars 6731. In some examples, the digital master breaker circuit interrupter electrical safety protection system 6700 may include one or more bus bar 6731.

Block 6720 is the insulator backplane support surface that supports all the connections from the main breaker; 6721, 6722 and 6723 are connection posts for connecting the hot phases or neutral wires coming from the transformer and/or other panels to the digital master breaker circuit interrupter electrical safety protection system 6700. Block 6732 and 6733 represent the hot distribution busbars for the 2 hot phases powering the local breakers.

Blocks 6719 are the sensor data connectors, such as cables for transmitting measurement data from the sensors to the circuit interrupter 6716. Block 6718 shows two sensors monitoring hot phase(s) 6713 and 6715. In this embodiment, Block 6716 replaces the master analog breaker and acts as the master circuit interrupter protecting the breaker panel 6701. In another embodiment, the master circuit interrupter 6716 may be placed before or after (from an electrical standpoint) the traditional master breaker and be located in the immediate vicinity.

In the example of FIG. 67A, the digital master breaker 6716 is outside the breaker panel 6701. The digital master breaker 6716 may or may not replace the master analog circuit breaker. In another example embodiment, a legacy analog main breaker may be used instead of being replaced by a digital master breaker 6716, and sensor connectors 6719 may be connected to a separate monitoring unit.

In this specific embodiment, the digital master breaker 6716 is a digital circuit interrupter which may directly manage and optionally directly monitor, protect and control one or more emergency circuits 6740 that may not trip if the breaker panel is disconnected in case of a detected fault.

In this embodiment, the entire breaker panel 6701 is monitored by one or more sensors 6718 and one or more sensing busbars 6730 and 6731. The example in FIG. 67 illustrates two sensors 6718 and two sensing busbars 6730 and 6731. This embodiment shows that the digital master breaker circuit interrupter electrical safety protection system 6700 may be used in a two-phase system. The digital master breaker circuit interrupter electrical safety protection system 6700 may also be used in 1 to 3 hot phases, and even more phases.

The information transmitted to the digital master breaker 6716 by the different sensors allows the digital circuit interrupter 6716 to protect the environment as a whole, rendering this legacy analog breaker panel as safe as a modern unit.

This digital master breaker circuit interrupter system 6700 may also provide system wide statistics, including but not limited to the electrical consumption; and if properly certified, it may be used as a utility meter—reporting directly to the utility.

Block 6770 may be an encased sensor communication module for receiving and aggregating information from all the sensors 6718 via a communication path 6719. Although in the example of FIG. 67A, the sensor communication module 6770 is located inside the breaker panel 6701, in another example embodiment, the sensor communication module 6770 may be located outside the breaker panel 6701. A digital master breaker 6716 may note be required; sensor communication module 6770 may optionally transmit command(s) and/or data signal(s) from a processor for possible actions that result from sensor information received. If digital circuit interrupter 6716 is present, the digital circuit interrupter 6716 may decide whether or not to trip or power a circuit based on the signal information received from 6770. Alternatively, intelligent sensing lugs may be installed on each hot wire coming from the field, therefore providing circuit specific information.

Block 6771 may be a communication link between the sensor communications module 6770 and the intelligent circuit breaker 6716.

Additional electrical safety functionality may be incorporated for example on the housing of the circuit interrupter, including but not limited to: on/off buttons, test/reset buttons, status LEDs and a display screen to show the status of the system and/or system statistics.

The sensor connectors may use other means of connections including but not limited ribbon cables, wireless connections, fiber optics. If an imbalance is detected by the module 6670 due to the presence of current or voltage that should not be present, the module 6670 may either inform the user by sending a present message/alarm or if an intelligent circuit interrupter is present, the module 6670 may determine, for example by consulting a pre-set table of values, the action to be taken: for example, from sending an alarm message to cutting power to the entire breaker panel.

FIG. 67B illustrates an example of a breaker panel 6700B incorporating intelligent voltage and/or current sensing lugs as described above in FIG. 66C. Wire may extend into the sensing lug described above which may extend into an existing connector. The breaker panel 6700B may be used on any or all the distributed power wires, including neutral if desired. The sensing lugs may be part of the sensor communication module 6770 described above.

In the example of FIG. 67B, Blocks 6778 are two lugs that are connected to at the point where the black and red used to be connected. Similarly, the same lugs may be incorporated in Blocks 6730 and 6731. As well, rather than changing the bus bar, the white wire connection may be replace with 6778 lug, as described above in FIG. 66C.

Blocks 6778, 6770 and 6719 (sensor wires) may be incorporated in a single "pre-assembled" module, or assembly. The digital circuit interrupter 6716 may or may not be incorporated as part of a pre-assembled assembly unit. The digital circuit interrupter 6716 acting as an intelligent master breaker, may be used in conjunction with an analog master breaker, whereby the analog master breaker is primarily used for protection against external fault events rather than inside events.

In another embodiment, the sensor data collection module Block 6770 may be external to the breaker panel 6701.

In another example embodiment, intelligent sensing lugs 6601 may be installed on multiple hot wires and breaker connections in FIG. 67B for black wires going into each of the breakers, thereby providing individual circuit information. For example, multiple intelligent sensing lugs may replace a traditional bus bar. Multiple configurations are possible, including but not limited to for example, 4 large size lugs connected into the module and 48 small lugs to monitor black wires.

The wire coming from the master breaker may be fed into an intelligent sensing lug 6601 first (albeit larger than in the other embodiment 6721 and 6723), and the lug 6601 may be connected to the terminal of the breaker panel 6701.

Same intelligent sensing lug(s) 6701 may be used to feed into a breaker, or for the main connection into the breaker panel.

Example embodiments of the electrical device can detect non-continuous arcing. Traditional industry devices require a continuous arc because they are looking only at the current. As traditional industry devices are looking only at the current, they have to have a steady arcing current so that they will be able to trip through their arcing mechanism. Loose connections are always non-continuous.

Example embodiments of the electrical device can detect non-continuous arcing quite easily as the electrical device is looking at erratic variations in the voltage, and a non-continuous arc will produce erratic variation in the voltage, rather than just dropping in the voltage.

Example embodiments of the electrical device are looking at erratic variations of the voltage RMS values; and would detect right away non-continuous arcing. The discontinuous nature of the series arc will give rise to erratic changes in the voltage and these will be detected by the electrical device and will trip based on the detection. Detection and tripping of a series arc based on examination of erratic changes in the voltage, which results from the non-continuous nature of the series arc.

If arcing were continuous, it would drop and stay at the lower levels. If voltage stays at the lower level, there is no variation again. The whole RMS goes down, but the standard deviation goes to zero because the whole thing is down now. Whereas if it is non-continuous it will go up and down, up and down. Example embodiments of the electrical device are looking at voltage to determine if an arc, and looking at current to make detection more reliable and avoid false tripping because of erroneous data.

In example embodiments, the electrical device uses solid state switches such as IGBTs and Triacs to continually deliver power within a cycle. An active power distribution device operates for every cycle.

An example embodiment is an electrical device for separated power lines, the electrical device comprising: a plurality of electrical devices, each electrical device comprising a first contact for electrical connection to a respective upstream hot power line, a second contact for electrical connection to a respective neutral power line, and a third contact for electrical connection to a respective upstream ground line; each electrical device comprising a fourth contact for electrical connection to a respective downstream hot power line, a fifth contact for electrical connection to a respective downstream neutral power line, and a sixth contact for electrical connection to a respective downstream ground line; and a bus for electrically connecting all of the downstream ground lines.

In example embodiments, the electrical device further comprises at least one sensor in series relationship between one of the upstream power lines and one of the downstream power lines for detecting signals.

In example embodiments, wherein each electrical device includes a switch in series relationship between the first contact and the fourth contact, for controlling conductive connectivity between the respective upstream hot power line and the respective downstream hot power line, responsive to the signals detected by at least one of the sensors.

In example embodiments, wherein the at least one sensor includes a respective sensor for each electrical device in series relationship between the first contact and the fourth contact for detecting signals indicative of one of the respective hot power lines, for controlling at least one of the switches.

In example embodiments, wherein the at least one sensor includes a respective sensor for each electrical device in series relationship between the second contact and the fifth contact for detecting signals indicative of one of the respective neutral power lines, for controlling at least one of the switches.

In example embodiments, wherein each electrical receptacle includes a respective filter or diode in series relationship between the third contact and the sixth contact, for filtering or one-way conductive connectivity from the respective upstream ground line to the respective downstream ground line.

In example embodiments, the electrical device further comprises at least one communication subsystem configured for wired communication over at least one of the downstream power lines with reference to the downstream ground line.

In example embodiments, wherein the one of the respective downstream power lines for the wired communication is the respective downstream neutral power line.

In example embodiments, wherein the one of the respective downstream power lines for the wired communication is the respective downstream hot power line.

In example embodiments, the electrical device further comprises at least one communication subsystem configured for wired communication over at least one of the upstream power lines with reference to the upstream ground line.

In example embodiments, the electrical device further comprises a circuit board that contains the plurality of electrical devices, the circuit board include the bus for the electrically connecting of all of the downstream ground lines.

In example embodiments, wherein the bus comprises a rail.

In example embodiments, wherein the bus is for connecting to earth ground.

In example embodiments, wherein the electrical device is a circuit breaker panel, an electrical junction box that is adjacent to the circuit break panel, an in-line power receptacle, a metering device, or an intelligent junction box.

In example embodiments, wherein the at least one sensor includes at least one current transducer.

In example embodiments, the electrical device further comprises a second bus for electrically connecting all of the downstream neutral lines without connecting to the upstream neutral lines.

In example embodiments, the electrical device further comprises a plurality of circuit boards, wherein a first circuit board includes the bus and a second circuit board includes the second bus.

In example embodiments, the electrical device further comprises a plurality of circuit boards, wherein a first circuit board includes the bus and a second circuit board includes the first contact for electrical connection to the respective upstream hot power line.

An example embodiment is an extension cord, comprising: a cable having a first end portion and a second end portion; a power input end terminating the first end portion of the cable; a power output end terminating the second end portion of the cable; at least one sensor positioned at the second end portion for detecting signals indicative of the cable; a solid state switch in series relationship with the cable at the second end portion of the cable; a processor configured to determine, based on the detected current, that there is a ground fault, arc fault or over-current condition, and in response cause the solid state switch to deactivate.

In example embodiments, wherein the processor is configured to cause the solid state switch to activate when there is no ground fault, arc fault or over-current condition.

In example embodiments, wherein the processor is configured to cause the solid state switch to deactivate in response to receiving a manual command.

In example embodiments, wherein the solid state switch and the at least one sensor are in a same packaging or a same circuit board.

In example embodiments, wherein the solid state switch and the at least one sensor are in the same packaging or the same circuit board as the power output end.

In example embodiments, wherein the at least one sensor is in series relationship with the cable at the second end portion of the cable.

In example embodiments, wherein the at least one sensor comprises a current sensor for detecting current and/or a voltage sensor for detecting voltage.

In example embodiments, wherein the at least one sensor detects signals of a hot power line of the cable.

In example embodiments, wherein the at least one sensor detects signals of a neutral power line of the cable.

In example embodiments, wherein the power input end comprises a male end, and wherein the power output end comprises a female end.

In example embodiments, wherein the power output end comprises a plurality of plug outlets.

In example embodiments, wherein each of the plurality of plug outlets are individually controllable by the processor.

An example embodiment is a communication device, comprising: a first contact configured for electrical connection to a downstream power line; a second contact configured for electrical connection to ground; a processor; and a communication subsystem configured for wired communications over the neutral power line to the ground by sending an AC signal over the downstream power line.

In example embodiments, wherein the downstream power line is a neutral power line.

In example embodiments, wherein the downstream power line is a hot power line.

In example embodiments, wherein the wired communications continue when a circuit breaker of a breaker panel opens a hot power line.

In example embodiments, wherein the wired communications bypass a circuit breaker panel.

In example embodiments, wherein the communication device is a circuit breaker panel, a junction box, or an in-line control and monitoring unit.

An example embodiment is a communication device, comprising: a first contact configured for electrical connection to a neutral power line; a second contact configured for electrical connection to ground; a processor; and a communication subsystem configured for wired communications over the neutral power line to the ground by sending an AC signal over the neutral line.

In example embodiments, wherein the neutral power line is a downstream power line.

In example embodiments, wherein the wired communications continue when a circuit breaker of a breaker panel opens a hot power line.

In example embodiments, wherein the wired communications bypass a circuit breaker panel.

In example embodiments, wherein the communication device is a device comprising a plug for plugging into a plug outlet.

In example embodiments, wherein the communication device is an electrical device having a plug outlet.

In example embodiments, wherein the communication device is a circuit breaker panel.

An embodiment is an electrical device comprising: a first contact and a second contact configured for electrical connection to a hot power line and a neutral power line, respectively, the first contact and the second contact for downstream electrical connection to a downstream hot power line and downstream neutral power line, respectively; a switch connected in series relationship to the hot power line; at least one sensor configured to detect signals of the hot power line and/or the neutral power line; memory; a communication interface; at least one processor configured to execute instructions stored in the memory for: i) active power distribution of the power line within each cycle of the detected voltage signals by activating or deactivating the switch in response to the signals detected by at least one of the sensors, ii) control of the switch in response to receiving a communication over the communication interface, iii) processing raw information of the signals detected by the at least one sensor to arrive at processed information, and storing the raw information and the processed information to the memory, and iv) sending at least the processed information through the communication interface.

In example embodiments, wherein the at least one processor includes a programmable logic controller (PLC) configured to have preprogramming to perform the automated control; wherein the communication interface comprises a serial communication interface for wired communication to the at least one processor; and wherein the at least one processor executes a MODBUS protocol over the serial communication interface to: receive command through the serial communication interface for the preprogramming of the PLC, receive command through the serial communication interface for the control of the switch, and send at least the processed information through the serial communication interface.

In example embodiments, wherein the at least one processor executes the MODBUS protocol over the serial communication interface to send the raw information of the signals from the memory through the serial communication interface.

In example embodiments, wherein the at least one processor is configured to determine a condition of the hot power line or the neutral power line from the signals detected by the at least one sensor, and perform any one of i)-iii) in response to the determined condition.

In example embodiments, wherein the processing raw information of the signals includes calculating power factor.

In example embodiments, wherein the switch is controlled to achieve a specified power factor to the downstream hot power line by comparing the calculated power factor to the specified power factor.

In example embodiments, wherein the specified power factor is achieved by cycle stealing.

In example embodiments, wherein the processing raw information of the signals includes performing frequency analysis.

In example embodiments, wherein the processing raw information of the signals includes calculating output power.

In example embodiments, wherein the at least one processor is configured to activate one of a plurality of selectable modes of diagnostic analysis for the electrical device.

In example embodiments, wherein the at least one sensor comprises a current sensor; wherein the processor is configured to control deactivation of the switch in response to the detected current of the current sensor output indicative of ground fault, arc fault or over-current conditions.

In example embodiments, wherein said downstream electrical connection is to a plug outlet of the electrical device.

In example embodiments, wherein said downstream electrical connection is to a second electrical device.

In example embodiments, the electrical device further comprises a second switch connected in series relationship to the neutral power line.

In example embodiments, whether each of the at least one sensor is in series relationship to one of the power lines.

In example embodiments, wherein the switch is controlled to achieve a partial power output.

In example embodiments, wherein the partial power output is achieved by cycle stealing.

In example embodiments, wherein the memory includes a first buffer and a second buffer, wherein the at least one processor is configured to store the raw information to the first buffer and store the processed information to the second buffer.

In example embodiments, wherein the at least processor comprises a universal asynchronous receiver-transmitter (UART) for communication over the communication interface.

In example embodiments, wherein the automated control is for safety control upon detection of a fault.

In example embodiments, wherein the electrical device is an electrical receptacle.

In example embodiments, wherein the command through the communication interface for the preprogramming of the PLC includes: a command to control activation or deactivation of power to the electrical device; a command to turn on diagnostic data for the electrical specific device; and/or a command to turn on diagnostic data of a selected specific mode of monitoring at the electrical device.

In example embodiments, wherein the communication is received from an appliance in response to a voice input made to the appliance.

An example embodiment is a metering device configured for distributing power, comprising: a first contact, a second contact, and a third configured for electrical connection to a hot power line, a neutral power line, and a ground line, respectively, the first contact, the second contact, and the third contact for downstream electrical connection to a downstream hot power line, downstream neutral power line, and downstream ground line, respectively; a switch connected in series relationship to the hot power line; at least one sensor configured to detect signals of the hot power line and/or the neutral power line; memory; a communication interface; and at least one processor configured to execute instructions stored in the memory for i) active power distribution of the power line within each cycle of the detected voltage signals by activating or deactivating the switch in response to the signals detected by at least one of the sensors, ii) control of the switch in response to receiving a communication over the communication interface, and iii) storing raw information of the signals and/or processed information of the signals to the memory.

In example embodiments, wherein the at least one processor is configured to send the raw information and/or the processed information through the communication interface.

In example embodiments, wherein the power distribution device is a power distribution cabinet.

In example embodiments, wherein the communication interface is a wired communication interface.

An example embodiment is an electrical device comprising: a contact for electrical connection to a hot power line, and configured for downstream electrical connection to a downstream power line; a switch connected in series relationship to the hot power line; at least one sensor configured to detect current or voltage signals of the hot power line; at least one further sensor, including a temperature sensor, humidity sensor, liquid sensor, vibration sensor, or carbon monoxide sensor, configured to detect a condition of the electrical device; and a processor configured to control an activation or a deactivation of the switch in response to the current or voltage signals detected by the at least one sensor and the condition detected by at least one further sensor.

An example embodiment is an electrical device, comprising: a plug outlet comprising a first contact configured for electrical connection to a first hot power line having a first phase and a second contact configured for electrical connection to a second hot power line having a second phase, a first switch connected to the first contact in series relationship with the first hot power line, a second switch connected to the first contact in series relationship with the second hot power line, a processor configured to control an activation or a deactivation of the first switch and the second switch, the switches being in a deactivation state as a default when there is a plug in the plug outlet, the processor configured to determine that electrical conditions are safe, and in response activate the first switch and the second switch to distribute two-phase power to the plug, wherein the plug is from an electric vehicle.

An example embodiment is an electrical device comprising: at least one circuit breaker for connection to at least one hot power line, and each circuit breaker configured for downstream electrical connection to a respective downstream power line; and a communication subsystem; a processor configured to send, through the communication subsystem, a communication that one of the circuit breakers has opened or tripped.

In example embodiments wherein said communication includes identifying which particular circuit breaker has opened or tripped.

In example embodiments wherein the communication subsystem is configured for wired communications over the hot power line.

In example embodiments wherein the wired communications continue when the one circuit breaker opens one of the power lines.

In example embodiments, wherein the at least one circuit breaker comprises a switch.

In example embodiments, wherein the switch comprises a solid state switch.

In example embodiments, wherein the at least one circuit breaker comprises a mechanical breaker.

An example embodiment is an electrical device comprising: a contact configured for electrical connection to a power line; at least one sensor to detect at least voltage signals indicative of the power line; and a processor configured to determine from the detected voltage signals that a series arc fault has occurred.

In example embodiments, the electrical device further comprises a solid state switch for in-series electrical connection with the power line, the processor further configured to, in response to said determining that the series arc fault has occurred on the power line, deactivating the solid state switch.

In example embodiments, wherein the solid state switch is a TRIAC.

In example embodiments, wherein the contact is configured for electrical connection to a downstream power line or an electrical outlet.

In example embodiments, wherein said determining comprises the processor determining that the series arc fault has occurred on the downstream power line or a load plugged into the electrical outlet.

In example embodiments, wherein said determining comprises the processor determining that the series arc fault has occurred on the power line.

In example embodiments, the electrical device further comprises a communication subsystem, wherein the processor is configured to, in response to said determining that the series arc fault has occurred, sending a communication that the series arc fault has occurred.

In example embodiments, wherein the at least one sensor further includes at least one current sensor to detect current signals indicative of the power line, wherein the determining is further based on the detected current signals in addition to the detected voltage signals.

In example embodiments, wherein the determining is that there is little or no variance in the detected voltage signals, and is below a specified voltage threshold.

In example embodiments, wherein the determining is that there is variance in the detected current signals, for a load that experiences current above a threshold.

In example embodiments, wherein the power line comprises a hot power line, or a neutral power line.

In example embodiments, wherein the series arc fault is between a hot power line and a second hot power line, or a neutral power line and a second neutral power line, or a ground power line and a second ground power line.

In example embodiments, wherein the series arc fault is between the power line and the contact or a second contact.

In example embodiments, wherein the determining from the detected voltage signals that the series arc fault has occurred comprises: computing a frequency analysis of the detected voltage signals, determining that the series arc fault has occurred from the frequency analysis by determining that there is little or no deviation of the frequency analysis.

In example embodiments, wherein the frequency analysis comprises calculating a Fourier transform a Fast Fourier Transform (FFT) of the detected voltage signals, and analyzing higher order frequency signals of the Fourier transform or the Fast Fourier Transform (FFT) that are higher than fundamental frequency of the power line.

In example embodiments, wherein the frequency analysis comprises analyzing higher order frequency signals that are higher than fundamental frequency of the power line.

In example embodiments, wherein the determining from the detected voltage signals that the series arc fault has occurred comprises calculating a mean square or root mean square of the detected voltage signals and determining that the mean square or the root mean square deviates from previous mean square or root mean square of previously detected voltage signals.

In example embodiments, wherein the determining from the detected voltage signals that the series arc fault has occurred comprises determining that that the mean square or the root mean square deviation has occurred for more than a threshold number of cycles of the detected voltage signals.

In example embodiments, wherein the processor is configured to, when the mean square or the root mean square deviation has occurred for less than a threshold number of cycles of the detected voltage signals, determine that no series arc fault has yet occurred to avoid false trips.

In example embodiments, wherein the variance is a decrease in the mean square or the root mean square of the detected voltage signals.

In example embodiments, wherein the determining from the detected voltage signals that the series arc fault has occurred comprises calculating a mean square or root mean square of individual cycles of the detected voltage signals and determining that there are two consecutive cycles of decreases in the mean square or the root mean square of the detected voltage signals.

In example embodiments, wherein the determining from the detected voltage signals that the series arc fault has occurred comprises determining whether there is a voltage variance for individual cycles of the detected voltage signals, and determining that the voltage variance has occurred for more than a threshold number of cycles of the detected voltage signals.

In example embodiments, wherein the processor is configured to determine whether there is a voltage variance for individual cycles of the detected voltage signals, and determine that no series arc fault has yet occurred to avoid false trips when the voltage variance has occurred for less than a threshold number of cycles of the detected voltage signals.

In example embodiments, the electrical device further comprises at least one analog-to-digital convertor (ADC) internal or external to the processor configured to receive a respective analog signal from the at least one sensor and output a respective digital signal for processing by the processor for the determining from the detected voltage signals that the series arc fault has occurred.

In example embodiments, wherein the at least one sensor is for in-series electrical connection with the power line.

In example embodiments, wherein the series arc fault is a non-continuous arc fault.

An example embodiment is an arc fault circuit interrupter comprising: a power line conductor; a solid state switch for electrical connection to the power line conductor and configured to be activated or deactivated; an arc fault trip circuit cooperating with said solid state switch, said arc fault trip circuit being configured to deactivate said solid state switch responsive to detection of a series arc fault condition associated with voltage conditions of the power line conductor.

In example embodiments, wherein the power line conductor comprises a hot conductor, a neutral conductor, or a ground conductor.

In example embodiments, wherein the solid state switch is a TRIAC.

An example embodiment is electrical device comprising: a contact configured for electrical connection to a power line; at least one sensor configured to detect voltage signals indicative of the power line; and a processor configured to sample a plurality of the detected voltage signals within individual cycles of the detected voltage signals, and calculate mean square or root mean square values of the sampled voltage signals for the respective individual cycle of the detected voltage signals.

In example embodiments, wherein sixty four samples are sampled from the respective individual cycle of the detected voltage signals.

In example embodiments, the electrical device further comprises an analog-to-digital convertor (ADC) configured to receive analog signals from the at least one sensor indicative of the detected voltage signals and output digital signals to the processor for the sampling.

In example embodiments, the electrical device further comprises a solid state switch for in-series electrical connection with the power line, the processor further configured to, in response to determining that a series arc fault has occurred from the calculated mean square or root mean square values of the sampled voltage signals, deactivate the solid state switch.

In example embodiments, wherein said determining comprises the processor determining that the series arc fault has occurred on the power line.

In example embodiments, the electrical device further comprises a communication subsystem, wherein the processor is configured to, in response to said determining that a series arc fault has occurred from the calculated mean square or root mean square values of the sampled voltage signals, send a communication that the series arc fault has occurred.

An example embodiment is an electrical circuit interruption device comprising: a contact configured for electrical connection to a power line; a solid state switch for in-series electrical connection with the power line; at least one sensor to detect voltage signals indicative of the power line and provide analog signals indicative of the detected voltage signals; an analog-to-digital convertor (ADC) configured to receive the analog signals from the at least one sensor and output digital signals to the processor; and a processor configured to determine from the digital signals that an arc fault has occurred, and in response deactivating the solid state switch.

In example embodiments, wherein the determining from the detected voltage signals that the arc fault has occurred comprises: computing a frequency analysis of the detected voltage signals, wherein the arc fault is determined to be a parallel arc fault from the frequency analysis.

In example embodiments, wherein the frequency analysis comprises calculating a Fourier transform or a Fast Fourier Transform (FFT) of the detected voltage signals, and analyzing higher order frequency signals of the Fourier transform or the Fast Fourier Transform (FFT) that are higher than fundamental frequency of the power line.

In example embodiments, wherein the calculating of the Fourier transform or the FFT of the detected voltage signals is performed on individual cycles of the detected voltage signals, and wherein the arc fault is determined to be a parallel arc fault based on the higher order frequency signals over a plurality of cycles.

In example embodiments, wherein the frequency analysis comprises analyzing higher order frequency signals that are higher than fundamental frequency of the power line.

In example embodiments, wherein the frequency analysis of the detected voltage signals comprises performing the frequency analysis on individual cycles of the detected voltage signals and wherein the arc fault is determined to be a series arc fault when there is little or no deviation of the frequency analysis over a plurality of cycles.

In example embodiments, wherein the determining from the detected voltage signals that the arc fault has occurred comprises calculating a mean square or root mean square of the detected voltage signals and determining that the mean square or the root mean square deviates from previous mean square or root mean square of previously detected voltage signals.

In example embodiments, wherein the variance is a decrease in the mean square or the root mean square of the detected voltage signals.

In example embodiments, wherein the variance is a decrease in a peak voltage of at least one cycle of the detected voltage signals.

In example embodiments, wherein the arc fault is determined to be a series arc fault, wherein the determining from the detected voltage signals that the arc fault has occurred comprises calculating a mean square or root mean square of individual cycles of the detected voltage signals and determining that a variance of the mean square or the root mean square has occurred over a plurality of cycles.

In example embodiments, wherein the arc fault is determined to be a series arc fault, wherein the determining from the detected voltage signals that the arc fault has occurred comprises determining whether there is a voltage variance for individual cycles of the detected voltage signals, and determining that the voltage variance has occurred for more than a threshold number of cycles of the detected voltage signals.

In example embodiments, wherein the at least one sensor is for in-series electrical connection with the power line.

In example embodiments, wherein the processor is configured to decide, for each cycle of the detected voltage signals, whether to activate or de-activate the solid state switch.

In example embodiments, wherein the processor is configured for active power distribution of the power line within each cycle of the detected voltage signals by activating or deactivating the solid state switch.

In example embodiments, wherein the arc fault is a glowing contact arc fault between the contact and the power line.

An example embodiment is an arc fault circuit interrupter comprising: a hot conductor; a solid state switch for electrical connection to the hot conductor and configured to be activated or deactivated; an arc fault trip circuit cooperating with said operating mechanism, said arc fault trip circuit being configured to deactivate said solid state switch responsive to detection of an arc fault condition between the hot conductor and a neutral power line associated with detected current variation of the hot conductor and neutral power line.

In example embodiments, wherein the arc fault condition is determined based on frequency analysis of the hot conductor and neutral power line.

An example embodiment is an electrical device comprising: a contact configured for electrical connection to a hot power line; at least one sensor to detect at least current signals indicative of the hot power line; and a processor configured to determine from the detected current signals that an arc fault has occurred between the hot power line and a neutral power line or between hot power line and ground power line.

In example embodiments, wherein the determining from the detected current signals that the arc fault has occurred comprises: computing a frequency analysis of the detected current signals of the hot power line.

In example embodiments, wherein the frequency analysis comprises calculating a Fourier transform or a Fast Fourier Transform (FFT) of the detected current signals, and analyzing higher order frequency signals of the Fourier transform or the Fast Fourier Transform (FFT) that are higher than fundamental frequency of the power line.

In example embodiments, wherein the calculating of the Fourier transform or the FFT of the detected current signals is performed on individual cycles of the detected current signals, and wherein the arc fault is determined to be a parallel arc fault based on the higher order frequency signals over a plurality of cycles.

In example embodiments, wherein the determining from the detected current signals that the arc fault has occurred comprises: determining a variation over a plurality of cycles of the detected current signals.

In example embodiments, the electrical device further comprises an analog-to-digital convertor (ADC) configured to receive analog signals from the at least one sensor indicative of the detected current signals and output digital signals to the processor for the determining.

In example embodiments, the electrical device further comprises a solid state switch for in-series electrical connection with the power line, wherein the processor is further configured to, in response to determining that the that arc fault has occurred, deactivating the solid state switch.

In example embodiments, wherein the solid state switch is deactivated prior to current overload of the hot power line.

In example embodiments, wherein the solid state switch is deactivated when there is no leakage to ground or another conductor.

In example embodiments, wherein the at least one sensor is for in-series electrical connection with the power line.

In example embodiments, wherein the determining from the detected current signals that the arc fault has occurred comprises: computing a frequency analysis of the detected current signals, wherein the arc fault is determined to be a parallel arc fault from the frequency analysis.

An example embodiment is an electrical device comprising: a sensor to detect voltage signals indicative of a hot power line; and a processor configured to determine from the detected voltage signals that an arc fault has occurred, and differentiate the arc fault as being a series arc fault versus a parallel arc fault.

An example embodiment is an electrical device comprising: a contact configured for electrical connection to a power line; a solid state switch for in-series electrical connection with the power line; a sensor to detect voltage signals indicative of the power line; a processor configured to determine from the detected voltage signals that an arc fault has occurred, and in response deactivating the solid state switch without false tripping of the solid state switch.

An example embodiment is an electrical circuit interruption device comprising: a contact configured for electrical connection to a power line; a solid state switch for in-series electrical connection with the power line; a sensor to detect current signals indicative of the power line; a processor configured to: set a settable current threshold value, and deactivate the solid state switch in response to the detect current signals of the power line exceeding the settable current threshold value.

In example embodiments, wherein the settable current threshold level is a standard current threshold value.

In example embodiments, wherein the standard current threshold value is 15 A/20 A, 16 A/32 A, 50 A, 100 A, 200 A, or a value higher than 200 A.

In example embodiments, wherein the settable current threshold level is non-standard current threshold value.

In example embodiments, wherein the setting is performed by the processor based on the detected current signals.

In example embodiments, wherein the setting is performed by the processor based on a database stored in a memory accessible by the processor.

In example embodiments, wherein the settable current threshold level for the setting is received by the processor by way of received input.

In example embodiments, wherein the received input is received from an Application Program Interface, a user input device, a second electrical receptacle device, or a computer device.

An example embodiment is an electrical device comprising: a contact configured for electrical connection to a power line; a voltage sensor for in-series connection to the power line to detect voltage signals indicative of the power line and provide analog signals indicative of the detected voltage signals; an analog-to-digital convertor (ADC) configured to receive the analog signals from the voltage sensor and output digital signals; and a processor configured to sample the digital signals in real time.

In example embodiments, wherein the processor is a microprocessor.

In example embodiments, wherein sixty four samples are sampled from the respective individual cycle of the detected voltage signals and the detected current signals.

In example embodiments, wherein the processor is configured to determine that an arc fault has occurred from at least some of the sampled digital signals.

In example embodiments, wherein the processor is configured to determine that the arc fault is a series arc fault from a calculated mean square or root mean square values of the sampled voltage signals, and that there is little or no deviation in the detected current signals.

In example embodiments, wherein the processor is further configured to compute a frequency analysis of the detected voltage signals, and determine that the arc fault is a parallel arc fault based on the frequency analysis.

In example embodiments, wherein the frequency analysis comprises calculating a Fourier transform or a Fast Fourier Transform (FFT) of the detected voltage signals, and analyzing higher order frequency signals of the Fourier transform or the FFT that are higher than fundamental frequency of the power line.

In example embodiments, wherein the calculating of the Fourier transform, or the FFT of the detected voltage signals is performed on individual cycles of the detected voltage signals, and wherein the arc fault is determined to be a parallel arc fault when based on the higher order frequency signals over a plurality of cycles.

In example embodiments, wherein the frequency analysis comprises analyzing higher order frequency signals of the Fourier transform or the FFT that are higher than fundamental frequency of the power line.

In example embodiments, wherein the power line is a hot power line, wherein when the parallel arc fault has occurred over the hot power line to a neutral power line, there is little or no deviation in the detected current signals.

In example embodiments, wherein the processor is configured to decide, for each cycle of the detected current and/or voltage signals, whether to activate or de-activate the solid state switch.

In example embodiments, wherein the processor is configured for active power distribution of the power line within each cycle of the detected current and/or voltage signals by activating or deactivating the solid state switch.

An example embodiment is an oscilloscope electrical device comprising: a contact configured for electrical connection to a power line; a sensor for in circuit electrical connection to the power line to detect signals indicative of the power line; a processor configured to sample the detected signals in real time, and provide oscilloscope information indicative of the sampled signals.

In example embodiments, wherein the electrical connection to the power line is in series electrical connection for current.

In example embodiments, wherein the electrical connection to the power line is in parallel electrical connection for voltage.

In example embodiments, wherein the oscilloscope information includes a waveform of the detected signals, further comprising a display screen for the providing of the waveform in real time.

In example embodiments, wherein the processor is configured to analyze the sampled signals in real time.

In example embodiments, wherein the analyzing includes calculating a mean square or a root mean square of the sampled signals.

In example embodiments, wherein the analyzing includes performing frequency analysis of the detected voltage signals.

In example embodiments, wherein the frequency analysis is a Fourier transform or a Fast Fourier Transform (FFT) of the detected voltage signals.

In example embodiments, wherein the oscilloscope information includes information of the analyzed sampled signals.

In example embodiments, the electrical device further comprises a communication subsystem for the providing of the oscilloscope information by transmitting to another device.

In example embodiments, the electrical device further comprises at least one analog-to-digital convertor (ADC) configured to receive a respective analog signal from the at least one sensor and output a respective digital signal for processing by the processor for the providing of the oscilloscope information.

In example embodiments, wherein the processor is configured to execute an application program interface (API).

In example embodiments, wherein the API includes commands for instructing what mode of the oscilloscope information is to be provided by the processor.

In example embodiments, the electrical device further comprises a solid state switch for in-series electrical connection with the power line, wherein the API includes control commands for manual or automatic power distribution or safety of the power line by activating or deactivating the solid state switch.

In example embodiments, wherein sixty four samples are sampled from the respective individual cycle of the detected signals.

An example embodiment is an electrical device comprising: a contact configured for electrical connection to a power line; at least one sensor to detect signals indicative of the power line and provide analog signals indicative of the detected signals; an analog-to-digital convertor (ADC) configured to receive the analog signals from the at least one sensor and output digital signals to the processor; and a processor configured to calibrate the electrical device by: applying a first known electrical signal to the sensor and receiving a first digital signal value, applying a second known electrical signal to the sensor and receiving a second digital signal value, performing linear interpolation or extrapolation using the first digital signal value and the second digital signal value for the calibrating of the electrical device.

In example embodiments, the electrical device further comprises more than two digital signal values for calibrating non-linear sensor characteristics using a piece-wise linear approximation.

In example embodiments, the electrical device further comprises a solid state switch for in-series electrical connection with the power line, the processor further configured to determine that a series arc fault has occurred, and in response deactivating the solid state switch.

In example embodiments, wherein the solid state switch is a TRIAC.

In example embodiments, wherein the contact is configured for downstream electrical connection to a downstream power line.

In example embodiments, wherein the contact is configured for electrical connection through an electrical outlet.

In example embodiments, wherein the processor is a microprocessor.

An example embodiment is an electrical device comprising: a first contact for configured for electrical connection to a hot power line; a first sensor configured to provide a first analog signal indicative of current of the hot power line; a second contact for configured for electrical connection to a neutral power line; a second sensor configured to provide a second analog signal indicative of current of the neutral power line; a solid state switch for electrical connection to the hot power line and configured to be activated or deactivated; an analog-to-digital convertor (ADC) configured to receive the analog and output a digital signal, and a processor configured to detect a ground fault condition of the hot power line by determining a current imbalance between the hot power line and the neutral power line based on the digital signal from the ADC, for the deactivation of the solid state switch.

An example embodiment is a ground fault circuit interrupter comprising: a power line conductor; a first sensor configured to provide a first analog signal indicative of current of the power line conductor; a neutral line conductor; a second sensor configured to provide a second analog signal indicative of current of the neutral line conductor; a solid state switch for electrical connection to the power line conductor and configured to be activated or deactivated; a ground fault trip circuit cooperating with said operating mechanism, said ground fault trip circuit being configured to deactivate said solid state switch responsive to detection of a ground fault condition associated with current imbalance between said hot conductor and said neutral conductor, wherein said ground fault trip circuit includes: an analog comparator circuit configured to receive the first analog signal and the second analog signal and output an analog signal indicative of a difference between the first analog signal and the second analog signal, an analog-to-digital convertor (ADC) configured to receive the analog signal from the analog comparator circuit and output a digital signal, and a processor configured to perform determining of the current imbalance for the detection of the ground fault condition based on the digital signal from the ADC, for the deactivation of the solid state switch.

In example embodiments, wherein the analog comparator circuit comprises a differential amplifier.

In example embodiments, wherein the differential amplifier is unaffected by magnetic field effects.

In example embodiments, wherein the detection of the ground fault condition by processor includes determining that the current imbalance exceeds a threshold current imbalance and/or that the current imbalance has lasted for more than a threshold time.

In example embodiments, wherein the detection of the ground fault condition by processor includes determining that the current imbalance exceeds a threshold current imbalance.

In example embodiments, wherein the detection of the ground fault condition by processor includes determining that the current imbalance has lasted for more than a threshold time.

In example embodiments, wherein the first sensor and the second sensor are unaffected by magnetic field effects.

An example embodiment is an electrical device comprising: a conductive housing defining a first channel for receiving a power line, and a second channel; a fastener through the second channel for tightening the power line to the first channel, a head of the fastener engaging the power line and the conductive housing when tightened.

In example embodiments, wherein the head is nested within an exterior of the conductive housing when tightened.

In example embodiments, wherein the fastener contacts the conductive housing without contacting the power line.

In example embodiments, wherein the conductive housing includes a first conductive part and a second conductive part that collectively define the first channel.

In example embodiments, wherein the first channel includes one or more ribs for crimping contact with the power line.

In example embodiments, wherein the fastener is a screw and the head is a screw head.

In example embodiments, wherein the power line does not wrap around the screw.

In example embodiments, the electrical device further comprises a conductive element conductively connected to the conductive housing for electrical connection to an electrical outlet or for downstream connection.

In example embodiments, the electrical device further comprises a circuit board that comprises the conductive element.

In example embodiments, wherein the circuit board includes an opening for receiving direct connection to the power line, the opening being accessible through the first channel.

In example embodiments, wherein the opening is axially offset from the first channel.

In example embodiments, wherein the opening and the first channel collectively define a guiding tunnel for the power line.

In example embodiments, wherein the power line does not wrap around the fastener.

In example embodiments, for preventing of glowing contact between the power line and the conductive housing.

In example embodiments, wherein the fastener and the head are conductive.

In example embodiments, wherein the first channel is generally perpendicular to the second channel.

In example embodiments, wherein the device is an in-wall receptacle, a multiple-outlet power adapter, a power strip, an in-line power receptacle, an extension cord, a circuit breaker, a circuit breaker panel, a junction box, or a load center.

An example embodiment is an electrical device comprising: a ground contact configured for electrical connection to ground; a first voltage sensor to detect voltage signals indicative of the ground contact; a first current sensor to detect current signals indicative of the ground contact; a neutral contact configured for electrical connection to a neutral power line; a second voltage sensor to detect voltage signals indicative of the neutral power line; a second current sensor to detect current signals indicative of the neutral power line; and a processor configured to determine from the detected voltage signals and/or the current signals that a ground imbalance has occurred between the neutral power line and the ground.

In example embodiments, the electrical device further comprises a solid state switch for in-series electrical connection with a power line, the processor further configured to, in response to said determining that the ground imbalance has occurred on the power line, deactivating the solid state switch.

In example embodiments, wherein the solid state switch is a TRIAC.

In example embodiments, wherein said determining comprises the processor determining that the ground imbalance has occurred upstream of the electrical device.

In example embodiments, the electrical device further comprises a communication subsystem, wherein the processor is configured to, in response to said determining that the ground imbalance fault has occurred, sending a communication that the ground imbalance has occurred.

In example embodiments, wherein the ground contact is for electrical connection to the ground by way of a ground power line.

In example embodiments, the electrical device further comprises at least one analog-to-digital convertor (ADC) configured to receive a respective analog signal from the first voltage sensor and output a respective digital signal for processing by the processor for the determining from the detected voltage signals that the ground imbalance has occurred.

In example embodiments, wherein the first voltage sensor is for in-series electrical connection with the ground.

In example embodiments, wherein the first current sensor includes a magnetic field sensor for the detecting of the current signals of the ground.

In example embodiments, further comprising a ground plate for connecting the ground contact to the ground.

In example embodiments, wherein the ground plate is a heat sink of the electrical device.

In example embodiments, wherein the ground plate is a face plate of the electrical device.

An example embodiment is an electrical device comprising: a ground contact configured for electrical connection to ground; a voltage sensor for in-series connection to the power line to detect voltage signals indicative of the ground contact line and provide analog signals indicative of the detected voltage signals; a current sensor for in-series connection to the power line to detect current signals indicative of the ground contact line and provide analog signals indicative of the detected current signals; an analog-to-digital convertor (ADC) configured to receive the analog signals from the voltage sensor and output digital signals; and a processor configured to sample the digital signals in real time.

In example embodiments, wherein the voltage sensor is for in-series electrical connection with the ground.

In example embodiments, wherein the current sensor includes a magnetic field sensor for the detecting of the current signals of the ground.

In example embodiments, the electrical device further comprises a ground plate for connecting the ground contact to the ground.

In example embodiments, wherein the ground plate is a heat sink of the electrical device.

In example embodiments, wherein the ground plate is a face plate of the electrical device.

An example embodiment is an electrical device comprising: a processor; and a sensor assembly electrically coupled to the processor for detecting a current leakage, a voltage between two power lines, or both the current leakage and the voltage between the two power lines.

In example embodiments, wherein the sensor assembly comprises a current sensor.

In example embodiments, wherein the sensor assembly comprises a voltage sensor.

In example embodiments, wherein the sensor assembly comprises both a current sensor and a voltage sensor.

In example embodiments, wherein current sensor detects current leakage on a safety ground wire.

In example embodiments, wherein current sensor detects a magnetic field generated by the leakage current on the safety ground wire.

In example embodiments, wherein current sensor detects a magnetic field generated by the leakage current on the safety ground wire.

In example embodiments, the electrical device further comprises a communications line for connecting the sensor assembly with the processor for transmitting measurement results from the sensor assembly to the processor.

An example embodiment is a method for detecting ground imbalance on an electrical device, comprising: receiving, from a senor assembly, current, voltage, or both current and voltage measurement results; determine whether a ground imbalance is above a predetermined safety threshold level; and sending an error message indicating the ground imbalance.

In example embodiments, the electrical device further comprises in response to the determining that the ground imbalance is above the predetermined safety threshold level, discontinuing delivery of power to the electrical device.

In example embodiments, the electrical device further comprises if a second ground imbalance indicated by an external sensors above a predetermined threshold, alerting an external safety ground fault.

In example embodiments, the electrical device further comprises if a second ground imbalance indicated by an external sensors above a predetermined threshold, alerting an external safety ground fault.

In example embodiments, the electrical device further comprises discontinuing delivery of power to the electrical device.

An example embodiment is an electrical device comprising: a dielectric body, a plurality of through holes formed on the dielectric body, each through hole for receiving a power line; and a housing at an end of the body for housing a current sensor for sensing a current of the power line, a voltage sensor for sensing the voltage of the power line, or both a current for sensing a current of the power line and a voltage sensor for sensing a voltage of the power line.

In example embodiments, the electrical device further comprises a plurality of screw holes, each hole for receiving a screw for securing the power line in a through hole.

In example embodiments, the electrical device further comprises a plurality of attachment screw holes for securing the electric device to an object.

In example embodiments, the electrical device further comprises a plurality of sensor leads, each for indicating a status of a sensor in the housing.

In example embodiments, the electrical device further comprises a conductor or a cable for transmitting measurement results to a processor.

In example embodiments, wherein the electrical device is an insulated bus bar mounted on a breaker panel housing.

In example embodiments, wherein the electrical device detects fault on current and/or voltage.

In example embodiments, wherein the electrical device is configured to receive a wire through a main feed conductor hole, and to provide an exit path for the wire through a second conductor hole.

In example embodiments, wherein the electrical device further comprising a jumper cable for use between the second conductor hole and a bus bar.

An example embodiment is an electrical device comprising: a dielectric body, a through holes formed on a first side of the dielectric body for receiving an end of a power line; and a housing at an end of the body for housing a current sensor for sensing a current of the power line, a voltage sensor for sensing the voltage of the power line, or both a current for sensing a current of the power line and a voltage sensor for sensing a voltage of the power line; and a conductive pin on a second side of the dielectric body for conducting current or voltage to or from the power line.

In example embodiments, wherein the conductive pin is mounted perpendicularly to the second side of the dielectric body.

An example embodiment is an electrical device comprising: a plurality of power output terminals for supplying power; a plurality of power supply terminals for receiving power supply from a power source; a plurality of insulated power delivery modules, each module electrically connected to a respective power supply terminal and a power output terminal for conducting power; and a sensor unit for sensing current and voltage flowing through each of the power delivery module.

In example embodiments, wherein the sensor unit is encapsulated in the electrical device.

"Fig." and "Figure" are used interchangeably herein in the present disclosure.

While some of the present embodiments are described in terms of methods, a person of ordinary skill in the art will understand that present embodiments are also directed to various apparatus such as processors, circuitry, and controllers including components for performing at least some of the aspects and features of the described methods, be it by way of hardware components, software or any combination of the two, or in any other manner, as applicable.

In the Figures, as applicable, at least some or all of the illustrated subsystems or blocks may include or be controlled by a processor, which executes instructions stored in a memory or computer readable medium. Variations may be made to some example embodiments, which may include combinations and sub-combinations of any of the above. The various embodiments presented above are merely examples and are in no way meant to limit the scope of this disclosure. Variations of the innovations described herein will be apparent to persons of ordinary skill in the art having the benefit of the example embodiments, such variations being within the intended scope of the present disclosure. In particular, features from one or more of the above-described embodiments may be selected to create alternative embodiments comprised of a sub-combination of features, which may not be explicitly described above. In addition, features from one or more of the above-described embodiments may be selected and combined to create alternative embodiments comprised of a combination of features which may not be explicitly described above. Features suitable for such combinations and sub-combinations would be readily apparent to persons skilled in the art upon review of the present disclosure as a whole. The subject matter described herein intends to cover and embrace all suitable changes in technology.

Certain adaptations and modifications of the described embodiments can be made. Therefore, the above discussed embodiments are considered to be illustrative and not restrictive.

What is claimed is:

1. A communication device, comprising:

a first contact configured for electrical connection to a downstream power line, wherein the downstream power line is a hot power line;

a second contact configured for electrical connection to ground;

a processor;

a communication subsystem configured for wired communications over the downstream power line to the ground by sending an AC signal over the downstream power line;

a switch connected in series relationship to the hot power line;

at least one sensor configured to detect signals of the hot power line; and memory;

the processor configured to execute instructions stored in the memory for: i) active power distribution of the power line within each cycle of the detected signals by activating or deactivating the switch in response to the signals detected by at least one of the sensors, ii) control of the switch in response to receiving a communication over the communication subsystem, iii) processing raw information of the signals detected by the at least one sensor to arrive as processed information, and storing the raw information and the processed information to the memory, and iv) sending at least the processed information through the communication subsystem.

2. A communication device as recited in claim 1, wherein the processor includes a programmable logic controller (PLC) configured to have preprogramming to perform the control;

wherein the communication interface comprises a serial communication interface for wired communication to the processor; and wherein the processor executes a MODBUS protocol over the serial communication interface to:

receive command through the serial communication interface for the preprogramming of the PLC, receive command through the serial communication interface for the control of the switch, and send at least the processed information through the serial communication interface.

3. A communication device as recited in claim 2, wherein the processor executes the MODBUS protocol over the serial communication interface to send the raw information of the signals through the serial communication interface.

4. A communication device as recited in claim 1, wherein the processor is configured to determine a condition of the hot power line from the signals detected by the at least one sensor, and perform any one of i), ii), or iii) in response to the determined condition.

5. A communication device as recited in claim 1, wherein the processing raw information of the signals includes calculating power factor.

6. A communication device as recited in claim 5, wherein the switch is controlled to achieve a specified power factor to the downstream hot power line by comparing the calculated power factor to the specified power factor.

7. A communication device as recited in claim 6, wherein the specified power factor is achieved by cycle stealing.

8. A communication device as recited in claim 1, wherein the processing raw information of the signals includes performing frequency analysis.

9. A communication device as recited in claim 1, wherein the processing raw information of the signals includes calculating output power.

10. A communication device as recited in claim 1, wherein the at least one processor is configured to activate one of a plurality of selectable modes of diagnostic analysis for the communication device.

11. A communication device as recited in claim 1, wherein the memory includes a first buffer and a second buffer, wherein the processor is configured to store the raw information to the first buffer and store the processed information to the second buffer.

12. A communication device as recited in claim 1, wherein the processor comprises a universal asynchronous receiver-transmitter (UART) for the serial communication interface.

13. A communication device as recited in claim 1, wherein the control is for safety control upon detection of a fault.

14. A communication device as recited in claim 1, wherein the command through the communication interface for the preprogramming of the PLC includes:

- a command to control activation or deactivation of power to the communication device;
- a command to turn on diagnostic data for the communication device; and/or
- a command to turn on diagnostic data of a selected specific mode of monitoring at the communication device.

15. A communication device as recited in claim 1, wherein the detected signals are voltage signals.

* * * * *